(12) United States Patent
Shafer et al.

(10) Patent No.: US 7,679,821 B2
(45) Date of Patent: *Mar. 16, 2010

(54) CATADIOPTRIC PROJECTION OBJECTIVE

(75) Inventors: David Shafer, Fairfield, CT (US);
Wilhelm Ulrich, Aalen (DE); Aurelian Dodoc, Heidenheim (DE); Rudolf Von Buenau, Jena (DE); Hans-Juergen Mann, Oberkochen (DE); Alexander Epple, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/184,818

(22) Filed: Aug. 1, 2008

(65) Prior Publication Data

US 2008/0297889 A1 Dec. 4, 2008

Related U.S. Application Data

(63) Continuation of application No. 12/046,040, filed on Mar. 11, 2008, now abandoned, which is a continuation of application No. 11/035,103, filed on Jan. 14, 2005, now Pat. No. 7,385,756.

(60) Provisional application No. 60/617,674, filed on Oct. 13, 2004, provisional application No. 60/612,823, filed on Sep. 24, 2004, provisional application No. 60/587,504, filed on Jul. 14, 2004, provisional application No. 60/536,248, filed on Jan. 14, 2004.

(51) Int. Cl.
*G02B 17/00* (2006.01)
*G02B 21/00* (2006.01)

(52) U.S. Cl. .................. 359/365; 359/730

(58) Field of Classification Search .......... 359/351, 359/355–357, 364–366, 730, 858, 649, 651; 250/492.2

See application file for complete search history.

(56) References Cited

U.S. PATENT DOCUMENTS 2,380,887 A 7/1945 Warmisham (Continued)

FOREIGN PATENT DOCUMENTS

DE 1064734 9/1959

(Continued)

OTHER PUBLICATIONS

M H. Freeman, Innovative Wide-Field Binocular Design, OSA Proceedings of the International Optical Design Conference, 1994, pp. 389-393, vol. 22.

(Continued)

*Primary Examiner*—Lee Fineman
(74) *Attorney, Agent, or Firm*—Fish & Richardson P.C.

(57) ABSTRACT

A catadioptric projection objective for imaging a pattern provided in an object plane of the projection objective onto an image plane of the projection objective comprises: a first objective part for imaging the pattern provided in the object plane into a first intermediate image; a second objective part for imaging the first intermediate imaging into a second intermediate image; a third objective part for imaging the second intermediate imaging directly onto the image plane; wherein a first concave mirror having a first continuous mirror surface and at least one second concave mirror having a second continuous mirror surface are arranged upstream of the second intermediate image;

pupil surfaces are formed between the object plane and the first intermediate image, between the first and the second intermediate image and between the second intermediate image and the image plane; and all concave mirrors are arranged optically remote from a pupil surface. The system has potential for very high numerical apertures at moderate lens material mass consumption.

35 Claims, 38 Drawing Sheets

U.S. PATENT DOCUMENTS

| | | |
|---|---|---|
| 3,244,073 A | 4/1966 | Bouwers et al. |
| 4,103,990 A | 8/1978 | Yamada |
| 4,241,390 A | 12/1980 | Markle et al. |
| 4,293,186 A | 10/1981 | Offner |
| 4,346,164 A | 8/1982 | Tabarelli et al. |
| 4,398,809 A | 8/1983 | Canzek |
| 4,443,068 A | 4/1984 | Itoh |
| 4,469,414 A | 9/1984 | Shafer |
| 4,482,219 A | 11/1984 | Canzek |
| 4,666,259 A | 5/1987 | Iizuka |
| 4,685,777 A | 8/1987 | Hirose |
| 4,711,535 A | 12/1987 | Shafer |
| 4,757,354 A | 7/1988 | Sato et al. |
| 4,779,966 A | 10/1988 | Friedman |
| 4,812,028 A | 3/1989 | Matsumoto |
| 4,834,515 A | 5/1989 | Mercado |
| 4,861,148 A | 8/1989 | Sato et al. |
| 4,951,078 A | 8/1990 | Okada |
| 5,004,331 A | 4/1991 | Haseltine et al. |
| 5,031,976 A | 7/1991 | Shafer |
| 5,063,586 A | 11/1991 | Jewell et al. |
| 5,114,238 A | 5/1992 | Sigler |
| 5,153,898 A | 10/1992 | Suzuki et al. |
| 5,212,588 A | 5/1993 | Viswanathan et al. |
| 5,220,590 A | 6/1993 | Bruning et al. |
| 5,315,629 A | 5/1994 | Jewell et al. |
| 5,353,322 A | 10/1994 | Bruning et al. |
| 5,410,434 A | 4/1995 | Shafer |
| 5,477,304 A | 12/1995 | Nishi |
| 5,488,229 A | 1/1996 | Elliott et al. |
| 5,515,207 A | 5/1996 | Foo |
| 5,636,066 A | 6/1997 | Takahashi |
| 5,650,877 A | 7/1997 | Phillips, Jr. et al. |
| 5,652,679 A | 7/1997 | Freeman |
| 5,686,728 A | 11/1997 | Shafer |
| 5,717,518 A | 2/1998 | Shafer et al. |
| 5,729,376 A | 3/1998 | Hall et al. |
| 5,734,496 A | 3/1998 | Beach |
| 5,802,335 A | 9/1998 | Sturlesi et al. |
| 5,805,346 A | 9/1998 | Tomimatsu |
| 5,805,365 A | 9/1998 | Sweatt |
| 5,815,310 A | 9/1998 | Williamson |
| 5,825,043 A | 10/1998 | Suwa |
| 5,861,997 A | 1/1999 | Takahashi |
| 5,917,879 A | 6/1999 | Mashima |
| 5,956,192 A | 9/1999 | Williamson |
| 5,999,310 A | 12/1999 | Shafer et al. |
| 6,033,079 A | 3/2000 | Hudyma |
| 6,097,537 A | 8/2000 | Takahashi et al. |
| 6,169,627 B1 | 1/2001 | Schuster |
| 6,169,637 B1 | 1/2001 | Tsunashima |
| 6,172,825 B1 | 1/2001 | Takahashi |
| 6,188,513 B1 | 2/2001 | Hudyma et al. |
| 6,195,213 B1 | 2/2001 | Omura et al. |
| 6,213,610 B1 | 4/2001 | Takahashi et al. |
| 6,259,510 B1 | 7/2001 | Suzuki |
| 6,262,845 B1 | 7/2001 | Sweatt |
| 6,285,737 B1 | 9/2001 | Sweatt et al. |
| 6,353,470 B1 | 3/2002 | Dinger |
| 6,426,506 B1 | 7/2002 | Hudyma |
| 6,473,243 B1 | 10/2002 | Omura |
| 6,600,608 B1 | 7/2003 | Shafer et al. |
| 6,631,036 B2 | 10/2003 | Schuster |
| 6,636,350 B2 | 10/2003 | Shafer et al. |
| 6,731,374 B1 | 5/2004 | Sewell |
| 6,750,948 B2 | 6/2004 | Omura |
| 6,757,051 B2 | 6/2004 | Takahashi et al. |
| 6,822,727 B2 | 11/2004 | Shima |
| 6,829,099 B2 | 12/2004 | Kato et al. |
| 6,842,298 B1 | 1/2005 | Shafer et al. |
| 6,873,476 B2 | 3/2005 | Shafer et al. |
| 6,909,492 B2 | 6/2005 | Omura |
| 6,912,042 B2 | 6/2005 | Shafer |
| 6,995,886 B2 | 2/2006 | Hendriks |
| 6,995,918 B2 | 2/2006 | Terasawa |
| 7,030,965 B2 | 4/2006 | Takahashi |
| 7,075,726 B2 | 7/2006 | Terasawa et al. |
| 7,079,314 B1 | 7/2006 | Suenaga et al. |
| 7,085,075 B2 | 8/2006 | Mann et al. |
| 7,092,168 B2 | 8/2006 | Terasawa et al. |
| 7,187,503 B2 | 3/2007 | Rostalski et al. |
| 7,190,530 B2 | 3/2007 | Mann et al. |
| 7,218,445 B2 | 5/2007 | Shafer et al. |
| 7,224,520 B2 | 5/2007 | Mitchell |
| 7,237,915 B2 | 7/2007 | Hudyma |
| 7,239,453 B2 | 7/2007 | Terasawa et al. |
| 7,309,870 B2 | 12/2007 | Omura |
| 7,312,463 B2 | 12/2007 | Omura |
| 7,348,575 B2 | 3/2008 | Omura |
| 7,385,756 B2 | 6/2008 | Shafer et al. |
| 7,463,422 B2 | 12/2008 | Kamenow |
| 2002/0024741 A1 | 2/2002 | Terasawa et al. |
| 2002/0176063 A1 | 11/2002 | Omura |
| 2003/0011755 A1 | 1/2003 | Omura et al. |
| 2003/0011894 A1 | 1/2003 | Schuster |
| 2003/0197922 A1 | 10/2003 | Hudyma |
| 2003/0197946 A1 | 10/2003 | Omura |
| 2003/0234912 A1 | 12/2003 | Omura |
| 2003/0234992 A1 | 12/2003 | Shafer |
| 2004/0012866 A1 | 1/2004 | Mann et al. |
| 2004/0130806 A1 | 7/2004 | Takahashi |
| 2004/0160677 A1 | 8/2004 | Epple et al. |
| 2004/0240047 A1 | 12/2004 | Shafer et al. |
| 2005/0036213 A1 | 2/2005 | Mann et al. |
| 2005/0082905 A1 | 4/2005 | Gronau et al. |
| 2005/0179994 A1 | 8/2005 | Webb |
| 2005/0190435 A1 | 9/2005 | Shafer et al. |
| 2005/0225737 A1 | 10/2005 | Weissenrieder et al. |
| 2006/0012885 A1 | 1/2006 | Beder et al. |
| 2006/0066962 A1 | 3/2006 | Totzeck et al. |
| 2006/0077366 A1 | 4/2006 | Shafer |
| 2006/0119750 A1 | 6/2006 | Epple et al. |
| 2006/0198018 A1 | 9/2006 | Shafer |
| 2006/0221456 A1 | 10/2006 | Shafer et al. |
| 2006/0244938 A1 | 11/2006 | Schuster |
| 2006/0256447 A1 | 11/2006 | Dodoc |
| 2007/0024960 A1 | 2/2007 | Omura |
| 2007/0037079 A1 | 2/2007 | Omura |
| 2007/0091451 A1 | 4/2007 | Schuster |
| 2007/0109659 A1 | 5/2007 | Rostalski et al. |
| 2007/0165198 A1 | 7/2007 | Kneer et al. |
| 2007/0236674 A1 | 10/2007 | Shafer et al. |
| 2007/0252094 A1 | 11/2007 | Ulrich et al. |
| 2007/0297072 A1 | 12/2007 | Omura |
| 2008/0151364 A1 | 6/2008 | Shafer et al. |
| 2008/0151365 A1 | 6/2008 | Shafer et al. |
| 2008/0186567 A1 | 8/2008 | Shafer et al. |
| 2008/0212170 A1 | 9/2008 | Shafer et al. |
| 2008/0285121 A1 | 11/2008 | Shafer et al. |
| 2008/0297889 A1 | 12/2008 | Shafer et al. |
| 2008/0310014 A1 | 12/2008 | Shafer et al. |

FOREIGN PATENT DOCUMENTS

| | | |
|---|---|---|
| DE | 103 32 112 | 1/2005 |
| DE | 102005056721 | 11/2006 |
| EP | 0267766 | 5/1988 |
| EP | 0 951 054 | 10/1999 |
| EP | 0 962 830 | 12/1999 |
| EP | 1059550 | 12/2000 |
| EP | 1 069 448 | 1/2001 |
| EP | 1098215 | 10/2001 |
| EP | 1 318 425 | 6/2003 |
| EP | 1318425 | 6/2003 |

| | | |
|---|---|---|
| EP | 1 336 887 | 8/2003 |
| JP | 5-175098 | 7/1993 |
| JP | 6-188169 | 7/1994 |
| JP | 8-166542 | 6/1995 |
| JP | 8-330220 | 12/1996 |
| JP | 9-148241 | 6/1997 |
| JP | 10-163099 | 6/1998 |
| JP | 10-214783 | 8/1998 |
| JP | 10-284408 | 10/1998 |
| JP | 10-303114 | 11/1998 |
| JP | 2000-505958 | 5/2000 |
| JP | 2001-228401 | 8/2001 |
| JP | 3246615 | 11/2001 |
| JP | 2002-208551 | 7/2002 |
| JP | 2002372668 | 12/2002 |
| JP | 2003114387 | 4/2003 |
| JP | 2003-307680 | 10/2003 |
| JP | 2004-333761 | 11/2004 |
| JP | 2004317534 | 11/2004 |
| JP | 2005-003982 | 1/2005 |
| SU | 124665 | 3/1959 |
| WO | WO 92/05462 | 4/1992 |
| WO | WO 94/06047 | 3/1994 |
| WO | WO 98/28665 | 7/1998 |
| WO | WO 99/26097 | 5/1999 |
| WO | WO 99/42905 | 8/1999 |
| WO | WO 99/57596 | 11/1999 |
| WO | WO 01/04682 | 1/2001 |
| WO | WO 01/51979 | 7/2001 |
| WO | WO 01/55767 | 8/2001 |
| WO | WO 01/59502 | 8/2001 |
| WO | WO 02/35273 | 5/2002 |
| WO | WO 03/036361 | 5/2003 |
| WO | WO 03/088330 | 10/2003 |
| WO | WO 2004/010200 | 1/2004 |
| WO | WO 2004/019128 | 3/2004 |
| WO | WO 2004/107011 | 12/2004 |
| WO | WO 2005/015316 | 2/2005 |
| WO | WO 2005/040890 | 5/2005 |
| WO | WO 2005/059654 | 6/2005 |
| WO | WO 2005/059055 | 7/2005 |
| WO | WO 2005/098504 | 10/2005 |
| WO | WO 2005/098505 | 10/2005 |
| WO | WO 2005/098506 | 10/2005 |
| WO | WO 2005/111689 | 11/2005 |
| WO | WO 2006/005547 | 1/2006 |
| WO | WO 2007/025643 | 3/2007 |
| WO | WO 2007/086220 | 8/2007 |

OTHER PUBLICATIONS

Tomoyuki Matsuyama et al., Nikon Projection Lens Update, Proceedings of SPIE, 2004, vol. 5377, No. 65.
Donald DeJager, Camera viewfinder using tilted concave mirror erecting elements, International Lens Design Conference (OSA), SPIE, 1980, pp. 292-298, vol. 237.
U.S. Appl. No. 60/511,673, filed Oct. 17, 2003.
U.S. Appl. No. 60/530,623, filed Dec. 19, 2003.
"Rapid Communication", Applied Optics, vol. 23, No. 13, Sep. 1, 1984.
Jacobs et al., "Expansion hysteresis upon thermal cycling of Zerodur", Applied Optics, vol. 23, No. 17, Sep. 1, 1984.
Lindig et al.,"Thermal expansion and length stability of Zerodur in dependence on temperature and time", Applied Optics, vol. 24, No. 20, Oct. 15, 1985.
M. Switkes et al., Resolution Enhancement of 157-nm Lithography by Liquid Immersion, Proc. SPIE vol. 4691, Optical Microlithography XV, pp. 459-465, Jul. 2002.
Tomoyuki Matsuyama et al., "Microlithographic Lens for DUV Scanner," SPIE vol. 4832, Dec. 2003, Conference Jun. 3-7, 2002, pp. 170-174.
Tomoyuki Matsuyama et al., "High NA and Low Residual Aberration Projection Lens for DUV Scanner,"PSIE, vol. 4691 2002, pp. 687-695.
Ulrich, W. et al., "Trends in Optical Design of Projection Lenses for UV-and EUV-Lithography," Proc. Of SPIE, vol. 4146 (2000).
Glatzel, E., "New Lenses for Microlithography," SPIE vol. 237 (1980), pp. 310-320.
Sworn Translation of International Patent Application No. PCT/JP2004/006417, filed May 6, 2004.
Certified Japanese Application No. 2003-364596, filed Oct. 24, 2003.
Sworn Translation of Japanese Application No. 2003-364596, filed Oct. 24, 2003.
Claim Chart Showing Omura's Entitlement to Benefit.
Declaration of Mitchell C. Ruda, Ph.D.
Curriculum vitae of Mitchell C. Ruda Ph.D.
Warren Smith, "Modern Optical Engineering," 123-25 (McGraw Hill 1966).
File history for U.S. Appl. No. 11/266,288, filed Nov. 4, 2005.
Declaration of Richard C. Juergens dated Jun. 1, 2009.
Curriculum Vitae of Richard C. Juergens.
U.S. Appl. No. 60/654,950 to David Shafer, filed Feb. 23, 2005.
Office communication mailed on Jan. 6, 2009, in Shafer's Involved Application, U.S. Appl. No. 11/653,366.
Filing Receipt mailed Feb. 12, 2007, in Shafer's Involved Application, U.S. Appl. No. 11/653,366.
Information Disclosure Statement filed on Oct. 20, 2006, in Omura's '934 Application, U.S. Appl. No. 11/583,934.
Combined Declaration and Power of Attorney submitted on Oct. 20, 2006, in Omura's '934 Application, U.S. Appl. No. 11/583,934.
Combined Declaration and Power of Attorney submitted on Feb. 7, 2006, in Omura's Parent Application.
Notice of allowance mailed on Aug. 14, 2007, in Omura's '934 Application, U.S. Appl. No. 11/583,934.
Issue Fee Payment mailed on Nov. 2, 2007, in Omura's '934 Application, U.S. Appl. No. 11/583,934.
Claims marked to show differences between: (1) Omura's '934 Application, U.S. Appl. No. 11/583,934, filed Oct. 20, 2006 and (2) Shafer's Published PCT Application, WO 2006/005547 to Shafer et al., published on Jan. 19, 2006.
Requirement for Restriction/Election mailed on Apr. 4, 2007, in Omura's Sister Application, U.S. Appl. No. 11/513,160.
Reply to Election of Species Requirement filed on Apr. 27, 2007, in Omura's Sister Application, U.S. Appl. No. 11/513,160.
Office Communication mailed on Jul. 5, 2007, in Omura's Sister Application, U.S. Appl. No. 11/513,160.
Supplemental Reply to Election of Species Requirement filed on Oct. 3, 2007, in Omura's Sister Application, U.S. Appl. No. 11/513,160.
Non-Final Rejection mailed on Dec. 12, 2007, in Omura's Sister Application, U.S. Appl. No. 11/513,160.
Amendment filed on Apr. 9, 2008, in Omura's Sister Application, U.S. Appl. No. 11/513,160.
Final Rejection mailed on Jul. 14, 2008, in Omura's Sister Application, U.S. Appl. No. 11/513,160.
Notice of Appeal filed on Jan. 14, 2009, in Omura's Sister Application, U.S. Appl. No. 11/513,160.
Omura et al., *Catadioptric lens development for DUV and VUV projection optics*, Optical Microlithography XVI, Proc. SPIE vol. 5040, pp. 781-788 (2003).
Optical Prescription Data cited in Declaration of Richard C. Juergens dated Jun. 1, 2009.
Claim Chart Showing Exemplary Common Disclosure in Shafer Involved Application, Shafer's PCT Application, and Shafer's '950 Provisional Relevant to the Count.
Threshold issue, 68 Fed. Reg. 66,648; 66,664; and 66,689 (Nov. 26, 2003).
Threshold issue, 69 Fed. Reg. 49,960; 49,969; 49,991; and 50,019 (Aug. 12, 2004) (to be codified at 37 C.F.R. § 41.201).
Harry J. Levinson, "Principles of Lithography," SPIE, 2001, pp. 150-167.
Warren J. Smith, "Modern Optical Engineering: The Design of Optical Systems," 3$^{rd}$ Edition, McGraw-Hill, New York, 2000, pp. 487-492.

James R. Sheats et al., "Microlithography: Science and Technology," Marcel Dekker, Inc. New York, 1998, pp. 261-270.

P. Rai-Choudhury, "Handbook of Microlithography, Micromachining, and Microfabrication: vol. 1: Microlithogtaphy," SPIE, 1997, pp. 82-126.

U.S Court of Appeals for the Federal Circuit 2008-1466, *Agilent Technologies, Inc.* v. *Affymetrix, Inc.*, the Appeal from the US District Court for Northern California District of California in Case No. 06-CV-05958, Judge James Ware, dated Jun. 4, 2009 (26 pages).

Translation of PCT/JP01/09266, filed Oct. 23, 2003, publication No. WO 2002/35273, published May 2, 2002.

Matsuyama et al., "Nikon Projection Lens Update," Optical Microlithography XVII, Proceeding of SPIE, vol. 5377, pp. 730-741.

Warren Smith, "Modern Optical Engineering," $3^{rd}$ edition, Chapter 13, pp. 439-502 (2000).

BPAI Interference No. 105,678, *Omura* v. *Shafer*, Notice to Declare Interference, filed Jan. 30, 2009.

BPAI Interference No. 105,678, *Omura* v. *Shafer*, Standing Order, filed Jan. 30, 2009.

BPAI Interference No. 105,678, *Omura* v. *Shafer*, Omura Designation of Lead and Backup Counsel, filed Feb. 13, 2009.

BPAI Interference No. 105,678, *Omura* v. *Shafer*, Omura Notice of Real Party in Interest, filed Feb. 13, 2009.

BPAI Interference No. 105,678, *Omura* v. *Shafer*, Omura Notice of Related Proceedings, filed Feb. 13, 2009.

BPAI Interference No. 105,678, *Omura* v. *Shafer*, Omura Clean Claims, filed Feb. 13, 2009.

BPAI Interference No. 105,678, *Omura* v. *Shafer*, Omura Request for Copies, filed Feb. 13, 2009.

BPAI Interference No. 105,678, *Omura* v. *Shafer*, Shafer Designation of Lead Attorney, filed Feb. 13, 2009.

BPAI Interference No. 105,678, *Omura* v. *Shafer*, Shafer Notice of Real Party in Interest, filed Feb. 13, 2009.

BPAI Interference No. 105,678, *Omura* v. *.Shafer*, Shafer Notice of Related Proceedings, filed Feb. 13, 2009.

BPAI Interference No. 105,678, *Omura* v. *Shafer*, Shafer Clean Claims, filed Feb. 13, 2009.

BPAI Interference No. 105,678, *Omura* v. *Shafer*, Schafer File Request, filed Feb. 13, 2009.

BPAI Interference No. 105,678, *Omura* v. *Shafer*, Order BD.R. 109(B) Authorizing Office Records, filed Feb. 23, 2009.

BPAI Interference No. 105,678, *Omura* v. *Shafer*, Omura Annotated Claims, filed Feb. 27, 2009.

BPAI Interference No. 105,678, *Omura* v. *Shafer*, Shafer Annotated Claims, filed Feb. 27, 2009.

BPAI Interference No. 105,678, *Omura* v. *Shafer*, Shafer Designation of New Lead Counsel, filed Mar. 6, 2009.

BPAI Interference No. 105,678, *Omura* v. *Shafer*, Omura Notice of Non-Receipt of File Copies, filed Mar. 17, 2009.

BPAI Interference No. 105,678, *Omura* v. *Shafer*, Shafer Notice of Missing Copies, filed Mar. 17, 2009.

BPAI Interference No. 105,678, *Omura* v. *Shafer*, Shafer Supplemental Notice of Related Proceeding, filed Mar. 23, 2009.

BPAI Interference No. 105,678, *Omura* v. *Shafer*, Shafer Motion List, filed Mar. 25, 2009.

BPAI Interference No. 105,678, *Omura* v. *Shafer*, Omura Motion List, filed Mar. 25, 2009.

BPAI Interference No. 105,678, *Omura* v. *Shafer*, Shafer Notice of Updated Lead Counsel Contact Information, filed Mar. 30, 2009.

BPAI Interference No. 105,678, *Omura* v. *Shafer*, Order Motion Times BD.R.104(C), filed Mar. 31, 2009.

BPAI Interference No. 105,678, *Omura* v. *Shafer*, Omura Designation of New Lead and Backup Attorneys, filed Apr. 1, 2009.

BPAI Interference No. 105,678, *Omura* v. *Shafer*, Joint Stipulation to Extend Time Periods 1-4, filed May 5, 2009.

BPAI Interference No. 105,678, *Omura* v. *Shafer*, Shafer Submission of Appointment of Additional Attorney, filed May 18, 2009.

BPAI Interference No. 105,678, *Omura* v. *Shafer*, Shafer Designation of Additional Backup Lead Counsel, filed May 18, 2009.

BPAI Interference No. 105,678, *Omura* v. *Shafer*, Shafer Substantive Motion 1, filed Jun. 2, 2009.

BPAI Interference No. 105,678, *Omura* v. *Shafer*, Shafer Substantive Motion 2, filed Jun. 2, 2009.

BPAI Interference No. 105,678, *Omura* v. *Shafer*, Shafer Substantive Motion 3, filed Jun. 2, 2009.

BPAI Interference No. 105,678, *Omura* v. *Shafer*, Shafer Notice of Filing Priority Statement, filed Jun. 2, 2009.

BPAI Interference No. 105,678, *Omura* v. *Shafer*, Shafer Exhibit List (as of Jun. 2, 2009), filed Jun. 2, 2009.

BPAI Interference No. 105,678, *Omura* v. *Shafer*, Omura Notice of Filing Priority Statement, filed Jun. 2, 2009.

BPAI Interference No. 105,678, *Omura* v. *Shafer*, Omura Motion 1, filed Jun. 2, 2009.

BPAI Interference No. 105,678, *Omura* v. *Shafer*, Omura Exhibit List, filed Jun. 2, 2009.

BPAI Interference No. 105,678, *Omura* v. *Shafer*, Shafer Notice of Serving Priority Statement, filed Jun. 9, 2009.

BPAI Interference No. 105,678, *Omura* v. *Shafer*, Omura Notice of Serving Priority Statement, filed Jun. 9, 2009.

BPAI Interference No. 105,678, *Omura* v. *Shafer*, Order Miscellaneous BD.R. 104(c), filed Jun. 17, 2009.

BPAI Interference No. 105,678, *Omura* v. *Shafer*, Omura Notice Regarding Responsive Motions, filed Jun. 23, 2009.

BPAI Interference No. 105,678, *Omura* v. *Shafer*, Shafer Submission of Appointment of Additional Attorney, filed Jul. 15, 2009.

BPAI Interference No. 105,678, *Omura* v. *Shafer*, Shafer Designation of Additional Backup Lead Counsel, filed Jul. 15, 2009.

BPAI Interference No. 105,678, *Omura* v. *Shafer*, Joint Stipulation to Extend Time Periods 3 and 4, filed Jul. 31, 2009.

BPAI Interference No. 105,678, *Omura* v. *Shafer*, Second Joint Stipulation to Extend Time Periods 3 and 4, filed Aug. 10, 2009.

BPAI Interference No. 105,678, *Omura* v. *Shafer*, Third Joint Stipulation to Extend Time Periods 3 and 4, filed Aug. 21, 2009.

BPAI Interference No. 105,678, *Omura* v. *Shafer*, Omura Response to Shafer Motion 1, filed Aug. 26, 2009.

BPAI Interference No. 105,678, *Omura* v. *Shafer*, Decision on Motions, filed Aug. 31, 2009.

BPAI Interference No. 105,678, *Omura* v. *Shafer*, Judgment Request for Adverse, filed Aug. 31, 2009.

Deposition of Mitchell C. Ruda, Ph.D., Jul. 23, 2009.

Deposition of Richard C. Juergens, Jul. 17, 2009.

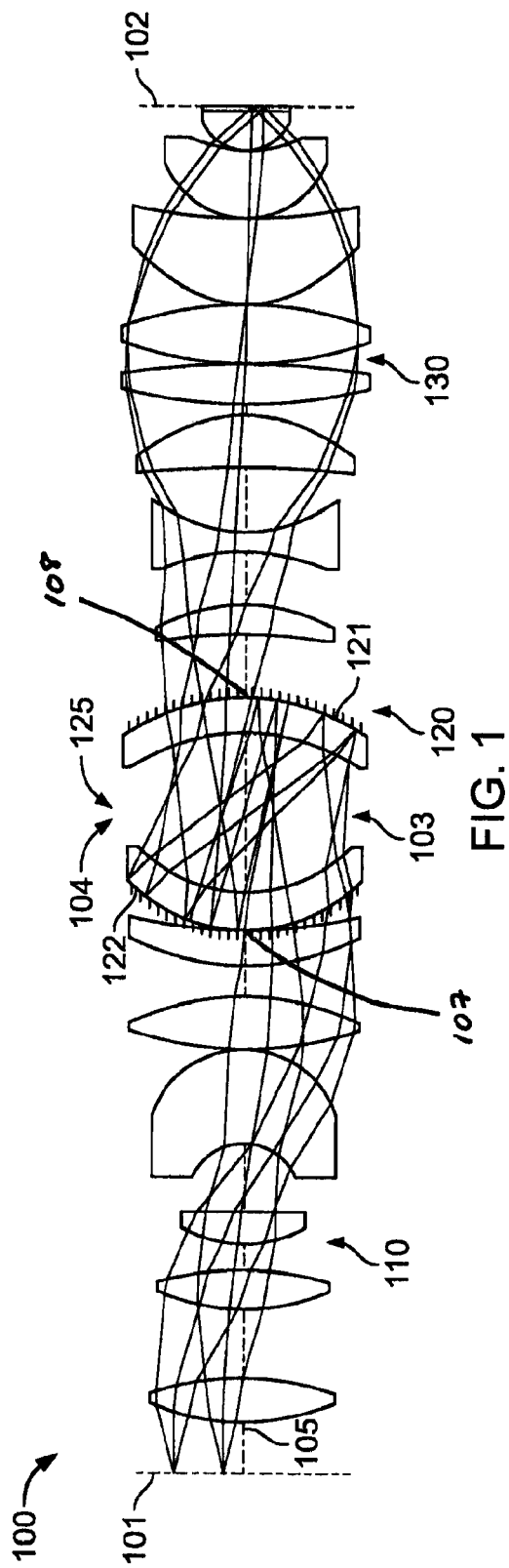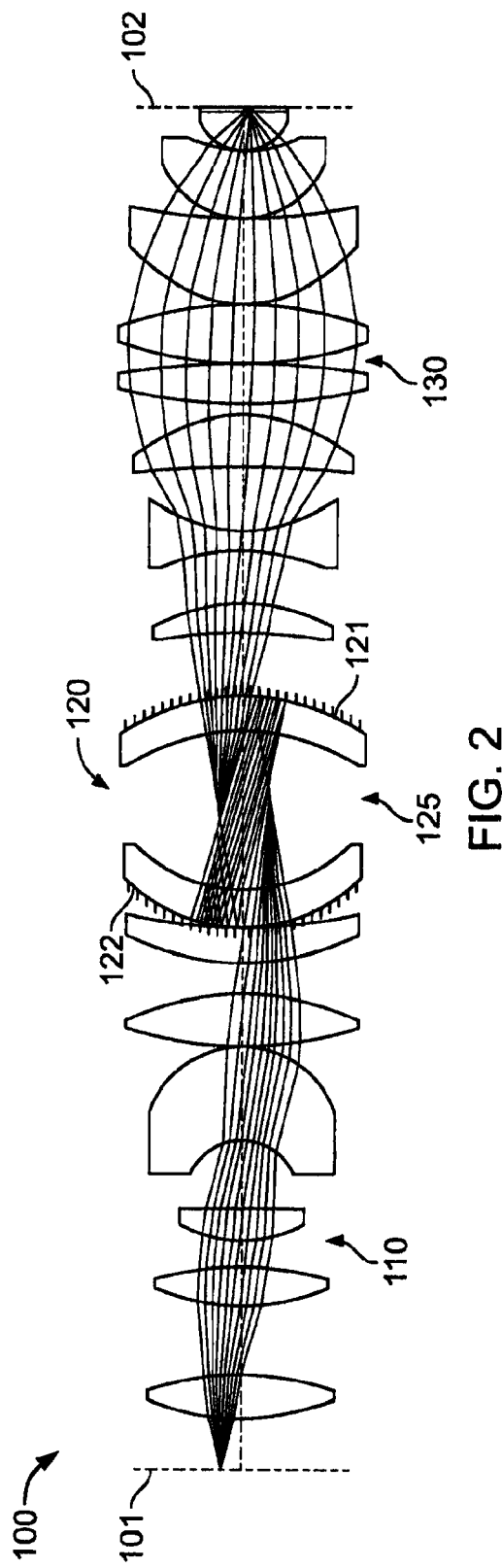

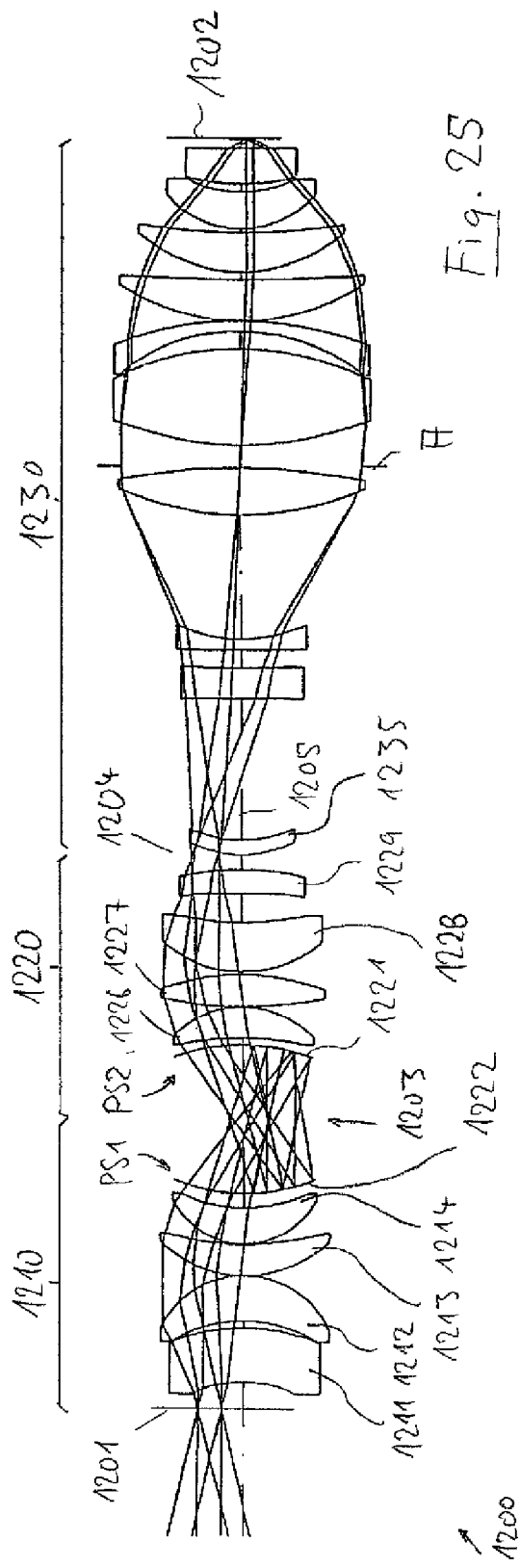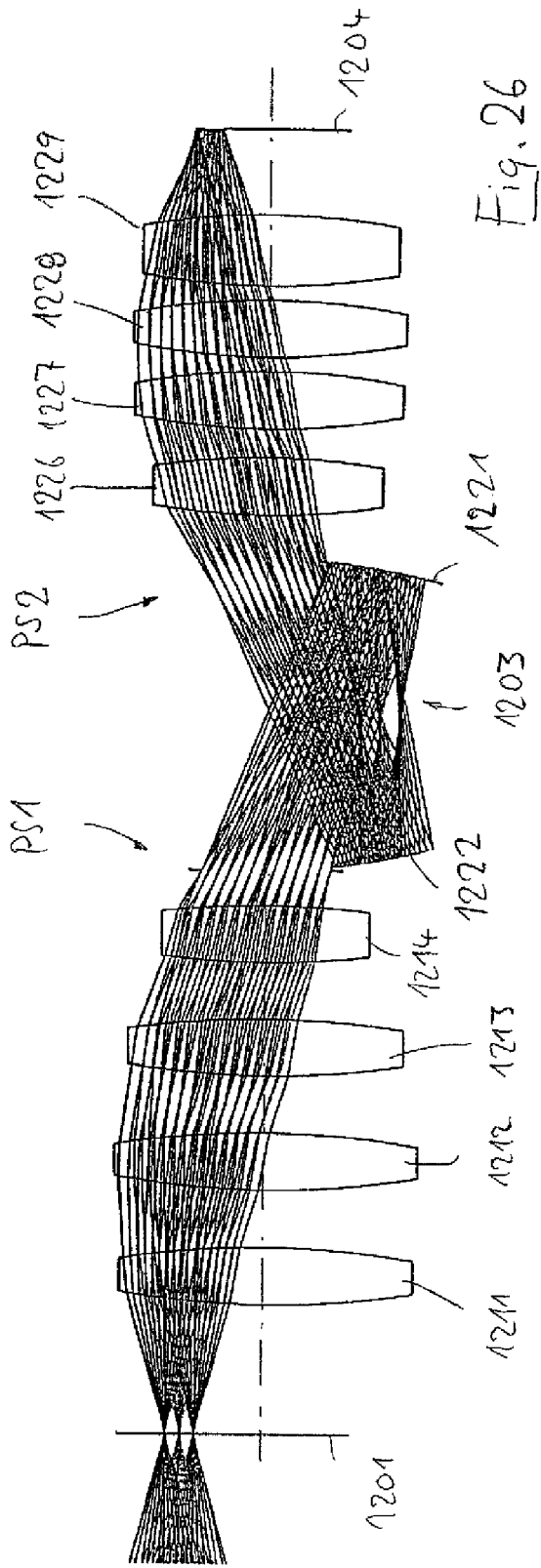

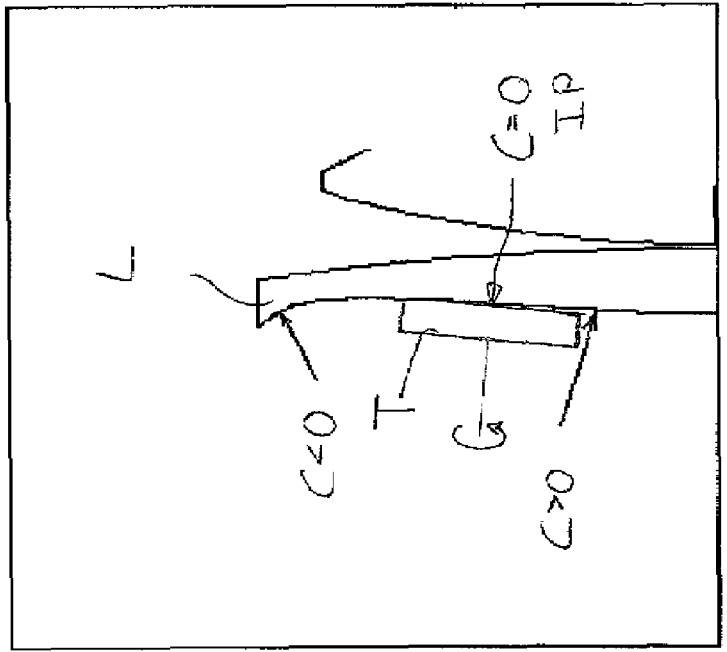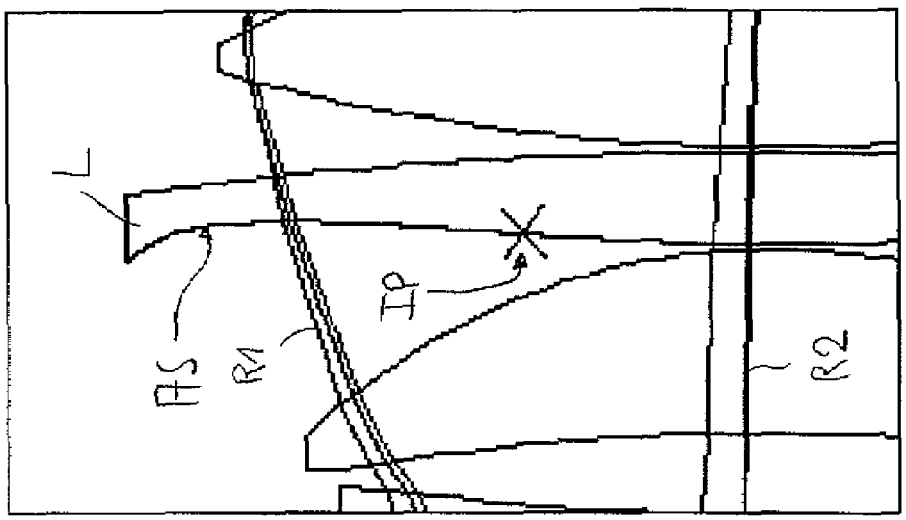
Fig. 33

CATADIOPTRIC PROJECTION OBJECTIVE

CROSS-REFERENCE TO RELATED APPLICATIONS

The present application is a continuation of U.S. patent application Ser. No. 12/046,040, Mar. 11, 2008, which is a continuation of U.S. patent application Ser. No. 11/035,103, filed Jan. 14, 2005, which claims priority benefit to U.S. Provisional 60/536,248 filed Jan. 14, 2004; U.S. Provisional 60/587,504 filed Jul. 14, 2004; U.S. Provisional 60/612,823 filed Sep. 24, 2004; and U.S. Provisional 60/617,674 filed Oct. 13, 2004. The disclosures of all of these Provisional applications and of U.S. patent application Ser. No. 12/046,040 are incorporated into this application by reference.

BACKGROUND OF THE INVENTION

1. Field of the Invention

The invention relates to a catadioptric projection objective for imaging a pattern arranged in an object plane onto an image plane.

2. Description of the Related Art

Projection objectives of that type are employed on projection exposure systems, in particular wafer scanners or wafer steppers, used for fabricating semiconductor devices and other types of microdevices and serve to project patterns on photomasks or reticles, hereinafter referred to generically as "masks" or "reticles," onto an object having a photosensitive coating with ultrahigh resolution on a reduced scale.

In order create even finer structures, it is sought to both increase the image-end numerical aperture (NA) of the projection objective to be involved and employ shorter wavelengths, preferably ultraviolet light with wavelengths less than about 260 nm.

However, there are very few materials, in particular, synthetic quartz glass and crystalline fluorides, that are sufficiently transparent in that wavelength region available for fabricating the optical elements required. Since the Abbé numbers of those materials that are available lie rather close to one another, it is difficult to provide purely refractive systems that are sufficiently well color-corrected (corrected for chromatic aberrations).

In view of the aforementioned problems, catadioptric systems that combine refracting and reflecting elements, i.e., in particular, lenses and mirrors, are primarily employed for configuring high-resolution projection objectives of the aforementioned type.

The high prices of the materials involved and limited availability of crystalline calcium fluoride in sizes large enough for fabricating large lenses represent problems, particularly in the field of microlithography at 157 nm for very large numerical apertures, NA, of, for example, NA=0.80 and larger. Measures that will allow reducing the number and sizes of lenses employed and simultaneously contribute to maintaining, or even improving, imaging fidelity are thus desired.

Catadioptric projection objectives having at least two concave mirrors have been proposed to provide systems with good color correction and moderate lens mass requirements. The U.S. Pat. No. 6,600,608 B1 discloses a catadioptric projection objective having a first, purely refractive objective part for imaging a pattern arranged in the object plane of the projection objective into a first intermediate image, a second objective part for imaging the first intermediate image into a second intermediate image and a third objective part for imaging the second intermediate image directly, that is without a further intermediate image, onto the image plane. The second objective part is a catadioptric objective part having a first concave mirror with a central bore and a second concave mirror with a central bore, the concave mirrors having the mirror faces facing each other and defining an intermirror space or catadioptric cavity in between. The first intermediate image is formed within the central bore of the concave mirror next to the object plane, whereas the second intermediate image is formed within the central bore of the concave mirror next to the object plane. The objective has axial symmetry and provides good color correction axially and laterally. However, since the reflecting surfaces of the concave mirrors are interrupted at the bores, the pupil of the system is obscured.

The Patent EP 1 069 448 B1 discloses another catadioptric projection objective having two concave mirrors facing each other. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors are disclosed in Japanese patent application JP 2002208551 A and US patent application US 2002/00241 A1.

European patent application EP 1 336 887 (corresponding to US 2004/0130806 A1) discloses catadioptric projection objectives having one common straight optical axis and, in that sequence, a first catadioptric objective part for creating a first intermediate image, a second catadioptric objective part for creating a second intermediate image from the first intermediate image, and a refractive third objective part forming the image from the second intermediate image. Each catadioptric system has two concave mirrors facing each other. The intermediate images lie outside the intermirror spaces defined by the concave mirrors. Concave mirrors are positioned optically near to pupil surfaces closer to pupil surfaces than to the intermediate images of the projection objectives.

In the article "Nikon Projection Lens Update" by T. Matsuyama, T. Ishiyama and Y. Ohmura, presented by B. W. Smith in: Optical Microlithography XVII, Proc. of SPIE 5377.65 (2004) a design example of a catadioptric projection lens is shown, which is a combination of a conventional dioptric DUV system and a 6-mirror EUV catoptric system inserted between lens groups of the DUV system. A first intermediate image is formed behind the third mirror of the catoptric (purely reflective) group upstream of a convex mirror. The second intermediate image is formed by a purely reflective (catoptric) second objective part. The third objective part is purely refractive featuring negative refractive power at a waist of minimum beam diameter within the third objective part for Petzval sum correction.

Japanese patent application JP 2003114387 A and international patent application WO 01/55767 A disclose catadioptric projection objectives having one common straight optical axis, a first catadioptric objective part for forming an intermediate image and a second catadioptric objective part for imaging the intermediate image onto the image plane of this system. Concave and convex mirrors are used in combination.

U.S. provisional application with Ser. No. 60/511,673 filed on Oct. 17, 2003 by the applicant discloses catadioptric projection objectives having very high NA and suitable for immersion lithography at NA>1. In preferred embodiments, exactly three intermediate images are created. A cross-shaped embodiment has a first, refractive objective part creating a first intermediate image from the object, a second, catadioptric objective part for creating a second intermediate image from the first object, a third, catadioptric objective part for creating a third intermediate image from the second intermediate image and a fourth, refractive objective part for imaging the third intermediate image onto the image plane. The catadioptric objective parts each have one concave mirror, and planar folding mirrors are associated therewith. The concave mirrors are facing each other with the concave mirror surfaces. The folding mirrors are arranged in the middle or the intermirror space defined by the concave mirrors. The concave mirrors may be coaxial and the optical axes of the catadioptric parts may be perpendicular or at an angle with respect to the optical axis defined in the refractive imaging systems.

The full disclosure of the documents mentioned above is incorporated into this application by reference.

The article "Camera view finder using tilted concave mirror erecting elements" by D. DeJager, SPIE. Vol. 237 (1980) p. 292-298 discloses camera view finders comprising two concave mirrors as elements of a 1:1 telescopic erecting relay system. The system is designed to image an object at infinity into a real image, which is erect and can be viewed through an eyepiece. Separate optical axes of refractive system parts upstream and downstream of the catoptric relay system are parallel offset to each other. In order to build a system having concave mirrors facing each other mirrors must be tilted. The authors conclude that physically realizable systems of this type have poor image quality.

International patent applications WO 92/05462 and WO 94/06047 and the article "Innovative Wide-Field Binocular Design" in OSA/SPIE Proceedings (1994) pages 389ff disclose catadioptric optical systems especially for binoculars and other viewing instruments designed as in-line system having a single, unfolded optical axis. Some embodiments have a first concave mirror having an object side mirror surface arranged on one side of the optical axis and a second concave mirror having a mirror surface facing the first mirror and arranged on the opposite side of the optical axis such that the surface curvatures of the concave mirrors define and intermirror space. A front refractive group forms a first intermediate image near the first mirror and a second intermediate image is formed outside of the space formed by the two facing mirrors. A narrow field being larger in a horizontal direction than in a vertical direction is arranged offset to the optical axis. The object side refractive group has a collimated input and the image side refractive group has a collimated output and entrance and exit pupils far from telecentric are formed. The pupil shape is semi-circular unlike pupil surfaces in lithographic projection lenses, which have to be circular and centered on the optical axis. The PCT application WO 01/044682 A1 discloses catadioptric UV imaging systems for wafer inspection having one concave mirror designed as Mangin mirror.

SUMMARY OF THE INVENTION

It is one object of the invention to provide a catadioptric projection objective suitable for use in the vacuum ultraviolet (VUV) range having potential for very high image side numerical aperture which may be extended to values allowing immersion lithography at numerical apertures NA>1. It is another object of the invention to provide catadioptric projection objectives that can be build with relatively small amounts of optical material.

As a solution to these and other objects the invention, according to one formulation, provides a catadioptric projection objective for imaging a pattern provided in an object plane of the projection objective onto an image plane of the projection objective comprising:

a first objective part for imaging the pattern provided in the object plane into a first intermediate image;

a second objective part for imaging the first intermediate image into a second intermediate image;

a third objective part for imaging the second intermediate image onto the image plane;

wherein a first concave mirror having a first continuous mirror surface and at least one second concave mirror having a second continuous mirror surface are arranged upstream of the second intermediate image;

pupil surfaces are formed between the object plane and the first intermediate image, between the first and the second intermediate image and between the second intermediate image and the image plane; and all concave mirrors are arranged optically remote from a pupil surface.

In designs according to this aspect of the invention a circular pupil centered around the optical axis can be provided in a centered optical system. Two or more concave mirrors in the system parts contributing to forming the second intermediate image are provided, where the used area of the concave mirrors deviates significantly from an axial symmetric illumination. In preferred embodiments exactly two concave mirrors are provided and are sufficient for obtaining excellent imaging quality and very high numerical aperture. Systems having one common unfolded (straight) optical axis can be provided which facilitate manufacturing, adjustment and integration into photolithographic exposure systems. No planar folding mirrors are necessary. However, one or more planar folding mirrors can be utilized to obtain more compact designs.

All concave mirrors are arranged "optically remote" from pupil surfaces which means that they are arranged outside an optical vicinity of a pupil surface. They may be arranged optically nearer to field surfaces than to pupil surfaces. Preferred positions optically remote from a pupil surface (i.e. outside an optical vicinity of a pupil surface) may be characterized by the ray height ratio $H=h_C/h_M>1$, where $h_C$ is the height of a chief ray and $h_M$ is the height of a marginal ray of the imaging process. The marginal ray height $h_M$ is the height of a marginal ray running from an inner field point (closest to the optical axis) to the edge of an aperture stop, whereas the chief ray height $h_C$ is the height of a chief ray running from an outermost field point (farthest away from the optical axis) parallel to or at small angle with respect to the optical axis and intersecting the optical axis at a pupil surface position where an aperture stop may be positioned. With other words: all concave mirrors are in positions where the chief ray height exceeds the marginal ray height.

A position "optically remote" from a pupil surface is a position where the cross sectional shape of the light beam deviates significantly from the circular shape found in a pupil surface or in an immediate vicinity thereto. The term "light beam" as used here describes the bundle of all rays running from the object plane to the image plane. Mirror positions optically remote from a pupil surface may be defined as positions where the beam diameters of the light beam in mutually perpendicular directions orthogonal to the propagation direction of the light beam deviate by more than 50% or 100% from each other. In other words, illuminated areas on the concave mirrors may have a shape having a form strongly deviating from a circle and similar to a high aspect ratio rectangle corresponding to a preferred field shape in lithographic projection objectives for wafer scanners. Therefore, small concave mirrors having a compact rectangular or near rectangular shape significantly smaller in one direction than in the other may be used. A high aperture light beam can therefore be guided through the system without vignetting at mirror edges.

Wherever the terms "upstream" or "downstream" are used in this specification these terms refer to relative positions along the optical path of a light beam running from the object plane to the image plane of the projection objective. Therefore, a position upstream of the second intermediate image is a position optically between the object plane and the second intermediate image.

According to another aspect of the invention there is provided a catadioptric projection objective for imaging a pattern provided in an objective plane of the projection objective onto an image plane of the projection objective comprising:
a first objective part for imaging the pattern provided in the object plane into a first intermediate image;
a second objective part for imaging the first intermediate image into a second intermediate image;
a third objective part for imaging the second intermediate image onto the image plane;
wherein the second objective part includes a first concave mirror having a first continuous mirror surface and a second concave mirror having a second continuous mirror surface, the concave mirror surfaces of the concave mirrors facing each other and defining an intermirror space;
wherein at least the first intermediate image is located geometrically within the intermirror space between the first concave mirror and the second concave mirror.

In this specification the term "intermediate image" generally refers to a "paraxial intermediate image" formed by a perfect optical system and located in a plane optically conjugated to the object plane. Therefore, wherever reference is made to a location or position of an intermediate image, the axial location of this plane optically conjugated to the object plane is meant.

The above aspect of invention may be understood more clearly based on the following general considerations.

As Jan Hoogland has pointed out in some publications, the most difficult requirement that you can ask of any optical design is that it have a flat image, especially if it is an all-refractive design. Providing a flat image requires opposing lens powers and that leads to stronger lenses, more system length, larger system glass mass, and larger higher-order image aberrations that result from the stronger lens curves.

By contrast to this, allowing a system to have a curved image automatically leads to low lens powers, weaker curves, a more compact design with much less glass mass, and much smaller higher-order image aberrations.

Shafer has shown a lens design with a curved image that only uses positive lenses (and no aspherics) and has very good performance. A group of 4 or 5 weak positive lenses in front can provide correction of spherical aberration and coma, and a thick positive immersion lens can provide astigmatism correction. The image is quite curved.

However, a flat image is essential for lithography. Therefore the question then becomes how to provide this with the least disturbance of the good properties that result when a curved image is allowed.

Some classical lens types like the Cooke Triplet and the Double-Gauss designs achieve a flat image by putting strong negative power in the middle of the design. But that completely destroys all the benefits that were just listed of having a curved image, and the lens powers have to be strong and the curves lead to bad higher-order aberrations.

A much better solution is provided by the classical field-flattened Petzval lens design, where a strong negative lens is placed just in front of the image, the closer the better. This negative lens, at the very end of the design, then provides all the image flattening means of the design and the rest of the design has weak curves, low lens powers, small glass volume, etc. In addition, the aberration correction performance is extremely high. That is why this design form was used for the extremely high resolution aerial reconnaissance lenses of the 1960's.

However, this great design cannot be used in lithography since putting a strong negative lens right before the image leads to an exit pupil location that is very far from telecentric. And a telecentric exit pupil is always required in lithography.

Possibly the only way a field-flattened Petzval lens can be given a telecentric exit pupil is to move the aperture stop very far out in front of the design, far away from where it wants to be for good higher-order aberration correction. By contrast some other design types, like the Double-Gauss, can be modified to have a telecentric exit pupil without too much change in the aperture stop position, compared to its preferred location. So because of this telecentric exit pupil requirement in lithography, one is forced to abandon the best design form and move to less desirable ones.

The invention considers these aspects and provides a good compromise solution.

One can keep all the many benefits of a curved image design if one can find some way to flatten the image, have a telecentric exit pupil, and yet keep the aperture stop close to where it most wants to be for good aberration correction.

What would be perfect is if a positive power lens could be given the opposite Petzval curvature to what it actually has. Such a "magic lens", if it could exist, could then be placed right near the curved image of a curved image design. It would then flatten the image and would even help give a telecentric exit pupil while leaving the design's aperture stop where it wants to be.

A concave mirror is ideal for the problem. A concave mirror has positive power, like a positive lens, but the opposite sign of Petzval curvature. So a concave mirror placed right in front of the image could flatten the image of a curved image lens design, have positive power to help in providing a telecentric pupil, and have no color problems.

Unfortunately it also makes the resulting image be completely inaccessible, since it sends the light right back in the direction it came from. One solution might be to use the lens system far off-axis, and then it might be possible to have one or two reflections right near the image and have the final image "walk-off" the mirrors and lie clear outside of the incoming rays. But even a moment of study will show that this is impractical on the high-NA end of the design, or would lead to the main lens system (i.e. the image side focussing lens system) being used so far off-axis that it would have very poor performance.

The situation is much better on the other end of a lithographic design, with about 4× magnification, for example. Then the main refractive design does not have to be used off-axis as much before the low-NA image can be made to "walk-off" a mirror pair. By using two concave mirrors instead of one, the light keeps going in the same direction and the image is accessible. The best performance results occur when the main lens system is used with the least amount of off-axis use. But having the rays get through the concave mirror pair with no vignetting is helped by using the main lens system far off-axis. These are then incompatible goals.

In order to minimize vignetting problems and to make them insensitive on the system overall numerical aperture it is favorable to have intermediate images with low NA next to all positions where two ray bundles before and after a reflection lie geometrically separated, but next to each other. The clearance is then mainly determined by the field size and scales only very poorly with numerical aperture. This is important to reach real high NA catadioptric designs.

The best solution is to not have the two mirrors be between the main lens system and its low-N.A object end. That then avoids a large amount of off-axis use of the main lens in order to have no vignetting at the mirrors. The mirrors should be physically (not necessarily optically) on either side of the low-NA object. Then the main lens system can be used much closer to the optical axis. A less preferable solution is to have both mirrors be outside of the main system and its low NA end object. In either case, of the last two mentioned, there is a need to reimage the low NA object, since it is no longer the end of the complete system.

While reimaging the object to a first real intermediate image, the system magnification of this first relay system may be designed such that it is an enlarging system. This reduces more and more the NA at the intermediate image and thus relaxes the vignetting problem. The vignetting depends less and less on the system NA.

In a preferred design, there are two concave mirrors on either side (again, physically, not optically) of the low-NA object plane of the main lens system and the system is used as close to the axis as possible without mirror vignetting. Then either another refractive system or a catadioptric system, working e.g. at about 1× or 1.5× enlargement, is used to relay this buried object to another real image location.

Another solution, with both mirrors physically and optically outside of the low-NA object, gives the possibility of just these same two mirrors doing the re-imaging. But the requirement of a fairly large working distance and thick mirror substrates makes this not practical without vignetting problems that require using the main system far off-axis. So this other solution also benefits from using a separate 1× or 1.5× enlarging refractive or catadioptric relay system.

In all of these cases, a pair of concave mirrors is used to flatten the image of one or two refractive systems. No convex mirrors are used. The refractive systems can then have the benefits described of being curved image designs.

Designs according to preferred embodiments of the invention with just two reflecting surfaces, both concave, have several advantages compared with the prior art.

In contrast to prior art systems with central pupil obscuration designs according to some embodiments of the invention have small mirror sizes, no obscuration at all, no double or triple-pass lenses, and very effective field flattening of the system due to the strong mirror powers. In other embodiments, double- or triple-pass lenses may be present.

Embodiments according to the invention, which preferably have two refractive relay groups, may have about 3× or 4× reduction magnification from the refractive group near the wafer, i.e. from the third objective part, (so only high N.A on one end) and the other refractive group (the first objective part) is low NA on both ends. As a result there is much less lens power needed and relatively few elements are needed to get the desired aberration correction.

Some prior art systems have been found to be limited NA systems. By contrast, preferred design according to the invention have no such difficulties and can handle very high NA values close to NA=1 or above, for immersion systems. Preferably, the two intermediate images both have low NA values and there is no problem with the mirrors interfering with each other's space at their rims.

It is to be noted that it is difficult to correct some useful designs according to the present invention for axial colour. However the lenses in preferred embodiments are small enough, and their powers weak enough, so that the axial color of the new design is at an acceptable value.

Other prior art high NA catadioptric systems for lithography, either require at least one convex mirror in the design, or have multiple mirrors and tend to give very long track length designs. The use of a convex mirror, in combination with a concave mirror and some lenses, can be the basis of a catadioptric design and can make it possible to have an unobscured design that does not have to be used too far off-axis to avoid vignetting. This is a characteristic of some prior patent designs which are in-line systems with no flat fold mirrors. The catadioptric part is on the reticle end of the system. There are at least two problems with such designs. One is that the first intermediate image after the reticle has to be clear of the concave mirror, and the light rays leaving the convex mirror tend to have relatively steep angles with respect to the optical axis in order to clear the edge of the concave mirror without vignetting. Some field lenses or field mirrors are then required to catch these rays and bend them back towards the optical axis and the main focusing lens group. These field lens or mirrors have to be quite large and strong in power to catch the rays and reimage the pupil towards the main focusing lens group. If they are field lenses, then they are large in diameter, have strong positive power, and result in an excess of glass volume in the design. In addition they have a lot of positive power and make further difficulties in correcting the Petzval curvature of the system. If, instead, field mirrors are used then they have to be quite large in diameter and it is difficult to configure them to avoid vignetting of the rays. They do, however, help with Petzval correction since they have the opposite sign from field lenses. The second problem with these kinds of system is that the convex mirror in the system has the wrong sign of Petzval curvature to help with image flattening. This then tends to lead to 4 or 6 mirror systems in order to find a way with several mirrors to provide the system with enough good Petzval correction from mostly concave mirrors so that this burden does not fall entirely on the main focusing lens group.

Preferred embodiments of the invention, by contrast, do not have any convex mirror and have some characteristics that allow it to work quite close to the optical axis without obscuration or vignetting. This then means that the intermediate image size is not so large and the field lenses in the design do not have to be too large. Since there is no convex mirror, but just two concave mirrors, the new design is quite simple compared to the multi-mirror systems of the prior art. Its two concave mirrors may provide just the right amount of Petzval correction for the lenses in the system, which may be almost all positive, and the resulting design has a relatively short track length, small size elements, small glass volume, very good aberration correction, and the capability of working with very high immersion NA values.

There are other particularly useful features specific to the new design according to the invention. As the NA value of the design is increased, it makes almost no difference to the sizes of the mirrors, or how close the design can work to the optical axis. All other in-line designs from the prior art have to keep working further and further off-axis, as the NA is increased, in order to avoid vignetting and obscuration. That leads to worse high-order aberrations, a drop in performance, and larger element sizes in the catadioptric part. The new design is quite unusual in not having that problem.

An alternative to embodiments having one common straight optical axis is provided by catadioptric designs which have at least one flat fold mirror. Then part of the optical path is folded, e.g. at 90 degrees to the optical axis, and then brought back and refolded back again so that the reticle and wafer are parallel. The input and output axis (i.e. object and image side part of the optical axis) may be co-axial, in some embodiments, or have a lateral off-set in some other embodiments.

Such designs can have just one powered mirror in the system, which is a concave mirror, and two flat fold mirrors. Some, designs, like the design disclosed in U.S. provisional application with Ser. No. 60/511,673 filed on Oct. 17, 2003 by the applicant, have two concave mirrors and two flat fold mirrors. These folded designs can have many of the good properties of the new design according to the invention that is being discussed here. However, there may occur polarization problems with these fold mirrors and that makes the preferred embodiments, with no fold mirrors, very attractive.

In some embodiments there is at least one lens having a free entry surface and a free exit surface arranged within the intermirror space, wherein the lens is transited at least twice in the optical path between an intermediate image and a concave mirror or vice versa. Such mirror-related lens may have negative refractive power and may be designed as a meniscus lens having a sense of curvature similar to the concave mirror to which it is assigned. Color correction can be positively influenced this way. The lens may be designed as a truncated lens being arranged exclusively on the side of the optical axis where the associated concave mirror is situated. If a mirror-related lens is extended across the optical axis, the lens may be transited three times by the radiation, thus increasing optical effect without significantly increasing lens mass. One or both concave mirrors may have mirror-related lenses.

In some embodiments the first concave mirror and the second concave mirror are designed to have essentially the same or exactly the same curvature. This allows to manufacture the concave mirrors simultaneously from the same blank material such that firstly a mirror blank for the first and second concave mirror is manufactured and that, afterwards, the mirror blank is separated into two truncated mirrors used as the first and second concave mirror. Manufacturing can be facilitated and more cost effective this way. Likewise, lens material used for two similar truncated mirror-related lenses can be manufactured from one lens blank, which is shaped first and than separated into two truncated lenses. Systems having catadioptric subgroups which are designed identically or almost identically and which can be arranged symmetrically with respect to each other can be provided this way at reasonable costs for manufacturing.

In some embodiments at least one mirror surface of a concave mirror is aspheric. In some embodiments, concave surfaces of both concave mirrors are aspheric. Aspheric concave mirrors facilitate optical correction and allow to reduce lens mass.

In some embodiments it has been found useful to have at least one lens arranged between an intermediate image and the associated concave mirror, wherein at least one surface of the lens is aspheric. The aspheric surface may be the surface facing the intermediate image. Field aberrations can be corrected effectively this way.

In some embodiments both concave mirrors have spherical mirror surfaces, thus facilitating manufacturing and improving optical performance. It has been found useful if the following condition is fulfilled: $1 < D/(|c_1|+|c_2|) \cdot 10^{-4} < 6$. Here, D is a maximum diameter of a lens element of the third objective part in [mm] and $c_1$ and $c_2$ are the curvatures of the concave mirrors in [mm$^{-1}$]. If this condition is fulfilled, then there is an optimum balance between the positive power in the third imaging system and the Petzval correction due to the concave mirrors in the projection objective. This condition applies for both spherical and aspherical concave mirrors.

As the basic shape and, if applicable, the aspheric character of a concave mirror strongly influences optical performance, ways of manufacturing of concave mirrors are desired in order to produce high quality mirrors having defined optical properties. It has been found that relatively "flat" concave mirrors, i.e. concave mirrors having a relatively shallow depth on the concave side, can be manufactured with particularly high optical quality if the relation $p_{max} < 0.22R$ holds where $p_{max} = R - (R^2 - D^2/4)^{0.5}$. In this relation, R is the curvature radius of the aspherical mirror surface and D is the diameter of the aspherical mirror. Preferably, the condition $D \leq 1.3R$ or, more preferably, the condition $D \leq 1.2R$ is fulfilled. Parameter p denotes the "sagitta" or "rising height" of a point on an optical surface. This parameter is sometimes also denoted SAG (for sagitta) in the literature. Sagitta p is a function of the height h, i.e. the radial distance from the optical axis, of the respective point.

Generally it may be preferred from a manufacturing point of view to make the curvatures of the concave mirrors at the vertex of the mirror surface (vertex curvature) as similar as possible. If the vertex curvature radii of the first and second mirrors are denoted R1 and R2, preferably the following condition holds: $0.8 < |R1/R2| < 1.2$.

Some embodiments are designed such that the first intermediate image is located geometrically within the intermirror space whereas the second intermediate image is arranged outside the mirror space. The first and second objective parts can then be catadioptric objective parts, wherein the first concave mirror is part of the first objective part creating the first intermediate image, whereas the second concave mirror contributes to forming the second intermediate image from the first intermediate image by the second objective part.

A mirror group defined by the first and second concave mirrors facing each other can have a mirror group entry and a mirror group exit, each positioned next to the closest concave mirror closed to an edge of a concave mirror faced in the optical axis. Pupil surfaces of the projection objective can be arranged in the vicinity of the mirror group entry and the mirror group exit such that the mirror group performance a pupil imaging between the mirror group entry and the mirror group exit. The first and second concave mirror can then be disposed on one side of the optical axis. In other embodiments where field surfaces are in the vicinity of the mirror group entry and mirror group exit, the first and second concave mirror may be positioned at opposite sides of the optical axis.

According to another aspect of the invention a projection objective is provided having a first and at least one second concave mirror, wherein the first concave mirror has a first aspheric mirror surface and the second concave mirror has a second aspheric mirror surface, and wherein the first and second mirror surfaces have essentially the same aspheric shape. The aspheric shapes may be identical, i.e. may be described by identical aspheric constants and basic spherical radius. This aspect of the invention may be utilized in embodiments where all concave mirrors are arranged optically remote from the pupil surface, particularly where exactly two concave mirrors are used. However, the advantages may also be used in projection objectives where one or more concave mirrors are positioned in a pupil surface or optically near a pupil surface. If the first and second mirror surface have essentially the same or identical aspheric shape, manufacturing can be simplified since the aspheric shapes can be manufactured using essentially the same grinding and polishing steps or other steps for removing material from a spheric basic shape. Further, the testing process utilized during manufacturing of the aspheric surfaces can be organized cost-efficient since the same testing device for characterizing the aspheric shape can be used for testing more than one concave mirror surface. In that sense, the term "essentially the same aspheric shape" is to be understood to encompass aspheric surface shapes, which can be tested by the same optical testing device. If applicable, the surface shapes may be similar in that sense that the same optical testing device can be used, but with different working distance.

In one embodiment, the second objective part has two concave mirrors, each having an aspheric surface, wherein the first and second mirror surfaces have essentially the same aspheric shape. In one embodiment, the second objective part of this type is a catoptric objective part, i.e. consisting of only two concave mirrors having aspheric mirror surfaces which have essentially the same aspheric shape. Catadioptric second objective parts of this type are also possible.

According to another aspect, the invention provides a catadioptric projection objective having at least one concave mirror, where the mirror surface of the concave mirror has a parabolic shape. In an embodiment, two concave mirrors are provided, wherein at least one of the concave mirrors has a parabolic shape. Utilizing a parabolic mirror (i.e. a concave mirror where a meridian of the mirror is parabolic) has proven advantageous particularly with regard to testing the aspheric surface shape of the mirror. A parabolic mirror collects parallel incident light into one single focus, whereby parallel light rays impinging on the parabolic mirror surface are collected free of spherical aberration in one focal point. Parabolic mirrors of this type can easily be tested optically using comparatively simple optical testing devices designed for creating a test beam having a planar wave front. Optical testing devices with simple construction can be used, thereby making the testing of the aspheric mirror cost-effective.

Whereas optical properties are essential for obtaining the desired function of a projection objective, other factors related to the costs involved for manufacturing the optical system and/or factors influencing the overall size and shape of the optical system may be critical. Also, aspects of lens mounting and incorporation of lens manipulators must be considered. One class of embodiments is particularly advantageous in this respect in that projection objectives having a small number of lens elements, particularly in the first objective part, are provided. In one embodiment, the first objective part has positive lenses only. The term "lens" as used here is meant to designate optical elements having substantive refractive power. In that respect, a plate having essentially parallel plate surfaces is not a lens and may, therefore, be inserted in addition to the positive lenses. Using positive lenses only is enabling for providing axially compact first objective parts having relatively small maximum lens diameter. In one embodiment, the first objective part has only six lenses having substantial refractive power. One or more aspheric surfaces may be provided in the first objective part. By using suitable aspheric shapes of aspheric lens surfaces a compact design can be obtained. As a tendency, the first objective part can be designed more compact the more aspheric surfaces are used. In preferred embodiments a ratio between a number of lens element and a number of aspheric surfaces is less than 1.6. In one embodiment, a first lens element of the first objective part immediately following the object plane has an aspheric surface facing the object plane, wherein the aspheric surface is essentially flat having a local radius R of curvature where R>300 mm at each point of the aspheric surface. Object side telecentricity and an effective correction of field aberration, such as distortion, can be obtained this way.

A compact shape of a dioptric system can also be facilitated if all negative lenses (i.e. lenses with substantial negative refractive power) are arranged optically remote from a pupil plane. With other words, negative lenses optically near a pupil plane should be avoided if a design is to be optimized in respect to a compact shape.

Aspheric surfaces provided on optical elements, such as lenses, mirrors and/or essentially planar faces of plates, prisms or the like can be utilized to improve both the correction status and the overall size and material consumption of an optical system. Optimum surface shapes of aspheric surfaces may be derived from theoretical considerations and/or numerical calculations. However, whether or not an optical system can be manufactured depends among other factors on the question whether or not an aspherical surface can actually be manufactured in the desired shape with the necessary optical quality. Feasibility studies of the inventors have shown some essential rules governing the use of aspheric surfaces in optical systems, particularly in high-resolution projection objectives suitable for microlithography.

According to one embodiment, the projection objective has at least one optical element having an aspherical surface with a surface shape free of inflection points in an optically used area of the aspheric surface. In a rotationally symmetric aspheric surface an "inflection point" is characterized as a point along a meridional direction where a sign change occurs in the local curvature of the aspherical surface. With other words, an inflection point is found geometrically between a locally convex surface region and a locally concave surface region of an aspheric surface. When a plurality of optical elements having at least one aspherical surface is provided, it is preferred that all aspheric surfaces have surface shapes which are free of inflection points. As a compromise, it may be useful to design a system such that at least 50% or 60% or 70% or 80% or 90% of the aspheric surfaces are free of inflection points. Avoiding inflection points on an aspheric surface has proven to improve the optical quality of the finished aspheric surface when compared to aspherical surfaces including inflection points. It is contemplated that the material removing effects of surface preparation tools can be made more uniform if inflection points are avoided. On the other hand, if a polishing tool is acting on a surface area including an inflection point, the material removing action of the tool on either side of the inflection point may differ considerably, thus leading to irregularities in the optical quality of the finished surface.

According to another aspect of the invention the projection objective includes a plurality of optical elements having at least one aspheric surface, wherein all aspheric surfaces have a surface shape free of extremal points outside the optical axis, wherein an extremal point is defined by the following equations:

$$\frac{dp}{dh} = 0 \text{ and } \frac{d^2p}{dh^2} \neq 0.$$

In this equation, the parameter "p" represents a distance, measured parallel to the optical axis of an optical element, of a point at height h from the vertex of the surface (positioned on the optical axis) as explained in connection with the equation describing the mathematical description of the aspherical surfaces given above. The parameter p(h) is also denoted as "sagitta" or "rising height" of a point on an optical surface. Based on these considerations, an "extremal point" is a maximum or a minimum of the function p(h), respectively. Studies of the inventors have revealed that extremal points outside the optical axis (where h=0) may be critical during manufacturing of the aspherical surfaces since, in the region of extremal points, the material removing action of tools used for finishing may differ significantly from the action imposed on areas surrounding the extremal point, whereby non-uniform optical surface quality may result.

This condition should be obeyed in an area including the optically utilized area (defined by the optically used radius $h_{opt}$) but going beyond that area up to a maximum height $h_{max} > h_{opt}$, where $h_{max} = h_{opt} + OR$ and where OR is the radial width of an "overrun area" adjacent to the optically utilized area, where a rotary tool will be in contact with the optical surface when the periphery of the optically used area is polished. Typical widths of the overrun area are dependent on the tool dimensions and may be in the order of 5 mm to 15 mm.

Whereas extremal points on aspheric surfaces may be critical from a manufacturing point of view, extremal points may be desirable from an optical point of view to provide a desired change of refractive power of an aspheric surface in radial (meridonal) direction. As a compromise, it has been found advantageous that aspheric surfaces having at least one extremal point should be essentially flat cross the entire usable diameter. With other words, the basic shape of the aspherical surface having at least one extremal point should be a plane or should have only small deviations from a plane. In that respect, projection objectives are preferred with at least one aspheric surface having at least one extremal point, where the following condition holds for these aspheric surfaces:

$$|p(h)| < p_{max},$$

where $p_{max}=0.5$. More preferably, $p_{max}=0.25$.

The preferred conditions for aspheric surfaces given above have been derived from feasibility studies performed on certain embodiments of this invention. However, the conditions may also be utilized on other types of optical systems having optical elements with aspheric surfaces. Therefore, these aspects of the invention are useful independent of other features of preferable embodiments of the invention.

According to another aspect of the invention the first objective part includes a concave mirror and at least one additional mirror having a curved mirror surface, where curved mirror surfaces of the concave mirror and the additional mirror are facing each other. In this embodiment two mirrors having curved mirror surfaces contribute to the formation of the first intermediate image. Preferably, first objective parts of this type are catadioptric, i.e. at least one lens is provided in addition to the concave mirror and the additional mirror. The concave mirror and the additional mirror preferably share a common straight optical axis coinciding with the optical axes of the second and third objective part such that all objective parts share a common straight optical axis. Preferably first objective parts of this type are designed as enlarging imaging system. In some embodiments the additional mirror is a convex mirror having a convex mirror surface compensating as at least partially the effect of the concave mirror of that objective part. Preferably, first objective parts of this type are combined with a second objective part including a first and a second concave mirror, the concave mirror surfaces of which are facing each other and define an intermirror space. Whereas typically the first intermediate image may be positioned outside that intermirror space in these embodiments, the second intermediate image may be positioned inside the intermirror space. Embodiments having at least three concave mirrors, preferably exactly three concave mirrors, distributed in two objective parts (first objective part and second objective part) may be designed such that all concave mirrors are arranged optically remote from a pupil surface. However, if desired, it is also possible that at least one concave mirror, particularly the concave mirror positioned in the first objective part, is positioned optically near a pupil surface.

In embodiments of this type the correction capabilities provided by concave mirrors can be advantageously distributed between two objective parts separated by an intermediate image, whereby a good balance and compensation between the correcting actions can be obtained. It is also possible to design the first and second objective part such that certain correction effects supported by concave mirrors are present twice in the optical path. The correcting means may, however, be arranged in optical positions where they have different optical effects since the heights of principal ray (chief ray) and marginal ray may be different for different concave mirrors in different objective parts. All advantages provided by in-line-arrangement of the optical elements (one common straight optical axis) can be preserved.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 1 is a longitudinally sectioned view of a first embodiment of a projection objective according to the invention;

FIG. 2 is a representation of an inner off-axis beam passing through the system of FIG. 1.

FIG. 25 shows a lens section of another embodiment of a projection objective according to the invention having only one intermediate image in the intermirror space and pupil planes close to the entrance and exit of the mirror group;

FIG. 26 shows an enlarged view of a section of the embodiment shown in FIG. 25 between the object plane and the first intermediate image;

FIGS. 33A and 33B show schematic diagrams of conventional aspheric surfaces having an inflection point;

DETAILED DESCRIPTION OF THE PREFERRED EMBODIMENTS

Figure 3:
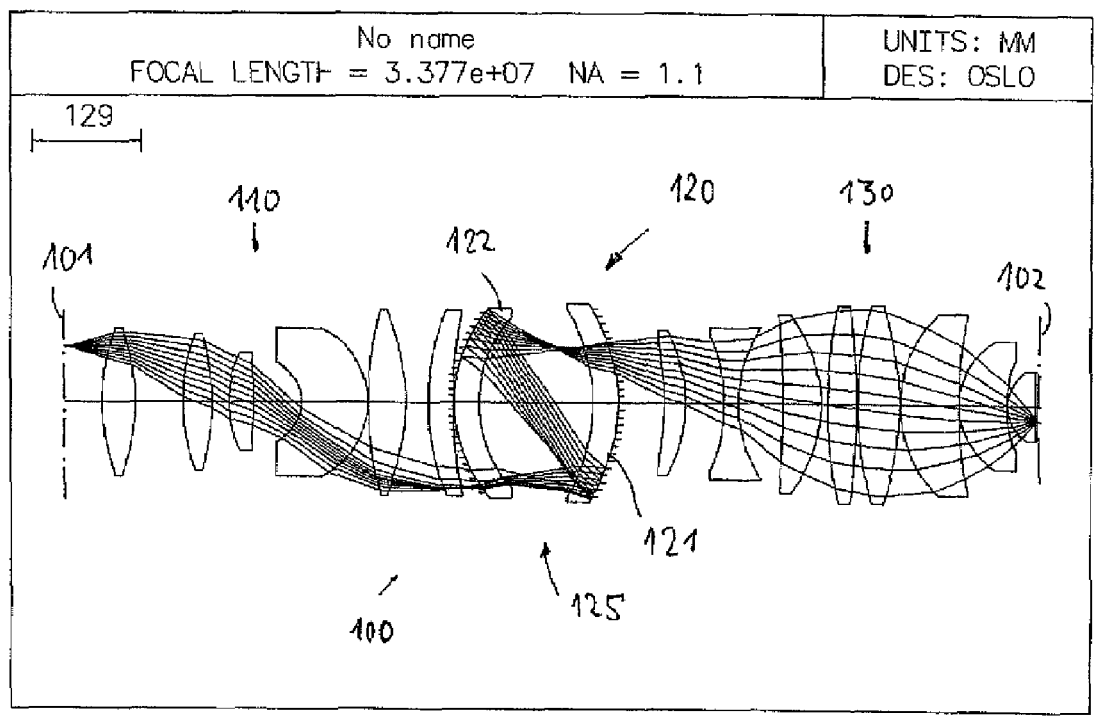
FIG. 3 is a representation of an outer off-axis beam passing through the system of FIG. 1.

In the following description of preferred embodiments of the invention, the term "optical axis" shall refer to a straight line or sequence of straight-line segments passing through the centers of curvature of the optical elements involved. The optical axis is folded by folding mirrors (deflecting mirrors) or other reflective surfaces. In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Where tables are provided to disclose the specification of a design shown in a figure, the table or tables are designated by the same numbers as the respective figures.

FIG. 1 shows a first embodiment of a catadioptric projection lens 100 according to the invention designed for ca. 193 nm UV working wavelength. It is designed to project an image of a pattern on a reticle arranged in the object plane 101 into the image plane 102 on a reduced scale, for example, 4:1, while creating exactly two real intermediate images 103, 104. A first refractive objective part 110 is designed for imaging the pattern in the object plane into the first intermediate image 103 at an enlarged scale, a second, catadioptric objective part 120 images the first intermediate image 103 into the second intermediate image 104 at a magnification close to 1:1, and a third, refractive objective part 130 images the second intermediate image 104 onto the image plane 102 with a strong reduction ratio. The second objective part 120 comprises a first concave mirror 121 having the concave mirror surface facing the object side, and a second concave mirror 122 having the concave mirror surface facing the image side. The mirror surfaces are both continuous or unbroken, i.e. they do not have a hole or bore. The mirror surfaces facing each other define a catadioptric cavity 125, which is also denoted intermirror space 125, enclosed by the curved surfaces defined by the concave mirrors. The intermediate images 103, 104 are both situated inside the catadioptric cavity 125, at least the paraxial intermediate images being almost in the middle thereof well apart from the mirror surfaces. FIG. 1 shows a first point 108 on optical axis 105 which is the point on optical axis 105 nearest mirror 121. Also shown is a second point 107 on optical axis 105, which is the point on optical axis nearest mirror 122. Intermediate images 103 and 104 are positioned along optical axis 105 between second point 107 and first point 108.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry.

For improved clarity of the beam path through the optical system, FIGS. 2 and 3 show two distinguished beam bundles originating from the off-axis object field. The beam bundle in FIG. 2 originates from an object point closest to the optical axis, whereas in FIG. 3 the beam bundle originates from an object point farthest away from the optical axis. The situation of the intermediate images almost in the middle between the concave mirrors can be clearly seen in this representation. In FIG. 2, the shown positions of the intersections of the crossing light beams between the mirrors are close to the positions of the paraxial intermediate images. In contrast, in FIG. 3 the shown positions or zones of the intersections of the crossing light beams between the mirrors are further offset from the positions of the paraxial intermediate images.

The system 100 is rotational symmetric and has one straight optical axis 105 common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting (compare e.g. FIG. 4 or FIGS. 7-9).

A maximum light beam height at the concave mirrors is almost the same as the maximum light beam height within the third objective part. Preferably, the maximum light beam height at the concave mirrors is less than the 1.5 fold or less than the 1.2 fold of the maximum light beam height within the third objective part. This allows constructions wherein all light beams within the projection objective are located within a space defined as a cylinder around the optical axis of said third objective part, extending from the object plane to the image plane and having a maximum radius of the 1.5 fold, preferably the 1.2 fold, of a maximum beam height within said third objective part.

The system has good lateral color correction, whereas axial color is not entirely corrected. In this embodiment, both concave mirrors are designed as Mangin mirrors. Each Mangin mirror consists of a negative meniscus lens with a mirrored convex surface. The undercorrected spherical aberration of the mirror is offset by the overcorrected spherical aberration of the negative lens. Both concave mirrors have very little refractive power. The concave mirrors may also be designed as simple mirrors (compare FIG. 4). If they are simple mirrors (without meniscus lens), then the mass of transparent optical material is less but it may be necessary to cut the mirrors.

The projection objective is designed as an immersion lens. The correction status is about 9 milliwaves at 1.1 NA over a 26×5.0 mm² field. The field radius is 65 mm. No aspheric surfaces having a departure from a best fitting sphere (deformation) larger than 1.0 mm are necessary. A maximum diameter of 220 mm for the largest elements shows the potential for a low lens mass consumption. The design has 1160 mm track length (axial distance between object plane and image plane) and small glass mass. The last lens next to the image plane is made of calcium fluoride, for immersion.

This new design has very good lateral colour correction but none for axial colour. But the small lens sizes give it less axial colour than an all-refractive design of the same NA. The pupil aberration is well corrected and the chief rays are almost exactly telecentric on both ends.

The design with only two reflections and the small glass volume has no problem with obscuration, so the mirrors can be a good size—not so large—and their strong power provides almost all the Petzval correction of the system. In the embodiment the two intermediate images are almost exactly in the middle of the catadioptric cavity.

A modification not shown here has a first refractive objective part and a third refractive objective part quite similar to those disclosed in U.S. provisional application with Ser. No. 60/511,673 filed on Oct. 17, 2003 by the applicant. The corresponding specification is incorporated by reference.

This basic design has potential to get by on even smaller amounts of optical material volume, especially if the Mangin mirrors have their glass removed. (Compare FIG. 4).

Figure 4:
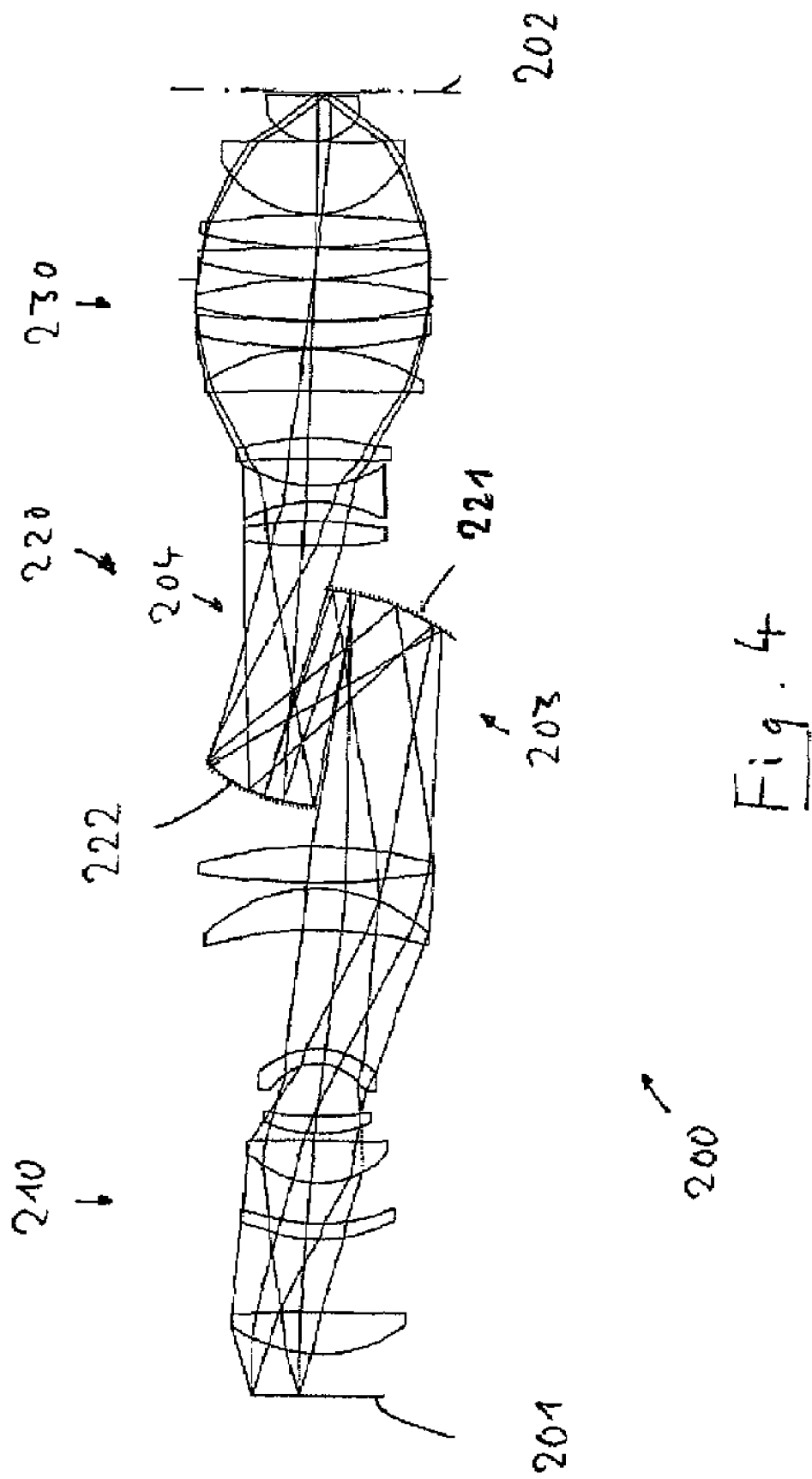
FIG. 4 is a longitudinally sectioned view of a second embodiment of a projection objective according to the invention.

In FIG. 4 a second embodiment is shown. Features or feature groups identical or similar in structure and/or function to those in FIG. 1 are denoted by similar numerals increased by 100. Specifically, projection objective 200 includes a first objective part 210, a second objective part 220, and a third objective part 230. First objective part 210 images an object positioned at object plane 201 to a first intermediate image 203. Second objective part 220, which includes concave mirrors 221 and 222, images first intermediate image 203 to a second intermediate image 204. Third objective part 230 images second intermediate image to an image plane 202.

The projection objective 200 is designed as an immersion lens for λ=193 nm having an image side numerical aperture NA=1.20 when used in conjunction with a high index immersion fluid, e.g. pure water, between the exit face of the objective and the image plane. The field size is 26×5.0 mm². The specifications for this design are summarized in Table 4. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the refractive index of the material employed for its fabrication. The sixth column lists the optically utilizable, clear, semi diameter [mm] of the optical component. A radius r=0 in a table designates a planar surface (having infinite radius).

In the case of this particular embodiment, twelve surfaces, namely surfaces 2, 3, 8, 12, 15, 16, 17, 19, 22, 30, 33 and 35 in table 4, are aspherical surfaces. Table 4A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2h^2))]+C1 \cdot h^4+C2 \cdot h^6+\ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 4A.

Since the objective has 17 lenses, more than 50% or more than 60% of the lenses are aspheric lenses.

Figure 5:
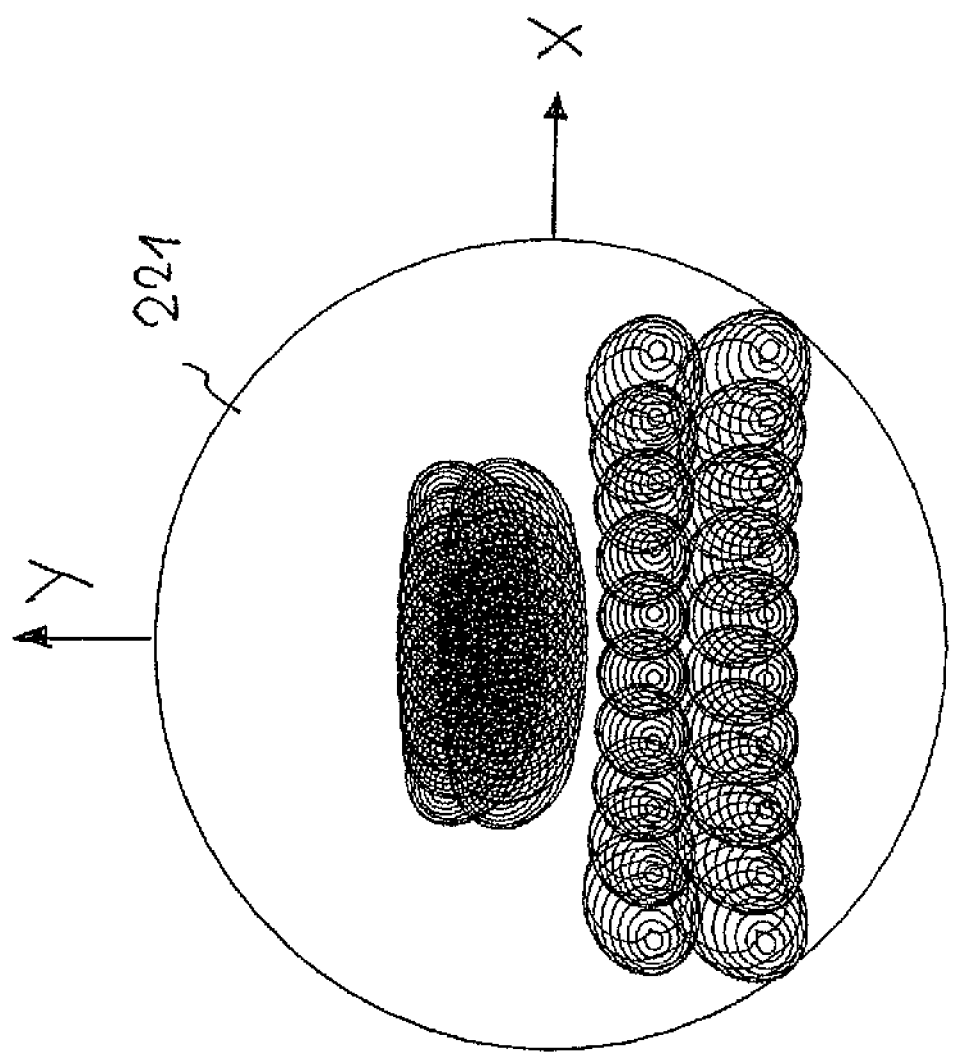
FIGS. 5, 6 are schematic diagrams showing footprints of beams on the concave mirrors of the embodiment shown in FIG. 4.
Figure 6:
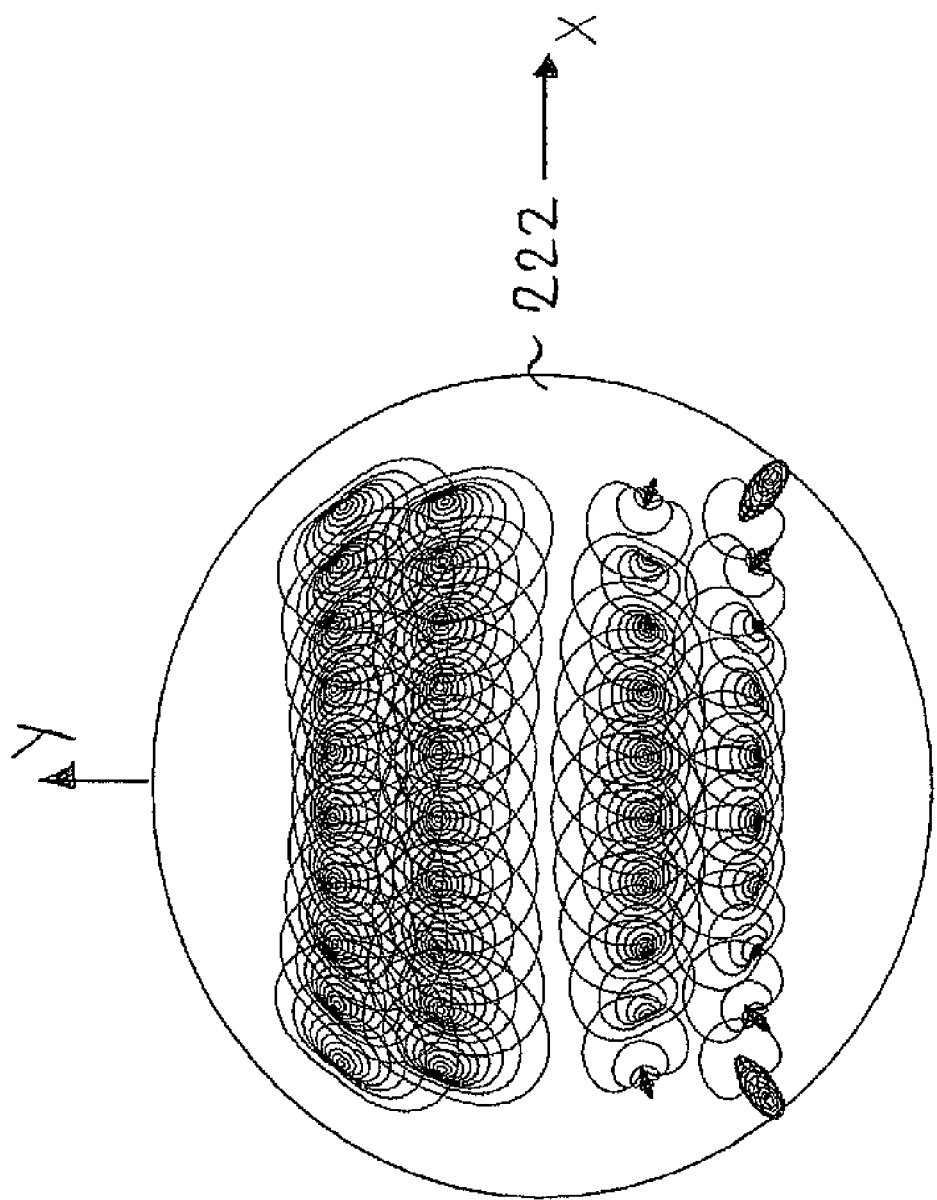

Like the embodiment of FIG. 1, there are no folding mirrors leaving a straight, unfolded optical axis common to all optical components. In contrast to the first embodiment, the two concave mirrors 221, 222 facing each other are simple mirrors instead of Mangin-mirrors, which allows to reduce the overall mass of the system. In order to demonstrate the path of the light transiting the catoptric (purely reflective) group 220, FIGS. 5 and 6 show the "footprints" of the beams on the concave mirrors. In FIG. 5, footprints at the position of the first concave mirror 221 are shown. The lower group of elliptic lines represent beams reflected at the first concave mirror 221, and the upper group of elliptic lines represent the beams coming from the second concave mirror 222 towards the second refractive part 230. In FIG. 6, the footprints at the position of the second concave mirror 222 are shown. The lower part represents beams running from the first refractive part 210 to the first concave mirror 221, whereas the upper elliptic lines represent the beams reflected at the second concave mirror 222 and running to the image plane. It can be seen that the used areas on the mirrors have simple contiguous shapes such that the mirrors may be fabricated, for example, as a rectangular mirror, which is easy to mount.

It is a characterizing feature that the overall cross sectional beam shape at a concave mirror deviates significantly from a circular shape found at pupil positions. The beam diameters in mutually perpendicular directions have a ratio of about 1:3 in this embodiment, where the diameter in scan direction y is less than 50% or 30% of the diameter in a cross scan direction x. The beam shape resembles the rectangular field shape indicating that the concave mirror is closer to a field surface than to a pupil surface, i.e. the concave mirror is positioned optically remote from a pupil surface. Small, narrow mirrors can therefore be used as concave mirrors. This facilitates guiding the light flux past the concave mirrors at one side without vignetting even when the numerical aperture is high.

Generally, in embodiments according to the invention, the size of the concave mirrors is not directly coupled to the numerical aperture such that very high values of NA, e.g. NA>1.3 or NA>1.4 can be obtained without unduly increasing the mirror size.

Figure 7:
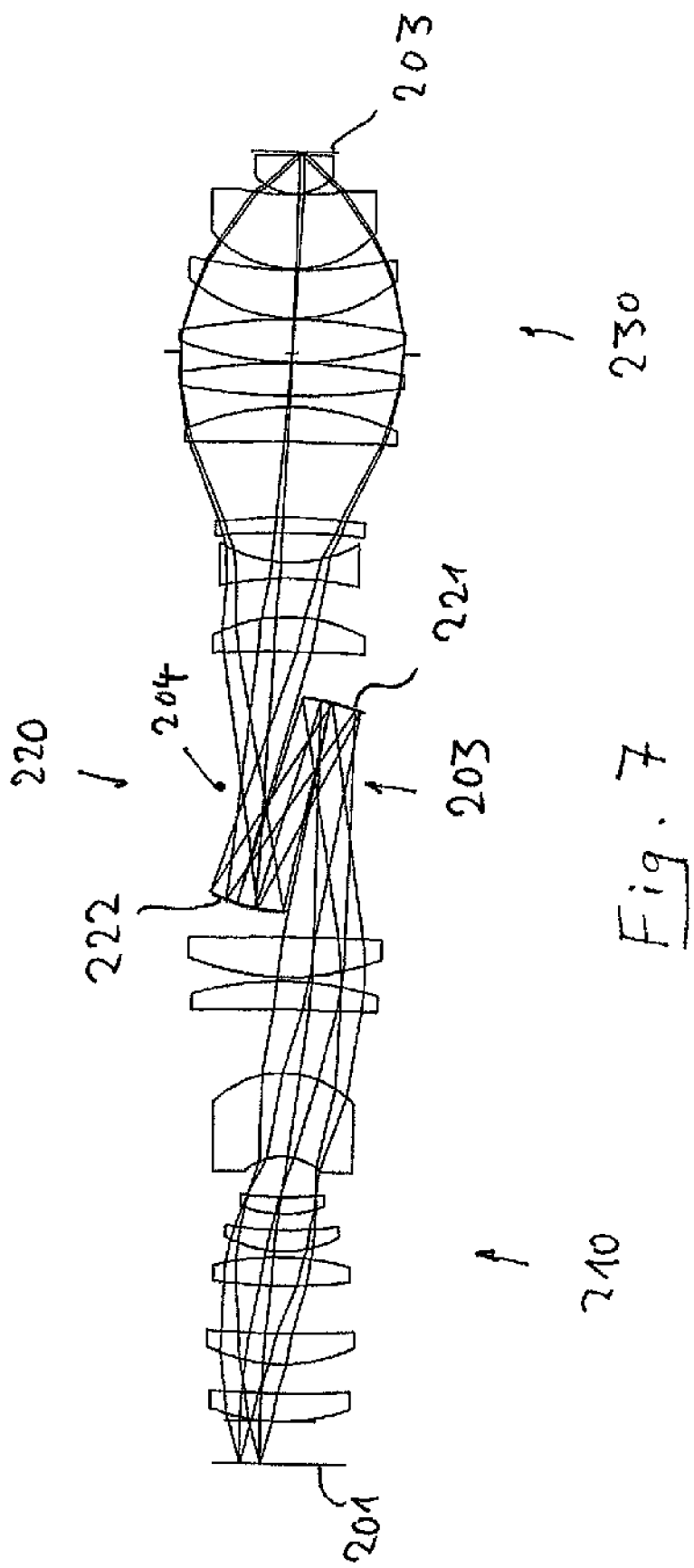
FIGS. 7, 8 and 9 show variants of the embodiment of FIG. 4 having different NA values and different positions of the aperture stop.
Figure 8:
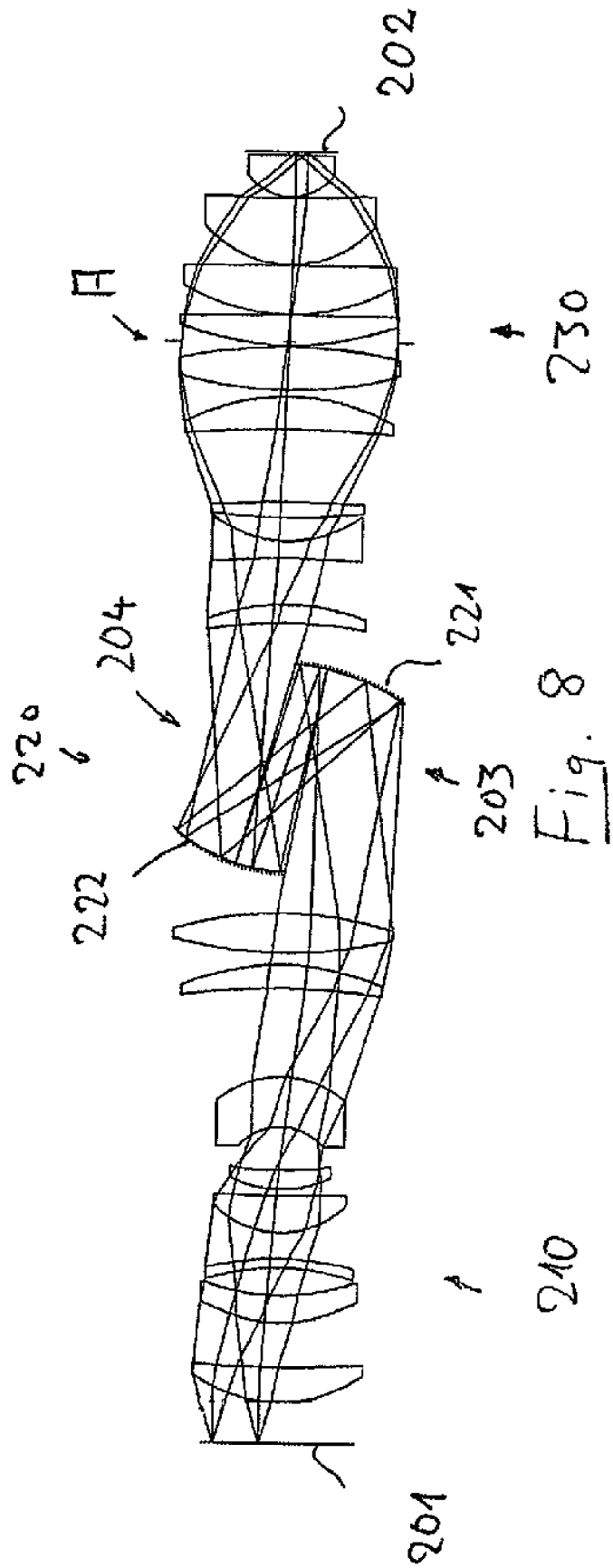
Figure 9:
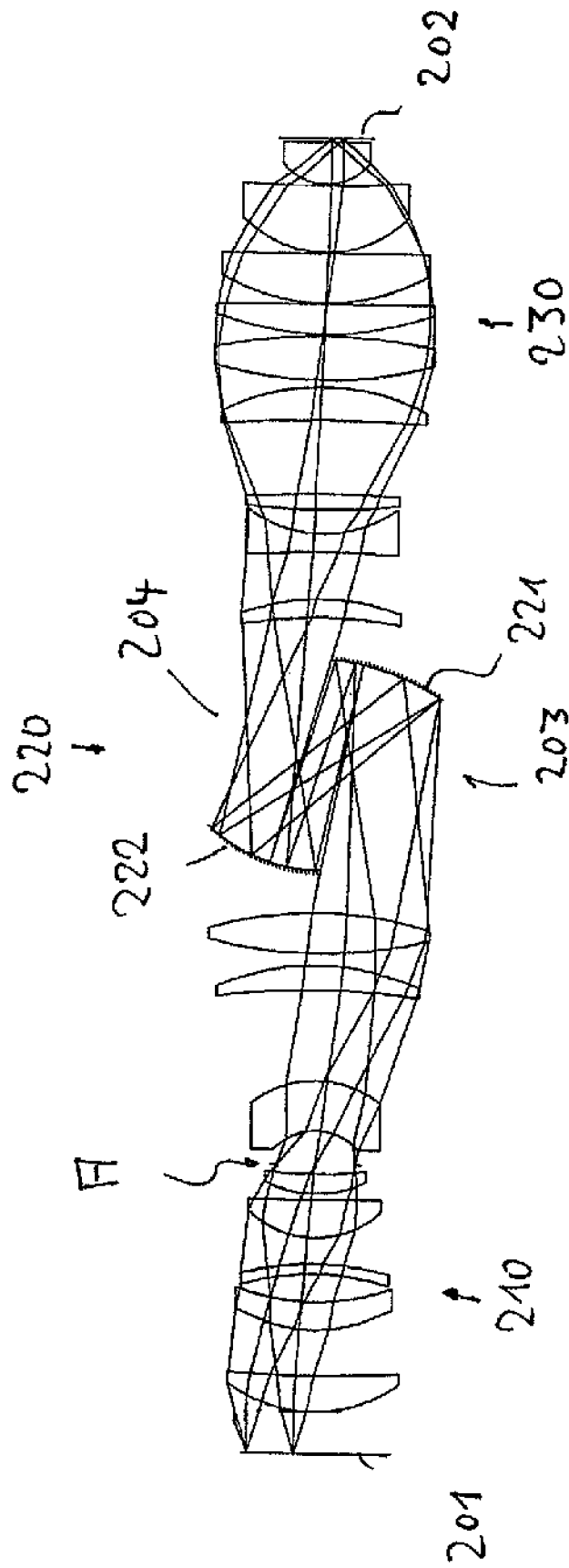

In FIG. 7 to 9 some beneficial variants of the second embodiment are shown. Features or feature groups identical or similar in structure and/or function to those in FIG. 4 are denoted by similar numerals. All variants are designed as immersion lens for λ=193 nm having an image side numerical aperture NA≧1 when used in conjunction with a high index immersion fluid, e.g. pure water, between the exit face of the objective and the image plane. The field size is 26×5.0 mm. Specifications are given in Tables 7 and 7A for FIG. 7, and in tables 8 and 8A for FIG. 8 and for FIG. 9. The designs in FIG. 8 and 9 are the same, the difference lies in the position of the aperture stop A.

The variant of FIG. 7 (NA=1.1) is characterized by the fact that the used areas on the concave mirrors are smaller than in the embodiment of FIG. 4. Consequently, the sizes of the rectangularly shaped concave mirrors may be further reduced.

The variant of FIG. 8 (NA=1.15) is characterized by the fact that the aperture stop A is positioned in the third, purely refractive part 230 in the region of maximum beam diameter. By contrast, in the closely related variant in FIG. 9 (NA=1.15) the aperture stop A is positioned in the first refractive objective part 210. This demonstrates that the designs allow flexibility as to where the aperture stop can be placed.

The embodiments described above are characterized by a straight, unfolded optical axis common to all optical elements. A potential problem of such designs may be that the mounts provided for the concave mirrors may lead to a long track length or may interfere with the beam path. In the following, embodiments comprising at least one planar folding mirror are shown as design alternatives to obtain compact designs.

Figure 10:
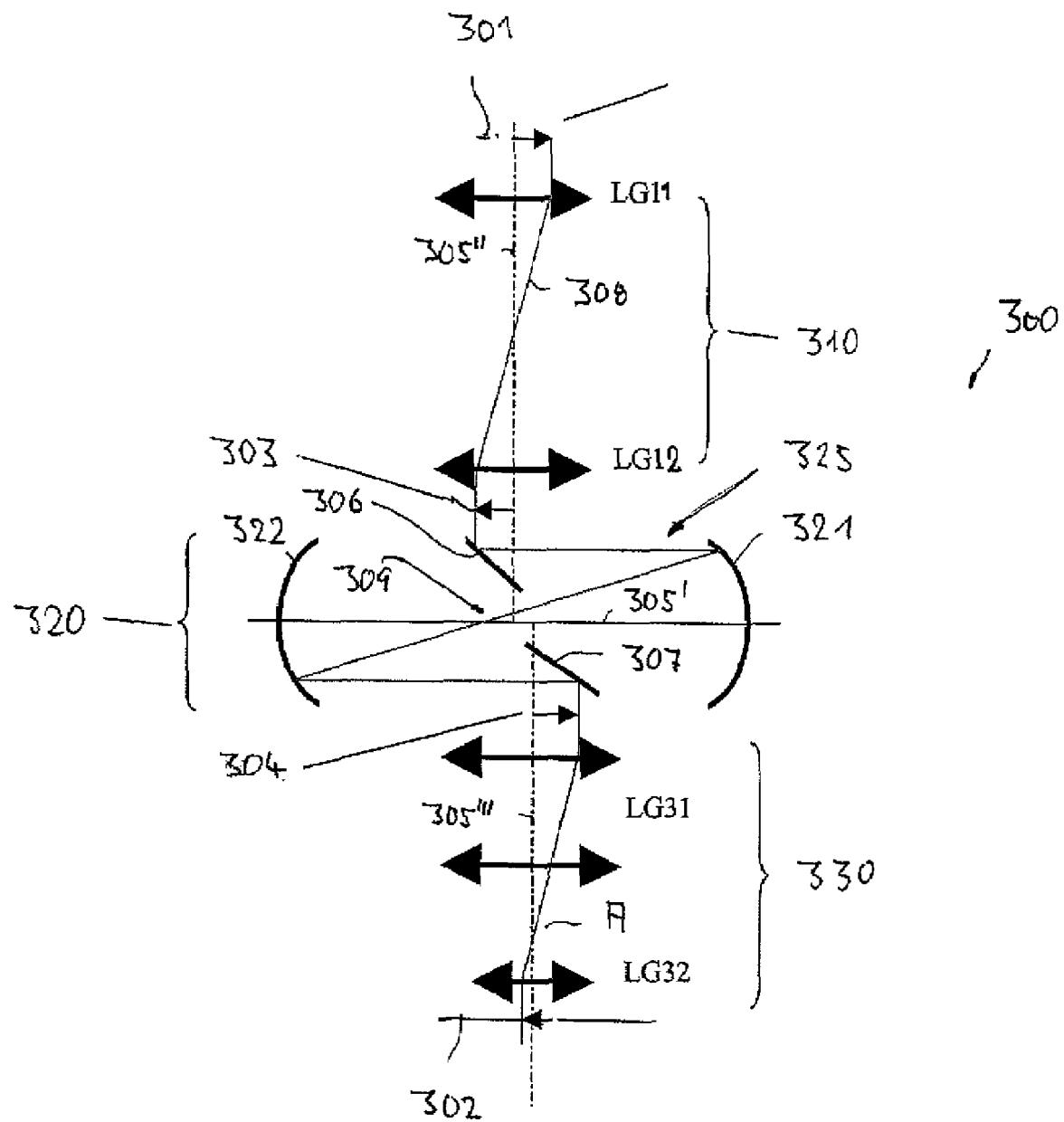
FIGS. 10, 11 show a schematic representation and a lens section, respectively, of a third embodiment of a projection objective according to the invention.
Figure 11:
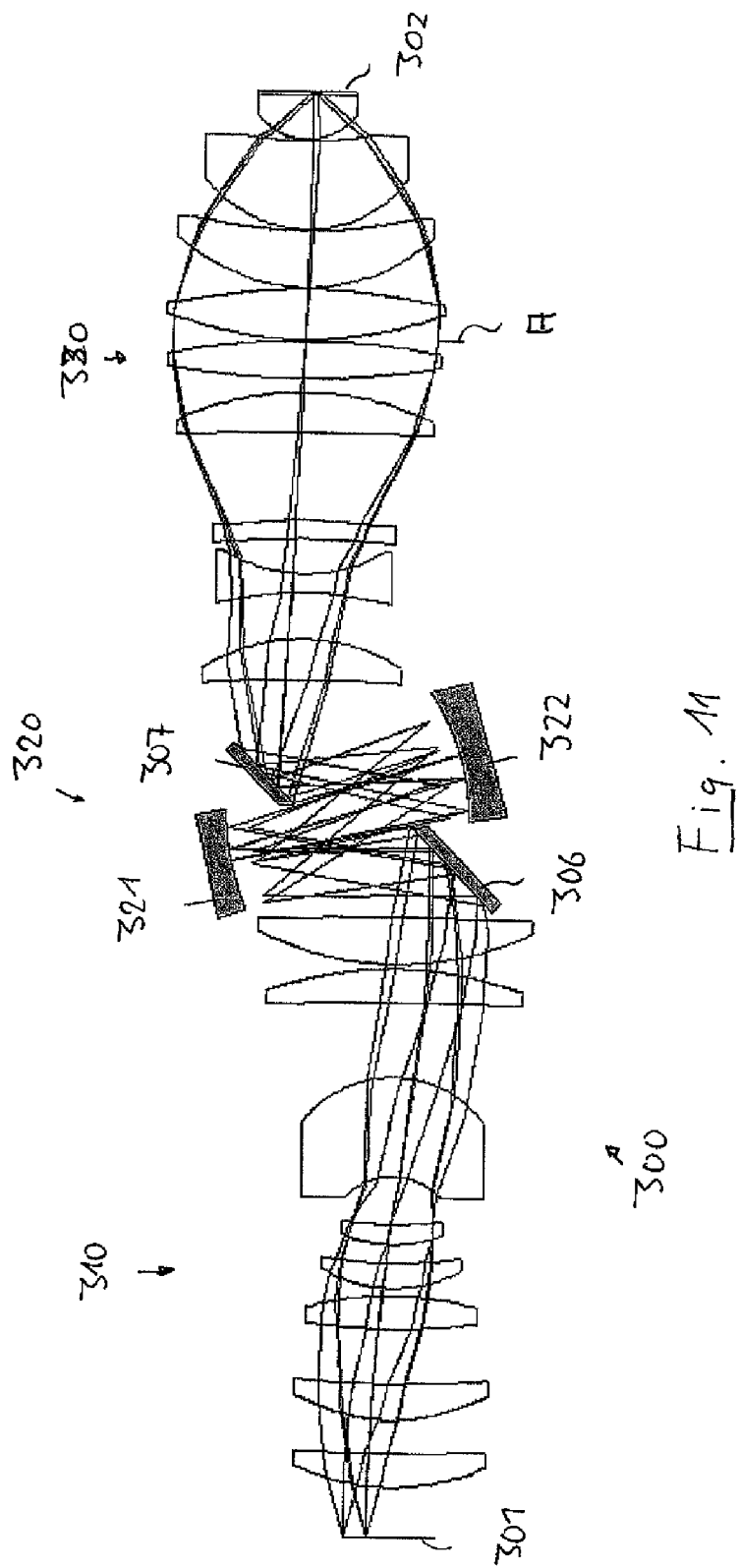

In FIG. 10 a third embodiment is shown. Features or feature groups identical or similar in structure and/or function to those in FIG. 1 are denoted by similar numerals increased by 200. FIG. 11 represents a longitudinal sectional view of an embodiment designed on the basis depicted in FIG. 10.

The embodiment of a catadioptric projection objective 300 in FIG. 10 is similar to some of the above mentioned embodiments in that it comprises a first, refractive objective part 310 for creating a first intermediate image 303 of an object positioned at an object plane 301, a second, catoptric objective part 320 for creating a second intermediate image 304 from the first intermediate image, and a third, refractive objective part 330 for re imaging the second intermediate image onto the image plane 302. The second objective part may include at least one lens such that it becomes a catadioptric objective part.

In contrast to the embodiments shown above, the second objective part 320 includes four reflective surfaces, namely two planar folding mirrors 306, 307 and two concave mirrors 321, 322 facing each other. The concave mirror surfaces of these mirrors define a catoptric cavity 325 inside which the folding mirrors and the intermediate images are located.

The first folding mirror 306 located immediately near the first intermediate image 303 is arranged for reflecting the radiation coming from the object plane onto the first concave mirror 321, which reflects the light directly, i.e. without intermediate image, to the second concave mirror 322. Light reflected from the second concave mirror strikes the second folding mirror 307 which reflects the light to the object plane, thereby creating the second intermediate image immediately near the second folding mirror. In this construction, the concave mirrors and the mounts of these mirrors are situated outside the central main part running between object plane and image plane. The concave mirrors have a common optical axis 305' which may be exactly or almost perpendicular to the object side and image side parts 305" and 305''' of the optical axis, which are laterally offset in this embodiment. Inclination angles of the folding mirrors with respect to the optical axis may be 45° or may deviate significantly therefrom, e.g. by up to 5 or 10 degrees. Therefore, inclination angles between 70° and 110° may occur between the common optical axis of the concave mirrors and the object and image side part of the optical axis.

Whereas the intermediate images are geometrically situated between the concave mirrors, it is to be noted that no intermediate image lies optically between the concave mirrors. This configuration allows for small spot diameters on the concave mirrors, which is advantageous for reducing the geometric light guidance value (etendue). A pupil plane 309 lies at a distance from both concave mirrors at the position where the chief ray 308 crosses the optical axis 305' defined by the concave mirrors. An aperture stop may be positioned here. It may be beneficial if at least one of the concave mirrors has an aspheric reflecting surface having a curvature which decreases from the optical axis to the edge of the mirror in a radial direction.

The purely refractive first objective part 310, which transforms the off axis object field into the first intermediate image, has a first lens group LG11 with positive power and a second lens group LG12 with a positive power. An aperture stop may be provided between these lens groups where the chief ray 308 crosses the optical axis. The catoptric objective part 320 images the first intermediate image into the second intermediate image and has a pupil plane between the concave mirrors. The purely refractive third objective part 330 has a first lens group LG31 with positive power, and a second lens group LG32 with a positive power. An position for an aperture A stop lies between LG31 and LG32.

Figure 12:
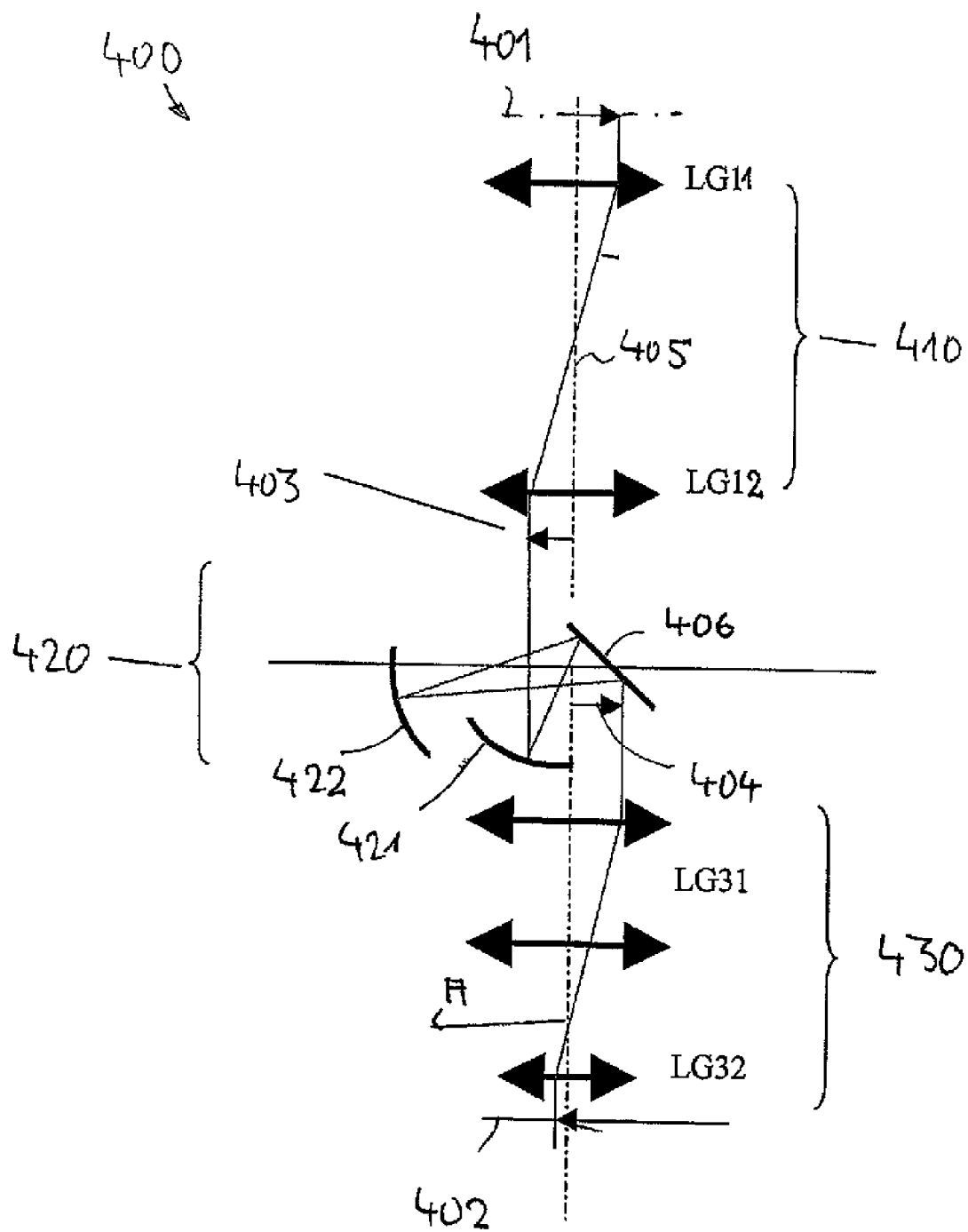
FIGS. 12, 13 show a schematic representation and a lens section, respectively, of a fourth embodiment of a projection objective according to the invention.
Figure 13:
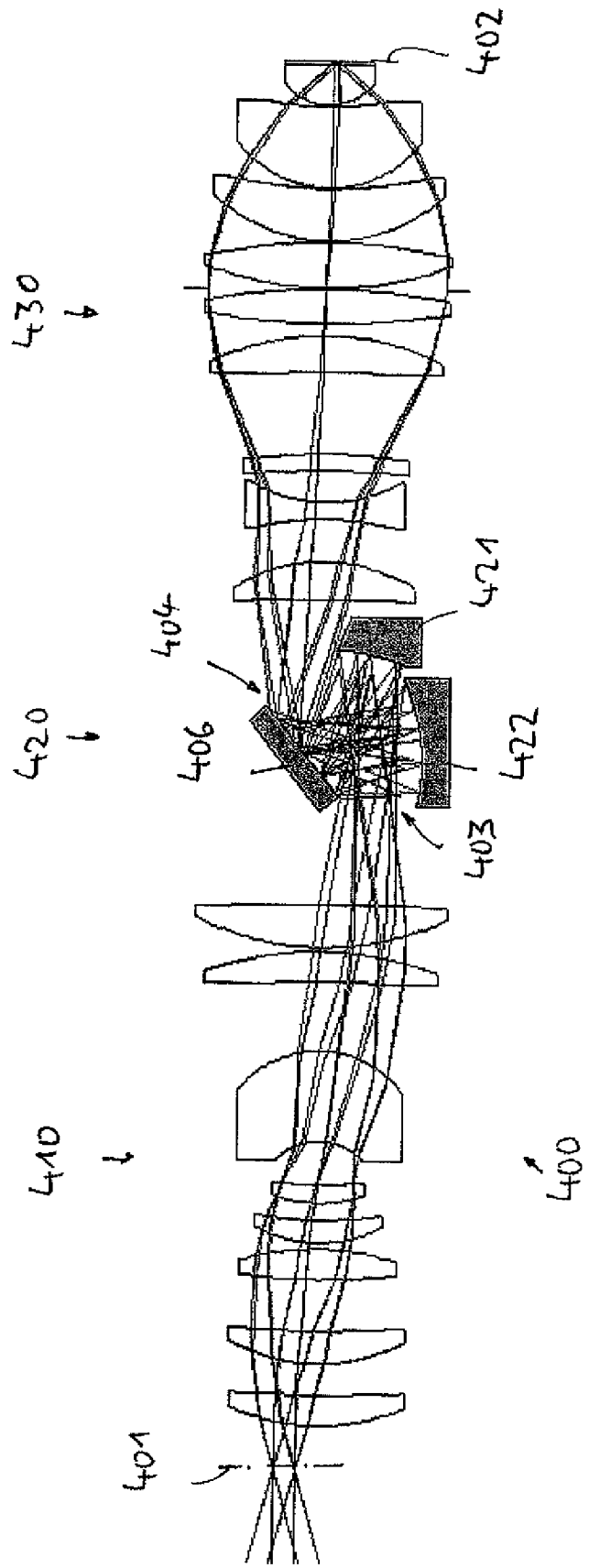

FIG. 12 shows a schematic representation of another projection objective 400 having two concave mirrors 421 and 422 and two intermediate images 403, 404. Features or feature groups identical or similar in structure and/or function to those in FIG. 10 are denoted by similar numerals increased by 100. Specifically, projection objective 400 includes a first objective part 410, a second objective part 420, and a third objective part 430. First objective part 410 images an object positioned at object plane 401 to first intermediate image 403. Second objective part 420, which includes concave mirrors 421 and 422, images first intermediate image 403 to second intermediate image 404. Third objective part 430 images second intermediate image to an image plane 402. FIG. 13 represents a longitudinal sectional view of an embodiment designed on the basis depicted in FIG. 12.

In contrast to the embodiment shown in FIGS. 10, 11, the concave mirrors 421, 422 do not share a common straight optical axis. Instead, the optical axis of the concave mirror 421 corresponds to the optical axis 405 between object plane and image plane. The optical axis of the concave mirror 422 is nearly perpendicular to the optical axis 405. The construction space for the mirror mounts lies outside the optical axis connecting object and image plane, which may be favorable. Note that the object side and the image side section of the optical axis are coaxial. As the concave mirrors both lie on one side of the optical axis 405, the first and second folding mirror can be designed as one single planar mirror 406 with a mirror face facing the concave mirrors and used twice as the light passes through. Also, the two separate concave mirrors 421, 422 can be combined to form one single concave mirror which is used twice.

Figure 14:
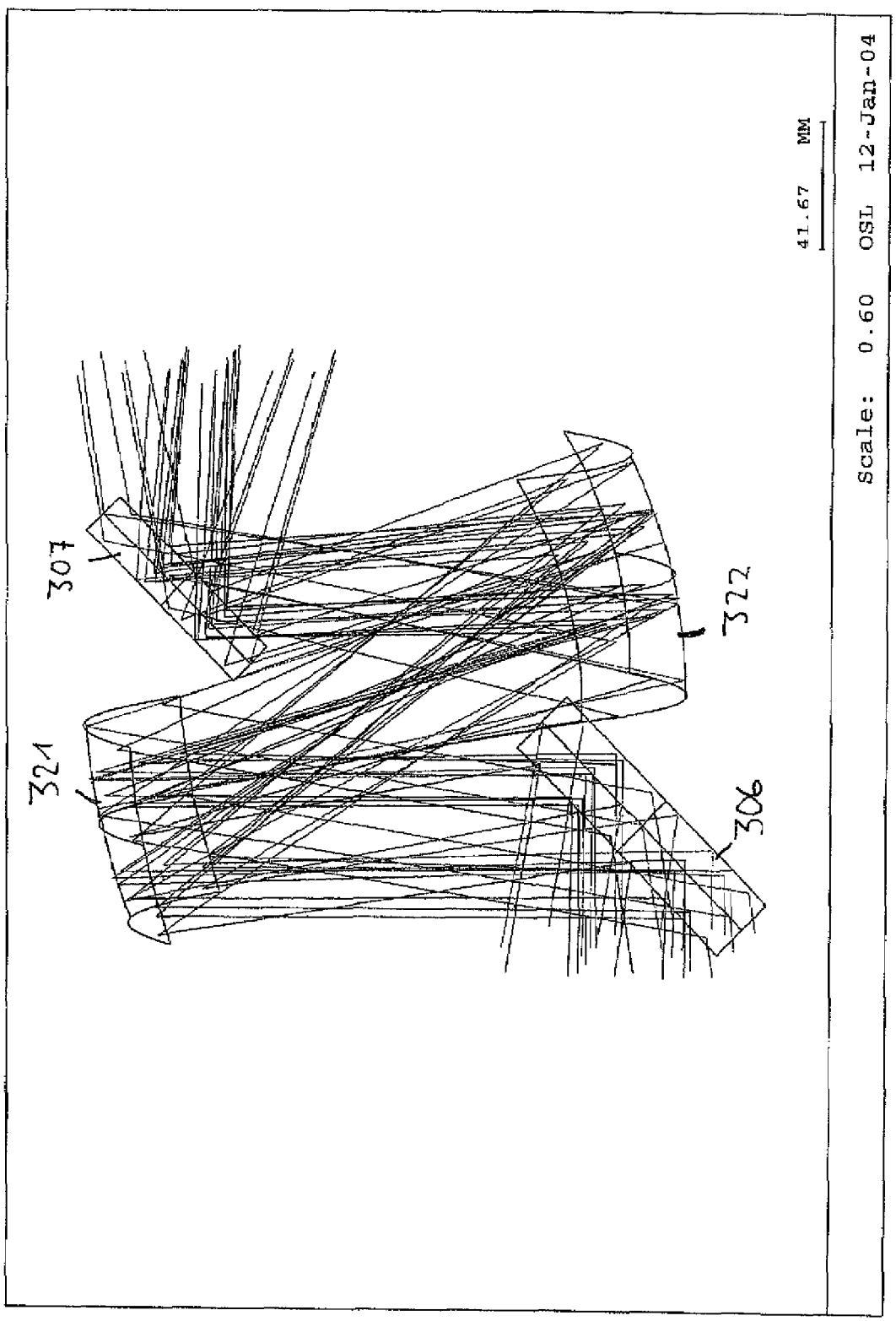
FIG. 14 shows a perspective view of the catadioptric objective part of the third embodiment to demonstrate the mirror geometry.

FIG. 14 shows a perspective view of the catoptric objective part of the third embodiment to demonstrate the mirror geometry. It can be seen that the folding mirrors and the concave mirrors can have geometrically simple shapes since the illuminated areas are of simple form and contiguous. The concave mirrors and the folding mirrors in this embodiment have rectangular shape which facilitates mounting.

Figure 15:
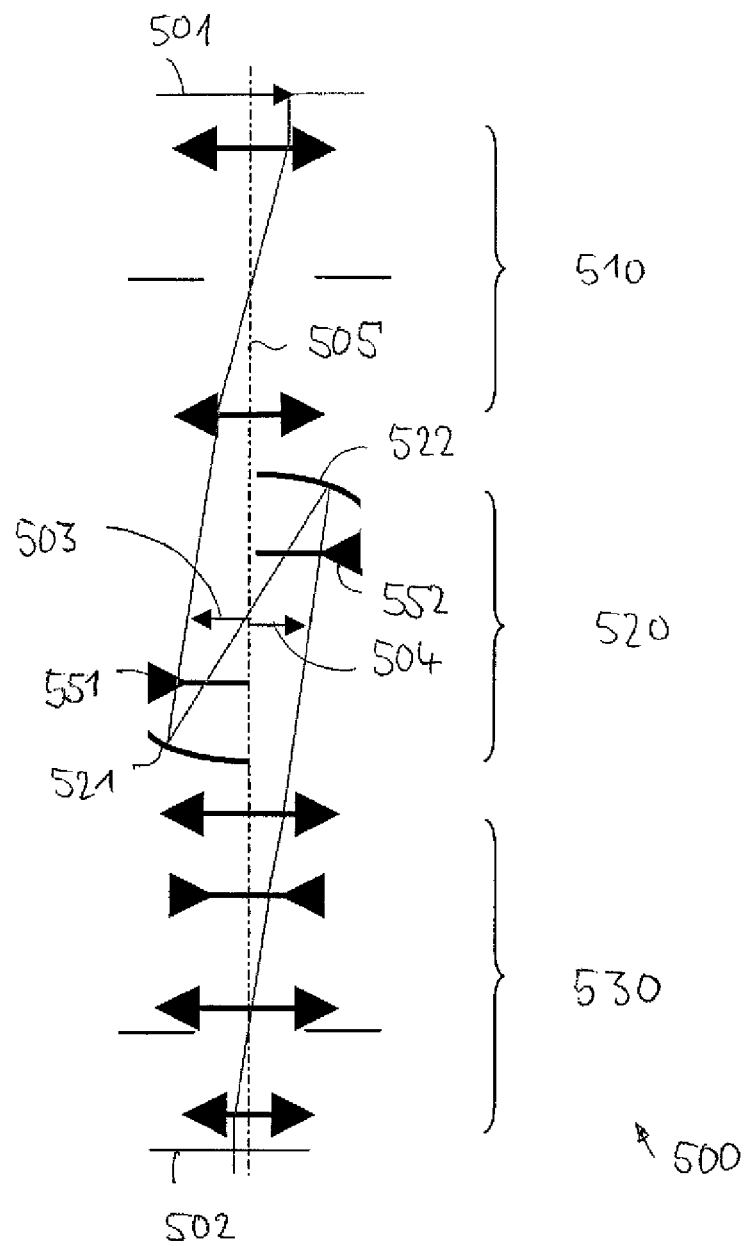
FIG. 15 shows a schematic representation of another embodiment having double-passed lenses between concave mirrors and an oblique field (FIG. 15a)
Figure 16:
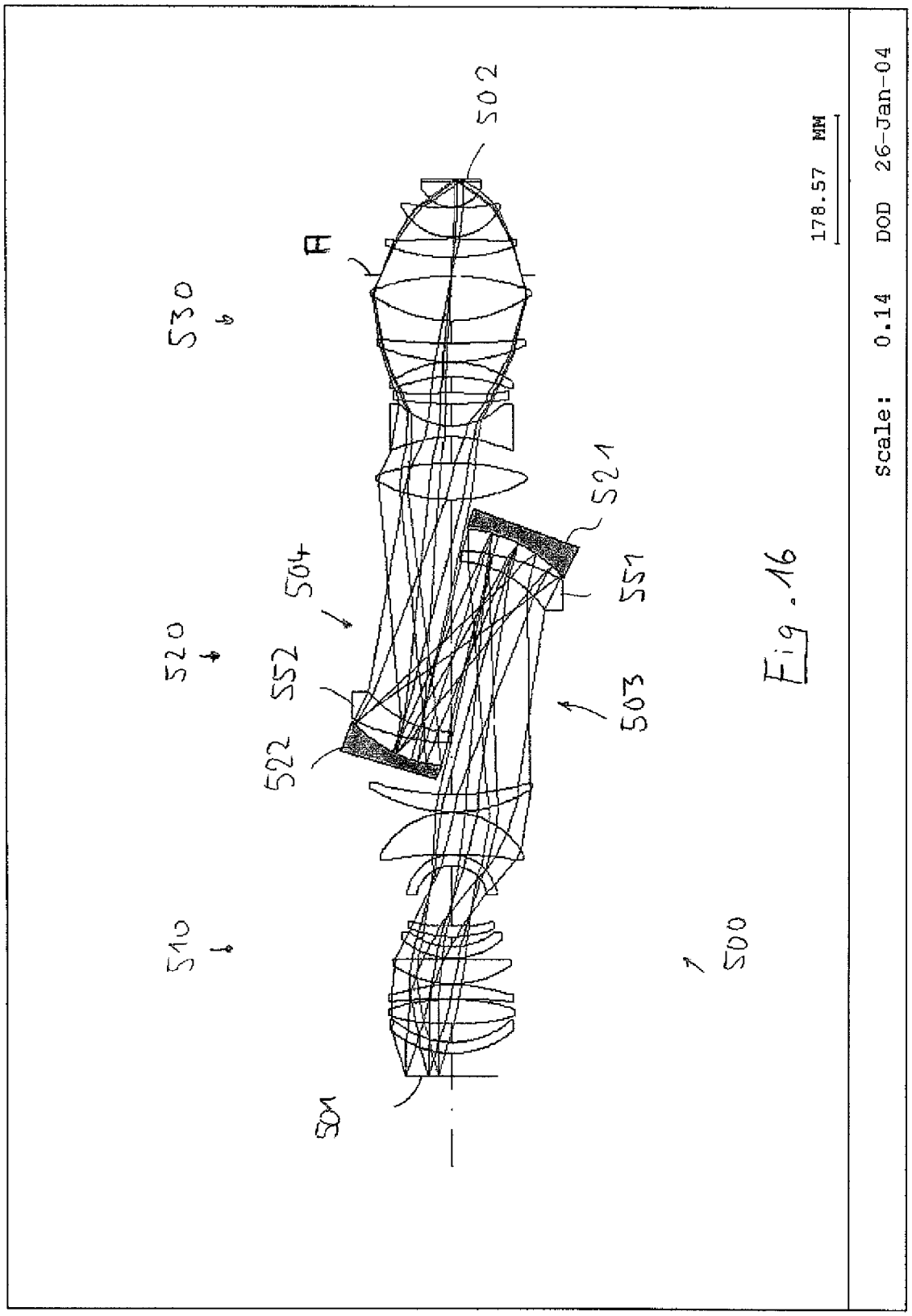
FIG. 16 shows a lens section through an embodiment constructed according to FIG. 15.

FIG. 15 shows a schematic representation of another embodiment of a projection objective 500 having features improving optical performance and features facilitating manufacturing. FIG. 16 shows a lens section of a projection objective designed according to the principles shown in FIG. 15. The specification of this embodiment is shown in tables 16 and 16A. Features or feature groups identical or similar in structure and/or function to those in FIG. 1 are denoted by similar numerals, increased by 400. Specifically, projection objective 500 includes a first objective part 510, a second objective part 520, and a third objective part 530. First objective part 510 images an object positioned at object plane 501 to first intermediate image 503. Second objective part 520, which includes concave mirrors 521 and 522, images first intermediate image 503 to second intermediate image 504. Third objective part 530 images second intermediate image to an image plane 502.

The second objective part 520 which serves to image the first intermediate image 503 into the second intermediate image 504 includes a first concave mirror 521 and a second concave mirror 522 optically downstream of the first concave mirror 521. The curvature surfaces of the first and second concave mirror have a common axis of rotational symmetry co-axial with the optical axis shared by all optical elements of the projection objective. The unbroken mirror surfaces used on the first and second concave mirror are on opposite sides of the optical axis 505. A first mirror-related lens 551 is arranged optically between the first intermediate image 503 and the first concave mirror 521 immediately in front of the first concave mirror such that it is transited twice in the optical path between the first intermediate image and the first concave mirror and in the optical path between the first concave mirror and the second concave mirror. In order to avoid influencing the optical path between the second concave mirror and the image plane the first mirror-related lens 551 is designed as a truncated lens arranged outside the optical axis. A second mirror-related lens 552 is arranged immediately in front of the second concave mirror 522 such that is used twice in the optical path between the first and the second concave mirror and in the optical path between the second concave mirror and the image plane 502. The lens 552 is truncated such that it does not extend into the optical path between the object plane 501 and the first concave mirror 521. Both the first and second mirror related lenses 551, 552 are free standing lenses having free entrance and exit surfaces. Particularly, the lens surfaces facing the respective concave mirrors have curvatures different from the curvatures of the concave mirrors, which allows additional degrees of freedom when compared to the embodiments having Mangin mirrors (compare FIG. 1). Both mirror-related lenses 551, 552 are designed as negative meniscus lenses having a sense of curvature similar to the curvature of the associated concave mirror, i.e. having a convex surface facing the concave mirror surface of the associated concave mirror. The negative refractive power arranged immediately in front of the concave mirrors serves to improve correction of the chromatic length aberration (CHL). All optically active surfaces of the second objective part are spherical, which greatly facilitates manufacturing and improves the optical performance. Particularly, stray light may be reduced when compared to embodiments having aspheric surfaces, particularly aspheric mirror surfaces.

Figure 15A:
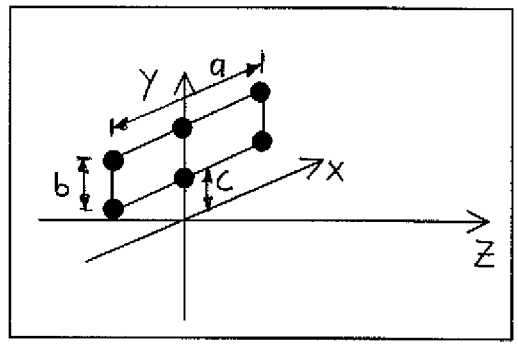

The field having the shape of a high aspect ratio rectangle having a width a in cross-scan direction (x-direction) and a smaller width b in scan direction (y-direction) and arranged off-axis at a distance c from the optical axis is shown in FIG. 15a. The immersion objective has image side numerical aperture NA=1.2 when used in conjunction with pure water as an immersion medium at 193 nm. The system is telecentric on the object and image side and essentially free of field zone aberrations.

Figure 17:
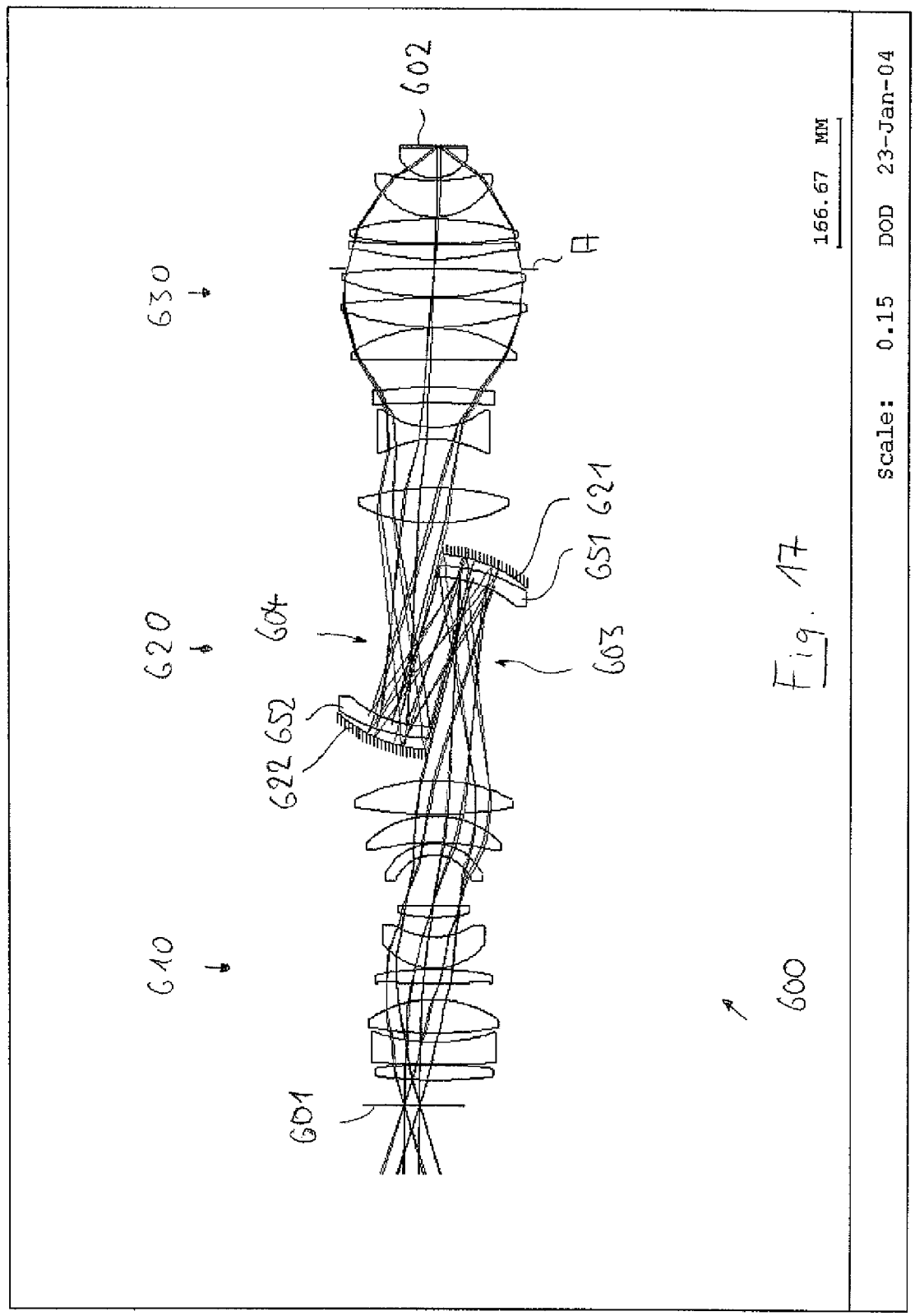
FIG. 17 shows a lens section of another embodiment constructed according to the principles shown in FIG. 15.

In FIG. 17 a lens section of a variant of a system according to the principles explained in connection with FIG. 15 is shown. The specification of the 193 nm immersion lens having NA=1.2 is given in tables 17 and 17A. Features or feature groups identical or similar in structure and/or function to those in FIG. 1 are denoted by similar numerals, increased by 500. Specifically, projection objective 600 includes a first objective part 610, a second objective part 620, and a third objective part 630. First objective part 610 images an object positioned at object plane 601 to first intermediate image 603. Second objective part 620, which includes concave mirrors 621 and 622, images first intermediate image 603 to second intermediate image 604. Third objective part 630 images second intermediate image to an image plane 602. The second objective part 620 has aspherical negative meniscus lenses 651, 652 immediately in front of the spherical concave mirrors 621, 622 and used twice in the light path to and from the respective concave mirrors. For the sake of simplicity, each group of optical elements consisting of a concave mirror 621, 622 and the associated lenses 651, 652 immediately ahead of the respective concave mirror is denoted as "catadioptric sub-group". In the embodiment of FIG. 17 the catadioptric sub-group 621, 651 and the catadioptric sub group 622, 652 are designed identically and arranged symmetrically with respect to each other. Particularly, the radii of the optical surfaces, the axial distances or thicknesses of the optical surfaces and the diameters of the optical surfaces of the symmetry related lenses as well as the symmetry related concave mirrors are identical. This makes it possible that the lenses 651, 652 and the mirrors 621, 622, respectively, may be manufactured simultaneously from the same blank material. Therefore, arrangements of the type exemplarily shown in FIG. 17 allow for significant reduction in costs for material and manufacturing for the optical elements used in the second, catadioptric objective part.

In a corresponding method of manufacturing optical elements for an catadioptric or catoptric objective part of a projection lens having a first concave mirror and a second concave mirror designed as truncated mirrors the first and second mirrors are fabricated such that firstly a mirror blank for the first and second concave mirror is manufactured to obtain the desired concave shape of the mirror surface and secondly the shaped mirror blank is separated into two truncated mirrors used as first and second concave mirror. The mirror blank may be a single piece cut into two pieces after surface preparation. It is also possible to join two separate blank parts together, e.g. by wringing or cementing, prior to shaping the mirror surface. This allows easy separation after the surface preparation. The coating of the mirror substrate may be performed prior to or after separation of the mirror substrate parts. The mirror related lenses may be manufactured correspondingly.

A further difference to the embodiment shown in FIG. 16 lies in the fact that at least one of the surfaces of the lenses 651, 652 close to the respective concave mirrors has aspheric shape. In the embodiment, each concave lens surface of the lenses 651, 652 is aspheric. The aspheric surfaces arranged closed to the respective intermediate images, which are field surfaces of this system, can be designed such that a strong influence on field dependent aberrations, like distortion on the object imaging or the spherical aberration of the pupil imaging, are influenced. Generally, it may be useful to have at least one lens arranged between an intermediate image and the associated concave mirror optically near the intermediate image (upstream or downstream of the intermediate image), wherein at least one surface of the lens arranged between the intermediate image and the concave mirror is aspheric. Particularly, the lens surface facing the intermediate image may be aspheric.

In an alternative embodiment the mirror related lenses, which are truncated lenses in the embodiments of FIGS. 16 and 17, are designed as full meniscus shaped negative lenses extending across the optical axis such that they are transited three times. Specifically, lens 652 (associated to the second concave mirror 622) may extend across the optical axis 605 such that light coming from the object plane transits this lens prior to forming the first intermediate image 603 and then, on the other side of the optical axis, in the optical path between first and second concave mirror and second concave mirror and image plane. Likewise, lens 651 associated to the first concave mirror 621 may extend across the optical axis such that the lens is used twice in the optical path to and from the first concave mirrors and a third time in the optical path between the second intermediate image 604 and the image plane. In this embodiment, two aspheric surfaces transited three times upstream and downstream of an intermediate image are provided, which facilitates optical correction. In addition, mounting of the lenses is improved when compared to the mounting of truncated lenses (compare FIGS. 18 and 19).

Figure 18:
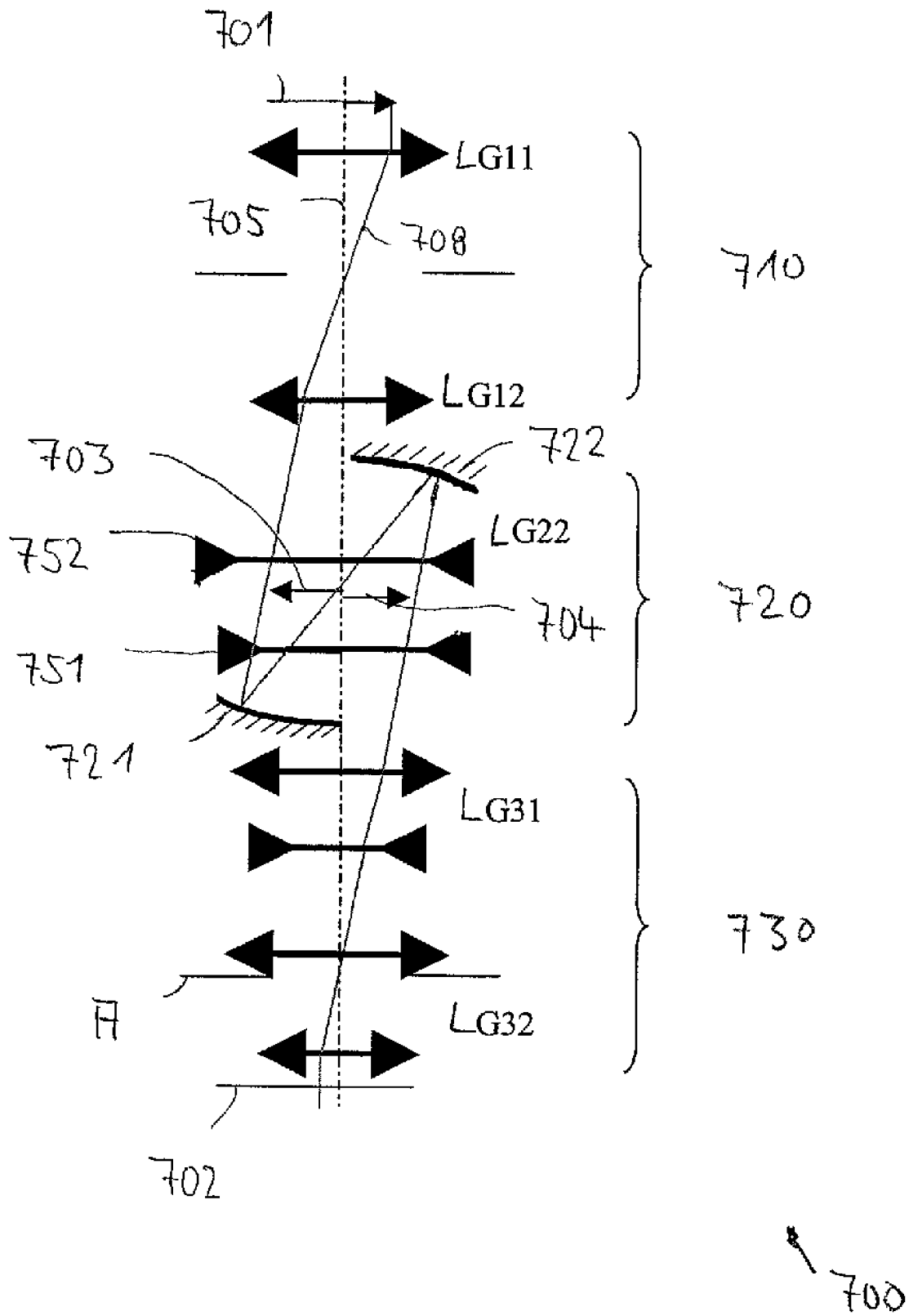
FIG. 18 shows a schematic representation of an embodiment having triple-passed lenses between the concave mirrors.
Figure 19:
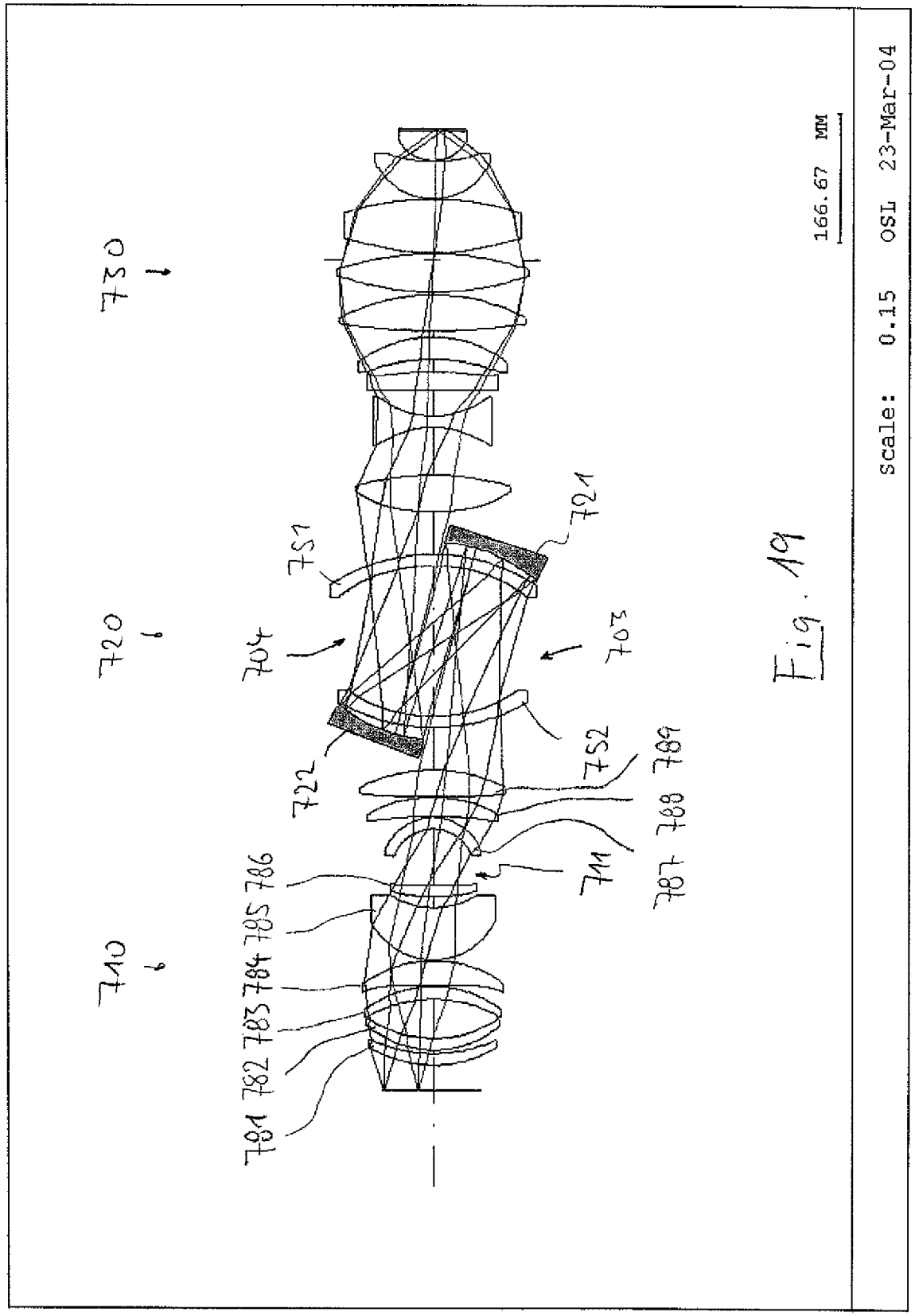
FIG. 19 shows a lens section of an embodiment constructed according to the principles shown in FIG. 18.

In FIG. 18 a schematic representation of a projection objective 700 having two lenses used three times in transmission is shown. FIG. 19 shows an embodiment of this type, for which the specification is given in tables 19 and 19A. Features similar or identical to features described in detail in connection with FIGS. 15 to 17 are designated with the same reference numbers, increased by 100 or 200, respectively.

The catadioptric second objective part 720 serves to image the first intermediate image 703 into the second intermediate image 704. A first mirror related lens 751 is arranged optically between the first intermediate image 703 and the first concave mirror 721, whereas, on the opposite side of the optical axis 705, the second mirror related lens 752 is arranged optically between the second concave mirror 722 and the second intermediate image 704. Both mirror-related lenses 751, 752 extend across the optical axis into the beam pass of light passing the respective concave mirrors 721, 722. Particularly, the second mirror related lens 752 extends into the beam pass between the object plane 751 and the first concave mirror 721, whereas the first mirror related lens 751 extends into the beam path into the second concave mirror 752 and the image plane. Therefore, each of the mirror-related lenses 751, 752 is optically used three times, whereby the optical effect of a lens can be maximized and, at the same time, the consumption of optical material can by minimized. In addition, mounting of the lenses 751, 752 is facilitated when compared to a mounting of truncated lenses.

The triply passed lenses 751, 752 may preferably be designed as multigrade lenses having a first lens zone associated with one side of the optical axis and transited twice in the optical path to and from the associated concave mirror and a second zone associated with the opposite side of the optical axis and transited once, where the first lens zone and the second lens zone have different lens surface curvature on at least one side of the lens such that the multigrade lens forms a pair of mutually independently acting lenses acting at a common location. A monolithic multigrade lens providing different optical powers on opposite sides of the optical axis may be fabricated from a single lens blank and can be mounted conventionally with a circular mount. The lens zones on either side of the optical axis may have different aspheric shape, where the aspheres are preferably based on the same spherical base shape to facilitate manufacturing. Note that the part of lens 752 closest to the first intermediate image and the part of lens 751 closest to the second intermediate image are both located close to field surfaces such that the lens surfaces are effective for correcting field aberrations, particularly if they are made aspheric.

In the embodiment shown in FIG. 19, both lenses 751, 752 with triple use are designed as negative meniscus lenses having a sense of curvature similar to the related concave mirrors and having weak negative refractive power. In other embodiments, the lenses may also be almost without optical power. In both cases, at least one lens surface may be aspheric in order to support optical correction.

In all embodiments, the first, dioptric objective part serves to form the first intermediate image from a flat object field. The size and axial position of the first intermediate image as well as the aberrations associated with the first intermediate image are determined by the optical properties of the first objective part. Like in the embodiments shown above, the first objective part may be subdivided into a first lens group LG11 having positive refractive power and the second lens group LG12 having positive refractive power, wherein a pupil surface 711 of the system is disposed between the lens groups in an axial position where the chief ray 708 of the imaging intersects the optical axis. An aperture stop for determining the numerical aperture used in the imaging process may be provided in the vicinity of this pupil surface. However, in the embodiment shown in FIGS. 18 and 19, the aperture stop A is provided in the vicinity of a pupil surface optically conjugate to this pupil surface in the third, dioptric objective part. The second lens group LG12 between the pupil surface 711 and the first intermediate image includes the negative meniscus lens 752 immediately upstream of the first intermediate image.

In the embodiment of FIG. 19 the first lens group LG11 consists of a positive meniscus lens 781 having an image side concave surface and weak optical power, a negative meniscus lens 782 having an image side concave surface and weak negative power, a positive meniscus lens 783 having an object side concave surface, a biconvex positive lens 784, a positive meniscus lens 785 having an image side concave surface and a positive meniscus lens 786 having an image side concave surface immediately ahead of the pupil surface 711. The second lens group LG12 includes a meniscus shaped lens 787 having a strongly curved concave surface facing the object, a positive meniscus lens 788 having an object side concave surface and a biconvex positive lens 789 immediately behind, and the negative meniscus lens 752 which is integral part of the mirror related second lens. The meniscus lens 787 immediately following the pupil surface and having the concave surface facing the pupil and the object plane is particularly useful for correcting spherical aberration, astigmatism and image curvature in the first objective part. The optical correction is also positively influenced by a negative-positive-doublet formed by the negative meniscus lens 782 and the positive meniscus lens 783 arranged in the divergent beam section of the first lens group LG11. The negative meniscus lens having the concave exit surface optically close to the object plane is arranged in a region where the height of the chief ray is larger than the height of the marginal ray, whereby field aberrations, like distortion, can be effectively corrected.

Figure 20:
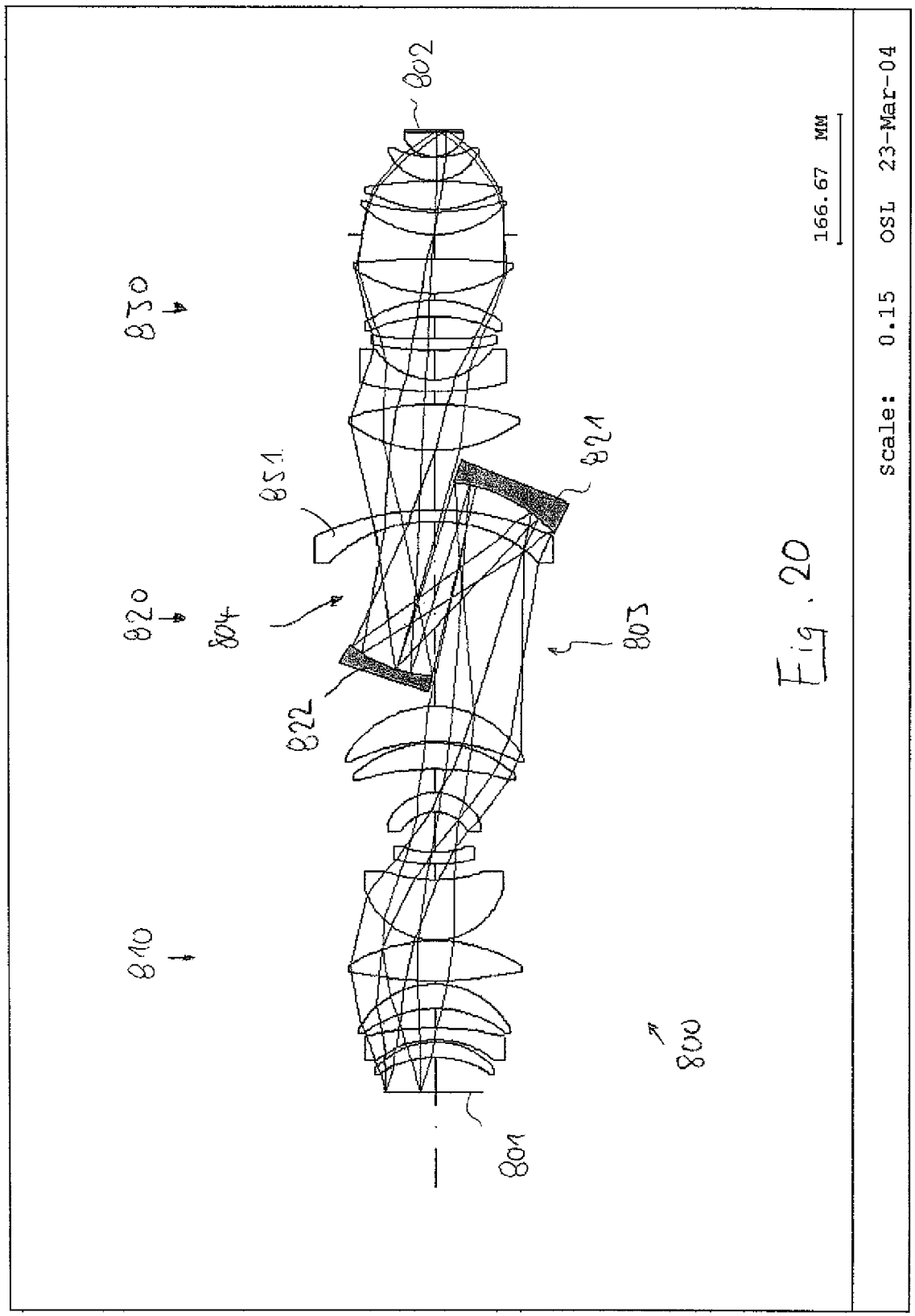
FIG. 20 shows a lens section through an embodiment having a mirror-related lens close to one of the concave mirrors.

The embodiment of a projection objective 800 shown in FIG. 20 having a specification as given in tables 20 and 20A can be described as a variant of the embodiment shown in FIG. 19. Similar to that embodiment, a negative meniscus lens 851 is arranged immediately ahead of the first concave mirror 821, the lens 851 being passed three times by the light beam. In contrast to the embodiment of FIG. 19, lens 851 is the only lens passed three times by the light beam. There is no negative refractive power or positive refractive power immediately in front of the second concave mirror 822. Therefore, the mass of transparent optical material required for the catadioptric objective part is smaller than in the embodiment shown in FIG. 19. The first objective part has magnification $|\beta_1| \approx 1.9$.

Figure 21:
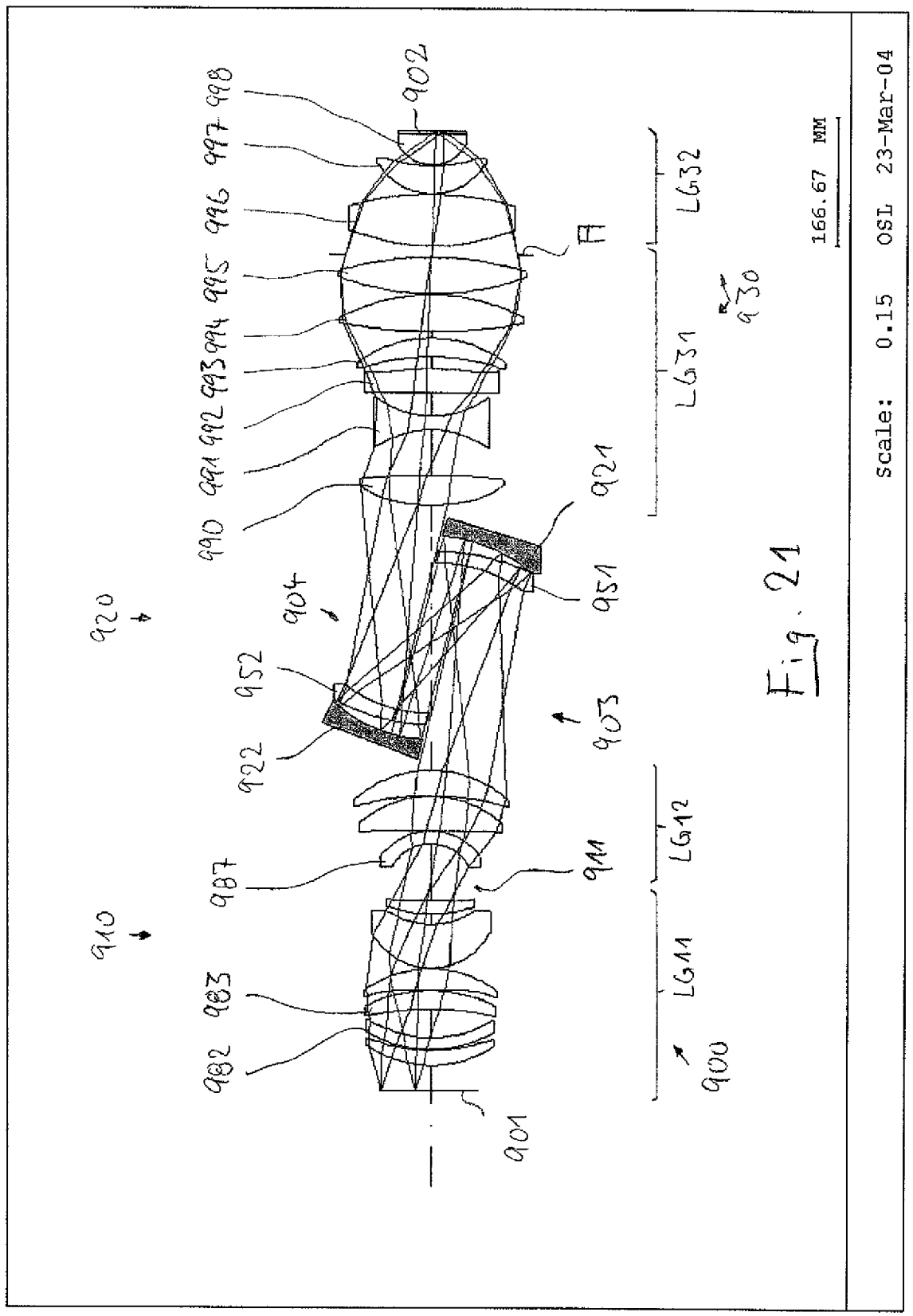
FIG. 21 shows a lens section through another embodiment of a projection objective according to the invention.

In FIG. 21 another embodiment of a projection objective 900 is shown which is generally designed according to the principles explained in detail in connection with FIG. 15. The specification is given in tables 21 and 21A. Reference numerals are similar, but increased by 400. Particularly, to each concave mirror 921, 922 is as signed a negative meniscus lens 951, 952 immediately in front of the concave mirror optically between the respective concave mirror and an intermediate image upstream or downstream of the concave mirror. Each negative meniscus lens 951, 952 is designed as a truncated lens arranged only at the side of the optical axis where the associated concave mirror is positioned. Therefore, the mirror-related lens is passed twice by the light. The first objective part 910 can be subdivided into two lens groups, lens group LG11 being arranged between the object plane and the pupil plane 911, whereas lens group LG12 is arranged between the pupil plane and the first intermediate image 903. Like in the embodiment shown in FIG. 19, the first lens group LG11 includes a negative-positive-doublet 982, 983, the negative meniscus 982 being arranged close to the object plane and having a concave exit side facing the image plane. The positive refractive power following this negative lens is split into two positive meniscus lenses, each having a concave side facing the object. A meniscus lens 987 having a strongly curved concave entrance side facing the object is arranged immediately downstream of the pupil plane 911. Optically, this lens is useful for correcting spherical aberration, astigmatism and image curvature in the first objective part.

The third objective part 930 is composed of a first lens group LG31 between the second intermediate image 904 and the aperture stop A, and the second lens group LG32 between the aperture stop A and the image plane. The aperture stop is arranged between the region of largest beam diameter of the third objective part and the image plane. The biconvex positive lens 996 immediately following the aperture stop A is a biaspherical lens having both the entrance side and the exit side being aspheric surfaces. The aspheric surfaces in close vicinity to each other and arranged in the convergent beam path immediately upstream of the image plane have a strong influence on aberration correction. Particularly, higher orders of spherical aberration and coma are positively influenced. There is only one negative lens 991 arranged in the third objective part. The biconvex negative lens 991 defines a shallow waist in the beam path of the third objective part. All lenses downstream of negative lens 991 are positive lenses. Avoiding negative lenses in the region of increasing and large beam diameters of the third objective part allows to keep the beam diameter small, thus decreasing the demand of optical material used for the lenses of the third objective part.

Both concave mirrors 921, 922 have spherical mirror surfaces, thus facilitating manufacturing and improving optical performance. If D is a maximum diameter of a lens element of the third objective part in [mm] and $c_1$ and $c_2$ are the curvatures of the concave mirrors 921, 922 in [mm$^{-1}$], then the following condition is fulfilled by the embodiment of FIG. 21: $1 < D/(|c_1|+|c_2|) \cdot 10^{-4} < 6$. The curvature c is the reciprocal of the curvature radius at the vertex. If this condition is fulfilled, then a good balance between Petzval correction and positive power in the third objective part can be obtained.

Figure 22:
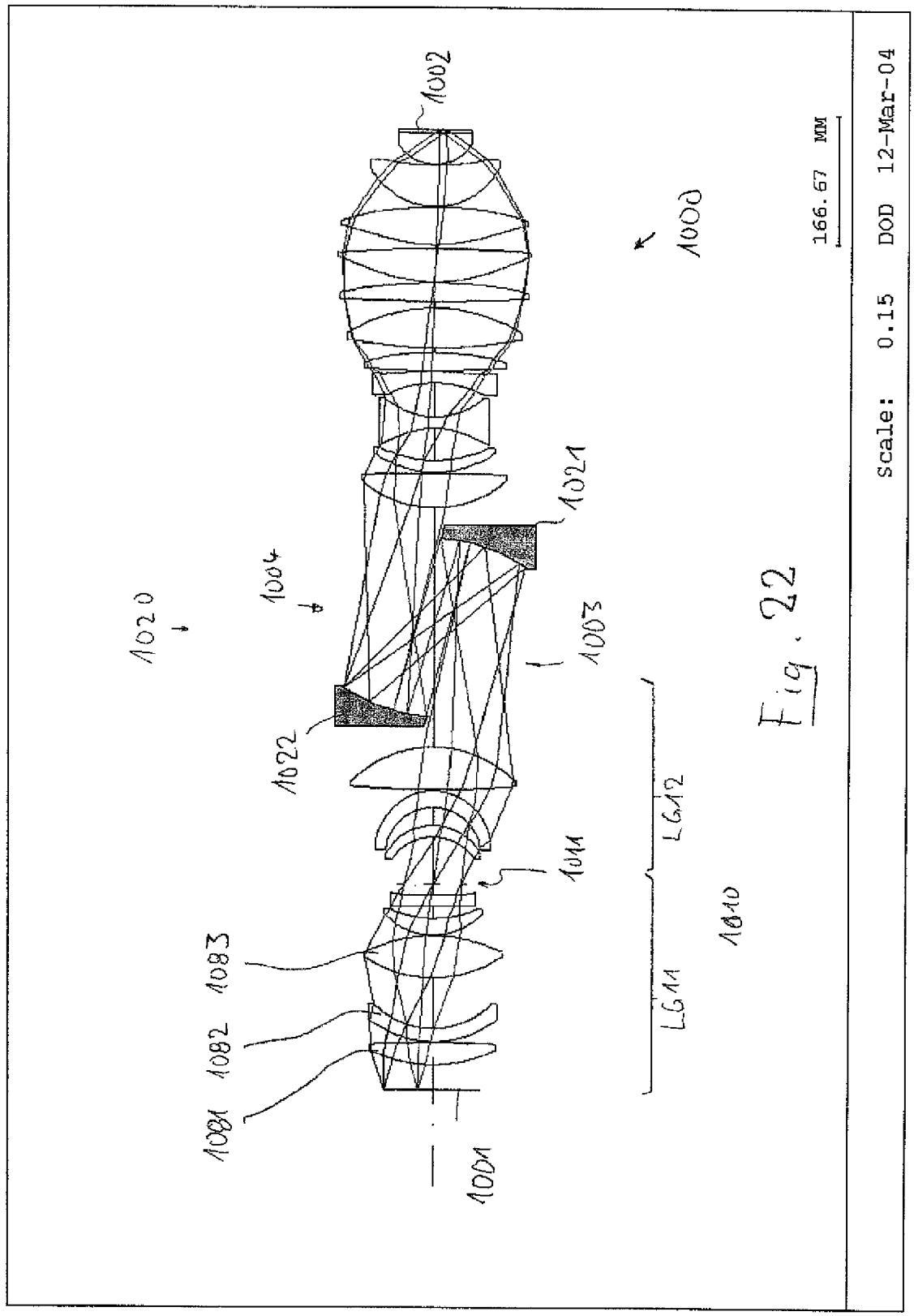
FIG. 22 shows a lens section of another embodiment of a projection objective according to the invention having similar, shallow concave mirrors.

FIG. 22 shows a variant of a projection objective 1000 having a general construction similar to that of the embodiment shown in FIG. 4, i.e. having a second objective part 1020 consisting of two concave mirrors 1021, 1022 and having no refractive optical elements. Reference numerals for similar features/feature groups are similar, increased by 800. The specification is given in tables 22 and 22A. The first, dioptric objective part 1010 for creating the first intermediate image 1003 is subdivided into a first lens group LG11 between object plane and pupil plane 1011 and a second lens group LG12 between the pupil plane and the first intermediate image. The first lens group LG11 starts with the biconvex positive lens 1081, followed by a negative meniscus lens 1082 having an image side concave surface and a biconvex positive lens 1083. Particularly high incidence angles occur at the concave exit side of the negative meniscus lens 1082, which is arranged in a region where the light beam is slightly divergent. The high incidence angles have strong correcting influence. The sequence positive-negative-positive provided by lenses 1081, 1082, 1083 has been found to be useful. Therefore, it may be preferable if the first objective part creating the first intermediate image includes at least one concave surface facing the image, which is preferably included in a sequence of positive-negative-positive lenses.

Figure 23:
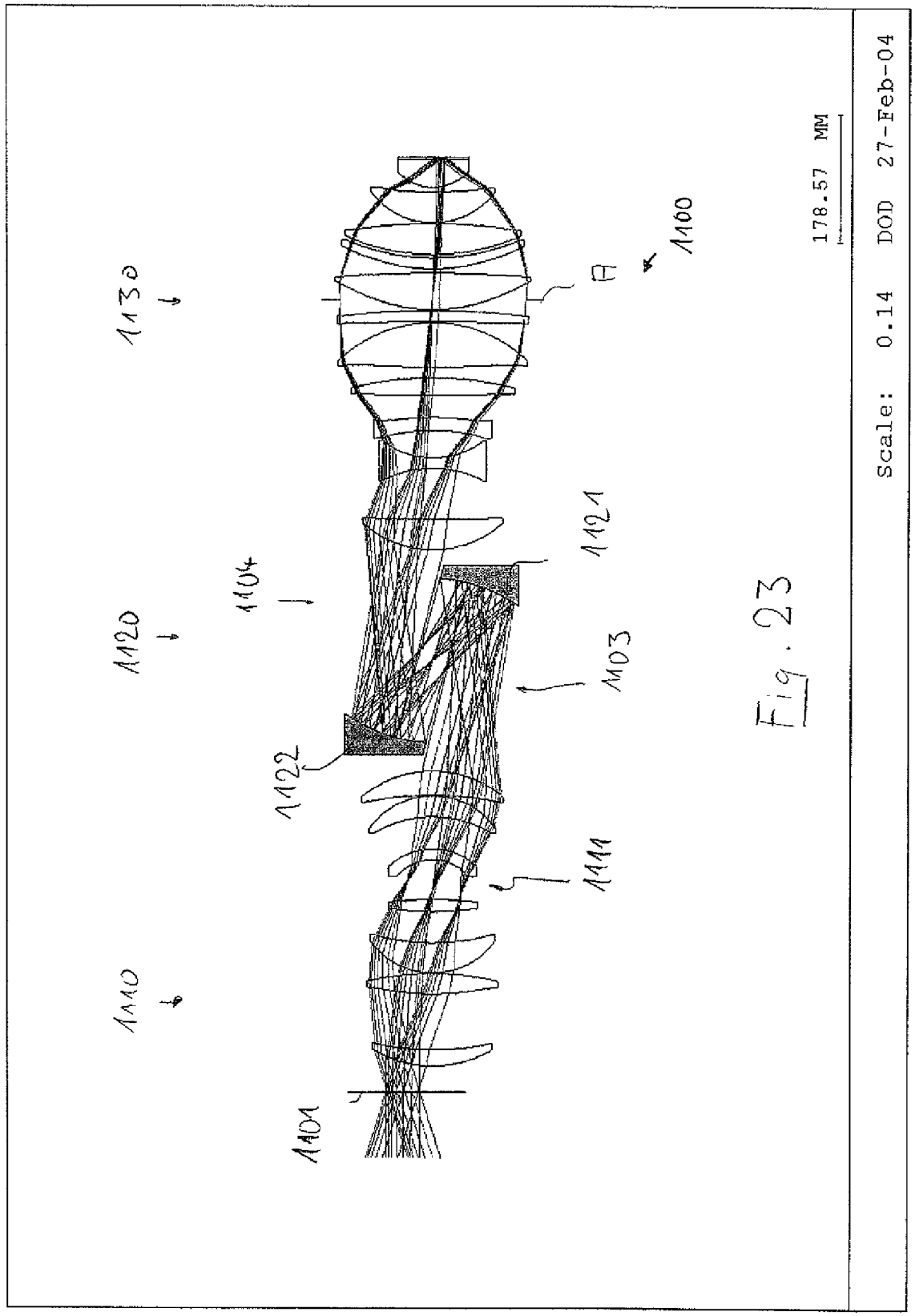
FIG. 23 shows a lens section of another embodiment of a projection objective according to the invention having similar, shallow concave mirrors.

FIG. 23 shows another embodiment of a projection objective 1100 generally designed in accordance of the principles explained in connection with the FIG. 4. The specification is given in tables 23 and 23A. The second objective part 1120 is purely reflective, thus requiring no transparent optical material. Some aspects regarding features facilitating manufacturing will now be explained in connection with this embodiment and with FIG. 24. They may, however, be implemented in other embodiments. Both concave mirrors 1121, 1122 have similar surfaces, which facilitates manufacturing and improves optical performance. Generally, the shape of a concave mirror has a strong influence on certain aberrations. Particularly, the image curvature (Petzval curvature) is influenced by the vertex curvature of the mirror. If an aspherical mirror surface is used, the basic data of the aspheric surface define certain field dependent aberrations, particularly the spherical aberration of the pupil, which is proportional to $y^4$, where is the beam height at the concave mirror. Both factors influencing the shape of the mirror surface are deeply rooted in the optical design and are dependent from one another. Particularly, the second factor regarding the type of asphere is strongly influenced by the first factor (basic curvature), since, for example, a strong curvature of the concave mirror will induce strong field dependent aberrations.

Figure 24:
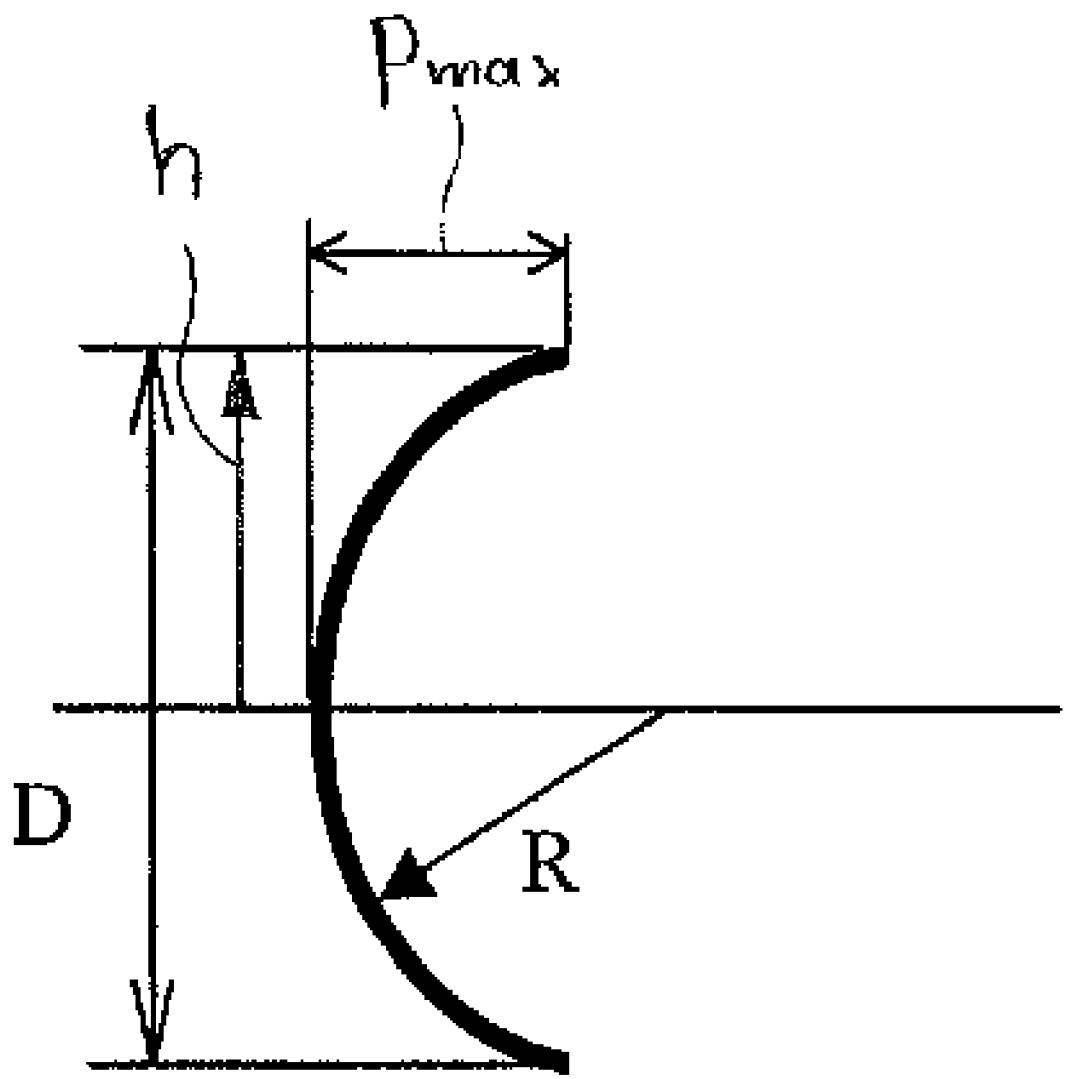
FIG. 24 shows a diagram for defining the plunging depth of a concave mirror.

Certain crucial factors influencing a good compromise between manufacturability and optical performance of concave mirrors have been identified. One disruptive factor resulting from manufacturing of a concave mirror is the depth up to which a tool must plunge into the material of the mirror substrate in order to create the concave mirror surface. This plunging depth is denoted "$p_{max}$" in connection with FIG. 24. The maximum sagitta or rising height at the edge of a mirror may be defined as the axial separation of a plane normal to the optical axis and touching the edge of the concave mirror to a plane parallel thereto and touching the vertex of the concave mirror. As schematically shown in FIG. 24, $p_{max}$ is dependent on the curvature radius R of the aspherical mirror surface, and the diameter D of the aspherical mirror. In a first approximation (for aspherical form) $p_{max}$ is given by: $p_{max}=R-(R^2-D^2/4)^{0.5}$. Since the basic shape of the mirror cannot be altered without strongly influencing the optical effect, only the diameter of the mirror surface can be used as a free parameter to influence manufacturability. When considering manufacturing, the grinding of the mirror substrate necessary to define the basic shape of the mirror substrate prior to polishing is particularly addressed. It has been found that it is preferable if the condition $D \leqq 1.3R$ is fulfilled and that it may be more preferable if the condition $D \leqq 1.2R$ is fulfilled such that also the condition: $p_{max}<0.22R$ is fulfilled. Manufacturing is also facilitated if the radii of curvature at the vertex of the curved mirror surfaces for two mirrors are as similar as possible. If R1 is the vertex radius of curvature of a first mirror and R2 is the vertex radius of curvature of the second mirror, it is preferable that the following condition is fulfilled: $0.8<|R1/R2|<1.2$. In the embodiment shown in FIG. 23 this condition and the two following conditions are fulfilled: $p_{max} \leqq 0.22R$ and $D \leqq 1.3R$. It may be sufficient if, in addition to the condition regarding the relation of curvature radii one of the latter conditions is fulfilled.

In the embodiment shown in FIG. 23 the curvatures of the mirrors 1121, 1122 are almost identical (curvature radii differ within less than 1%) and the aspheric shapes are almost identical. The mirrors 1121, 1122 are the only optical elements of the second objective part, thus making this part a catoptic part. The maximum diameter of optical elements of the second objective part 1120 is smaller or almost equal to the maximum diameter of lenses in the third objective part. This facilitates implementation of the axial symmetric projection objective into a wafer stepper or a wafer scanner. Although the aperture stop A is provided in the third objective part, it may also be provided in the first objective part in the vicinity of the pupil surface 1111 thereof.

In FIG. 25 another embodiment of a projection objective 1200 is shown. FIG. 26 shows a detailed view of a section between the object plane 1201 and the second intermediate image 1204 which is the object of a purely refractive objective part 1230 for imaging the second intermediate image onto the image plane 1290 at a reduced scale of about 1:4.

The entire projection objective 1200 designed to image an object disposed in the object plane 1201 onto the image plane 1202 at a reduced scale consists of three objective parts 1210, 1220, 1230, each designed to image a field plane upstream of the objective part into field plane downstream of the objective part. The first objective part 1210 consists of four consecutive lenses 1211, 1212, 1213 and 1214 followed by the first concave mirror 1221 immediately upstream of the first intermediate image 1203. Therefore, the first objective part is catadioptric. The second objective part 1220 is also catadioptric, including the second concave mirror 1222 immediately downstream of the first intermediate image 1203 and positive lenses 1226, 1227, 1228, 1229, all effective for refocusing the first intermediate image 1203 into the second intermediate image 1204. The third objective part 1230 is purely refractive and includes the freely accessible aperture stop A of the system.

In contrast to the embodiments shown above, only the first intermediate image 1203 is positioned in the intermirror space defined by the concave mirrors 1221, 1222, whereas the second intermediate image 1204 lies outside of this intermirror space. The mirror group defined by the two concave mirrors 1221, 1222 facing each other has a mirror group entry and a mirror group exit. At the mirror group entry positioned geometrically next to the edge of the second mirror 1222 facing the optical axis 1205 radiation coming from the object side enters the intermirror space and at the mirror group exit positioned geometrically next to the edge of the first mirror 1221 facing the optical axis the radiation exits the intermirror space after the reflections on the concave mirrors. It is a characterizing feature of this embodiment that a first pupil surface PS1 of the projection objective lies in the vicinity of the mirror group entry and a second pupil surface PS2 lies in the vicinity of the mirror group exit. In contrast, in most other embodiments, for example those shown in FIGS. 1 to 4, 7 to 14, the entry of the mirror group and the exit of the mirror group are optically close to the intermediate images, which are field surfaces of the projection lens. Also, in the embodiments mentioned above the radiation reflected from the first concave mirror crosses the optical axis prior to impinging on the second concave mirror which effectively leaves the footprints of the radiation on the reflecting surfaces of the concave mirrors at opposite sides of the optical axis. In contrast, in the embodiment shown in FIGS. 25 and 26, first and second concave mirrors 1221, 1222 are disposed on the same side of the optical axis. Due to this difference the optical path within the space defined by the concave mirrors has almost point symmetry with respect to a symmetry point arranged midways between the vertices of the concave mirrors in the embodiments mentioned above, whereas the optical path is almost mirror-symmetric with respect to a mirror plane perpendicular to the optical axis and arranged midways between vertices of the concave mirrors in the embodiment of FIGS. 25, 26.

Optically, embodiments designed essentially according to the principles of the embodiment shown in FIGS. 25, 26 can be advantageous if it is desired to influence field aberrations by the action of lenses close to field planes since one of the field planes between object plane 1201 and image plane 1202, namely the field surface of the second intermediate image 1204 is arranged freely accessible at a distance outside the intermirror space defined by the concave mirrors 1221, 1222. As shown in FIG. 25, two field lenses 1229, 1235 are arranged close to the second intermediate image 1204 immediately upstream (1229) and immediately downstream (1235) of this intermediate image, thus forming a field lens group for aberration correction.

The first and second objective parts 1210, 1220 are effective to form an intermediate image 1204 at a distance from the mirror group defined by the concave mirrors 1221, 1222 geometrically behind this mirror group. Since a pupil surface PS2 is arranged in the vicinity of the exit of the mirror group, a group of lenses 1226 to 1228 acting in combination as a Fourier-transforming lens group can be used to position and define the characteristics of the intermediate image 1204, which then is reimaged on the image plane 1202 by the third objective part 1230. These properties make the sub-system formed by the first and second objective part 1210, 1220 useful as a relay system for linking light paths of optical systems ahead and downstream of the relay system together. Due to the action of the concave mirrors 1221, 1222 of the mirror group this relay system can be designed to have strong influence on the image curvature compensating at least partly the opposite influence of positive lenses upstream and downstream of the mirror group.

Figure 27:
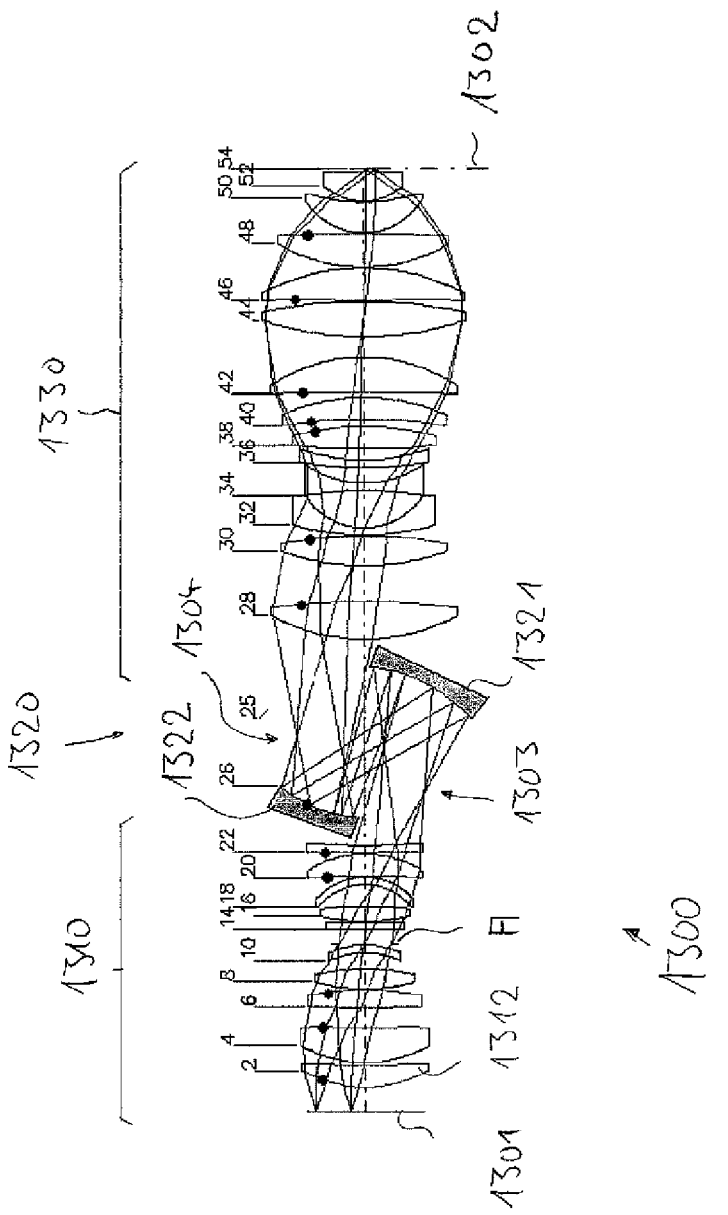
FIG. 27 shows a lens section of an embodiment of the invention, where a catoptric second objective part has two concave mirrors having exactly the same aspheric shape.

FIG. 27 shows a variant of a projection objective 1300 having a general construction similar to that of the embodiment shown in FIG. 4, i.e. having a second, catoptric objective part 1320 consisting of two concave mirrors 1321, 1322 and having no refractive optical element. Reference numerals for similar features/feature groups are similar as in FIG. 4, increased by 1100. The specification is given in tables 27, 27A.

The first, dioptric objective part 1310 for creating the first intermediate image 1303 has a first lens element 1312 immediately following the object surface 1301, where the entrance surface of this first lens element is aspheric and convex to the object surface and an aperture stop A is provided in the first objective part in between lens groups each having positive refractive power. The concave mirrors 1321, 1322 of the catoptric second objective part 1320 each have an aspheric mirror surface. It is a characterizing feature of this design that the aspheric mirror surfaces of mirrors 1321, 1322 have identical aspheric shape. This allows to use exactly the same optical testing device for measuring the aspheric shape of both concave mirrors in the manufacturing process. As it can be seen from tables 27, 27A the radii of the concave mirrors (describing the basic shape of the mirror surface) and the aspheric constants (describing the aspherical deviation from the basic shape of surfaces 25, 26) are identical. In other embodiments the basic shape and the aspheric constants may vary slightly between the two concave mirror. Even in that case significant improvements relating to costs of the manufacturing process can be obtained if the mirror surfaces are shaped similar such that the same measuring optics can be used for testing both mirror surfaces.

Figure 28:
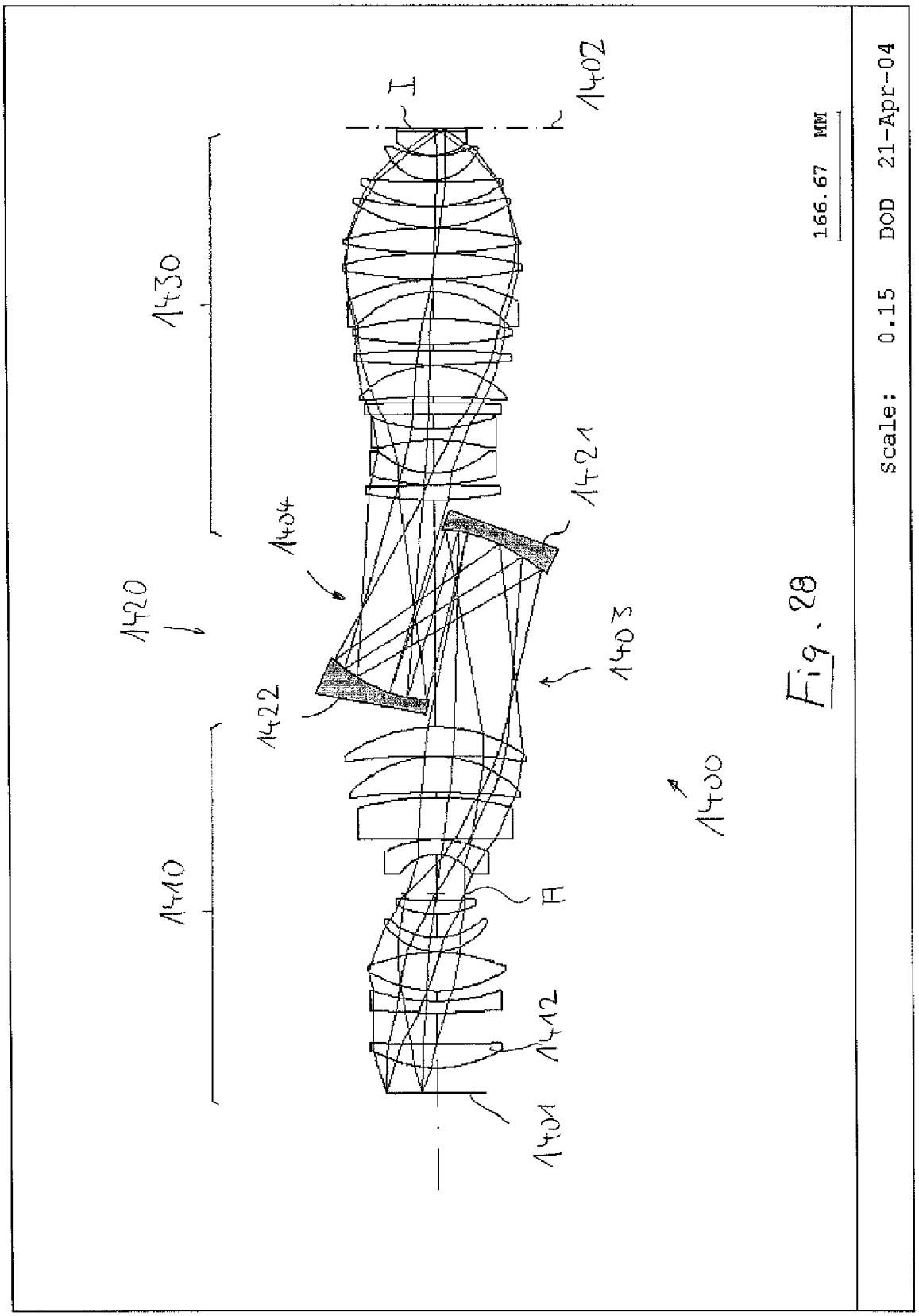
FIG. 28 show a lens section of an embodiment having a catoptric second objective part, where the first concave mirror is designed as a parabolic mirror.

The projection objective 1400, a lens section of which is shown in FIG. 28, has a general construction similar to that on the embodiment shown in FIG. 4. Therefore, reference numerals for similar features/feature groups are similar, increasing by 1200. The specification is given in tables 28 and 28A.

A first, dioptric objective part 1410 including an aperture stop A is designed for creating a first intermediate image 1403. The second, catoptric (purely reflective) objective part 1420 consists of a first concave mirror 1421 and a second concave mirror 1422 which, in combination, create the second intermediate image 1404 from the first intermediate image 1403. A dioptric third objective part 1430 is designed for imaging the second intermediate image 1404 onto the image plane 1402, whereby, during operation, a thin layer of immersion fluid I (water) is transited by the radiation. When optimizing the design, particular care was taken to facilitate optical testing of the aspheric mirror surfaces during mirror manufacturing. For this purpose, the mirror surface of the first concave mirror 1421 has a parabolic shape (compare table 28A, surface 23).

The following considerations are provided to facilitate understanding why a parabolic shape of a mirror surface facilitates testing. In a general case, optical testing of an aspherical mirror surface requires use of specifically adapted optical testing system designed to create testing radiation having a distorted wave front which is adapted to the desired aspheric shape of the mirror surface such that the local incidence angles of the test wave onto the aspheric surface are rectangular for each location of the aspheric surface. Optical testing devices using aplanatic optical systems, or compensation systems (K-systems) or computer generated holograms (CGH) or a combination thereof for shaping the distorted wave front are usually employed for this purpose. Since the construction of specifically designed testing optics for each aspherical shape is expensive, alternative methods are desired.

An aspheric mirror having a parabolic shape, in contrast, can be tested with simple testing equipment. For further explanation, it is considered that a purely conical, rotational symmetric surface shape can be described by the following equation:

$$p = \frac{ch^2}{1 + \sqrt{1 - c(k+1)h^2}}$$

Here, p is the axial coordinate of a surface point, k is a conical constant, c is the curvature (i.e. the reciprocal (1/r) of radius r) of the surface at the vertex (where the optical axis intersects the mirror surface) and h is the height (measured perpendicular to the optical axis). Using this equation, different conical, rotational symmetric surface shapes can be generated depending on the value of the conical constant k. For example, a spherical shape corresponds to k=0, a value k=−1 describes a parabola, values k<−1 describe a hyperbola and values −1≦k≦0 describe an elliptic shape. All these shapes have in common that an object point arranged in a specific position (depending on the shape of the surface) will be imaged without aberrations (stigmatic imaging). At least one non-spherical conical mirror may therefore be useful in an embodiment of the invention or in other projection objectives having concave mirrors. Considering the requirements of mirror testing, a parabolic shape (k=−1) is particularly useful since the object point, which will be imaged without spherical aberrations, is positioned at infinity. With other words: light from a test beam or parallel light impinging parallel to the optical axis on a parabolic surface will be focused in one and only one focal point by the parabolic mirror. This is advantageous since no special arrangements for diverging or converging a beam bundle of a test wave are necessary. The test wave has a planar wave front.

Figure 29:
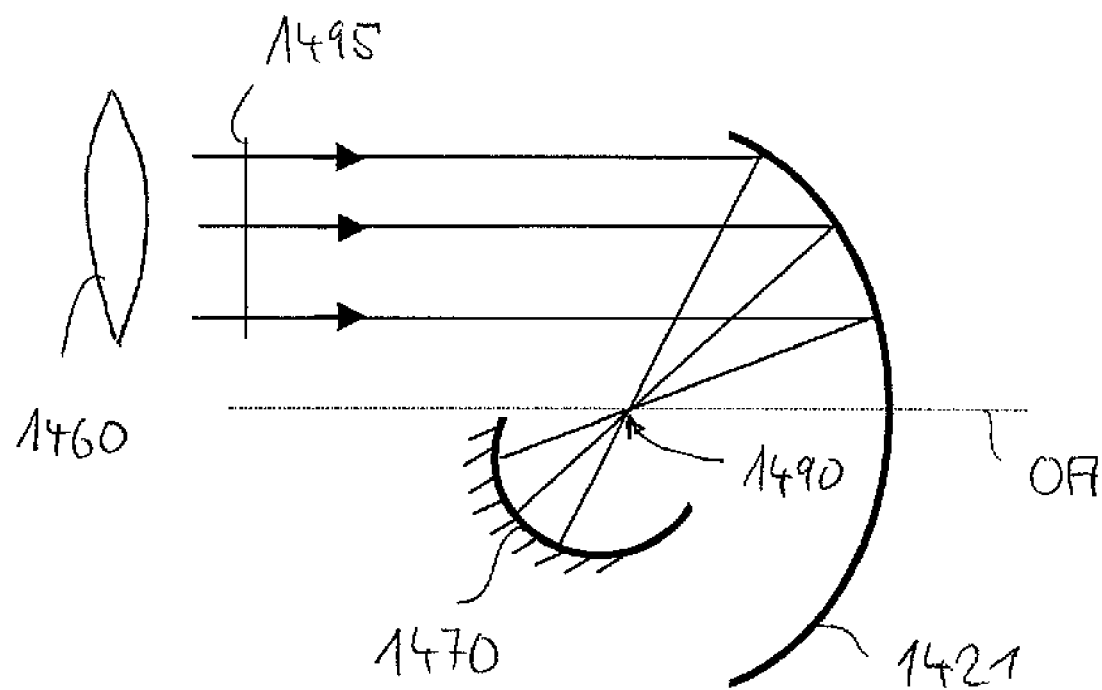
FIG. 29 is a schematic diagram showing a testing device for optically testing a parabolic mirror.

A possible testing arrangement is schematically shown in FIG. 29. Here, the parabolic mirror surface 1421 is shown together with the optical axis OA defined by that mirror surface. The testing equipment includes a testing optical system 1460 designed for creating a parallel test light beam parallel to the optical axis OA and incident on the parabolic mirror surface. The testing arrangement further includes a spherical mirror 1470 shaped and arranged with respect to the desired shape of the parabolic mirror 1421 such that the center of curvature 1490 of the spherical mirror 1470 coincides with the focal point of the parabolic mirror. In this arrangement, a test wave 1495 having a plane wave front provided by the optics 1460 and incident on the parabolic mirror surface 1421 is first converged by the parabolic mirror into the focal point 1490 of the parabolic mirror prior to impinging on the spherical mirror 1470. The spherical mirror 1470 reflects the test wave back along the same path into the test optics 1460. Deviations in path length between a planar reference wave and the wave reflected back from the parabolic mirror can be used to characterize the parabolic shape of the parabolic mirror.

The projection objective 1400 is telecentric on the object side and on the image side. One feature contributing to telecentricity on the object side is the particular convex shape of the entrance side of the first lens element (positive meniscus 1412) immediately following the object plane. Aspheric surfaces on the first two lenses on the object side contribute to telecentricity. The telecentric beam is essentially free of field zone errors on the object and image side, i.e. there is virtually no variation of telecentricity across the object or image field.

Figure 30:
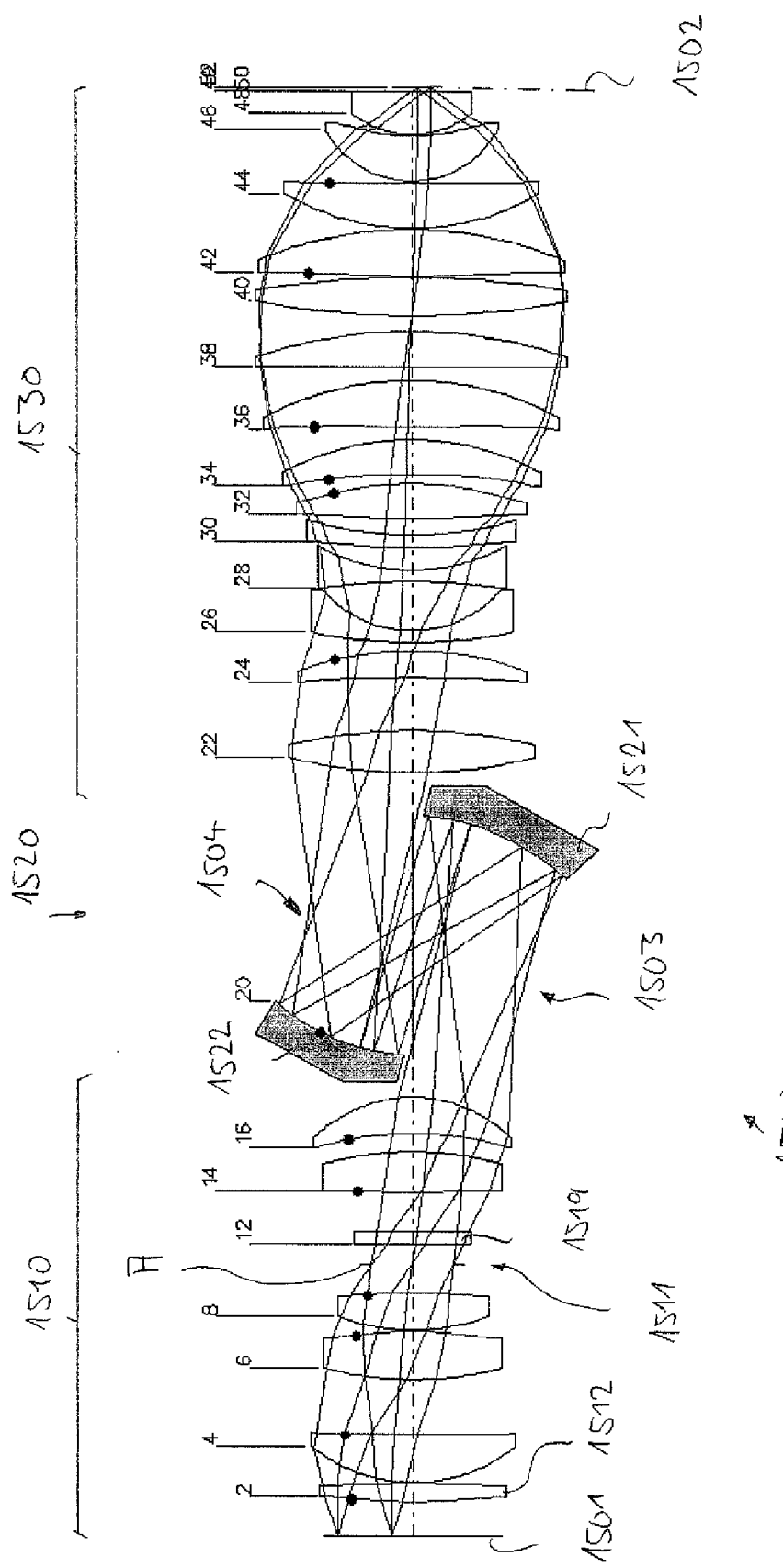
FIGS. 30-32 show embodiments of projection objectives having a compact first objective part having positive lenses only and different numbers of aspheric surfaces.
Figure 31:
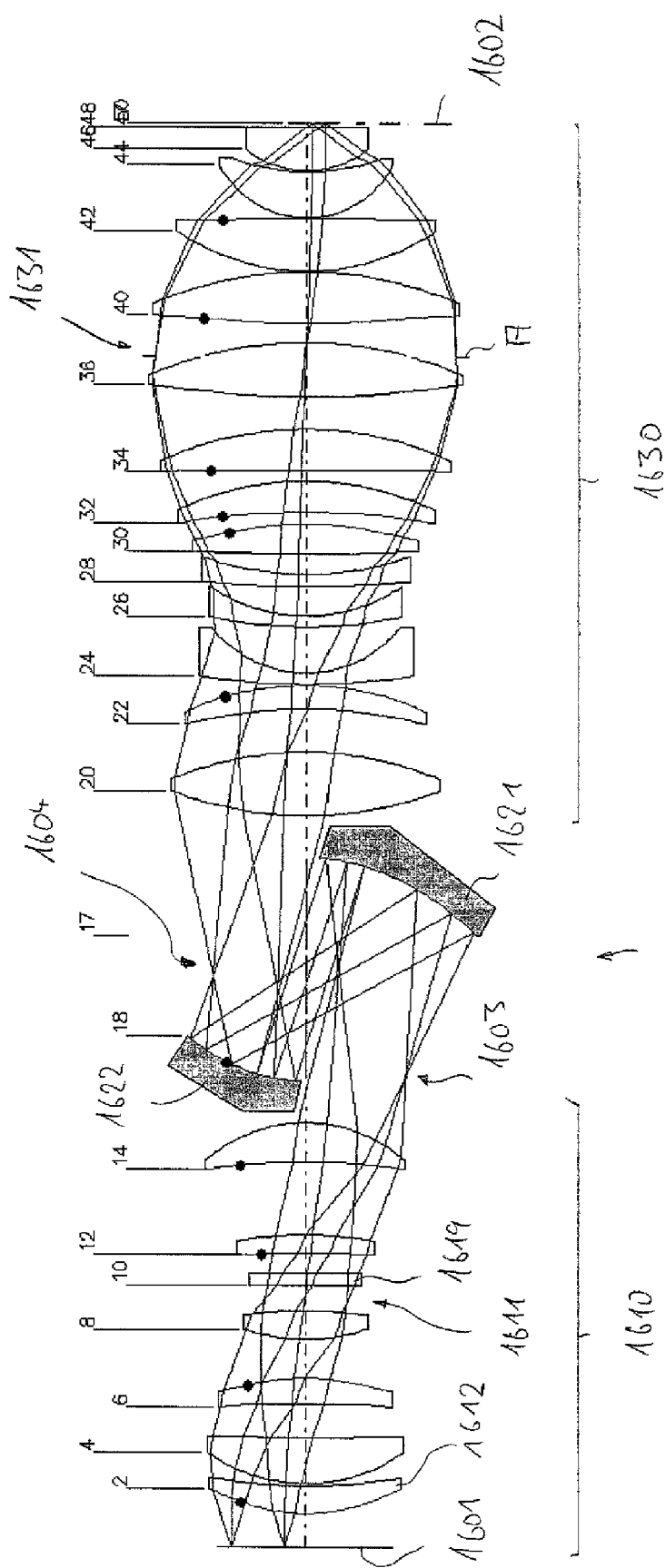
Figure 32:
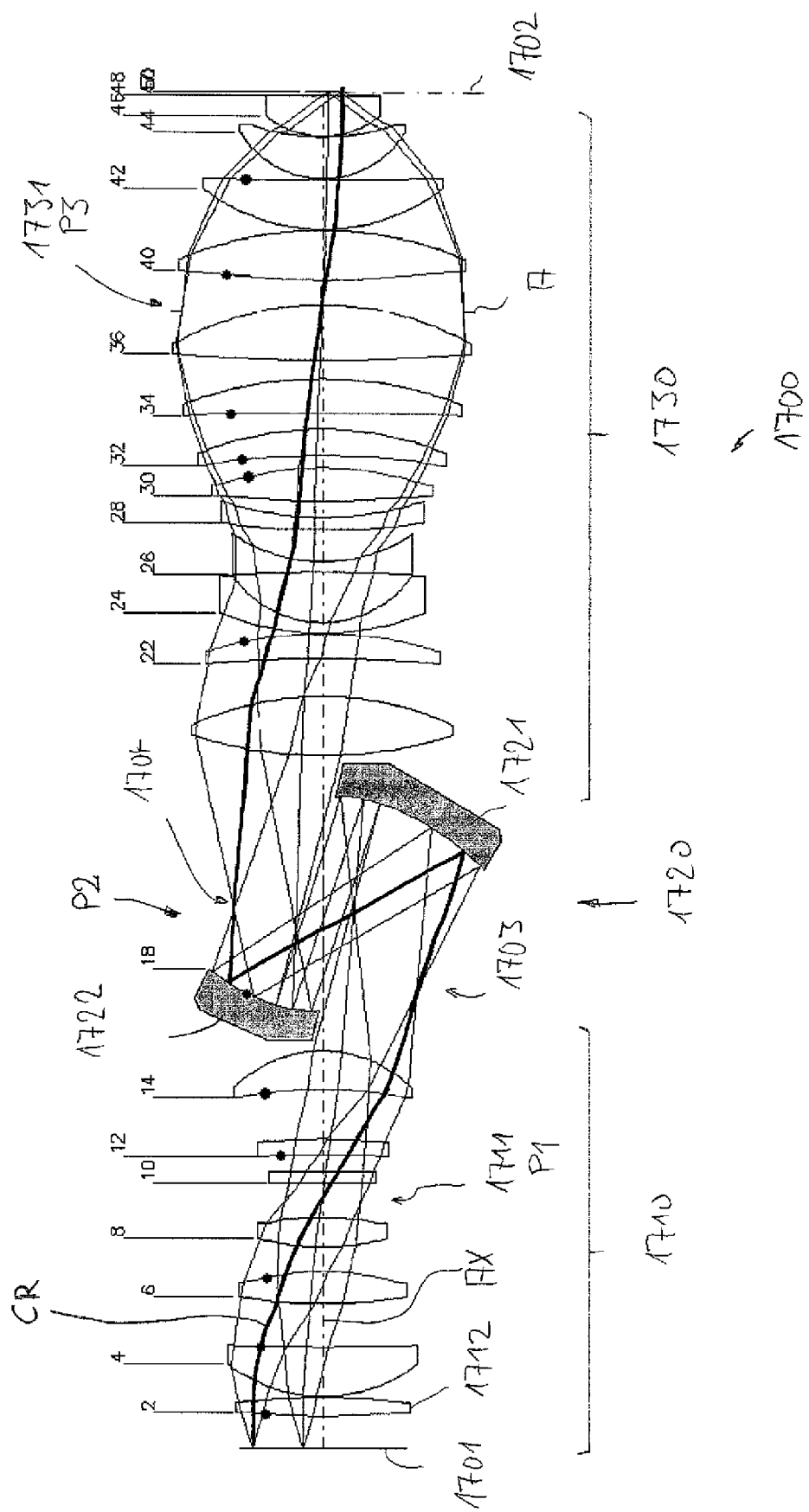

In FIGS. 30 to 32 three further embodiments of projection objectives 1500, 1600 and 1700 having a general construction similar to that shown in FIG. 4 having a catoptric second objective part are shown. Reference numerals for similar features/feature groups are similar, increased by 1300, 1400, 1500 respectively. For example, the object and image planes for projection objective 1500 are indicated as object plane 1501 and image plane 1502, respectively. Also, projection objective 1500 includes mirrors 1521 and 1522. The object and image planes for projection objective 1600 are indicated as object plane 1601 and image plane 1602, respectively. Also, projection objective 1600 includes mirrors 1621 and 1622. The object and image planes for projection objective 1700 are indicated as object plane 1701 and image plane 1702, respectively. Also, projection objective 1700 includes mirrors 1721 and 1722. The specifications are given in tables 30, 30A, 31, 31A and 32, 32A. When designing these embodiments, special emphasis was placed on optimization of material consumption and installation space required for the first, dioptric objective part 1510, 1610, 1710 serving as a relay system for imaging the object field into the first intermediate image.

As a common feature to all embodiments of FIGS. 30, 31 and 32 the first objective part has only six lens elements, i.e. transparent optical elements having considerable refractive power. Only positive lenses are used, thereby creating first objective parts with strong converging power in an axially short objective part having relatively small maximum diameter. In all embodiments, a plane parallel plate 1519, 1619, 1719 is positioned immediately following the respective first pupil plane 1511, 1611, 1711 of the projection objective. One advantage of placing at least one essentially plane parallel plate near a pupil surface is that such plate can be aspherized to correct for aberrations introduced by manufacturing or other effects (correction asphere). Such plate can be exchangeable. In the embodiment of FIG. 30, an aperture stop A is provided within the first objective part 1510 at the pupil position immediately ahead of the parallel plate 1519. In the embodiments of FIGS. 31 and 32 the aperture stop is arranged within the third objective part in the region of maximum beam diameter at the third pupil surface 1631, 1731 respectively. All embodiments mentioned here have only positive lenses between the image side pupil plane and the image plane, where the embodiment in FIG. 30 has five such positive lenses and the other embodiments (FIGS. 31, 32) have only four positive lenses between the image side pupil surface and the image plane.

A comparative view of the first objective parts of the embodiments in FIGS. 30 to 32 reveals certain relations between the use of aspheric surfaces and the curvature of the entrance surface of the first lens element immediately following the objective plane. In the embodiment of FIG. 30, first lens element 1512 is a biconvex positive lens having a aspheric entrance surface facing the object plane, where this entrance surface is only slightly curved, with the radius of curvature exceeding 300 mm. Six aspheric surfaces (indicated by dots) are used. As evident from the rays crossing in the region of the first intermediate image 1503, coma is one prominent imaging error in the first intermediate image 1503. This error is compensated by the design of the optical surfaces downstream of the first intermediate image. In contrast, in the embodiment shown in FIG. 31 the aspheric entrance surface of the first lens element (positive meniscus 1612) has a relatively strong convex curvature having a radius of curvature below 300 mm (R≈154 mm in this case). Only four aspheric surfaces are employed in the first objective part 1610. The aspheric surfaces are adapted to the optical effect of the curved entrance surface such that the first intermediate image 1603 is essentially free of coma. This indicates a trend that a strong convex curvature of the entrance side is useful for obtaining a good quality first intermediate image with a small number of aspherical surfaces. In the first objective part 1710 of the embodiment shown in FIG. 32 an intermediate number of five aspheric surfaces is used in combination with an entrance surface of the first element (biconvex lens 1712) having moderate curvature (radius of curvature >300 mm). Providing an entry surface of the projection objective having no curvature (planar surface) or weak curvature (e.g. value of radius of curvature >500 nm or more) renders the objective relatively insensitive against pressure fluctuations of ambient pressure. As the number of aspheric surfaces is equal or less than the number of positive lenses in the first objective part of all three embodiments it can be seen that compact designs can be obtained when only positive lens elements are used and if a ratio between the number of lenses having refractive power and the number of aspheric surfaces is smaller than 1.6.

The embodiments of FIGS. 30 to 32 show that in the framework of a preferred design having a straight optical axis common to all objective parts and a catoptric second objective part it is possible to design the relay system on the entrance side of the objective (first objective part) with an axial length considerably smaller than the axial length of the third objective part. The axial length (measured between the object surface and the first intermediate image) may be less than 90% or less than 80% of the axial length of the third objective part (measured between the second intermediate image and the image plane). This indicates that the design can be used with various different positions of the second (catoptric or catadioptric) objective part between the refractive objective parts.

In the embodiments of FIGS. 30 to 32 the plano-convex lens closest to the image plane, i.e. the last lens of the objective, is made of calcium fluoride. Since this material is less sensitive to radiation induced density variations (particularly compaction) the service life time of the objective maybe increased when compared to objectives having last lenses made of fused silica. However, in immersion objectives designed for operating with water based immersion liquids last lens elements of calcium fluoride are problematic since calcium fluoride is soluble in water. Therefore, the life time of the system may be reduced. Therefore, a protection layer protecting the last lens element from degradation caused by an aggressive immersion liquid may be useful. Suitable protection layers are described, for example, in U.S. provisional application 60/530,623 filed on Dec. 19, 2003 by the applicant, the disclosure of which is incorporated herein by reference. In the embodiments of FIGS. 30 to 32 a thin plane parallel plate of fused silica having a thickness of 0.3 mm is adhered to the planar exit surface of the plano-convex calcium fluoride lens by wringing. The plane parallel quartz glass plate providing the exit surface of the projection objective can be exchanged, if desired. Exchanging may be desired if the fused silica material is damaged due to high radiation load and/or if contamination and/or scratches on the fused silica protection plate occur.

Using the embodiment of FIG. 32 as an example further characteristic features of projection objectives according to the invention are explained. To this end, a chief ray CR running from an outermost field point (furthest away from the optical axis AX) essentially parallel to the optical axis and intersecting the optical axis at three consecutive pupil surface positions P1, P2, P3, each within one of the imaging objective parts 1710, 1720, 1730, is drawn in bold line to facilitate understanding. The angle included between the optical axis AX and the chief ray CR at each position along the chief ray is denoted "chief ray angle" in the following. The chief ray CR is divergent (chief ray height increasing in light propagation direction) at the position of the first intermediate image 1703. The increasing chief ray height after the first intermediate image corresponds to a negative chief ray intersection length of the first objective part 1710 downstream of the first intermediate image 1703. Here, the "chief ray intersection length" is defined as an axial length between the position of the intermediate image and the intersection point of a tangent to the chief ray CR at the intermediate image. The intersection point is positioned on the object side of the first intermediate image within the first objective part 1710. A negative chief ray intersection length relative to the first intermediate image corresponds to a negative (virtual) exit pupil of the first objective part. In contrast, a convergent chief ray exists at the second intermediate image 1704, corresponding to a positive chief ray intersection length downstream of the second intermediate image, which corresponds to a real exit pupil existing downstream of the second intermediate image. The real exit pupil of the second objective part 1720 relative to the second intermediate image 1704 is therefore positioned outside the third objective part 1730 (real exit pupil) beyond the image plane. The virtual exit pupil of the first objective part 1710 coincides with the real entrance pupil of the second objective part 1720. Given these conditions a projection objective is provided having at least two intermediate images, wherein one imaging objective part (here the catadioptric or catoptric second objective part disposed between a refractive first objective part and a refractive third objective part) performs a real image formation between the first and second intermediate images wherein, in addition, a real entrance pupil is imaged into a real exit pupil. Since there is an accessible pupil surface P1 within the refractive first objective part and another accessible pupil surface P3 within the third objective part projection objectives of this type have two potential positions for placing an aperture stop to effectively define the numerical aperture used in the imaging process. Here, the term "accessible" refers to a potential aperture stop position in a section of an objective part passed only once by the light running through the projection objective.

Further, projection objectives according to preferred embodiments discussed here, have three real pupil surfaces P1, P2, P3 between object plane and image plane, wherein the maximum chief ray angle in one of these pupil surfaces is smaller than the object side numerical aperture and wherein in addition at least one of the following conditions is fulfilled: (1) The maximum marginal ray height in two of the three pupil surfaces is at most 50% of the maximum marginal ray height in the third pupil surface (here the third pupil surface P3); (2) the maximum chief ray angle in two of the pupil surfaces is at least twice as large as a maximum chief ray angle in the third pupil surface; (3) a maximum chief ray angle in two of the pupil surfaces is at least twice as large as the object side numerical aperture.

In the following, a number of embodiments are shown which are optimized with respect to the aspect of manufacturing and testing the aspheric surfaces used therein. In order to demonstrate one of the problems arising during preparation of aspheric surfaces on lenses FIGS. 33(*a*) and 33(*b*) each show an enlarged partial view of a meridonal lens section through a conventional objective having a thin positive lens L having an aspherical entrance surface AS. In FIG. 33(*a*) a characteristic ray R1 running along the periphery of the transmitted beam bundle and a characteristic beam R2 running close to the optical axis of the optical system are shown to demonstrate the optical action of the aspherical lens L. In the conventional system CONV the aspheric surface AS is designed to act as a positive lens for rays passing close to the optical axis and as a negative lens for rays close to the periphery of the light beam (ray R1). In order to obtain this variation of refractive power in meridional direction the aspheric surface has a positive curvature (C>0) in the area around the optical axis and a negative curvature (C<0) in the peripheral region where ray R1 passes. An inflection point IP characterized by a local curvature C=0 is positioned between the convex section (around the optical axis) and the concave section (at the periphery). Although the local change of the sense of curvature obtained this way may be desirable from an optical point of view, inflection points are critical when the surface finishing is considered since a finishing tool (schematically shown as tool T in FIG. 33(*b*)) having a reasonable diameter for efficient surface polishing may have substantially non-uniform effect in the region around the inflection point. Therefore, sufficient optical quality of aspherical surfaces having inflection points is difficult to obtain.

Figure 34:
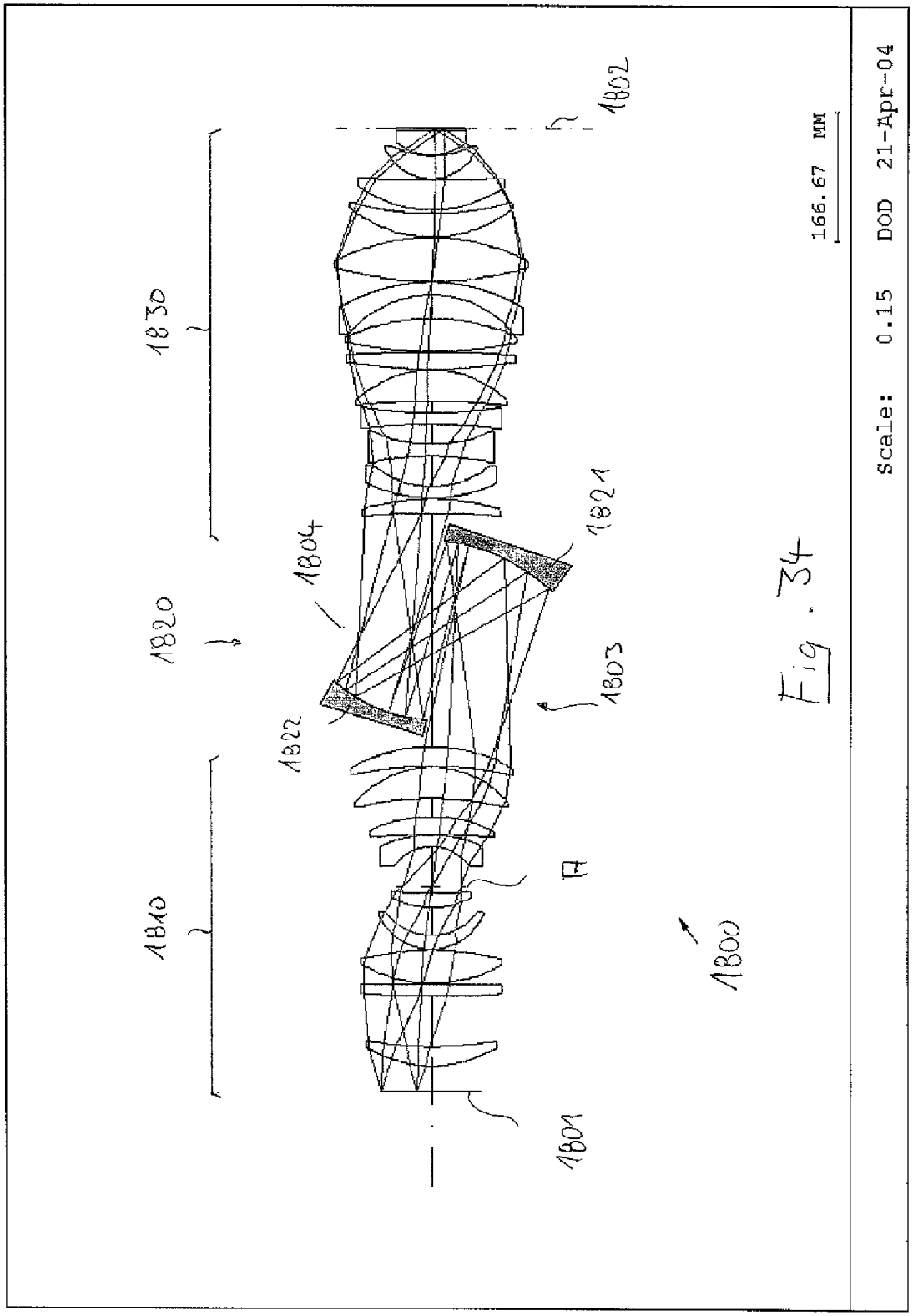
FIG. 34 shows a lens section of an embodiment where all aspheric surfaces are free of inflection points.

These problems can be avoided if the aspherical surface has no inflection point. The projection objective 1800 shown in FIG. 34 (specification given in tables 34 and 34A) is designed such that none of the aspherical surfaces has an inflection point.

Figure 35:
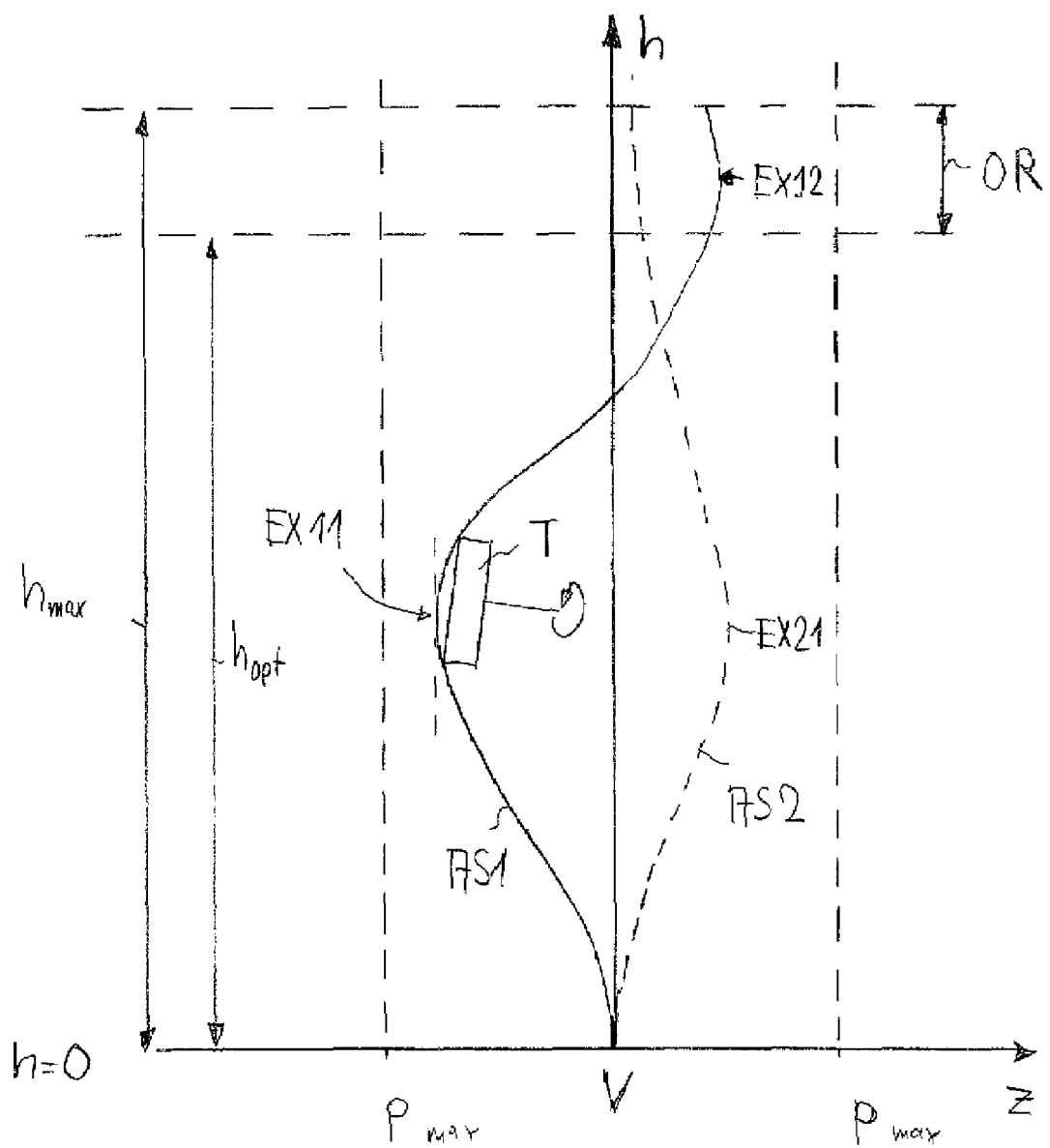
FIG. 35 is a schematic diagram showing aspheric surfaces having extremal points.

Another feature of aspheric surfaces identified by inventors as being critical from a manufacturing point of view is explained in connection with FIG. 35. The inventors have found that high optical quality of aspheric surfaces can be obtained if extremal points (minima or maxima) on the surface shape of an aspheric surface outside the optical axis are avoided or, if that is not possible, if extremal points are only used on aspheric surfaces having an essentially flat basic shape. In FIG. 35 the surface shapes of two aspheric surfaces AS1 and AS2 are shown schematically in terms of the function p(h), where p is measured parallel to the optical axis (z-direction) and h is the height of a surface point, where the height corresponds to the radial distance between a surface point and the optical axis. Parameter p, as used here, denotes the axial separation of a plane normal to the optical axis and intersecting the relevant surface point to a plane parallel thereto and touching the vertex V of the optical elements on the optical axis.

In that respect, an extremal point on an aspheric surface is characterized by the fact that the first derivative (characterizing the slope of the surface) given by $$\frac{dp}{dh} = 0$$

and that the second derivative $$\frac{d^2 p}{dh^2} \neq 0$$

(here the second derivative describes the surface curvature). Therefore, the first asphere AS1 in FIG. 35 has a first extremal point EX11 and a second extremal point EX12 having opposite signs of the second derivative, whereas the second asphere AS2 has only one extremal point EX21. In the definitions used here the vertex V of the optical surface (where h=0) is excluded from the considerations, since the vertex always is an extremal point of rotational symmetric aspheric surfaces considered here.

In FIG. 35, the surface shape is depicted schematically between the optical axis (h=0) and the outer periphery of an area of the surface, which is finished with a tool e.g. by polishing. This finishing area is characterized by a maximum height $h_{max}$. The maximum area optically used in operation is generally smaller such that the optically utilized radius is characterized by a maximum value $h_{opt} < h_{max}$. The area outside the optically used area between the edge of that area and the edge of the optical component is denoted overrun region OR. This area is normally used for mounting the optical elements. However, during manufacturing the overrun region has to be included into the consideration regarding an optimum surface shape.

In the following it will be explained why extremal points on aspheric surfaces may be critical if optimum surface quality is desired. To this end, a rotary polishing tool T having a reasonable sized diameter is operating in the region of the first extremal point EX11. Depending on the relative dimensions between the "valley" around the extremal point EX11 and the tool T the area at the bottom of the concave valley may not to be polished sufficiently enough since the tool "bridges" the critical bottom area most of the time. Therefore, the surface quality in the extremal point region may be different from the surface quality of regions farther a way from the critical extremal point. On the other hand, if the extremal point corresponds to a convex "hill" on the aspheric surface, this area may be polished stronger than the surrounding area, which may also lead to irregularities of the surface quality in the extremal point region. These problems can be avoided if the aspheric surface has no extremal points (with the exception of the necessary extremal point at the vertex). Since the tool T will generally extend beyond the maximum optically used area (at $h_{opt}$) when the peripheral region of the optically used area is treated, it is desirable that extremal points are avoided also in the edge region OR.

On the other hand, aspheric surfaces having extremal points may be desired to obtain certain variations of refractive power of an aspheric surface in meridonal direction. It has been found by the inventors that extremal points can be acceptable from a manufacturing point of view if the extremal point is present on an optical surface having an essentially flat basic shape. For example, the aspheric surface may be formed on a flat side of a plano convex or a plano concave lens or on a surface of a plane parallel plate. Preferably, the absolute value of the maximum z-variation ($p_{max}$) of such surfaces having an extremal point should not exceed 0.5 mm, more preferably should be smaller than 0.25 mm. The optical advantages of extremal points on aspheric surfaces can thus be obtained without significant irregularities in optical surface quality.

Figure 36:
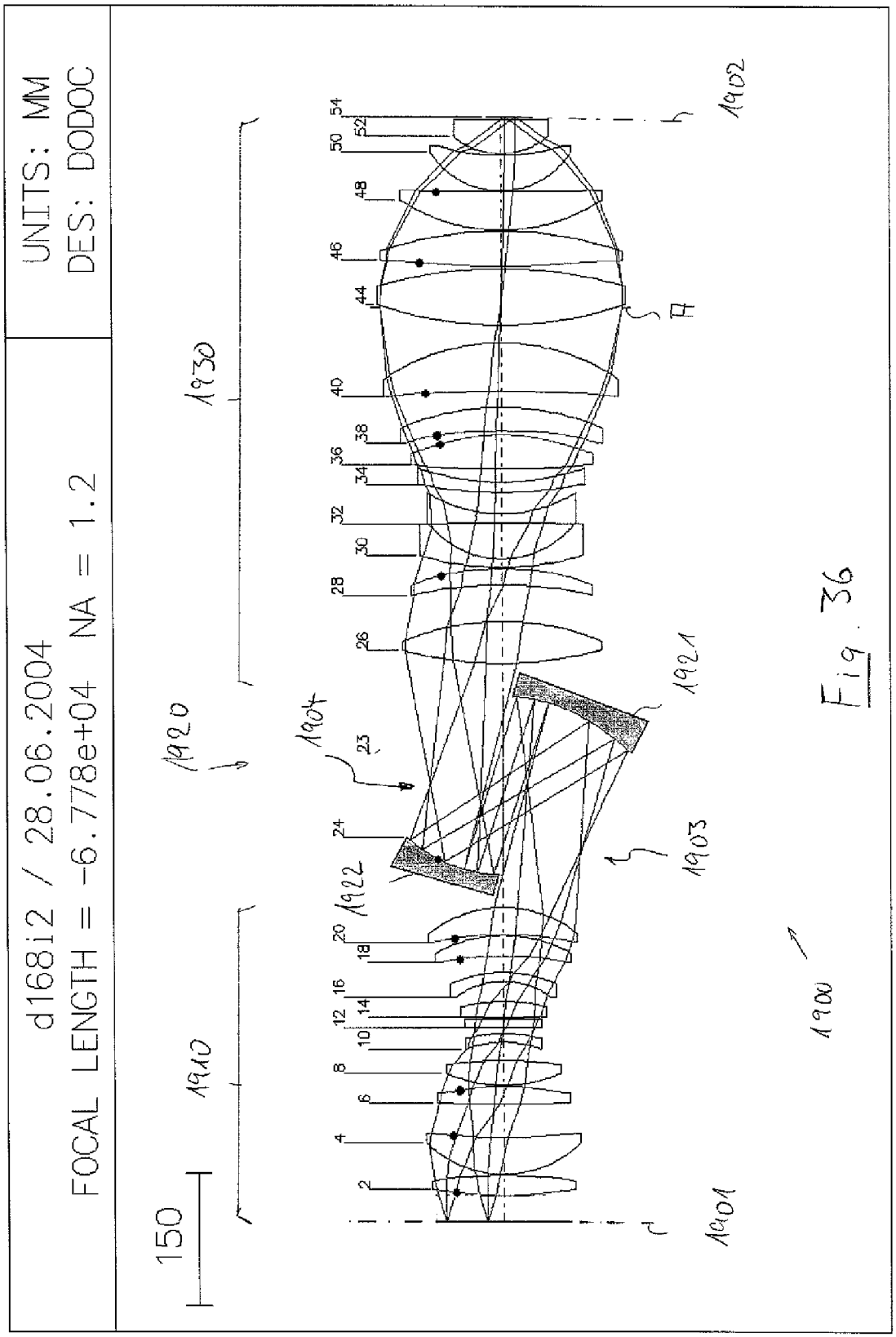
FIG. 36 shows a lens section of an embodiment of a projection objective where problems due to the existence of extremal points are avoided.

In FIG. 36 an embodiment of a projection objective 1900 is shown where all aspheric surfaces are free of extremal points outside the optical axis. The specification is given in tables 36 and 36A. If an aspherical surface with an extremal point should be desired, this should be formed on an optical surface having an essentially flat basic shape, typically having a long radius with |r|>2000 mm.

Figure 37:
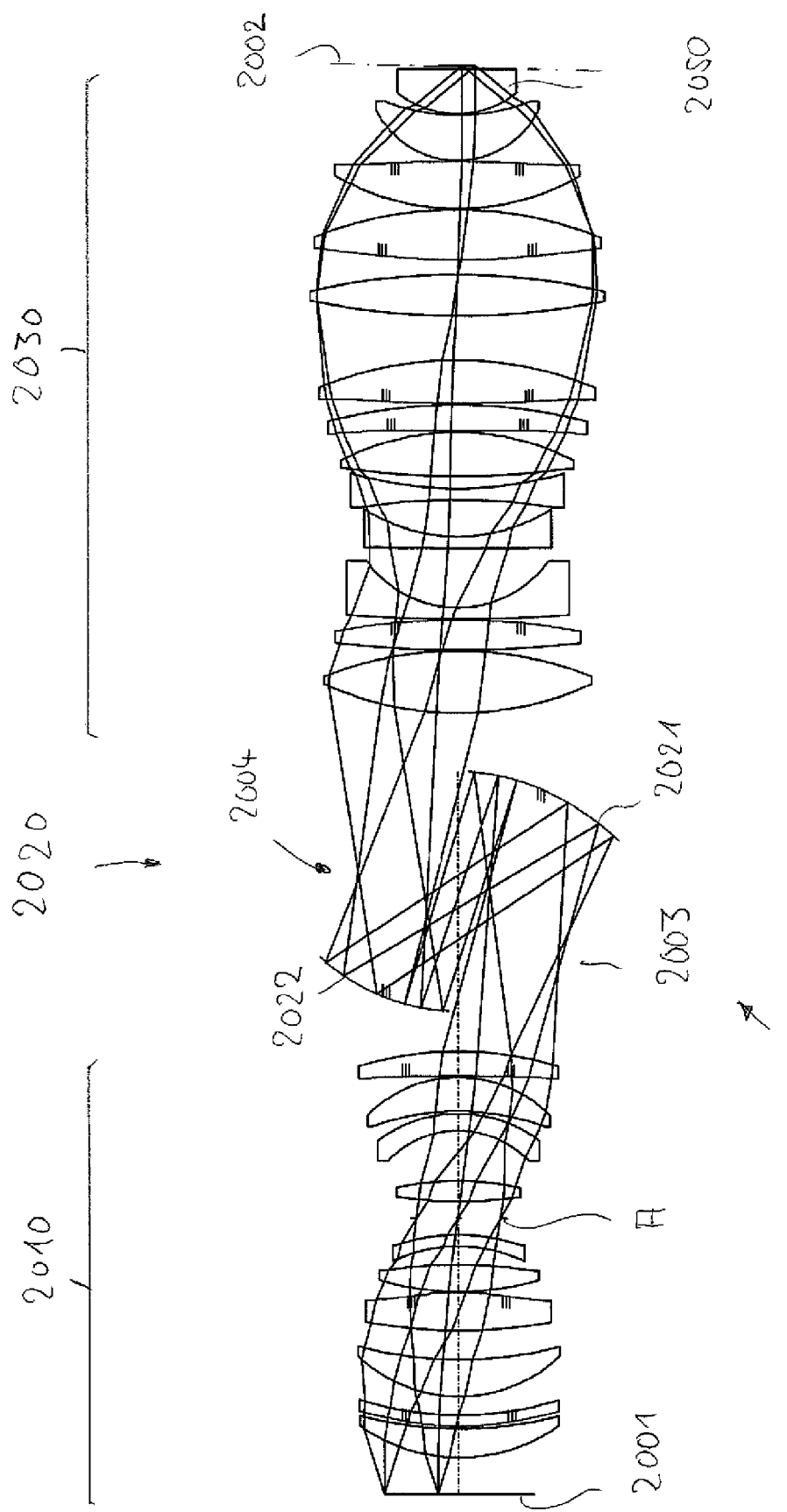
FIG. 37 shows a lens section of another embodiment having a small number of aspheric surfaces.
Figure 38:
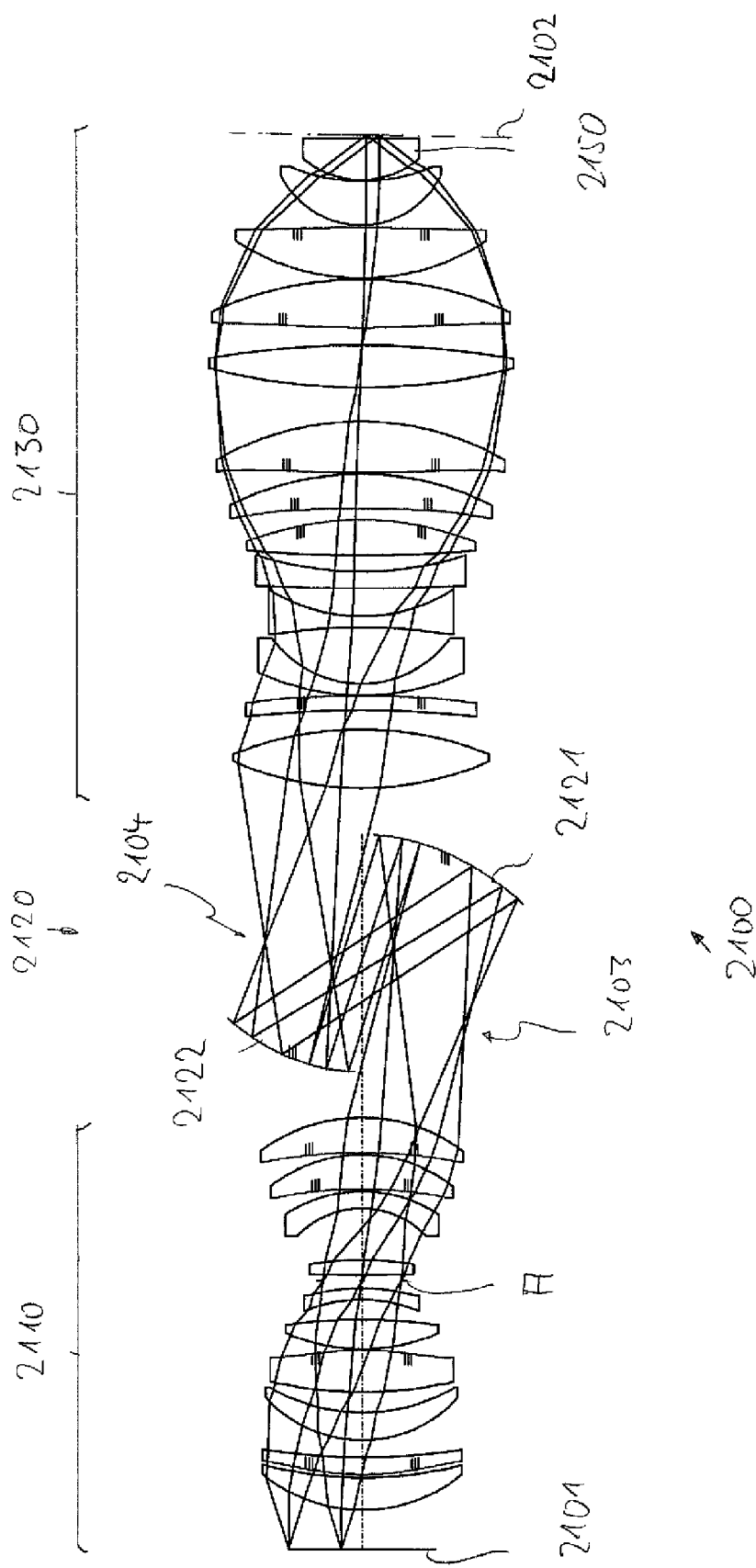
FIG. 38 shows a lens section of another embodiment having a small number of aspheric surfaces.

FIGS. 37 and 38 show embodiments of projection objectives 2000, 2100 designed according to the general construction given in FIG. 4, i.e. having a catoptric (purely reflective) second objective part 2020, 2120, respectively. Reference numerals for similar features/feature groups are similar, increased by 1800, 1900, respectively. The specifications are given in tables 37, 37A and 38, 38A. When designing these embodiments, special emphasis was placed on a balanced design having only few correcting means, such as aspheres, and a moderate number of lens elements. In addition, a balanced distribution of refractive power amongst different parts of the projection objective contributes to a harmonic beam deflection throughout the optical system. The harmonic general construction makes the designs less sensitive against maladjustment of single lens elements or lens groups and facilitates incorporation of manipulators for dynamically influencing the performance of the optical system, e.g. by moving of single lenses or lens groups in axial direction, perpendicular to the optical axis and/or by tilting.

In the embodiment of FIG. 37 only ten aspheric surfaces are used, which, according to the considerations given above, can be manufactured and tested in a relatively cost-effective way. The last optical element (plano-convex lens 2050 immediately ahead of the image plane 2002) is made of fused silica, having a thickness at the edge of the optical used area of about 23 mm. The overall wave front error is reduced to 1.6 mλ. All lenses are made of fused silica, about 60 kg blanc material of fused silica being necessary to make all lenses. In contrast, the plano-convex lens 2150 forming the last element of the embodiment of FIG. 38 is made of calcium fluoride, which material is less prone to radiation induced density variations (compaction and rarefaction). Using 12 aspheric surfaces which can be manufactured with moderate effort it is possible to obtain a performance characterized by a wave front error of 2.1 mλ. An overall blanc mass of about 63 kg fused silica and 1.5 kg calcium fluoride is used for this embodiment.

Figure 39:
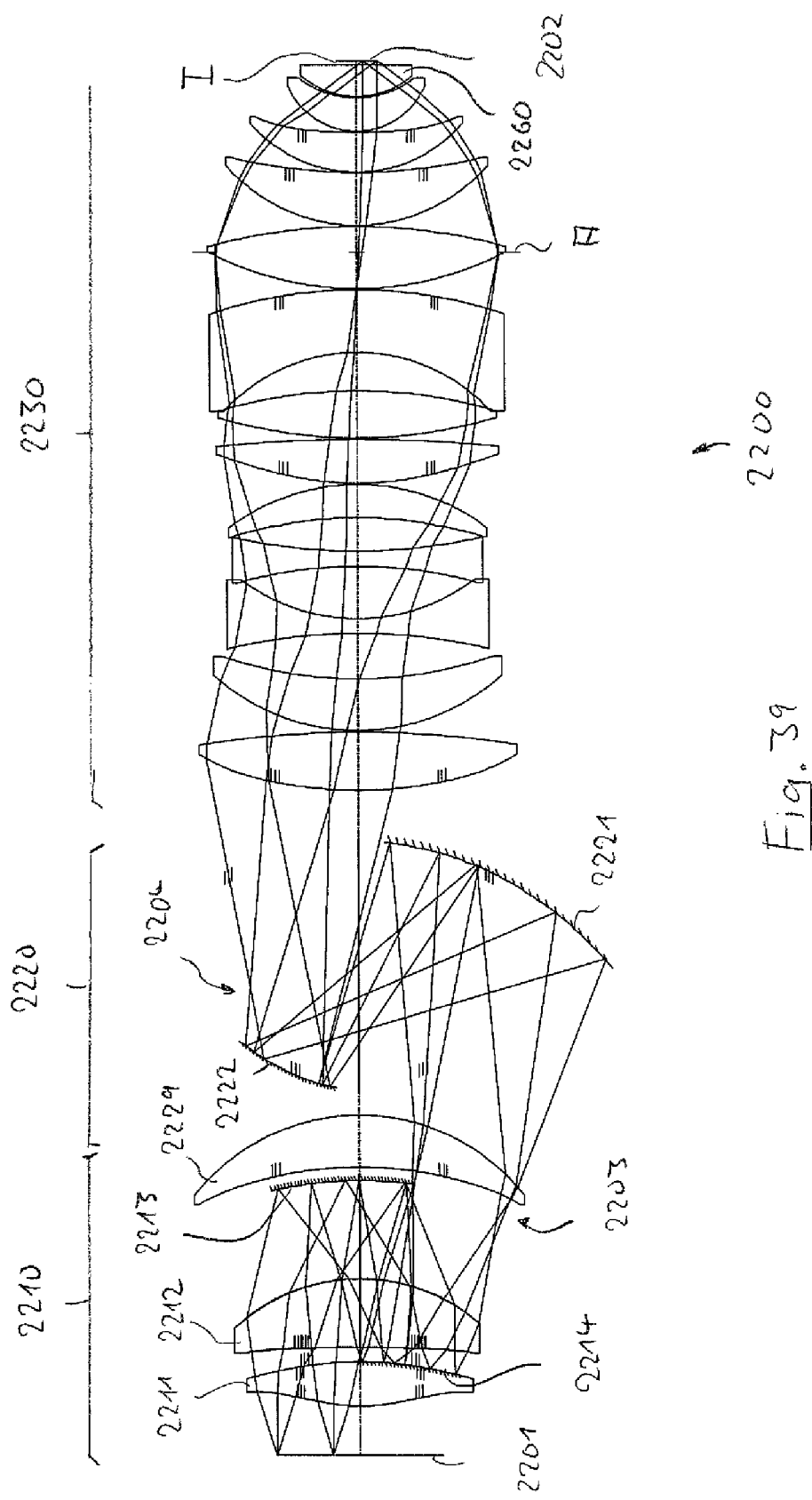
FIG. 39 shows a lens section of an embodiment having a catadioptric first objective part including two curved mirrors and a catadioptric second objective part having two concave mirrors.
Figure 40:
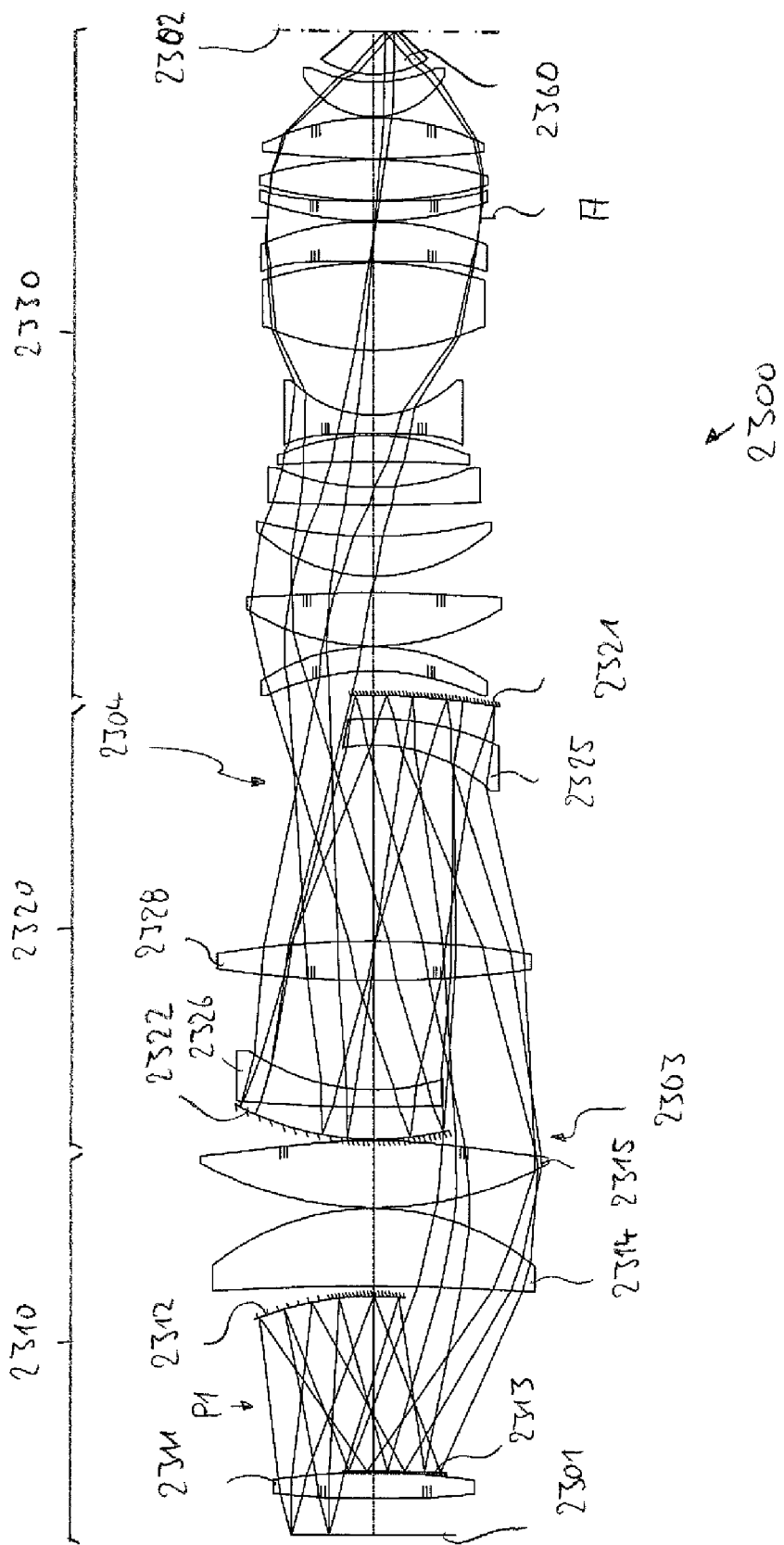
FIG. 40 shows a lens section of another embodiment having a first objective part with two curved mirrors and a catadioptric second objective part having two concave mirrors.

In FIGS. 39 and 40 two embodiments are shown which are characterized, amongst other features, by the fact that the first objective part imaging the object field into the first intermediate image is a catadioptric objective part including one concave mirror and one additional mirror having a curved mirror surface, where the curved mirror surfaces of the concave mirror and the additional mirror are facing each other such that the first objective part can serve as a relay system in projection objectives of preferred embodiments having one straight common optical axis for all objective parts.

The specification of the projection objective 2200 shown in FIG. 39 is given in table 39 and 39A (aspheric constants). The system is designed for 193 nm for using water (n=1.436677) as an immersion fluid. All lenses except the last image side optical element (plano-convex lens 2260 made of calcium fluoride) are made of fused silica. An image side numerical aperture NA=1.2 is obtained at an image field size 26 mm×5.5 mm arranged 21.8 mm outside the optical axis. The track length (object image distance) is 1125 mm.

A first, catadioptric objective part 2210 is designed for creating a first intermediate image 2203. The second, catadioptric objective part 2220 designed for creating the second intermediate image 2204 from the first intermediate image includes a first concave mirror 2221 and a second concave mirror 2222 having concave mirror surfaces facing each other and defining an intermirror space, and a positive meniscus lens 2229 having an aspheric, concave entrance surface immediately downstream of the first intermediate image. A dioptric third objective part 2230 is designed for imaging the second intermediate image onto the image plane 2202, whereby a thin layer of water (immersion fluid I) is transited by the radiation. An aperture stop A is positioned in the third objective part.

The first objective part 2210 includes, in that optical sequence from the object field, a biconvex positive lens 2211 having a strongly aspheric entrance surface and an aspheric exit surface, a positive meniscus lens 2212 having an aspheric concave entrance surface and a spherical exit surface, and a concave mirror 2213 having an object side concave mirror surface and being arranged eccentrically to the optical axis, but intersecting the optical axis 2205. The radiation reflected back from the concave mirror transits the positive meniscus 2212 in the opposite direction and mostly on the opposite side of the optical axis compared to the radiation passing between object field and concave mirror 2213. An additional mirror 2214 with convex mirror surface is provided by an off-axis mirror coating on the image side surface of convex lens 2211. The radiation passes the positive meniscus 2212 a third time prior to formation of the first intermediate image. Therefore, the lens 2212 is used three times at laterally offset lens regions.

Whereas concave mirror 2213 is positioned optically near a pupil surface, convex mirror 2214 is arranged optically near to the intermediate image 2203. Therefore, field aberrations and pupil aberrations can be corrected separately by selecting according shapes of the concave and convex mirrors 2213, 2214. This allows to adjust the correction status of the first intermediate image 2203 such that residual imaging errors can be compensated by the two objective parts following downstream of the first intermediate image including the catadioptric second objective part 2220.

The first objective part is designed as an enlarging system having a significant magnification $|\beta_1|>1$. The first intermediate image 2203 is positioned geometrically near the closest edge of concave mirror 2213 outside the intermirror space defined between the concave mirrors 2221 and 2222 of the second objective part, whereby the optical distance between the first intermediate image and the first concave mirror 2221 becomes rather large, whereas the optical distance between the second concave mirror 2222 and the second intermediate image 2204 becomes rather small. Therefore, the sizes of the concave mirrors of the second objective part differ significantly, the optically used area of the first concave mirror being about twice as large as the corresponding area on the second concave mirror. Both concave mirrors 2221 and 2222 are positioned outside the optical axis such that the optical axis does not intersect the optically used mirror surfaces. Since the concave mirrors are positioned at different positions with regard to the ratio between the ray heights of principal ray and marginal ray, the correcting effects of the concave mirrors on different imaging errors can be distributed between the two catadioptric objective parts 2210 and 2220.

The projection objective 2300 shown in FIG. 40 is designed as a "solid immersion lens" having a finite image side working distance in the order of the design wavelength λ of the system (193 nm) or fractions thereof (e.g. λ/2 or λ/4 or below). Evanescent fields exiting from the exit surface of the last lens can be used for imaging. The system is adapted for optical near field lithography. Reference is made to German patent application DE 10332112.8 filed on Jul. 9, 2003 by the applicant, where preferred conditions for optical near field lithography are specified. No liquid immersion fluid is necessary in this case for obtaining an image side numerical aperture NA>1. In the embodiment NA=1.05 for a image field size 22 mm×4.5 mm, where the image field is arranged 39 mm off-axis. The overall reduction ratio is 1:4, the track length is 1294.4 mm. In this design, all lenses including the last, image side plano-convex lens 2360 are made of fused silica. The specification is given in tables 40 and 40A (aspheric constants).

The first, catadioptric objective part 2310 designed for creating the first intermediate image 2303 from the object field on an enlarged scale includes, in that sequence along the optical path, a biconvex positive lens 2311 having an aspheric entrance surface and a spherical exit surface, a concave mirror 2312, having an object side mirror surface, a convex mirror 2313 having slightly curved convex mirror surface facing the concave mirror and being formed by a mirror coating on an elevated section of the image side lens surface of lens 2311, a bispherical positive meniscus lens 2314 having a concave entry side, and a biconvex positive lens 2315 having a strongly aspheric exit surface positioned in the immediate vicinity of the first intermediate image 2303.

The second, catadioptric objective part 2320 picks up the first intermediate image 2303 and forms the second intermediate image 2304 located geometrically within an intermirror space defined by the first concave mirror 2321 and the second concave mirror 2322 of the second objective part. The second objective part further includes negative meniscus lenses 2325, 2326 each positioned immediately ahead of the mirror surface of an associated concave mirror 2321 and 2322, respectively. A strong correcting effect on longitudinal chromatic aberration (CHL) can be obtained this way. A biconvex positive lens 2328 having an object side aspheric surface and an image side spherical surface extents across the entire diameter of the projection objective between the first and second concave mirrors 2321, 2322 and is passed three times by the radiation, once between the first intermediate image and the first concave mirror, a second time between the first and the second concave mirrors 2321, 2322 and a third time between the second concave mirror 2322 and the second intermediate image 2304.

In this embodiment, all three concave mirrors 2312, 2321, 2322 are positioned optically remote from the pupil surface of the projection objective. Also, the almost flat convex mirror 2313 is positioned clearly outside the first pupil surface P1. The design allows to distribute the correcting effects of catadioptric objective parts between the first and the second objective part.

The invention allows to manufacture catadioptric projection objectives which, in many respects of practical implementation into a projection exposure apparatus, have similar properties to conventional refractive projection objectives, whereby a change over between refractive systems and catadioptric systems is greatly facilitated. Firstly, the invention allows to built catadioptric projection objectives having one straight (unfolded) optical axis. Further, an object field disposed on one side of the optical axis may be imaged into an image field disposed on the opposite side of the optical axis, i.e. the imaging is performed with "negative magnification". Thirdly, the objectives can be designed to have isotropic magnification. Here, the term "isotropic magnification" refers to an image formation without "image flip", i.e. without a change of chirality between object field and image field. With other words, features on the reticle described in a right handed coordinate system can be described in a similar right handed coordinate system in the image. The negative isotropic magnification is present in both x- and y-directions perpendicular to the optical axis. This allows to use the same type of reticles also used for imaging with refractive projection objectives. These features facilitate implementation of catadioptric projection objectives according to the invention in conventional exposure apparatus designed for refractive projection objectives since no major reconstructions are required, for example, at the reticle- and wafer-stages. Also, reticles designed for use with refractive projection objectives can in principle also be used with catadioptric projection objectives according to the invention. Considerable cost savings for the end user can be obtained this way.

As mentioned earlier, the invention allows to built catadioptric projection objectives with high numerical aperture, particularly allowing immersion lithography at numerical apertures NA>1, that can be built with relatively small amounts of optical material. The potential for small material consumption is demonstrated in the following considering parameters describing the fact that particularly compact projection objectives can be manufactured.

Generally, the dimensions of projection objectives tend to increase dramatically as the image side numerical aperture NA is increased. Empirically it has been found that the maximum lens diameter $D_{max}$ tends to increase stronger than linear with increase of NA according to $D_{max} \sim NA^k$, where k>1. A value k=2 is an approximation used for the purpose of this application. Further, it has been found that the maximum lens diameter $D_{max}$ increases in proportion to the image field size (represented by the image field height Y'). A linear dependency is assumed for the purpose of the application. Based on these considerations a first compactness parameter COMP1 is defined as:

$$COMP1 = D_{max}/(Y' \cdot NA^2).$$

It is evident that, for given values of image field height and numerical aperture, the first compaction parameter COMP1 should be as small as possible if a compact design is desired.

Considering the overall material consumption necessary for providing a projection objective, the absolute number of lenses, $N_L$ is also relevant. Typically, systems with a smaller number of lenses are preferred to systems with larger numbers of lenses. Therefore, a second compactness parameter COMP2 is defined as follows:

$$COMP2 = COMP1 \cdot N_L.$$

Again, small values for COMP2 are indicative of compact optical systems.

Further, projection objectives according to the invention have at least three objective parts for imaging an entry side field plane into an optically conjugate exit side field plane, where the imaging objective parts are concatenated at intermediate images. Typically, the number of lenses and the overall material necessary to build an projection objective will increase the higher the number $N_{OP}$ of imaging objective parts of the optical system is. It is desirable to keep the average number of lenses per objective part, $N_L/N_{OP}$, as small as possible. Therefore, a third compactness parameter COMP3 is defined as follows:

$$COMP3 = COMP1 \cdot N_L/N_{OP}.$$

Again, projection objectives with low optical material consumption will be characterized by small values of COMP3.

Table 41 summarizes the values necessary to calculate the compactness parameters COMP1, COMP2, COMP3 and the respective values for these parameters for each of the systems presented with a specification table (the table number (corresponding to the same number of a figure) is given in column 1 of table 41). Therefore, in order to obtain a compact catadioptric projection objective having at least one concave mirror and at least three imaging objective parts (i.e. at least two intermediate images) at least one of the following conditions should be observed:

COMP1<11

Preferably COMP1<10.8, more preferably COMP1<10.4, even more preferably COMP1<10 should be observed.

COMP2<300

Preferably COMP2<280, more preferably COMP2<250, even more preferably COMP2<230 should be observed

COMP3<100

Preferably COMP3<90, more preferably COMP3<80, even more preferably COMP3<75 should be observed.

Table 41 shows that preferred embodiments according to the invention generally observe at least one of these conditions indicating that compact designs with moderate material consumption are obtained according to the design rules laid out in this specification.

If desired, various types of filling gases can be used to fill the empty spaces between the optical elements of the projection objectives. For example, air or nitrogen or helium can be used as filling gas depending or desired properties of the embodiment.

Favorable embodiments may be characterized by one or more of the following conditions. The first objective part is preferably designed as an enlarging system, preferably having a magnification $\beta_1$ in the range $1 < |\beta_1| < 2.5$. This ensures low NA at the first intermediate image and helps to avoid vignetting problems. $|\beta_1|$ may be 1:1 or may be slightly smaller, e.g. $0.8 \leq |\beta_1| \leq 1$. The second objective part is preferably designed as a system having near to unit magnification, i.e. almost no magnification or reduction. Particularly, the second objective part may be designed as a system having a magnification $\beta_2$ in the range $0.4 < |\beta_2| < 1.5$, more preferably in the range $0.8 < |\beta_2| < 1.25$ or in the range $0.9 < |\beta_2| < 1.1$. The third objective part preferably has a reducing magnification $|\beta_3| < 1$. The entire projection objective has a magnification $\beta$ where $\beta = \beta_1 \cdot \beta_2 \cdot \beta_3$. The second intermediate image may have a size larger than the image size.

Preferably, both the first intermediate image and the second intermediate image are located geometrically within the intermirror space between the first concave mirror and the second concave mirror. They may be located geometrically in a middle region centered around the midpoint between the two concave mirrors within the intermirror space between the first concave mirror and the second concave mirror, wherein the middle region extends in a space having an axial extension ≦90% of an axial distance between the vertices of the curvature surfaces of the first and second concave mirror.

If d is the distance on the optical axis between the two concave mirrors, d1 is the distance on the optical axis between the first intermediate image and the first concave mirror and d2 is the distance on the optical axis between the second concave mirror and the second intermediate image, then the relations: 0.5 d/2<d1<1.5 d/2 and 0.5 d/2<d2<1.5 d/2 are preferably satisfied. The distances mentioned above are to be measured along the optical axis, which may be folded. Preferably, a chief ray of the most off axial field point intersects the optical axis in the same described region between d/4 and 3d/4 between the two concave mirrors in the vicinity of the location of the first intermediate image. Pupil positions are then remote from mirrors.

It has been found useful to design the optical system such that at least one intermediate image, preferably all intermediate images are positioned such that there exists a finite minimum distance between the intermediate image and the next optical surface, which is a mirror surface in most embodiments. If a finite minimum distance is maintained it can be avoided that contaminations or faults on or in the optical surface are imaged sharply into the image plane such that the desired imaging of a pattern is disturbed.

Preferably, the finite distance is selected depending on the numerical aperture of the radiation at the intermediate image such that a sub-aperture (footprint of a particular field point) of the radiation on the optical surface next to the intermediate image has a minimum diameter of at least 3 mm or at least 5 mm or at least 10 mm or at least 15 mm. It is obvious from the figures and tables that these conditions are easily met by most or all embodiments in relation to the distance between an intermediate image within the intermirror space and the mirror surface arranged optically nearest to the intermediate image. Embodiments having intermediate images arranged in the middle region between the concave mirrors are particularly well-natured in this respect.

All transparent optical components of the embodiments described above, with a possible exception at the last image side lens, which may be of calcium fluoride, are fabricated from the same material, namely fused silica ($SiO_2$). However, other materials, in particular, crystalline alkaline earth metal fluoride materials, that are transparent at the working wavelength may also be used. At least one second material may also be employed in order to, for example, assist correction for chromatic aberration, if necessary. Of course, the benefits of the invention may also be utilized in the case of systems intended for use at other wavelengths, for example, at 248 nm or 157 nm.

Some or all conditions are met by some or all embodiments described above.

It is to be understood that all systems described above may be complete systems for forming a real image (e.g. on a wafer) from a real object. However, the systems may be used as partial systems of larger systems. For example, the "object" for a system mentioned above may be an image formed by an imaging system (relay system) upstream of the object plane. Likewise, the image formed by a system mentioned above may be used as the object for a system (relay system) downstream of the image plane.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The contents of all the claims is made part of this description by reference.

TABLE 4

J 205

| Surface | Radius | Thickness | Material | ½ Diam. |
|---|---|---|---|---|
| 1 | 151.647118 | 39.665046 | SIO2 | 86.120 |
| 2 | -1368.552447 | 69.197177 | | 85.246 |
| 3 | 158.992783 | 15.145647 | SIO2 | 75.907 |
| 4 | 206.923841 | 38.570349 | | 73.675 |
| 5 | 97.678872 | 40.014335 | SIO2 | 69.070 |
| 6 | -5437.460665 | 6.811056 | | 64.924 |
| 7 | 138.801509 | 16.000000 | SIO2 | 53.028 |
| 8 | 573.226631 | 49.296968 | | 47.448 |
| 9 | -57.862177 | 14.263643 | SIO2 | 47.630 |
| 10 | -84.936107 | 112.509668 | | 57.274 |
| 11 | -413.250477 | 39.459821 | SIO2 | 106.087 |
| 12 | -160.648303 | 5.882304 | | 109.942 |
| 13 | 797.277933 | 34.177152 | SIO2 | 115.560 |
| 14 | -430.752073 | 244.699332 | | 115.661 |
| 15 | -199.609067 | -204.699112 | REFL | 134.925 |
| 16 | 157.344690 | 246.319295 | REFL | 109.289 |
| 17 | 862.084499 | 22.994398 | SIO2 | 70.571 |
| 18 | -419.719089 | 18.726730 | | 69.767 |
| 19 | -150.816336 | 15.000000 | SIO2 | 67.991 |
| 20 | 131.971848 | 26.143914 | | 70.182 |
| 21 | -1567.196375 | 19.813697 | SIO2 | 72.656 |
| 22 | -217.593380 | 44.615314 | | 76.740 |
| 23 | -2829.863046 | 39.782748 | SIO2 | 103.845 |
| 24 | -203.824432 | 1.000000 | | 107.411 |
| 25 | 524.684787 | 25.000000 | SIO2 | 114.960 |
| 26 | 902.564365 | 1.000000 | | 115.451 |
| 27 | 530.781146 | 38.825378 | SIO2 | 116.178 |
| 28 | -473.210631 | 1.000000 | | 116.066 |
| 29 | 0.000000 | 0.000000 | | 113.556 |
| 30 | 322.948582 | 29.038119 | SIO2 | 113.791 |
| 31 | -2580.799702 | 1.000000 | | 113.022 |
| 32 | 512.569763 | 30.174661 | SIO2 | 110.876 |
| 33 | -677.235877 | 1.000000 | | 109.014 |
| 34 | 106.347684 | 68.066974 | SIO2 | 90.295 |
| 35 | -1474.944139 | 0.999719 | | 77.627 |
| 36 | 54.296611 | 42.467148 | CAF2 | 45.513 |
| 37 | 0.000000 | 3.000000 | H2O | 20.998 |

TABLE 4A

Aspherical Constants

| | SRF | | | | |
|---|---|---|---|---|---|
| | 2 | 3 | 8 | 12 | 15 |
| K | 0 | 0 | 0 | 0 | 0 |
| C1 | 3.477033e-08 | -6.813990e-09 | 3.966411e-07 | 4.439638e-09 | 1.447452e-08 |
| C2 | -4.731536e-13 | -8.621629e-12 | -4.007014e-12 | 1.686758e-13 | 2.261476e-13 |
| C3 | 2.796504e-17 | -2.762099e-16 | 7.436146e-15 | 8.011815e-19 | 2.580774e-18 |
| C4 | -6.649516e-22 | -9.615951e-21 | 1.520683e-18 | 9.201114e-22 | 1.377485e-22 |
| C5 | -2.829603e-25 | -5.726076e-24 | -9.949722e-22 | -4.382820e-26 | -3.426657e-27 |
| C6 | 1.815473e-29 | 3.251913e-28 | 7.293926e-25 | 1.782591e-30 | 1.279942e-31 |

| | SRF | | | | |
|---|---|---|---|---|---|
| | 16 | 17 | 19 | 22 | 30 |
| K | 0 | 0 | 0 | 0 | 0 |
| C1 | 4.549402e-08 | 1.523352e-07 | 1.162948e-07 | -1.982157e-08 | 1.201912e-08 |
| C2 | -5.067161e-12 | -5.763168e-12 | -6.089203e-13 | -5.382822e-13 | -1.705175e-13 |
| C3 | 2.777252e-16 | 7.475933e-17 | -1.025185e-16 | 1.200748e-17 | -8.926277e-17 |
| C4 | -3.138154e-20 | 6.617515e-20 | 2.192456e-20 | -2.867314e-21 | -4.435922e-21 |
| C5 | 2.350745e-24 | -2.264827e-24 | -5.792211e-25 | 1.105789e-25 | 8.175482e-25 |
| C6 | -7.599030e-29 | -1.064596e-28 | 5.642674e-28 | -3.023003e-31 | -2.371799e-29 |

TABLE 4A-continued

Aspherical Constants

| | SRF | |
|---|---|---|
| | 33 | 35 |
| K | 0 | 0 |
| C1 | 1.147736e−08 | 9.136462e−08 |
| C2 | 4.202468e−13 | −5.545932e−13 |
| C3 | −1.260714e−17 | 1.560631e−16 |
| C4 | −2.591704e−21 | −3.601282e−20 |
| C5 | 4.606100e−26 | 8.986671e−25 |
| C6 | 9.707119e−30 | 3.847941e−29 |

TABLE 7

J 206

| Surface | Radius | Thickness | Material | ½ Diam. |
|---|---|---|---|---|
| 1 | 0.000000 | 0.000000 | | 76.473 |
| 2 | 196.748623 | 27.263207 | SIO2 | 81.548 |
| 3 | 1380.478547 | 27.173549 | | 81.569 |
| 4 | 148.118896 | 29.558580 | SIO2 | 83.220 |
| 5 | 985.952509 | 45.383760 | | 81.731 |
| 6 | 587.017766 | 26.742601 | SIO2 | 74.752 |
| 7 | −268.687626 | 5.952675 | | 73.075 |
| 8 | 121.069967 | 20.000000 | SIO2 | 59.416 |
| 9 | 338.972294 | 15.471207 | | 55.151 |
| 10 | 123.398576 | 16.000000 | SIO2 | 42.222 |
| 11 | 493.239196 | 38.514952 | | 36.268 |
| 12 | −56.743953 | 79.995013 | SIO2 | 40.070 |
| 13 | −98.465204 | 60.825433 | | 74.618 |
| 14 | −3097.977653 | 27.304241 | SIO2 | 102.327 |
| 15 | −295.526762 | 3.782338 | | 104.658 |
| 16 | 271.693311 | 37.763865 | SIO2 | 112.015 |
| 17 | −3936.289483 | 25.000000 | | 112.208 |
| 18 | 162.629416 | 202.628857 | | 112.852 |
| 19 | −195.636303 | −202.628857 | REFL | 119.680 |
| 20 | 162.629416 | 202.628857 | REFL | 104.093 |
| 21 | −195.636303 | 44.391294 | | 76.907 |
| 22 | −1229.055417 | 33.250147 | SIO2 | 83.109 |
| 23 | −160.024467 | 37.552215 | | 84.448 |
| 24 | −246.047659 | 15.000000 | SIO2 | 74.951 |
| 25 | 134.897718 | 28.252914 | | 72.042 |
| 26 | −768.808515 | 15.000000 | SIO2 | 73.163 |
| 27 | −355.461110 | 71.356200 | | 76.177 |
| 28 | −3425.435334 | 32.788842 | SIO2 | 102.647 |
| 29 | −255.172254 | 10.903212 | | 105.332 |
| 30 | 695.872359 | 30.470261 | SIO2 | 110.205 |
| 31 | −625.346253 | 9.352817 | | 110.381 |
| 32 | 0.000000 | −8.352817 | | 108.884 |
| 33 | 329.990101 | 40.669818 | SIO2 | 110.434 |
| 34 | −427.546014 | 1.000000 | | 110.052 |
| 35 | 158.678466 | 45.978153 | SIO2 | 102.564 |
| 36 | 378.976619 | 1.000000 | | 95.391 |
| 37 | 108.606008 | 71.612816 | SIO2 | 81.775 |
| 38 | 526.305326 | 1.000000 | | 54.478 |
| 39 | 52.236898 | 36.413852 | CAF2 | 39.598 |
| 40 | 0.000000 | 3.000000 | H2O | 19.842 |

TABLE 7A

Aspherical Constants

| | SRF | | | | |
|---|---|---|---|---|---|
| | 4 | 11 | 15 | 18 | 19 |
| K | 0 | 0 | 0 | 0 | 0 |
| C1 | −6.330577e−08 | 3.463909e−07 | 1.324809e−08 | −7.037790e−09 | 2.310646e−08 |
| C2 | −3.872322e−12 | −2.533709e−11 | 2.103578e−13 | −2.219032e−13 | 3.623856e−13 |
| C3 | 1.663761e−17 | 3.527218e−14 | 3.059213e−18 | −7.410203e−18 | 5.711204e−18 |
| C4 | −2.340311e−20 | −2.199769e−17 | −5.028780e−23 | −1.155705e−22 | 8.453421e−23 |
| C5 | 1.375334e−24 | −1.507925e−21 | 1.624941e−26 | −8.984707e−27 | 1.508061e−27 |
| C6 | −1.682943e−29 | 5.496658e−24 | −6.281302e−31 | −1.590542e−31 | 1.239941e−31 |

| | SRF | | | | | |
|---|---|---|---|---|---|---|
| | 22 | 24 | 27 | 34 | 36 | 38 |
| K | 0 | 0 | 0 | 0 | 0 | 0 |
| C1 | 6.335247e−08 | 3.536885e−08 | 8.583557e−08 | 2.169817e−08 | −1.524001e−08 | 1.877887e−07 |
| C2 | −1.090600e−11 | 9.732363e−12 | 3.629209e−12 | −5.404878e−13 | 1.625696e−12 | 1.445239e−11 |
| C3 | 2.432505e−16 | −1.879646e−16 | −8.012301e−17 | 5.551093e−17 | −3.076521e−16 | 1.060456e−16 |
| C4 | −1.490760e−21 | 1.841476e−20 | 5.223547e−20 | −2.305595e−21 | 8.708326e−21 | 3.470869e−19 |
| C5 | 1.908731e−24 | −2.885890e−24 | −9.160836e−24 | 4.260803e−26 | 4.665020e−25 | −6.424228e−23 |
| C6 | −1.282225e−28 | 2.916860e−28 | 1.028273e−27 | −9.442220e−32 | −2.136828e−29 | 1.397331e−26 |

TABLE 8

J 201

| Surface | Radius | Thickness | Material | ½ Diam. |
|---|---|---|---|---|
| 1 | 0.000000 | 0.000000 | | 77.084 |
| 2 | 144.715774 | 34.413396 | SIO2 | 85.539 |
| 3 | 1168.820838 | 42.714222 | | 84.636 |
| 4 | 137.626538 | 26.913912 | SIO2 | 78.160 |
| 5 | 231.768696 | 25.969904 | | 74.133 |
| 6 | −256.723584 | 9.491982 | SIO2 | 73.679 |
| 7 | −300.099619 | 24.637606 | | 73.830 |
| 8 | 95.378233 | 35.795212 | SIO2 | 66.319 |
| 9 | 2978.156744 | 6.137057 | | 62.554 |
| 10 | 113.175934 | 18.340535 | SIO2 | 50.838 |
| 11 | 791.566883 | 42.223464 | | 45.085 |
| 12 | −57.334745 | 47.676082 | SIO2 | 42.772 |
| 13 | −104.057645 | 85.668623 | | 64.264 |
| 14 | −747.828120 | 23.558823 | SIO2 | 98.262 |
| 15 | −237.780029 | 11.502675 | | 100.729 |
| 16 | 466.711415 | 38.824036 | SIO2 | 109.480 |
| 17 | −377.473708 | 39.986102 | | 109.791 |
| 18 | 160.832778 | 201.116223 | | 111.102 |
| 19 | −190.162844 | −201.116223 | REFL | 125.335 |
| 20 | 160.832778 | 201.116223 | REFL | 106.939 |
| 21 | −190.162844 | 40.087040 | | 74.503 |
| 22 | −429.676099 | 17.543012 | SIO2 | 77.631 |
| 23 | −222.069915 | 45.151970 | | 78.588 |
| 24 | −438.919401 | 16.685064 | SIO2 | 75.545 |
| 25 | 125.893773 | 22.634903 | | 73.362 |
| 26 | 706.231560 | 15.535140 | SIO2 | 74.562 |
| 27 | −483.323705 | 69.793709 | | 76.473 |
| 28 | −1219.864506 | 31.389217 | SIO2 | 101.495 |
| 29 | −226.588128 | 6.763552 | | 104.174 |
| 30 | 443.080071 | 40.992305 | SIO2 | 110.047 |
| 31 | −556.882957 | 4.990520 | | 109.849 |
| 32 | 0.000000 | −3.144971 | | 107.701 |
| 33 | 274.803577 | 29.023782 | SIO2 | 108.934 |
| 34 | −6968.358008 | 0.969032 | | 108.499 |
| 35 | 213.748670 | 46.817088 | SIO2 | 106.084 |
| 36 | −8609.746220 | 0.945349 | | 101.542 |
| 37 | 114.821261 | 64.641285 | SIO2 | 84.961 |
| 38 | −4598.248046 | 0.926317 | | 66.788 |
| 39 | 53.647792 | 40.301900 | CAF2 | 42.988 |
| 40 | 0.000000 | 3.000000 | H2O | 20.327 |

TABLE 16

| Surface | Radius | Thickness | Material | ½ Diam. | Type |
|---|---|---|---|---|---|
| 0 | 0.000000000 | 31.999475127 | AIR | 65.000 | |
| 1 | 133.894287787 | 14.995217082 | SILUV | 84.778 | |
| 2 | 127.681095498 | 25.597460396 | AIR | 82.945 | |
| 3 | 402.041163143 | 34.247197246 | SILUV | 84.808 | |
| 4 | −292.795248488 | 0.996612226 | AIR | 85.527 | |
| 5 | −865.792789804 | 19.686989978 | SILUV | 84.845 | |
| 6 | −194.300017249 | 0.997731584 | AIR | 84.746 | |
| 7 | 166.499926718 | 34.205033740 | SILUV | 81.167 | |
| 8 | −3411.356708300 | 0.997606594 | AIR | 78.713 | |
| 9 | 108.528463069 | 16.234112594 | SILUV | 67.657 | |
| 10 | 101.654206518 | 13.668730583 | AIR | 60.671 | |
| 11 | 161.992336120 | 14.997158671 | SILUV | 58.598 | |
| 12 | 2789.766305580 | 83.396846659 | AIR | 54.555 | |
| 13 | −51.475183292 | 14.997760255 | SILUV | 49.489 | |
| 14 | −64.480378016 | 0.998543606 | AIR | 60.882 | |
| 15 | −523.449669764 | 57.729408261 | SILUV | 91.022 | |
| 16 | −124.018124564 | 0.995673329 | AIR | 97.756 | |
| 17 | 213.269322132 | 24.422343766 | SILUV | 111.322 | |
| 18 | 368.130596294 | 326.268973067 | AIR | 110.123 | |
| 19 | −161.615015336 | 14.998434538 | SILUV | 131.765 | |
| 20 | −312.345980956 | 31.430358591 | AIR | 153.714 | |
| 21 | −214.602996812 | −31.430358591 | AIR | 155.986 | REFL |
| 22 | −312.345980956 | −14.998434538 | SILUV | 149.921 | |
| 23 | −161.615015336 | −238.077915164 | AIR | 116.301 | |
| 24 | 149.287132498 | −14.998202246 | SILUV | 103.169 | |
| 25 | 317.538289321 | −33.202694396 | AIR | 133.495 | |
| 26 | 186.422421298 | 33.202694396 | AIR | 137.843 | REFL |
| 27 | 317.538289321 | 14.998202246 | SILUV | 136.305 | |
| 28 | 149.287132498 | 324.504871734 | AIR | 116.434 | |
| 29 | 304.025895186 | 51.634530337 | SILUV | 102.695 | |
| 30 | −321.237280055 | 36.471806645 | AIR | 101.284 | |
| 31 | −141.718556476 | 14.999755253 | SILUV | 84.799 | |
| 32 | 104.217593104 | 30.610688625 | AIR | 74.074 | |
| 33 | 581.141203674 | 15.015591714 | SILUV | 75.850 | |
| 34 | −637.266899243 | 22.019923725 | AIR | 78.058 | |
| 35 | −222.755672262 | 20.582750922 | SILUV | 80.475 | |
| 36 | −149.492790226 | 0.999906680 | AIR | 84.782 | |
| 37 | 260.619344057 | 25.604090348 | SILUV | 101.752 | |
| 38 | 1033.029187190 | 30.684011762 | AIR | 102.212 | |

TABLE 8A

Aspherical Constants

| | SRF | | | | |
|---|---|---|---|---|---|
| | 4 | 11 | 15 | 18 | 19 |
| K | 0 | 0 | 0 | 0 | 0 |
| C1 | −5.141395e−08 | 4.483031e−07 | 1.313620e−08 | −7.985633e−09 | 2.017668e−08 |
| C2 | −5.556822e−12 | −9.959839e−12 | 3.644835e−13 | −2.642498e−13 | 3.361249e−13 |
| C3 | −2.754499e−16 | 5.082134e−15 | 5.949608e−18 | −6.856089e−18 | 4.310554e−18 |
| C4 | −1.253113e−20 | 2.578467e−18 | 5.732895e−22 | −5.142965e−22 | 1.686493e−22 |
| C5 | −4.228497e−24 | −3.461879e−21 | −2.284813e−26 | 1.912150e−26 | −3.551936e−27 |
| C6 | 2.490029e−28 | 1.628794e−24 | 8.340263e−31 | −1.470786e−30 | 2.057764e−31 |

| | SRF | | | | | |
|---|---|---|---|---|---|---|
| | 22 | 24 | 27 | 33 | 36 | 38 |
| K | 0 | 0 | 0 | 0 | 0 | 0 |
| C1 | 4.549402e−08 | 1.523352e−07 | 1.162948e−07 | −1.982157e−08 | 1.201912e−08 | 1.148008e−07 |
| C2 | −5.067161e−12 | −5.763168e−12 | −6.089203e−13 | −5.382822e−13 | −1.705175e−13 | −5.056506e−13 |
| C3 | 2.777252e−16 | 7.475933e−17 | −1.025185e−16 | 1.200748e−17 | −8.926277e−17 | 1.189381e−16 |
| C4 | −3.138154e−20 | 6.617515e−20 | 2.192456e−20 | −2.867314e−21 | −4.435922e−21 | −1.274117e−20 |
| C5 | 2.350745e−24 | −2.264827e−24 | −5.792211e−25 | 1.105789e−25 | 8.175482e−25 | −3.981271e−24 |
| C6 | −7.599030e−29 | −1.064596e−28 | 5.642674e−28 | −3.023003e−31 | −2.371799e−29 | 3.798968e−28 |

TABLE 16-continued

| 39 | 181.295872049 | 62.489568781 | SILUV | 109.856 |
| 40 | −319.175759184 | 1.032697080 | AIR | 108.616 |
| 41 | 0.000000000 | 24.649355928 | AIR | 99.183 |
| 42 | 241.322246262 | 26.360109939 | SILUV | 88.680 |
| 43 | −555.614152728 | 2.010445644 | AIR | 85.697 |
| 44 | 77.526002487 | 41.372376482 | SILUV | 67.268 |
| 45 | 494.197664171 | 0.978420324 | AIR | 60.833 |
| 46 | 46.187199269 | 35.625423750 | CAFUV | 39.405 |

TABLE 16-continued

| 47 | 0.000000000 | 2.999559725 | H2OV | 20.942 |
| 48 | 0.000000000 | 0.000000000 | AIR | 16.250 |

NA = 1.2,
β = 0.25
Field    a    b    c
        26    5    4.75
WL    193.3 nm
SILUV   1.56049116
CAFUV   1.50110592
H2OV    1.4368

TABLE 16A

Aspherical Constants

| Surface | K | C1 | C2 | C3 |
|---|---|---|---|---|
| 3 | 0.00000000e+000 | −8.36067621e−008 | 2.12798795e−011 | −1.45207564e−015 |
| 6 | 0.00000000e+000 | 7.69835587e−008 | 2.07985891e−012 | 1.16482389e−016 |
| 7 | 0.00000000e+000 | 1.36850714e−007 | −9.44752603e−012 | −1.50977238e−016 |
| 12 | 0.00000000e+000 | 7.53715484e−007 | −6.61209701e−011 | 4.22074183e−015 |
| 16 | 0.00000000e+000 | −5.85261742e−008 | 7.70941737e−013 | −1.40836094e−016 |
| 29 | 0.00000000e+000 | 9.56507182e−008 | −2.16638529e−012 | −1.23753850e−017 |
| 31 | 0.00000000e+000 | 1.85417093e−007 | −2.24667567e−012 | 6.93769095e−017 |
| 34 | 0.00000000e+000 | 1.66095759e−007 | 2.43350203e−012 | 8.88822140e−017 |
| 39 | 0.00000000e+000 | −3.25790615e−009 | −2.00206347e−012 | 4.31870304e−017 |
| 42 | 0.00000000e+000 | −5.33787564e−008 | 2.40117270e−012 | 3.20136118e−016 |
| 43 | 0.00000000e+000 | 1.13532739e−007 | −5.93286761e−012 | 1.32296454e−015 |
| 45 | 0.00000000e+000 | 8.97031378e−008 | 2.47066509e−011 | −2.77876411e−016 |

| Surface | C4 | C5 | C6 |
|---|---|---|---|
| 3 | 7.63154357e−020 | 2.95348560e−024 | −3.46561258e−028 |
| 6 | −4.80737790e−021 | 5.59439946e−024 | −1.29197249e−028 |
| 7 | −5.84681939e−020 | 7.86623559e−024 | −7.24516725e−028 |
| 12 | −8.02992365e−019 | −7.38686026e−022 | 1.22771230e−025 |
| 16 | 6.45911985e−021 | −3.82872278e−025 | 4.17640461e−031 |
| 29 | 2.58232933e−022 | −6.80943505e−025 | 3.02935682e−029 |
| 31 | 6.79498891e−020 | −6.82812342e−024 | 2.20970580e−028 |
| 34 | 2.60945386e−020 | −3.60666201e−024 | 5.36227764e−028 |
| 39 | −2.48544823e−021 | 5.50166118e−026 | −3.31463292e−031 |
| 42 | 9.55299044e−021 | −9.27935397e−024 | 8.13460411e−028 |
| 43 | −1.88960302e−019 | 1.04299856e−023 | 1.69382125e−028 |
| 45 | −7.08589002e−019 | 1.20774587e−022 | −7.67132589e−027 |

TABLE 17

| Surface | Radius | Thickness | Material | ½ Diam. | Type |
|---|---|---|---|---|---|
| 0 | 0.000000000 | 31.997721704 | AIR | 65.000 | |
| 1 | 579.464506139 | 20.317824521 | SILUV | 74.592 | |
| 2 | −577.479988552 | 0.999475036 | AIR | 75.821 | |
| 3 | 2572.370914820 | 28.040565960 | SILUV | 76.612 | |
| 4 | 243.390586919 | 11.985977074 | AIR | 79.119 | |
| 5 | 500.676303821 | 43.989139515 | SILUV | 80.893 | |
| 6 | −155.064044118 | 21.184157632 | AIR | 82.707 | |
| 7 | 1381.321630200 | 18.191562266 | SILUV | 75.159 | |
| 8 | −393.944847792 | 0.998449340 | AIR | 74.340 | |
| 9 | 87.946501567 | 40.892320851 | SILUV | 65.550 | |
| 10 | 99.239178252 | 25.553101192 | AIR | 52.382 | |
| 11 | 209.138140913 | 15.063951314 | SILUV | 45.950 | |
| 12 | −601.200979555 | 66.005892131 | AIR | 42.845 | |
| 13 | −55.332841330 | 14.999477956 | SILUV | 50.547 | |
| 14 | −72.577526567 | 1.163693447 | AIR | 62.349 | |
| 15 | −346.873498438 | 34.446292165 | SILUV | 80.990 | |
| 16 | −150.420697383 | 2.645359711 | AIR | 86.680 | |
| 17 | 611.326207207 | 44.474569849 | SILUV | 99.391 | |
| 18 | −228.818841769 | 265.128541011 | AIR | 100.925 | |
| 19 | −190.727371287 | 15.000448317 | SILUV | 108.586 | |
| 20 | −237.320724749 | 14.700965847 | AIR | 118.645 | |
| 21 | −194.872786703 | −14.700965847 | AIR | 120.611 | REFL |
| 22 | −237.320724749 | −15.000448317 | SILUV | 116.199 | |
| 23 | −190.727371287 | −195.428248584 | AIR | 100.830 | |

TABLE 17-continued

| | | | | | |
|---|---|---|---|---|---|
| 24 | 190.727371287 | −15.000448317 | SILUV | 104.448 | |
| 25 | 237.320724749 | −14.700965847 | AIR | 120.847 | |
| 26 | 194.872786703 | 14.700965847 | AIR | 124.569 | REFL |
| 27 | 237.320724749 | 15.000448317 | SILUV | 122.685 | |
| 28 | 190.727371287 | 266.167203345 | AIR | 111.392 | |
| 29 | 315.808627637 | 45.375871773 | SILUV | 95.944 | |
| 30 | −367.849317765 | 64.350407265 | AIR | 94.229 | |
| 31 | −123.002265506 | 14.998717744 | SILUV | 70.954 | |
| 32 | 113.714722161 | 32.318363032 | AIR | 68.389 | |
| 33 | −990.749351417 | 21.237444356 | SILUV | 71.838 | |
| 34 | −292.571717802 | 35.154029607 | AIR | 78.053 | |
| 35 | −18220.224013700 | 40.604404749 | SILUV | 103.420 | |
| 36 | −201.028020704 | 1.097799815 | AIR | 107.104 | |
| 37 | 366.725287540 | 37.745092677 | SILUV | 119.548 | |
| 38 | −961.362776974 | 0.999856805 | AIR | 119.749 | |
| 39 | 338.337923773 | 38.019811036 | SILUV | 118.590 | |
| 40 | −1026.771599840 | −1.410077329 | AIR | 117.118 | |
| 41 | 0.000000000 | 12.743520660 | AIR | 115.541 | |
| 42 | 280.022380007 | 19.482737236 | SILUV | 110.210 | |
| 43 | 1517.149279230 | 1.197846646 | AIR | 108.733 | |
| 44 | 719.327066326 | 32.079810786 | SILUV | 107.695 | |
| 45 | −474.571764529 | 2.724748590 | AIR | 105.913 | |
| 46 | 89.479992014 | 48.063302904 | SILUV | 75.467 | |
| 47 | 364.001398221 | 2.359587817 | AIR | 64.121 | |
| 48 | 52.126874613 | 39.040570663 | CAFUV | 42.333 | |
| 49 | 0.000000000 | 2.999196815 | H2OV | 20.183 | |
| 50 | 0.000000000 | 0.000000000 | AIR | 16.250 | |

NA = 1.2,
β = 0.25
Field  a  b  c
       26  5  4.75
WL    193.3 nm
SILUV  1.56049116
CAFUV  1.50110592
H2OV  1.4368

TABLE 17A

Aspherical Constants

| Surface | K | C1 | C2 | C3 |
|---|---|---|---|---|
| 6 | 0.00000000e+000 | −1.15035308e−009 | 6.18896918e−013 | −4.28285081e−016 |
| 7 | 0.00000000e+000 | −1.72652480e−008 | −3.70258486e−014 | −1.25882856e−015 |
| 12 | 0.00000000e+000 | 3.77928406e−007 | 1.46912216e−011 | 2.33469503e−015 |
| 16 | 0.00000000e+000 | −6.96857458e−008 | −2.84037647e−012 | 2.05085140e−017 |
| 19 | 0.00000000e+000 | −2.08753341e−008 | −3.76211193e−013 | −1.18384407e−017 |
| 23 | 0.00000000e+000 | −2.08753341e−008 | −3.76211193e−013 | −1.18384407e−017 |
| 24 | 0.00000000e+000 | 2.08753341e−008 | 3.76211193e−013 | 1.18384407e−017 |
| 28 | 0.00000000e+000 | 2.08753341e−008 | 3.76211193e−013 | 1.18384407e−017 |
| 29 | 0.00000000e+000 | 7.78624253e−008 | −5.29798090e−013 | 3.91516327e−018 |
| 31 | 0.00000000e+000 | 4.28231334e−008 | 1.84180203e−011 | 2.69407820e−017 |
| 34 | 0.00000000e+000 | 1.06085944e−007 | 5.27851125e−012 | 1.44463148e−016 |
| 42 | 0.00000000e+000 | −4.37269250e−008 | −1.57509731e−012 | 8.65198568e−019 |
| 45 | 0.00000000e+000 | −9.15770551e−009 | −5.99358306e−014 | −2.27293408e−016 |
| 47 | 0.00000000e+000 | 6.18789306e−008 | 2.40430885e−011 | −5.44722370e−015 |

| Surface | C4 | C5 | C6 |
|---|---|---|---|
| 6 | 4.88391880e−021 | 3.14518856e−024 | −2.05304958e−028 |
| 7 | 1.13451047e−019 | −1.35997879e−023 | 1.27061565e−027 |
| 12 | −6.54678942e−018 | 3.46881149e−021 | −5.35085168e−025 |
| 16 | −1.26467485e−020 | 4.46161412e−025 | −4.85676248e−029 |
| 19 | −1.88960591e−021 | 1.06203954e−025 | −5.85068978e−030 |
| 23 | −1.88960591e−021 | 1.06203954e−025 | −5.85068978e−030 |
| 24 | 1.88960591e−021 | −1.06203954e−025 | 5.85068978e−030 |
| 28 | 1.88960591e−021 | −1.06203954e−025 | 5.85068978e−030 |
| 29 | −1.04724068e−020 | 6.70919693e−025 | −2.39519868e−029 |
| 31 | 9.37813713e−020 | −2.33189316e−023 | 9.94588095e−028 |
| 34 | 1.26175655e−020 | −1.49657869e−024 | 2.33032636e−028 |
| 42 | −3.26636505e−021 | 2.73829199e−025 | 2.06805365e−030 |
| 45 | 2.70272716e−020 | −1.30446854e−024 | 3.13007511e−029 |
| 47 | 7.58602437e−019 | −6.94042849e−023 | 2.94089737e−027 |

TABLE 19

| Surface | Radius | Thickness | Material | ½ Diam. | Type |
|---|---|---|---|---|---|
| 0 | 0.000000000 | 31.999270282 | AIR | 65.000 | |
| 1 | 161.244041962 | 14.998636035 | SILUV | 82.320 | |
| 2 | 200.129661131 | 4.944776020 | AIR | 81.953 | |
| 3 | 138.221863276 | 14.998396795 | SILUV | 85.474 | |
| 4 | 156.496992798 | 50.903040817 | AIR | 83.945 | |
| 5 | −173.315527687 | 16.279875172 | SILUV | 84.438 | |
| 6 | −142.013268785 | 1.000634788 | AIR | 87.160 | |
| 7 | 15501.649257700 | 32.544206280 | SILUV | 87.713 | |
| 8 | −158.845141838 | 0.999631849 | AIR | 89.436 | |
| 9 | 91.597097363 | 67.410407247 | SILUV | 79.148 | |
| 10 | 107.035143103 | 13.851994874 | AIR | 57.324 | |
| 11 | 213.854334447 | 15.987143481 | SILUV | 54.995 | |
| 12 | −484.417010515 | 72.563101783 | AIR | 51.059 | |
| 13 | −54.334592127 | 14.997747797 | SILUV | 49.752 | |
| 14 | −68.072352503 | 0.998695446 | AIR | 60.236 | |
| 15 | −601.365655277 | 24.817582741 | SILUV | 80.082 | |
| 16 | −242.182339653 | 0.995504271 | AIR | 83.903 | |
| 17 | 920.810751329 | 35.748197919 | SILUV | 91.860 | |
| 18 | −213.159366146 | 55.021374074 | AIR | 93.280 | |
| 19 | 246.612722217 | 14.997702082 | SILUV | 89.716 | |
| 20 | 222.836314969 | 195.136099792 | AIR | 86.935 | |
| 21 | −235.528678750 | 14.998801176 | SILUV | 123.772 | |
| 22 | −252.575360887 | 16.051090308 | AIR | 131.942 | |
| 23 | −208.057958857 | −16.051090308 | AIR | 133.654 | REFL |
| 24 | −252.575360887 | −14.998801176 | SILUV | 128.868 | |
| 25 | −235.528678750 | −195.136099792 | AIR | 114.227 | |
| 26 | 222.836314969 | −14.997702082 | AIR | 106.191 | |
| 27 | 246.612722217 | −15.024807366 | AIR | 119.874 | |
| 28 | 190.206428127 | 15.024807366 | AIR | 122.140 | REFL |
| 29 | 246.612722217 | 14.997702082 | SILUV | 120.950 | |

TABLE 19-continued

| | | | | |
|---|---|---|---|---|
| 30 | 222.836314969 | 195.136099792 | AIR | 111.677 |
| 31 | −235.528678750 | 14.998801176 | SILUV | 83.094 |
| 32 | −252.575360887 | 56.045936568 | AIR | 86.484 |
| 33 | 370.979663784 | 47.033021034 | SILUV | 99.224 |
| 34 | −371.323272898 | 62.417517206 | AIR | 97.788 |
| 35 | −121.118365852 | 14.999357361 | SILUV | 74.709 |
| 36 | 120.855315866 | 33.365820253 | AIR | 72.995 |
| 37 | 20779.359547400 | 24.110061836 | SILUV | 77.786 |
| 38 | −269.244136428 | 16.073764059 | AIR | 83.845 |
| 39 | −236.048531861 | 28.909364173 | SILUV | 86.677 |
| 40 | −161.907128190 | 8.188854525 | AIR | 94.856 |
| 41 | 842.230350676 | 46.587674654 | SILUV | 117.052 |
| 42 | −262.240874081 | 3.490322496 | AIR | 119.226 |
| 43 | 374.311200849 | 50.091253523 | SILUV | 123.021 |
| 44 | −396.081152439 | −8.144186891 | AIR | 122.235 |
| 45 | 0.000000000 | 9.143428258 | AIR | 118.495 |
| 46 | 290.815269675 | 69.706490303 | SILUV | 113.550 |
| 47 | −465.439617778 | 0.998821533 | AIR | 106.611 |
| 48 | 84.362795313 | 48.231691787 | SILUV | 73.577 |
| 49 | 220.065022009 | 0.997153094 | AIR | 60.089 |
| 50 | 51.630320906 | 38.562324381 | CAFUV | 42.677 |
| 51 | 0.000000000 | 2.998760762 | H2OV | 20.925 |
| 52 | 0.000000000 | 0.000000000 | AIR | 16.250 |

NA = 1.2,
β = 0.25
Field  a    b    c
       26   4.5  4.75
WL     193.3 nm
SILUV  1.56049116
CAFUV  1.50110592
H2OV   1.4368

TABLE 19A

Aspherical Constants

| Surface | K | C1 | C2 | C3 |
|---|---|---|---|---|
| 6 | 0.00000000e+000 | 5.22123357e−008 | 8.58887551e−013 | −4.54164064e−016 |
| 7 | 0.00000000e+000 | −5.20183796e−008 | −4.57191269e−012 | −4.91479340e−016 |
| 12 | 0.00000000e+000 | 3.52517346e−007 | 2.85321977e−011 | 9.33189645e−017 |
| 16 | 0.00000000e+000 | −1.19054499e−007 | −6.17053971e−013 | 8.29918331e−017 |
| 20 | 0.00000000e+000 | 2.35880706e−008 | 1.10625664e−014 | 1.52718231e−017 |
| 21 | 0.00000000e+000 | −1.93271271e−008 | −1.21191457e−014 | −9.08764375e−018 |
| 25 | 0.00000000e+000 | −1.93271271e−008 | −1.21191457e−014 | −9.08764375e−018 |
| 26 | 0.00000000e+000 | 2.35880706e−008 | 1.10625664e−014 | 1.52718231e−017 |
| 30 | 0.00000000e+000 | 2.35880706e−008 | 1.10625664e−014 | 1.52718231e−017 |
| 31 | 0.00000000e+000 | −1.93271271e−008 | −1.21191457e−014 | −9.08764375e−018 |
| 33 | 0.00000000e+000 | 1.34282593e−007 | −1.85430392e−012 | −4.26524890e−017 |
| 35 | 0.00000000e+000 | −2.95757718e−009 | 1.59584067e−011 | −3.65004253e−016 |
| 38 | 0.00000000e+000 | 1.44418264e−007 | 4.50598204e−012 | −8.46201050e−019 |
| 46 | 0.00000000e+000 | −1.03608598e−008 | −1.39868032e−012 | −2.06257372e−017 |
| 47 | 0.00000000e+000 | −2.35449031e−008 | 6.28466297e−017 | 5.46615500e−020 |
| 49 | 0.00000000e+000 | 1.18378675e−007 | 2.25652288e−011 | −6.89451988e−015 |

| Surface | C4 | C5 | C6 |
|---|---|---|---|
| 6 | 1.80084384e−021 | −1.27939182e−025 | 9.21858288e−029 |
| 7 | 3.70354199e−020 | −2.59625588e−024 | −9.35416883e−031 |
| 12 | 1.46216022e−018 | 1.35490801e−022 | −4.07118530e−026 |
| 16 | −1.92366012e−020 | 1.44946211e−024 | −4.85055808e−029 |
| 20 | 4.13946988e−022 | −1.55058201e−026 | 1.20806176e−030 |
| 21 | −5.34976868e−023 | −1.13872365e−027 | −9.05434146e−032 |
| 25 | −5.34976868e−023 | −1.13872365e−027 | −9.05434146e−032 |
| 26 | 4.13946988e−022 | −1.55058201e−026 | 1.20806176e−030 |
| 30 | 4.13946988e−022 | −1.55058201e−026 | 1.20806176e−030 |
| 31 | −5.34976868e−023 | −1.13872365e−027 | −9.05434146e−032 |
| 33 | 2.28325758e−022 | −3.90557972e−026 | −2.65242779e−030 |
| 35 | 2.40761278e−019 | −3.76176852e−023 | 1.70246167e−027 |
| 38 | −5.19608735e−021 | −2.54791026e−025 | 1.06081720e−028 |
| 46 | −1.69652628e−021 | 1.44074754e−025 | 2.91395857e−030 |
| 47 | 5.71824030e−021 | −4.38179150e−025 | 1.61431061e−029 |
| 49 | 1.27155044e−018 | −1.75366514e−022 | 1.10664062e−026 |

TABLE 20

| Surface | Radius | Thickness | Material | ½ Diam. | Type |
|---|---|---|---|---|---|
| 0 | 0.000000000 | 44.536474494 | AIR | 64.000 | |
| 1 | −145.614238159 | 20.028968251 | SILUV | 71.569 | |
| 2 | −106.712344272 | 3.165042254 | AIR | 75.720 | |
| 3 | −126.799930892 | 14.997327707 | SILUV | 77.371 | |
| 4 | −400.529009983 | 24.938975486 | AIR | 89.386 | |
| 5 | −153.978050679 | 32.035367034 | SILUV | 91.679 | |
| 6 | −113.485754514 | 3.962209737 | AIR | 96.767 | |
| 7 | 481.661051100 | 51.626847869 | SILUV | 109.810 | |
| 8 | −218.069217303 | 0.986417498 | AIR | 110.501 | |
| 9 | 95.461306806 | 78.518887093 | SILUV | 88.224 | |
| 10 | 197.024903934 | 20.433893299 | AIR | 65.510 | |
| 11 | 245.480984290 | 15.389927680 | SILUV | 50.234 | |
| 12 | 208.931069399 | 52.005350380 | AIR | 39.571 | |
| 13 | −51.537539329 | 25.208829578 | SILUV | 43.896 | |
| 14 | −67.256773583 | 31.133045864 | AIR | 59.014 | |
| 15 | −353.059395237 | 33.742142302 | SILUV | 97.721 | |
| 16 | −152.100516860 | 1.776048462 | AIR | 102.828 | |
| 17 | −246.044785191 | 45.384512544 | SILUV | 109.125 | |
| 18 | −136.487212093 | 39.988466465 | AIR | 113.661 | |
| 19 | 0.000000000 | 201.398483236 | AIR | 114.931 | |
| 20 | −233.811577421 | 14.982820253 | SILUV | 137.713 | |
| 21 | −370.567496646 | 37.810813405 | AIR | 153.233 | |
| 22 | −216.552824900 | −37.810813405 | AIR | 155.425 | REFL |
| 23 | −370.567496646 | −14.982820253 | SILUV | 147.967 | |
| 24 | −233.811577421 | −201.398483236 | AIR | 120.238 | |
| 25 | 168.695670563 | 201.398483236 | AIR | 106.748 | REFL |
| 26 | −233.811577421 | 14.982820253 | SILUV | 76.924 | |
| 27 | −370.567496646 | 37.810813405 | AIR | 81.451 | |

TABLE 20-continued

| Surface | Radius | Thickness | Material | ½ Diam. | Type |
|---|---|---|---|---|---|
| 28 | 0.000000000 | 40.022296005 | AIR | 92.209 | |
| 29 | 241.209000864 | 59.448832101 | SILUV | 108.950 | |
| 30 | −367.385238353 | 16.411120649 | AIR | 108.057 | |
| 31 | 357.895873274 | 15.315252659 | SILUV | 93.192 | |
| 32 | 94.401040596 | 38.563342544 | AIR | 77.588 | |
| 33 | 442.579628511 | 14.989394891 | SILUV | 78.610 | |
| 34 | 12021.837327700 | 28.864129981 | AIR | 79.433 | |
| 35 | −191.074651244 | 21.063184315 | SILUV | 81.221 | |
| 36 | −155.506376055 | 9.229041305 | AIR | 86.157 | |
| 37 | 185.464309512 | 44.606063412 | SILUV | 101.263 | |
| 38 | −1150.340708410 | 31.620758000 | AIR | 100.270 | |
| 39 | 0.000000000 | −0.000000330 | AIR | 92.899 | |
| 40 | 134.597113443 | 29.097516432 | SILUV | 92.514 | |
| 41 | 296.937234549 | 3.458534424 | AIR | 90.494 | |
| 42 | 150.878027709 | 36.379168022 | SILUV | 87.171 | |
| 43 | −494.554249982 | 0.979230496 | AIR | 84.334 | |
| 44 | 65.631220570 | 30.011852752 | SILUV | 57.267 | |
| 45 | 126.706468270 | 0.934188028 | AIR | 49.586 | |
| 46 | 43.426322889 | 31.956384174 | CAFUV | 36.843 | |
| 47 | 0.000000000 | 2.999915964 | H2OV | 20.807 | |
| 48 | 0.000000000 | 0.000000000 | AIR | 16.001 | |

NA = 1.2,  
β = 0.25

| Field | a | b | c |
|---|---|---|---|
| | 26 | 4.5 | 4.75 |

WL 193.3 nm  
SILUV 1.56049116  
CAFUV 1.50110592  
H2OV 1.4368

TABLE 20A

Aspherical Constants

| Surface | K | C1 | C2 | C3 |
|---|---|---|---|---|
| 1 | 0.00000000e+000 | −1.87990337e−008 | −7.06178066e−012 | −1.25139326e−015 |
| 6 | 0.00000000e+000 | 2.08430698e−009 | 3.65727833e−013 | 1.43149385e−018 |
| 7 | 0.00000000e+000 | 1.33126997e−008 | −2.47997131e−012 | 3.62223701e−017 |
| 12 | 0.00000000e+000 | 6.92559246e−007 | 1.01811160e−010 | 4.16533262e−015 |
| 16 | 0.00000000e+000 | 1.26266812e−008 | −7.60497043e−013 | 5.26322462e−017 |
| 20 | 0.00000000e+000 | −2.84981575e−008 | 5.16388350e−013 | −2.39579817e−017 |
| 24 | 0.00000000e+000 | −2.84981575e−008 | 5.16388350e−013 | −2.39579817e−017 |
| 26 | 0.00000000e+000 | −2.84981575e−008 | 5.16388350e−013 | −2.39579817e−017 |
| 29 | 0.00000000e+000 | 1.10496506e−007 | −6.42644915e−012 | 2.43910073e−016 |
| 31 | 0.00000000e+000 | −8.94334736e−008 | 5.51621746e−012 | 2.64317734e−016 |
| 34 | 0.00000000e+000 | 7.27650226e−008 | 5.05452869e−012 | 2.12206759e−016 |
| 42 | 0.00000000e+000 | −5.69019750e−008 | −3.78079018e−012 | −3.58536429e−016 |
| 43 | 0.00000000e+000 | 3.85631053e−008 | −1.96032685e−012 | −4.18174469e−016 |
| 45 | 0.00000000e+000 | 1.32980535e−007 | 6.98357216e−011 | −9.96688046e−015 |

| Surface | C4 | C5 | C6 |
|---|---|---|---|
| 1 | 1.04002349e−019 | 1.61613724e−024 | −2.08243603e−028 |
| 6 | 3.84125705e−021 | −4.35918853e−025 | 5.89812982e−029 |
| 7 | −3.52780013e−022 | 1.86263171e−025 | −7.15398794e−030 |
| 12 | 2.76714831e−017 | −1.56122873e−020 | 5.24368076e−024 |
| 16 | 1.50861183e−021 | 2.14471673e−025 | 2.66224210e−030 |
| 20 | 3.35275866e−022 | −8.50016423e−028 | −1.97442790e−031 |
| 24 | 3.35275866e−022 | −8.50016423e−028 | −1.97442790e−031 |
| 26 | 3.35275866e−022 | −8.50016423e−028 | −1.97442790e−031 |
| 29 | −1.98759724e−020 | 8.00452148e−025 | −9.31628471e−030 |
| 31 | 3.20019743e−020 | −4.26422117e−024 | 1.50940276e−028 |
| 34 | 5.08829476e−020 | −5.03622460e−024 | 7.39342220e−028 |
| 42 | −4.25536201e−020 | 2.42006208e−024 | 1.84293028e−028 |
| 43 | 9.23637376e−020 | −8.60875665e−024 | 4.05098414e−028 |
| 45 | −3.10084571e−019 | 1.88265675e−022 | −4.40640742e−026 |

TABLE 21

| Surface | Radius | Thickness | Material | ½ Diam. | Type |
|---|---|---|---|---|---|
| 0 | 0.000000000 | 31.999392757 | AIR | 64.675 | |
| 1 | 149.202932404 | 20.120662646 | SILUV | 82.837 | |
| 2 | 233.357095260 | 1.010428853 | AIR | 82.195 | |
| 3 | 172.529012606 | 14.999455624 | SILUV | 83.021 | |
| 4 | 153.116811658 | 37.462782355 | AIR | 80.924 | |
| 5 | −385.292133909 | 24.003915576 | SILUV | 81.802 | |
| 6 | −189.041850576 | 1.014246919 | AIR | 84.223 | |
| 7 | −1521.447544300 | 27.529894754 | SILUV | 83.808 | |
| 8 | −150.691487200 | 0.999361796 | AIR | 85.384 | |
| 9 | 89.238407847 | 56.953687562 | SILUV | 75.993 | |
| 10 | 101.329520927 | 13.713067990 | AIR | 58.085 | |
| 11 | 176.794820361 | 18.039991299 | SILUV | 55.978 | |
| 12 | −447.950790449 | 73.129977874 | AIR | 52.127 | |
| 13 | −57.595257960 | 16.299538518 | SILUV | 50.436 | |
| 14 | −83.036630542 | 0.999811850 | AIR | 64.360 | |
| 15 | −2287.430407510 | 44.210083628 | SILUV | 86.772 | |
| 16 | −147.632600397 | 0.998596167 | AIR | 92.132 | |
| 17 | −352.966686998 | 32.886671205 | SILUV | 97.464 | |
| 18 | −153.824954969 | 271.807415024 | AIR | 100.038 | |
| 19 | −238.525982305 | 14.998824247 | SILUV | 122.669 | |
| 20 | −315.714610405 | 19.998064817 | AIR | 131.899 | |
| 21 | −202.650261219 | −19.998064817 | AIR | 131.917 | REFL |
| 22 | −315.714610405 | −14.998824247 | SILUV | 131.852 | |
| 23 | −238.525982305 | −196.811186275 | AIR | 112.411 | |
| 24 | 207.441141965 | −14.998504935 | SILUV | 107.771 | |
| 25 | 268.178120713 | −19.998469851 | AIR | 124.363 | |
| 26 | 193.196124575 | 19.998469851 | AIR | 127.679 | REFL |
| 27 | 268.178120713 | 14.998504935 | SILUV | 125.948 | |
| 28 | 207.441141965 | 271.807924190 | AIR | 114.576 | |
| 29 | 325.701461380 | 38.709870586 | SILUV | 92.964 | |
| 30 | −885.381927410 | 59.476563453 | AIR | 90.975 | |
| 31 | −123.867242183 | 18.110373017 | SILUV | 74.226 | |
| 32 | 126.359054159 | 30.087671186 | AIR | 73.733 | |
| 33 | −16392.865249200 | 31.626040348 | SILUV | 77.090 | |
| 34 | −299.592698534 | 15.292623049 | AIR | 86.158 | |
| 35 | −296.842399050 | 24.895495087 | SILUV | 89.777 | |
| 36 | −163.748333285 | 8.131594074 | AIR | 94.529 | |
| 37 | 675.259743609 | 47.908987883 | SILUV | 116.712 | |
| 38 | −263.915255162 | 1.054743285 | AIR | 118.641 | |
| 39 | 356.010681144 | 47.536295502 | SILUV | 120.712 | |
| 40 | −435.299476405 | 3.543672029 | AIR | 119.727 | |
| 41 | 0.000000000 | 10.346485925 | AIR | 112.597 | |
| 42 | 256.262375445 | 67.382487780 | SILUV | 107.047 | |
| 43 | −454.037284452 | 0.998990981 | AIR | 99.451 | |
| 44 | 84.434680547 | 36.424585989 | SILUV | 70.101 | |
| 45 | 207.490725651 | 0.997139930 | AIR | 62.005 | |
| 46 | 50.112836179 | 41.301883710 | CAFUV | 43.313 | |
| 47 | 0.000000000 | 2.999011124 | H2OV | 20.878 | |
| 48 | 0.000000000 | 0.000000000 | AIR | 16.169 | |

NA = 1.2,
β = 0.25
Field   a    b    c
        26   4.5  4.75
WL      193.3 nm
SILUV   1.56049116
CAFUV   1.50110592
H2OV    1.4368

TABLE 21A

| | Aspherical Constants | | | |
|---|---|---|---|---|
| Surface | K | C1 | C2 | C3 |
| 6 | 0.00000000e+000 | 5.47357338e−008 | 1.50925239e−012 | −1.14128005e−015 |
| 7 | 0.00000000e+000 | −5.65236098e−008 | −4.45251739e−012 | −1.12368170e−015 |
| 12 | 0.00000000e+000 | 3.75669258e−007 | 2.00493160e−011 | −1.57617930e−015 |
| 16 | 0.00000000e+000 | −2.97247128e−008 | −1.16246607e−013 | 1.91525676e−016 |
| 19 | 0.00000000e+000 | −1.79930163e−008 | −1.81456294e−014 | −6.42956161e−018 |
| 23 | 0.00000000e+000 | −1.79930163e−008 | −1.81456294e−014 | −6.42956161e−018 |
| 24 | 0.00000000e+000 | 1.41712563e−008 | 1.42766536e−013 | 5.35849443e−018 |
| 28 | 0.00000000e+000 | 1.41712563e−008 | 1.42766536e−013 | 5.35849443e−018 |
| 29 | 0.00000000e+000 | 1.42833387e−007 | 3.55808937e−014 | −1.23227147e−017 |
| 31 | 0.00000000e+000 | −1.51349602e−008 | 1.62092054e−011 | −4.43234287e−016 |

TABLE 21A-continued

Aspherical Constants

| | | | | |
|---|---|---|---|---|
| 34 | 0.00000000e+000 | 1.39181850e−007 | 3.36145772e−012 | −4.99179521e−017 |
| 42 | 0.00000000e+000 | −4.24593271e−009 | −1.84016360e−012 | −2.09008867e−017 |
| 43 | 0.00000000e+000 | −1.75350671e−008 | 1.70435017e−014 | 1.85876255e−020 |
| 45 | 0.00000000e+000 | 4.03560215e−008 | 2.57831806e−011 | −6.32742355e−015 |

| Surface | C4 | C5 | C6 |
|---|---|---|---|
| 6 | 2.03745939e−022 | −1.46491288e−024 | 3.18476009e−028 |
| 7 | 7.05334891e−020 | −6.42608755e−024 | 4.64154513e−029 |
| 12 | 2.00775938e−018 | −1.81218495e−022 | 1.59512857e−028 |
| 16 | −5.42330199e−021 | 4.84113906e−025 | −1.50564943e−030 |
| 19 | −1.72138657e−022 | 4.34933124e−027 | −2.46030547e−031 |
| 23 | −1.72138657e−022 | 4.34933124e−027 | −2.46030547e−031 |
| 24 | 5.30493751e−022 | −2.04437497e−026 | 1.09297996e−030 |
| 28 | 5.30493751e−022 | −2.04437497e−026 | 1.09297996e−030 |
| 29 | 1.26320560e−021 | 1.99476309e−025 | −1.46884711e−029 |
| 31 | 2.01248512e−019 | −3.73070267e−023 | 1.98749982e−027 |
| 34 | −8.18195448e−021 | 4.05698527e−025 | 4.11589492e−029 |
| 42 | −2.89704097e−021 | 1.96863338e−025 | 6.53807102e−030 |
| 43 | 6.37197338e−021 | −5.19573140e−025 | 2.34597624e−029 |
| 45 | 9.55984243e−019 | −1.13622236e−022 | 6.56644929e−027 |

TABLE 22

| Surface | Radius | Thickness | Material | ½ Diam. | Type |
|---|---|---|---|---|---|
| 0 | 0.000000000 | 31.993696817 | AIR | 65.000 | |
| 1 | 0.000000000 | −0.006216437 | AIR | 75.178 | |
| 2 | 173.245898492 | 28.849219645 | SILUV | 80.701 | |
| 3 | −1901.645842520 | 1.159056366 | AIR | 81.186 | |
| 4 | 139.958280577 | 17.383993593 | SILUV | 82.800 | |
| 5 | 114.690720801 | 65.798932682 | AIR | 78.012 | |
| 6 | 177.803002075 | 54.744184912 | SILUV | 88.979 | |
| 7 | −204.801382425 | 0.997356478 | AIR | 88.078 | |
| 8 | 89.450127459 | 21.884550473 | SILUV | 62.734 | |
| 9 | 143.066432170 | 15.678153833 | AIR | 57.180 | |
| 10 | −13433.891703300 | 15.000276693 | SILUV | 54.058 | |
| 11 | −8853.549440170 | 13.872934681 | AIR | 46.493 | |
| 12 | 0.000000000 | 0.000000000 | AIR | 37.955 | |
| 13 | 0.000000000 | 61.755398574 | AIR | 38.009 | |
| 14 | −66.760883146 | 14.994014816 | SILUV | 54.182 | |
| 15 | −72.012316741 | 23.617101147 | AIR | 60.909 | |
| 16 | −63.807677134 | 21.572901785 | SILUV | 62.830 | |
| 17 | −76.257505928 | 1.720678480 | AIR | 75.095 | |
| 18 | 1299.192911670 | 55.482510512 | SILUV | 104.240 | |
| 19 | −148.321651349 | 39.989348698 | AIR | 106.312 | |
| 20 | 0.000000000 | 232.380264110 | AIR | 95.929 | |
| 21 | −201.575622280 | −232.380264110 | AIR | 121.585 | REFL |
| 22 | 199.702239038 | 232.380264110 | AIR | 118.875 | REFL |
| 23 | 0.000000000 | 39.986853275 | AIR | 91.439 | |
| 24 | 162.499205332 | 44.748459237 | SILUV | 93.810 | |
| 25 | −2036.857320830 | 1.012661476 | AIR | 91.212 | |
| 26 | 141.444403824 | 15.471017813 | SILUV | 77.784 | |
| 27 | 167.499214725 | 41.441314042 | AIR | 72.833 | |
| 28 | −106.505215697 | 14.992253348 | SILUV | 70.530 | |
| 29 | 98.946616742 | 44.625025386 | AIR | 64.458 | |
| 30 | −139.301063148 | 14.998444853 | SILUV | 66.132 | |
| 31 | −339.669887909 | 0.997145626 | AIR | 79.298 | |
| 32 | 1356.020956420 | 23.905236106 | SILUV | 86.623 | |
| 33 | −340.109054698 | 5.477848077 | AIR | 90.957 | |
| 34 | 472.296115575 | 52.138063579 | SILUV | 108.763 | |
| 35 | −222.876812950 | 8.808100307 | AIR | 112.258 | |
| 36 | 2053.528638090 | 24.342755161 | SILUV | 119.824 | |
| 37 | −621.581254067 | 1.014456714 | AIR | 120.910 | |
| 38 | 210.455448779 | 43.312493694 | SILUV | 124.650 | |
| 39 | −1489.901649750 | 5.393215295 | AIR | 124.077 | |
| 40 | 210.646045010 | 47.972124824 | SILUV | 119.142 | |
| 41 | −627.180734089 | 0.998977914 | AIR | 117.607 | |
| 42 | 97.515291800 | 53.409662718 | SILUV | 82.565 | |
| 43 | 469.577208920 | 0.998603706 | AIR | 69.163 | |
| 44 | 58.393704585 | 42.102914517 | CAFUV | 46.689 | |
| 45 | 0.000000000 | 3.001333990 | H2OV | 20.956 | |

TABLE 22A

Aspherical Constants

Surface 2

| | |
|---|---|
| K | 0.0000 |
| C1 | −4.85507054e−008 |
| C2 | 8.30450606e−013 |
| C3 | −6.55835562e−016 |
| C4 | 6.07754089e−020 |
| C5 | −4.30736726e−024 |
| C6 | 9.97068342e−029 |
| C7 | 0.00000000e+000 |
| C8 | 0.00000000e+000 |
| C9 | 0.00000000e+000 |

Surface 5

| | |
|---|---|
| K | 0.0000 |
| C1 | 4.63982284e−008 |
| C2 | −4.36308368e−016 |
| C3 | −4.56700150e−016 |
| C4 | 1.41944231e−020 |
| C5 | −2.58792066e−024 |
| C6 | 2.91613493e−032 |
| C7 | 0.00000000e+000 |
| C8 | 0.00000000e+000 |
| C9 | 0.00000000e+000 |

Surface 6

| | |
|---|---|
| K | 0.0000 |
| C1 | 7.93368538e−008 |
| C2 | −3.49340213e−012 |
| C3 | −3.72450023e−016 |
| C4 | −1.50853577e−020 |
| C5 | 4.35840155e−024 |
| C6 | −1.74914218e−028 |
| C7 | 0.00000000e+000 |
| C8 | 0.00000000e+000 |
| C9 | 0.00000000e+000 |

Surface 11

| | |
|---|---|
| K | 0.0000 |
| C1 | 3.21277393e−007 |
| C2 | 2.34047891e−012 |
| C3 | 1.48915392e−014 |
| C4 | −1.12960188e−017 |
| C5 | 3.70333100e−021 |
| C6 | −4.63366043e−025 |
| C7 | 0.00000000e+000 |
| C8 | 0.00000000e+000 |
| C9 | 0.00000000e+000 |

Surface 19

| | |
|---|---|
| K | 0.0000 |
| C1 | 1.27016347e−008 |
| C2 | 4.09192710e−013 |
| C3 | 2.48214285e−017 |
| C4 | 9.66053244e−022 |
| C5 | 1.60329104e−027 |
| C6 | 2.07652380e−030 |
| C7 | 0.00000000e+000 |
| C8 | 0.00000000e+000 |
| C9 | 0.00000000e+000 |

Surface 21

| | |
|---|---|
| K | 0.0000 |
| C1 | 1.00526801e−008 |
| C2 | 1.78849410e−013 |
| C3 | 2.48862104e−018 |
| C4 | 9.77481750e−023 |
| C5 | −3.23740664e−028 |
| C6 | 6.28188299e−032 |
| C7 | 0.00000000e+000 |

TABLE 22A-continued

Aspherical Constants

| | |
|---|---|
| C8 | 0.00000000e+000 |
| C9 | 0.00000000e+000 |

Surface 22

| | |
|---|---|
| K | 0.0000 |
| C1 | −8.36189868e−009 |
| C2 | −1.86708153e−013 |
| C3 | −3.35782535e−018 |
| C4 | −6.14811355e−023 |
| C5 | −6.72093224e−028 |
| C6 | −5.98449275e−032 |
| C7 | 0.00000000e+000 |
| C8 | 0.00000000e+000 |
| C9 | 0.00000000e+000 |

Surface 24

| | |
|---|---|
| K | 0.0000 |
| C1 | 3.26436925e−008 |
| C2 | 9.95492740e−013 |
| C3 | 3.47886760e−017 |
| C4 | 6.60667009e−021 |
| C5 | −3.90366799e−025 |
| C6 | 4.03156525e−029 |
| C7 | 0.00000000e+000 |
| C8 | 0.00000000e+000 |
| C9 | 0.00000000e+000 |

Surface 28

| | |
|---|---|
| K | 0.0000 |
| C1 | 1.73452145e−007 |
| C2 | 9.62198511e−012 |
| C3 | 8.33010916e−016 |
| C4 | −4.89738667e−020 |
| C5 | −2.08149618e−023 |
| C6 | 2.57941116e−027 |
| C7 | 0.00000000e+000 |
| C8 | 0.00000000e+000 |
| C9 | 0.00000000e+000 |

Surface 31

| | |
|---|---|
| K | 0.0000 |
| C1 | 1.28849399e−007 |
| C2 | 4.99181087e−012 |
| C3 | 5.65181638e−017 |
| C4 | 2.64289484e−020 |
| C5 | −3.15869403e−024 |
| C6 | −3.04781776e−029 |
| C7 | 0.00000000e+000 |
| C8 | 0.00000000e+000 |
| C9 | 0.00000000e+000 |

Surface 34

| | |
|---|---|
| K | 0.0000 |
| C1 | −2.57944586e−008 |
| C2 | 7.33527637e−013 |
| C3 | −5.33079171e−018 |
| C4 | −8.21688122e−022 |
| C5 | −2.94478649e−026 |
| C6 | 2.23217522e−030 |
| C7 | 0.00000000e+000 |
| C8 | 0.00000000e+000 |
| C9 | 0.00000000e+000 |

Surface 38

| | |
|---|---|
| K | 0.0000 |
| C1 | −1.91471943e−008 |
| C2 | −1.34589512e−012 |
| C3 | 3.11852582e−017 |
| C4 | −2.35897615e−021 |
| C5 | 6.73415544e−026 |
| C6 | 1.62707757e−030 |

TABLE 22A-continued

Aspherical Constants

| | | |
|---|---|---|
| C7 | 0.00000000e+000 | |
| C8 | 0.00000000e+000 | |
| C9 | 0.00000000e+000 | |

Surface 40

| | |
|---|---|
| K | 0.0000 |
| C1 | −6.30346424e−008 |
| C2 | −4.64729134e−013 |
| C3 | 3.22359222e−017 |
| C4 | 2.89305419e−023 |
| C5 | −2.15332629e−026 |
| C6 | 8.39177392e−031 |
| C7 | 0.00000000e+000 |
| C8 | 0.00000000e+000 |
| C9 | 0.00000000e+000 |

Surface 41

| | |
|---|---|
| K | 0.0000 |
| C1 | −2.41682461e−008 |
| C2 | 1.18102559e−013 |
| C3 | −1.34037856e−016 |
| C4 | 1.79602212e−020 |
| C5 | −8.86179442e−025 |
| C6 | 1.89592509e−029 |
| C7 | 0.00000000e+000 |
| C8 | 0.00000000e+000 |
| C9 | 0.00000000e+000 |

Surface 43

| | |
|---|---|
| K | 0.0000 |
| C1 | 1.25460964e−007 |
| C2 | 7.10922055e−012 |
| C3 | −1.61078694e−015 |
| C4 | 1.49634597e−019 |
| C5 | −1.71885653e−023 |
| C6 | 1.04621563e−027 |
| C7 | 0.00000000e+000 |
| C8 | 0.00000000e+000 |
| C9 | 0.00000000e+000 |

TABLE 23

| Surface | Radius | Thickness | Material | ½ Diam. | Type |
|---|---|---|---|---|---|
| 0 | 0.000000000 | 32.343320391 | AIR | 64.675 | |
| 1 | 0.000000000 | 0.319194773 | AIR | 74.840 | |
| 2 | 165.502154849 | 22.393605178 | SILUV | 81.725 | |
| 3 | 427.564472229 | 78.042155049 | AIR | 81.442 | |
| 4 | 362.770694637 | 28.092832019 | SILUV | 88.424 | |
| 5 | −418.998032701 | 0.953143564 | AIR | 88.789 | |
| 6 | 108.458706796 | 42.211528711 | SILUV | 85.410 | |
| 7 | 309.813567338 | 43.976162585 | AIR | 80.542 | |
| 8 | 440.563406352 | 17.425727560 | SILUV | 60.495 | |
| 9 | −278.343745406 | 54.725816031 | AIR | 56.963 | |
| 10 | −65.973394609 | 15.012675322 | SILUV | 50.057 | |
| 11 | −89.483928231 | 44.616098218 | AIR | 59.618 | |
| 12 | −164.547135387 | 29.271100213 | SILUV | 82.247 | |
| 13 | −110.100956635 | 0.995307980 | AIR | 86.942 | |
| 14 | −467.051029385 | 33.374516855 | SILUV | 94.291 | |
| 15 | −156.421752282 | 39.987151223 | AIR | 96.378 | |
| 16 | 0.000000000 | 229.883694545 | AIR | 89.855 | |
| 17 | −196.922423263 | −229.883694545 | AIR | 115.021 | REFL |
| 18 | 196.894790764 | 229.883694545 | AIR | 115.024 | REFL |
| 19 | 0.000000000 | 40.005209742 | AIR | 89.120 | |
| 20 | 158.312187294 | 42.217660752 | SILUV | 95.332 | |
| 21 | 2467.131056460 | 70.144222480 | AIR | 92.913 | |
| 22 | −160.335654972 | 14.992560808 | SILUV | 73.410 | |
| 23 | 116.412074936 | 38.531709122 | AIR | 69.984 | |
| 24 | −250.712291671 | 18.369318291 | SILUV | 71.881 | |
| 25 | −300.079780156 | 31.051013458 | AIR | 80.817 | |

TABLE 23-continued

| | | | | |
|---|---|---|---|---|
| 26 | 5705.510103480 | 24.334610155 | SILUV | 107.710 |
| 27 | −458.981124329 | 14.563800138 | AIR | 111.524 |
| 28 | 946.448274166 | 62.249192106 | SILUV | 126.621 |
| 29 | −192.486608755 | 1.015402218 | AIR | 129.650 |
| 30 | −4079.043797180 | 15.732935333 | SILUV | 130.993 |
| 31 | −1100.089935780 | 14.595769901 | AIR | 131.283 |
| 32 | 0.000000000 | 0.000000000 | AIR | 130.790 |
| 33 | 0.000000000 | −13.603116119 | AIR | 131.340 |
| 34 | 220.445900864 | 51.281950308 | SILUV | 133.878 |
| 35 | −1597.683074300 | 5.271684397 | AIR | 133.124 |
| 36 | 215.527385603 | 15.522171709 | SILUV | 124.678 |
| 37 | 314.221642044 | 4.657196014 | AIR | 121.589 |
| 38 | 305.812344416 | 42.963421749 | SILUV | 120.269 |
| 39 | −771.778612980 | 0.996840378 | AIR | 117.157 |
| 40 | 109.741348234 | 43.192990855 | SILUV | 84.698 |
| 41 | 708.633799886 | 6.161060319 | AIR | 76.900 |
| 42 | 66.404779509 | 39.130193750 | CAFUV | 46.929 |
| 43 | 0.000000000 | 2.999814914 | H2OV | 20.723 |
| 44 | 0.000000000 | 0.000000000 | AIR | 16.171 |

| | | | |
|---|---|---|---|
| WL | 193.3 nm | 193.4 nm | 193.2 nm |
| SILUV | 1.560491 | 1.560332 | 1.560650 |
| CAFUV | 1.501106 | 1.501010 | 1.501202 |
| H2OV | 1.436800 | 1.436800 | 1.436800 |

Ymax = 64.675 mm;
NA = 1.2

TABLE 23A

Aspherical Constants

Surface 3

| | |
|---|---|
| K | 0.0000 |
| C1 | 5.16435696e−008 |
| C2 | −3.34181067e−012 |
| C3 | 3.14093710e−017 |
| C4 | −3.87421162e−022 |
| C5 | −8.61200118e−027 |
| C6 | −1.47089082e−029 |
| C7 | 0.00000000e+000 |
| C8 | 0.00000000e+000 |
| C9 | 0.00000000e+000 |

Surface 4

| | |
|---|---|
| K | 0.0000 |
| C1 | 9.50247881e−010 |
| C2 | −3.73319015e−012 |
| C3 | −6.51837734e−017 |
| C4 | −7.93160821e−021 |
| C5 | 9.00091591e−025 |
| C6 | −1.92340271e−028 |
| C7 | 0.00000000e+000 |
| C8 | 0.00000000e+000 |
| C9 | 0.00000000e+000 |

Surface 9

| | |
|---|---|
| K | 0.0000 |
| C1 | 1.24922845e−007 |
| C2 | 1.54187542e−011 |
| C3 | −3.69685941e−016 |
| C4 | 1.37785719e−018 |
| C5 | −3.60351270e−022 |
| C6 | 2.85480659e−026 |
| C7 | 0.00000000e+000 |
| C8 | 0.00000000e+000 |
| C9 | 0.00000000e+000 |

Surface 13

| | |
|---|---|
| K | 0.0000 |
| C1 | 1.45134700e−009 |
| C2 | 1.24926632e−014 |
| C3 | 8.37553299e−018 |
| C4 | 2.49716672e−021 |

TABLE 23A-continued

Aspherical Constants

| | |
|---|---|
| C5 | −2.66380030e−025 |
| C6 | 2.61815898e−029 |
| C7 | 0.00000000e+000 |
| C8 | 0.00000000e+000 |
| C9 | 0.00000000e+000 |

Surface 17

| | |
|---|---|
| K | 0.0000 |
| C1 | 9.25585261e−009 |
| C2 | 1.67052938e−013 |
| C3 | 2.68611580e−018 |
| C4 | 1.04166910e−022 |
| C5 | −1.70724722e−027 |
| C6 | 1.10260829e−031 |
| C7 | 0.00000000e+000 |
| C8 | 0.00000000e+000 |
| C9 | 0.00000000e+000 |

Surface 18

| | |
|---|---|
| K | 0.0000 |
| C1 | −8.29620456e−009 |
| C2 | −1.78159419e−013 |
| C3 | −3.07128696e−018 |
| C4 | −8.08505340e−023 |
| C5 | 2.33488811e−028 |
| C6 | −8.31087015e−032 |
| C7 | 0.00000000e+000 |
| C8 | 0.00000000e+000 |
| C9 | 0.00000000e+000 |

Surface 20

| | |
|---|---|
| K | 0.0000 |
| C1 | 1.71573479e−008 |
| C2 | 5.87191967e−013 |
| C3 | 3.53602344e−017 |
| C4 | 3.89188764e−021 |
| C5 | −2.56256746e−025 |
| C6 | 2.81528130e−029 |
| C7 | 0.00000000e+000 |
| C8 | 0.00000000e+000 |
| C9 | 0.00000000e+000 |

Surface 22

| | |
|---|---|
| K | 0.0000 |
| C1 | −9.04880266e−009 |
| C2 | 3.31829223e−012 |
| C3 | −7.82564703e−017 |
| C4 | 7.87650776e−020 |
| C5 | −7.94502597e−024 |
| C6 | 2.40943558e−027 |
| C7 | 0.00000000e+000 |
| C8 | 0.00000000e+000 |
| C9 | 0.00000000e+000 |

Surface 25

| | |
|---|---|
| K | 0.0000 |
| C1 | 1.11732794e−007 |
| C2 | 5.01044308e−012 |
| C3 | 1.82247821e−016 |
| C4 | 2.99282347e−021 |
| C5 | −2.06723334e−024 |
| C6 | 2.32093750e−029 |
| C7 | 0.00000000e+000 |
| C8 | 0.00000000e+000 |
| C9 | 0.00000000e+000 |

Surface 28

| | |
|---|---|
| K | 0.0000 |
| C1 | −2.42933057e−008 |
| C2 | 3.07041360e−014 |
| C3 | 7.41003764e−018 |

TABLE 23A-continued

Aspherical Constants

| | |
|---|---|
| C4 | −5.26534391e−022 |
| C5 | 1.17630052e−026 |
| C6 | −1.17982545e−031 |
| C7 | 0.00000000e+000 |
| C8 | 0.00000000e+000 |
| C9 | 0.00000000e+000 |

Surface 34

| | |
|---|---|
| K | 0.0000 |
| C1 | −8.91439687e−009 |
| C2 | −7.33160527e−013 |
| C3 | −4.83885006e−018 |
| C4 | −2.37515306e−022 |
| C5 | 2.33792040e−026 |
| C6 | −2.27854885e−032 |
| C7 | 0.00000000e+000 |
| C8 | 0.00000000e+000 |
| C9 | 0.00000000e+000 |

Surface 36

| | |
|---|---|
| K | 0.0000 |
| C1 | −5.63334250e−008 |
| C2 | −3.26907281e−013 |
| C3 | 9.72642980e−017 |
| C4 | 4.30118073e−021 |
| C5 | −5.03894259e−025 |
| C6 | 1.42974281e−029 |
| C7 | 0.00000000e+000 |
| C8 | 0.00000000e+000 |
| C9 | 0.00000000e+000 |

Surface 39

| | |
|---|---|
| K | 0.0000 |
| C1 | −1.21454753e−008 |
| C2 | 1.19750305e−012 |
| C3 | −6.39990660e−017 |
| C4 | 4.10753453e−021 |
| C5 | −1.17680773e−025 |
| C6 | 4.05203512e−030 |
| C7 | 0.00000000e+000 |
| C8 | 0.00000000e+000 |
| C9 | 0.00000000e+000 |

Surface 41

| | |
|---|---|
| K | 0.0000 |
| C1 | 4.06678857e−008 |
| C2 | 3.94505025e−012 |
| C3 | −2.03790398e−016 |
| C4 | 2.07246865e−020 |
| C5 | −3.19577553e−024 |
| C6 | 2.12601962e−028 |
| C7 | 0.00000000e+000 |
| C8 | 0.00000000e+000 |
| C9 | 0.00000000e+000 |

TABLE 27

(EM28)

| Surface | Radius | Asphere | Thickness | Material | ½ Diameter |
|---|---|---|---|---|---|
| 1 | 0.000000 | | −0.028411 | LUFTV193 | 76.078 |
| 2 | 148.374584 | AS | 30.141343 | SIO2V | 82.524 |
| 3 | 2980.684122 | | 2.731918 | N2VP950 | 82.907 |
| 4 | 177.363525 | | 46.196958 | SIO2V | 84.542 |
| 5 | 765.980001 | AS | 27.096346 | N2VP950 | 80.837 |
| 6 | 2666.335118 | | 22.841301 | SIO2V | 73.658 |
| 7 | −291.755432 | AS | 0.990907 | N2VP950 | 70.887 |
| 8 | 230.707988 | | 26.508915 | SIO2V | 65.013 |

TABLE 27-continued

(EM28)

| Surface | Radius | Asphere | Thickness | Material | ½ Diameter |
|---|---|---|---|---|---|
| 9 | −298.406132 | | 21.906961 | N2VP950 | 61.389 |
| 10 | −112.314548 | | 10.039397 | SIO2V | 45.510 |
| 11 | −118.846218 | | 2.540087 | N2VP950 | 43.187 |
| 12 | 0.000000 | | 0.000000 | N2VP950 | 35.411 |
| 13 | 0.000000 | | 18.000000 | N2VP950 | 35.411 |
| 14 | 0.000000 | | 10.013160 | SIO2V | 46.508 |
| 15 | 0.000000 | | 0.991399 | N2VP950 | 50.085 |
| 16 | 237.566392 | | 20.385633 | SIO2V | 54.619 |
| 17 | −476.646043 | | 28.746587 | N2VP950 | 57.184 |
| 18 | −81.332740 | | 10.129443 | SIO2V | 59.250 |
| 19 | −86.414601 | | 0.995700 | N2VP950 | 63.535 |
| 20 | −2069.485733 | AS | 30.115541 | SIO2V | 71.732 |
| 21 | −141.210644 | | 0.983397 | N2VP950 | 74.255 |
| 22 | 962.252932 | AS | 9.980083 | SIO2V | 74.793 |
| 23 | 819.084531 | | 36.977869 | N2VP950 | 75.040 |
| 24 | 0.000000 | | 198.944441 | N2VP950 | 77.850 |
| 25 | −167.595461 | AS | −198.944441 | REFL | 139.680 |
| 26 | 167.595461 | AS | 198.944441 | REFL | 111.811 |
| 27 | 0.000000 | | 36.992449 | N2VP950 | 110.123 |
| 28 | 268.305681 | | 49.624605 | SIO2V | 123.343 |
| 29 | −828.322347 | AS | 47.027120 | N2VP950 | 122.544 |
| 30 | 327.800199 | | 39.684648 | SIO2V | 108.912 |
| 31 | −1269.440044 | AS | 0.995014 | N2VP950 | 106.029 |
| 32 | 331.950903 | | 9.989996 | SIO2V | 93.089 |
| 33 | 95.290319 | | 49.810064 | N2VP950 | 76.973 |
| 34 | −442.703787 | | 9.991655 | SIO2V | 76.737 |
| 35 | 143.501616 | | 20.229593 | N2VP950 | 77.748 |
| 36 | 483.451705 | | 9.993273 | SIO2V | 79.933 |
| 37 | 241.810075 | | 15.546146 | N2VP950 | 84.505 |
| 38 | 928.401379 | | 29.795388 | SIO2V | 88.441 |
| 39 | −298.259102 | AS | 8.829909 | N2VP950 | 94.008 |
| 40 | −1812.559641 | AS | 29.628322 | SIO2V | 101.744 |
| 41 | −270.502936 | | 7.417032 | N2VP950 | 107.779 |
| 42 | −7682.999744 | AS | 45.892645 | SIO2V | 118.999 |
| 43 | −231.286706 | | 27.404554 | N2VP950 | 122.729 |
| 44 | 449.487156 | | 46.556603 | SIO2V | 134.549 |
| 45 | −668.069375 | | 1.250913 | N2VP950 | 134.857 |
| 46 | 886.959900 | AS | 43.269922 | SIO2V | 133.822 |
| 47 | −295.612418 | | 0.987420 | N2VP950 | 133.749 |
| 48 | 230.112826 | | 44.287713 | SIO2V | 112.987 |
| 49 | −2356.132765 | AS | 0.978312 | N2VP950 | 108.183 |
| 50 | 92.104165 | | 41.465221 | SIO2V | 76.439 |
| 51 | 253.332614 | | 1.131452 | N2VP950 | 67.260 |
| 52 | 84.180015 | | 39.033045 | CAF2V193 | 50.611 |
| 53 | 0.000000 | | 3.000000 | H2OV193 | 21.082 |
| 54 | 0.000000 | | 0.000000 | AIR | 16.500 |

TABLE 27A

Aspherical Constants

| Surface | | | | | |
|---|---|---|---|---|---|
| | 2 | 5 | 7 | 20 | 22 |
| K | 0 | 0 | 0 | 0 | 0 |
| C1 | −7.058653e−08 | −1.114728e−07 | 1.398385e−07 | −1.149358e−08 | −5.629065e−08 |
| C2 | −2.984480e−12 | 4.526601e−12 | −6.219606e−12 | −6.065516e−12 | 1.905377e−12 |
| C3 | −1.303901e−16 | 1.421882e−16 | 3.410808e−16 | 6.763250e−16 | −2.554160e−16 |
| C4 | −5.960748e−21 | −1.154537e−19 | 3.575265e−20 | −7.651964e−20 | 6.886775e−21 |
| C5 | −6.187687e−25 | 1.628794e−23 | −2.900443e−23 | 5.689563e−24 | −6.938594e−25 |
| C6 | 8.668981e−29 | −6.255900e−28 | 2.343745e−27 | −2.312648e−28 | −2.420574e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| Surface | | | | | |
|---|---|---|---|---|---|
| | 25 | 26 | 29 | 31 | 39 |
| K | −2.31378 | −2.31378 | 0 | 0 | 0 |
| C1 | −4.828221e−08 | 4.828221e−08 | 1.342570e−08 | −9.018801e−08 | 3.278431e−08 |
| C2 | 7.051572e−13 | −7.051572e−13 | −3.644532e−13 | 6.045342e−12 | 1.370822e−17 |
| C3 | −2.377185e−17 | 2.377185e−17 | −2.375681e−17 | −1.273791e−16 | 1.643036e−16 |
| C4 | 6.284480e−22 | −6.284480e−22 | −3.970849e−22 | −2.702171e−21 | −2.021350e−20 |
| C5 | −1.385194e−26 | 1.385194e−26 | −4.372813e−27 | 3.262226e−25 | 2.670722e−24 |
| C6 | 1.514567e−31 | −1.514567e−31 | 6.283103e−31 | −6.948598e−30 | −1.187217e−28 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| Surface | | | | |
|---|---|---|---|---|
| | 40 | 42 | 46 | 49 |
| K | 0 | 0 | 0 | 0 |
| C1 | −5.316551e−08 | −1.954895e−09 | −4.282391e−08 | −3.095959e−08 |
| C2 | −7.707570e−14 | 5.606761e−14 | −1.948121e−13 | 3.451241e−12 |
| C3 | 2.146900e−16 | −6.199304e−17 | 7.664802e−17 | −1.219768e−16 |
| C4 | −2.184878e−20 | 3.478339e−21 | −2.354982e−21 | 4.060098e−21 |
| C5 | 2.255720e−24 | −1.558932e−25 | 1.361973e−26 | −9.053687e−26 |
| C6 | −9.545251e−29 | 4.899450e−30 | 2.019923e−31 | 1.610152e−30 |
| C7 | 0.000000e+00 | 0.000000e+00 | 0.000000e+00 | 0.000000e+00 |

TABLE 27A-continued

Aspherical Constants

| | | | | |
|---|---|---|---|---|
| C8 | 0.000000e+00 | 0.000000e+00 | 0.000000e+00 | 0.000000e+00 |
| C9 | 0.000000e+00 | 0.000000e+00 | 0.000000e+00 | 0.000000e+00 |

TABLE 28

(EM25)

| Surface | Radius | Thickness | Material | ½ Diam. | Type |
|---|---|---|---|---|---|
| 0 | 0.000000000 | 31.974939715 | AIR | 66.000 | |
| 1 | 0.000000000 | −0.024765663 | AIR | 76.143 | |
| 2 | 148.940822391 | 31.463360093 | SIO2V | 83.171 | |
| 3 | 6331.489300420 | 40.453855135 | AIR | 83.210 | |
| 4 | 928.302406310 | 14.994423747 | SIO2V | 83.796 | |
| 5 | 251.967918823 | 13.753137508 | AIR | 83.372 | |
| 6 | 172.912005335 | 50.243372901 | SIO2V | 87.569 | |
| 7 | −197.856766081 | 1.000964332 | AIR | 86.631 | |
| 8 | 81.522536296 | 17.681593406 | SIO2V | 65.574 | |
| 9 | 88.327907526 | 30.256558951 | AIR | 60.047 | |
| 10 | 117.551427452 | 18.843304175 | SIO2V | 50.042 | |
| 11 | 855.507852453 | 8.921765220 | AIR | 45.493 | |
| 12 | 0.000000000 | 0.000000000 | AIR | 37.552 | |
| 13 | 0.000000000 | 49.799403498 | AIR | 37.641 | |
| 14 | −56.887108985 | 19.216557050 | SIO2V | 46.868 | |
| 15 | −153.952881762 | 0.978745522 | AIR | 66.363 | |
| 16 | −10783.364868000 | 53.980836551 | SIO2V | 79.120 | |
| 17 | −370.423261824 | 5.444267505 | AIR | 97.662 | |
| 18 | −1928.185768980 | 46.883883025 | SIO2V | 104.839 | |
| 19 | −156.534475362 | 0.983619441 | AIR | 108.499 | |
| 20 | −2025.935551520 | 37.434974978 | SIO2V | 114.116 | |
| 21 | −206.572644709 | 34.979106092 | AIR | 115.758 | |
| 22 | 0.000000000 | 220.766423587 | AIR | 108.107 | |
| 23 | −187.624624543 | −220.766423587 | AIR | 140.612 | REFL |
| 24 | 185.347836932 | 220.766423587 | AIR | 130.980 | REFL |
| 25 | 0.000000000 | 38.094302401 | AIR | 87.940 | |
| 26 | 572.857393641 | 19.003060435 | SIO2V | 84.526 | |
| 27 | −2621.148115610 | 0.995124659 | AIR | 83.267 | |
| 28 | 286.158521436 | 14.994640836 | SIO2V | 80.188 | |
| 29 | 106.165691183 | 42.739053946 | AIR | 72.275 | |
| 30 | −269.972769063 | 14.994253287 | SIO2V | 72.751 | |
| 31 | 217.103611286 | 19.468009312 | AIR | 79.551 | |
| 32 | 49574.268497900 | 15.072135262 | SIO2V | 82.355 | |
| 33 | −1724.117745890 | 7.993795407 | AIR | 87.009 | |
| 34 | −681.152171807 | 39.742301517 | SIO2V | 89.501 | |
| 35 | −135.848489522 | 0.995182990 | AIR | 93.025 | |
| 36 | 729.076676327 | 18.240313704 | SIO2V | 99.335 | |
| 37 | −1221.183105010 | 8.112527507 | AIR | 100.052 | |
| 38 | 470.281491581 | 33.610782817 | SIO2V | 101.641 | |
| 39 | −393.774605114 | 34.640728842 | AIR | 101.306 | |
| 40 | −135.515968276 | 14.997016204 | SIO2V | 100.625 | |
| 41 | −242.973369762 | 0.998166637 | AIR | 109.176 | |
| 42 | 629.218885691 | 33.238719341 | SIO2V | 114.327 | |
| 43 | −476.667589984 | 1.000069241 | AIR | 114.673 | |
| 44 | 609.210504505 | 31.634185939 | SIO2V | 112.966 | |
| 45 | −463.558570174 | 0.991784251 | AIR | 112.249 | |
| 46 | 181.331821629 | 26.489265851 | SIO2V | 99.538 | |
| 47 | 478.467068575 | 0.985154964 | AIR | 96.400 | |
| 48 | 166.964883598 | 32.619952496 | SIO2V | 90.254 | |
| 49 | 34746.976265700 | 0.961982243 | AIR | 86.267 | |
| 50 | 65.547601143 | 30.975153472 | SIO2V | 58.849 | |
| 51 | 118.066733717 | 1.052010322 | AIR | 51.946 | |
| 52 | 68.706870791 | 32.347686260 | CAF2V193 | 43.646 | |
| 53 | 0.000000000 | 3.000000148 | H2OV193 | 21.134 | |
| 54 | 0.000000000 | 0.000000000 | AIR | 16.501 | |

WL 193.368 nm 193.468 nm 193.268 nm
SIO2V' 1.5607857 1.56062813 1.56094365
CAF2V193' 1.50175423 1.50185255 1.50195109
H2OV193' 1.4364632 1.43667693 1.43689123
NA 1.2;
Fmin = 18.63 mm;
Fmax = 66 mm

TABLE 28A

| | Aspherical Constants | | | | |
|---|---|---|---|---|---|
| Surface | K | C1 | C2 | C3 | C4 |
| 2 | 0.00000000e+000 | −5.25595959e−008 | −5.05125696e−014 | −3.39834764e−016 | 1.43455947e−022 |
| 4 | 0.00000000e+000 | −9.82547285e−009 | −3.46617126e−012 | 4.26908111e−016 | 8.30046581e−021 |
| 7 | 0.00000000e+000 | 4.35702944e−008 | 3.07328355e−012 | −6.64471080e−016 | 8.46058187e−020 |
| 11 | 0.00000000e+000 | 1.78059855e−008 | −4.49918001e−011 | −1.45873634e−015 | −5.93868926e−020 |
| 15 | 0.00000000e+000 | 9.71039823e−009 | −5.80809116e−012 | 1.66373755e−015 | −6.79295769e−020 |
| 18 | 0.00000000e+000 | −9.90188358e−009 | −3.63667799e−012 | 4.39791888e−016 | −4.05829074e−020 |
| 20 | 0.00000000e+000 | −3.56668353e−008 | 1.04282881e−012 | −3.79146258e−017 | 1.77203987e−021 |
| 23 | −1.00000000e+000 | 0.00000000e+000 | 0.00000000e+000 | 0.00000000e+000 | 0.00000000e+000 |
| 24 | 0.00000000e+000 | −4.12889632e−009 | −9.85960529e−014 | −2.94691200e−018 | −3.56770055e−025 |
| 26 | 0.00000000e+000 | 2.84735678e−008 | 8.22076690e−013 | 8.98622393e−019 | 1.63369077e−020 |
| 36 | 0.00000000e+000 | −3.45458233e−008 | 7.01690612e−013 | 2.53558597e−017 | −2.32833922e−023 |
| 42 | 0.00000000e+000 | 6.80041144e−009 | −3.73953529e−014 | −4.59353922e−017 | 3.53253945e−021 |
| 47 | 0.00000000e+000 | 3.44340794e−008 | 8.40449554e−013 | −3.72972761e−016 | 3.22089615e−020 |
| 49 | 0.00000000e+000 | 1.97298275e−008 | 2.76921584e−012 | 1.03703892e−016 | −5.16050166e−020 |

| Surface | C5 | C6 | C7 | C8 |
|---|---|---|---|---|
| 2 | 5.23175535e−024 | −1.25244222e−027 | 1.21805557e−031 | −4.43910196e−036 |
| 4 | −4.64399579e−024 | 1.19810111e−027 | −1.78448775e−031 | 9.48653785e−036 |
| 7 | −6.78485826e−024 | 2.18615691e−028 | 1.27733528e−032 | −7.77343429e−037 |
| 11 | 2.10051516e−021 | −2.86208035e−027 | −1.14692199e−028 | −9.07436019e−033 |
| 15 | 4.67315167e−024 | 1.33956477e−027 | −1.86319592e−031 | 1.80116188e−036 |
| 18 | 3.14215669e−024 | −1.78747424e−028 | 6.25454799e−033 | −9.94933562e−038 |
| 20 | −1.02830257e−025 | 1.63016234e−030 | 9.47579264e−035 | −3.37443982e−039 |
| 23 | 0.00000000e+000 | 0.00000000e+000 | 0.00000000e+000 | 0.00000000e+000 |
| 24 | −4.97425291e−027 | 1.63379520e−032 | 3.42393048e−036 | −1.99876678e−040 |
| 26 | −7.11352194e−024 | 7.18534327e−028 | −1.59298542e−032 | −4.89537949e−037 |
| 36 | 2.60044530e−026 | −1.74079904e−030 | −4.85763706e−034 | 2.78340967e−038 |
| 42 | −9.74225973e−026 | 9.00308701e−031 | 0.00000000e+000 | 0.00000000e+000 |
| 47 | −2.63108130e−024 | 2.07908763e−028 | −7.57742152e−033 | 9.89130621e−038 |
| 49 | 8.50503256e−024 | −9.50392825e−028 | 5.47302796e−032 | −1.31141198e−036 |

TABLE 30

(EM29)

| Surface | Radius | Asphere | Thickness | Material | ½ Diameter |
|---|---|---|---|---|---|
| 1 | 0.000000 | | −0.000674 | LV193975 | 75.450 |
| 2 | 501.388885 | AS | 15.700263 | SIO2V | 76.793 |
| 3 | −2140.989756 | | 1.030768 | HEV19397 | 78.495 |
| 4 | 142.094518 | | 41.139801 | SIO2V | 86.380 |
| 5 | 4509.859821 | AS | 48.031590 | HEV19397 | 84.694 |
| 6 | 294.047825 | | 42.018849 | SIO2V | 75.299 |
| 7 | −284.632088 | AS | 0.899132 | HEV19397 | 70.073 |
| 8 | 196.950986 | | 32.325473 | SIO2V | 62.732 |
| 9 | −427.997978 | AS | 24.031073 | HEV19397 | 55.024 |
| 10 | 0.000000 | | 0.000000 | HEV19397 | 35.604 |
| 11 | 0.000000 | | 17.973629 | HEV19397 | 35.604 |
| 12 | 0.000000 | | 9.999076 | SIO2V | 45.185 |
| 13 | 0.000000 | | 34.757744 | HEV19397 | 48.346 |
| 14 | 997.955935 | AS | 34.646365 | SIO2V | 67.618 |
| 15 | −300.927832 | | 15.875609 | HEV19397 | 75.070 |
| 16 | −346.766852 | AS | 31.454835 | SIO2V | 80.051 |
| 17 | −123.279874 | | 36.439684 | HEV19397 | 83.364 |
| 18 | 0.000000 | | 205.977742 | HEV19397 | 86.638 |
| 19 | −174.397052 | AS | −205.977742 | REFL | 131.209 |
| 20 | 170.274411 | AS | 205.977742 | REFL | 116.516 |
| 21 | 0.000000 | | 37.095745 | HEV19397 | 97.388 |
| 22 | 437.401009 | | 36.383480 | SIO2V | 104.301 |
| 23 | −468.489757 | | 45.906894 | HEV19397 | 104.284 |
| 24 | −1223.579996 | | 21.742866 | SIO2V | 97.101 |
| 25 | −511.114441 | AS | 8.072398 | HEV19397 | 96.542 |
| 26 | 432.469418 | | 10.004999 | SIO2V | 85.308 |
| 27 | 102.889104 | | 42.520104 | HEV19397 | 75.234 |
| 28 | −594.379481 | | 9.996510 | SIO2V | 75.720 |
| 29 | 174.356867 | | 19.418323 | HEV19397 | 79.411 |

TABLE 30-continued (EM29)

| Surface | Radius | Asphere | Thickness | Material | ½ Diameter |
|---|---|---|---|---|---|
| 30 | 715.897359 | | 10.937733 | SIO2V | 82.556 |
| 31 | 324.211087 | | 13.818484 | HEV19397 | 88.129 |
| 32 | 1110.064311 | | 30.443596 | SIO2V | 93.022 |
| 33 | −264.206409 | AS | 7.862028 | HEV19397 | 97.550 |
| 34 | −1190.503106 | AS | 29.935994 | SIO2V | 104.823 |
| 35 | −237.772522 | | 11.246604 | HEV19397 | 110.038 |
| 36 | 10331.864054 | AS | 39.860150 | SIO2V | 122.900 |
| 37 | −277.281811 | | 10.852741 | HEV19397 | 125.931 |
| 38 | 214450.764260 | | 31.052526 | SIO2V | 131.630 |
| 39 | −428.573007 | | 13.316274 | HEV19397 | 132.643 |
| 40 | 751.599719 | | 33.094141 | SIO2V | 133.007 |
| 41 | −805.999226 | | 1.057548 | HEV19397 | 132.758 |
| 42 | 914.688148 | AS | 40.568688 | SIO2V | 130.742 |
| 43 | −348.277386 | | 0.878766 | HEV19397 | 129.732 |
| 44 | 219.106958 | | 38.836424 | SIO2V | 108.095 |
| 45 | 2357.913334 | AS | 1.971079 | HEV19397 | 102.766 |
| 46 | 85.554437 | | 39.388562 | SIO2V | 72.129 |
| 47 | 193.092045 | | 0.892017 | HEV19397 | 62.113 |
| 48 | 83.536468 | | 37.250760 | CAF2V193 | 49.390 |
| 49 | 0.000000 | | 0.300000 | SIO2V | 21.410 |
| 50 | 0.000000 | | 0.000000 | SIO2V | 21.050 |
| 51 | 0.000000 | | 3.000000 | H2OV193B | 21.050 |
| 52 | 0.000000 | | 0.000000 | AIR | 16.500 |

TABLE 30A

Aspherical Constants

| | Surface | | | | |
|---|---|---|---|---|---|
| | 2 | 5 | 7 | 9 | 14 |
| K | 0 | 0 | 0 | 1.84398 | 0 |
| C1 | −4.426813e−08 | −2.968289e−08 | 1.574555e−07 | 1.174665e−07 | −3.306265e−08 |
| C2 | −6.238723e−13 | 5.914537e−12 | −1.371133e−11 | 5.249946e−12 | −1.008549e−12 |
| C3 | 5.373027e−21 | −2.636410e−17 | 7.979944e−16 | 0.000000e+00 | −2.352647e−16 |
| C4 | 5.520432e−21 | −2.348783e−20 | −1.733518e−21 | 0.000000e+00 | 2.617179e−25 |
| C5 | −4.165047e−25 | 1.589258e−24 | −1.045941e−23 | 0.000000e+00 | −1.275061e−24 |
| C6 | −2.539882e−29 | −3.710160e−29 | 1.048551e−27 | 0.000000e+00 | 7.076571e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | | | | |
|---|---|---|---|---|---|
| | 16 | 19 | 20 | 25 | 33 |
| K | 0 | −2.01302 | −2.06565 | 0 | 0 |
| C1 | −4.975918e−08 | −3.276866e−08 | 4.322230e−08 | −1.196195e−07 | 2.211028e−08 |
| C2 | 1.193440e−12 | 3.671721e−13 | −3.203678e−13 | 6.474093e−12 | 7.931065e−13 |
| C3 | −3.326252e−18 | −8.127219e−18 | 1.331133e−17 | −2.172807e−16 | 2.746964e−17 |
| C4 | 5.194442e−21 | 1.823894e−22 | −2.254203e−22 | 5.562468e−21 | −3.773718e−21 |
| C5 | 7.844572e−25 | −2.990635e−27 | 4.731338e−27 | 4.566785e−26 | 8.556577e−25 |
| C6 | −3.910445e−29 | 4.402752e−32 | −3.185999e−32 | −6.729599e−30 | −5.193468e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | | | |
|---|---|---|---|---|
| | 34 | 36 | 42 | 45 |
| K | 0 | 0 | 0 | 0 |
| C1 | −6.109386e−08 | −2.940384e−09 | −3.072861e−08 | −4.317432e−08 |
| C2 | 1.186926e−12 | −1.302883e−13 | 1.225198e−13 | 5.093533e−12 |
| C3 | 9.338913e−17 | −7.457684e−17 | 6.438064e−17 | −2.542515e−16 |
| C4 | −8.049754e−21 | 4.922730e−21 | −2.717739e−21 | 1.185033e−20 |
| C5 | 7.964565e−25 | −1.822077e−25 | 3.936453e−26 | −3.870604e−25 |
| C6 | −3.877045e−29 | 3.491116e−30 | −1.518766e−31 | 7.346646e−30 |
| C7 | 0.000000e+00 | 0.000000e+00 | 0.000000e+00 | 0.000000e+00 |
| C8 | 0.000000e+00 | 0.000000e+00 | 0.000000e+00 | 0.000000e+00 |
| C9 | 0.000000e+00 | 0.000000e+00 | 0.000000e+00 | 0.000000e+00 |

TABLE 31

(EM29)

| Surface | Radius | Asphere | Thickness | Material | ½ Diameter |
|---|---|---|---|---|---|
| 1 | 0.000000 | | −0.012399 | LV193975 | 75.472 |
| 2 | 154.966472 | AS | 24.304901 | SIO2V | 82.008 |
| 3 | 529.820026 | | 2.090993 | HEV19397 | 82.074 |
| 4 | 150.769271 | | 40.595812 | SIO2V | 84.201 |
| 5 | 5646.002857 | | 29.581615 | HEV19397 | 81.519 |
| 6 | −1210.857565 | | 22.741810 | SIO2V | 74.381 |
| 7 | −182.994045 | AS | 34.025994 | HEV19397 | 72.364 |
| 8 | 173.187773 | | 25.484337 | SIO2V | 52.132 |
| 9 | −296.185557 | | 22.382287 | HEV19397 | 47.253 |
| 10 | 0.000000 | | 10.110510 | SIO2V | 44.035 |
| 11 | 0.000000 | | 17.152556 | HEV19397 | 46.863 |
| 12 | 51884.400557 | AS | 16.631540 | SIO2V | 54.537 |
| 13 | −361.923018 | | 63.995754 | HEV19397 | 58.291 |
| 14 | −878.387785 | AS | 34.625490 | SIO2V | 82.453 |
| 15 | −136.078636 | | 36.436642 | HEV19397 | 85.494 |
| 16 | 0.000000 | | 196.253966 | HEV19397 | 89.191 |
| 17 | −182.153238 | AS | −196.253966 | REFL | 149.252 |
| 18 | 150.956725 | AS | 196.253966 | REFL | 101.676 |
| 19 | 0.000000 | | 36.446112 | HEV19397 | 104.396 |
| 20 | 333.439228 | | 55.820683 | SIO2V | 116.602 |
| 21 | −309.405465 | | 37.869545 | HEV19397 | 116.527 |
| 22 | −424.165104 | | 20.518575 | SIO2V | 104.186 |
| 23 | −285.104268 | AS | 0.896321 | HEV19397 | 103.405 |
| 24 | 635.351851 | | 9.997637 | SIO2V | 92.108 |
| 25 | 107.969149 | | 40.308038 | HEV19397 | 80.454 |
| 26 | 389.814743 | | 9.996225 | SIO2V | 82.006 |
| 27 | 152.951561 | | 26.349381 | HEV19397 | 81.938 |
| 28 | 1310.914891 | | 9.999638 | SIO2V | 84.278 |
| 29 | 275.521100 | | 17.511021 | HEV19397 | 89.677 |
| 30 | 1763.795762 | | 26.773314 | SIO2V | 93.617 |
| 31 | −289.165601 | AS | 9.639413 | HEV19397 | 97.853 |
| 32 | −1578.752955 | AS | 27.680692 | SIO2V | 106.237 |
| 33 | −272.338400 | | 9.732573 | HEV19397 | 110.951 |
| 34 | −3842.769867 | AS | 35.516033 | SIO2V | 122.549 |
| 35 | −314.937511 | | 28.595034 | HEV19397 | 125.359 |
| 36 | 889.868029 | | 47.614171 | SIO2V | 135.827 |
| 37 | −355.067891 | | −12.204373 | HEV19397 | 136.279 |
| 38 | 0.000000 | | 0.000000 | HEV19397 | 133.729 |
| 39 | 0.000000 | | 28.717983 | HEV19397 | 133.729 |
| 40 | 574.174423 | AS | 45.539693 | SIO2V | 132.500 |
| 41 | −344.516223 | | 0.852315 | HEV19397 | 132.025 |
| 42 | 204.978326 | | 45.863613 | SIO2V | 111.958 |

TABLE 31-continued (EM29)

| Surface | Radius | Asphere | Thickness | Material | ½ Diameter |
|---|---|---|---|---|---|
| 43 | −6283.361425 | AS | 0.828469 | HEV19397 | 106.831 |
| 44 | 87.555579 | | 40.313564 | SIO2V | 74.022 |
| 45 | 201.419511 | | 0.722913 | HEV19397 | 64.044 |
| 46 | 86.647656 | | 38.420734 | CAF2V193 | 50.908 |
| 47 | 0.000000 | | 0.300000 | SIO2V | 21.485 |
| 48 | 0.000000 | | 0.000000 | SIO2V | 21.121 |
| 49 | 0.000000 | | 3.000000 | H2OV193B | 21.121 |
| 50 | 0.000000 | | 0.000000 | AIR | 16.500 |

TABLE 31A

Aspherical Constants

| | \multicolumn{5}{c}{Surface} |
|---|---|---|---|---|---|
| | 2 | 7 | 12 | 14 | 17 |
| K | 0 | 0 | 0 | 0 | −205.145 |
| C1 | −5.06E−02 | 1.55E−01 | −6.58E−02 | −3.99E−02 | −3.00E−02 |
| C2 | −1.36E−06 | −4.50E−06 | 6.94E−07 | 7.46E−07 | 3.06E−07 |
| C3 | −1.39E−10 | 2.86E−10 | −8.42E−10 | −4.18E−11 | −7.06E−12 |
| C4 | 2.02E−14 | 3.18E−14 | 3.01E−14 | −4.94E−18 | 1.35E−16 |
| C5 | −1.21E−18 | −4.70E−18 | 9.27E−20 | 2.51E−19 | −2.46E−21 |
| C6 | 7.59E−23 | 2.24E−22 | −5.52E−22 | −2.26E−23 | 2.42E−26 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | \multicolumn{5}{c}{Surface} |
|---|---|---|---|---|---|
| | 18 | 23 | 31 | 32 | 34 |
| K | −19.986 | 0 | 0 | 0 | 0 |
| C1 | 5.81E−02 | −5.44E−02 | 2.45E−02 | −6.17E−02 | 2.25E−02 |
| C2 | −5.04E−07 | 5.13E−06 | 5.17E−07 | 1.84E−06 | −1.23E−06 |
| C3 | 2.61E−11 | −2.58E−10 | 4.76E−11 | 9.77E−11 | −5.97E−11 |
| C4 | −5.07E−16 | 1.19E−14 | −1.55E−15 | −8.36E−15 | 6.09E−15 |
| C5 | 1.40E−20 | −3.68E−19 | 8.15E−19 | 8.28E−19 | −2.59E−19 |
| C6 | −4.71E−26 | 5.92E−24 | −4.46E−23 | −3.91E−23 | 5.18E−24 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | |
|---|---|---|
| | 40 | 43 |
| K | 0 | 0 |
| C1 | −3.76E−02 | −2.60E−02 |
| C2 | 7.18E−08 | 3.27E−06 |
| C3 | 5.92E−11 | −1.25E−10 |
| C4 | −1.80E−15 | 4.09E−15 |
| C5 | 7.98E−21 | −8.18E−20 |
| C6 | 1.92E−25 | 8.62E−25 |
| C7 | 0.000000e+00 | 0.000000e+00 |
| C8 | 0.000000e+00 | 0.000000e+00 |
| C9 | 0.000000e+00 | 0.000000e+00 |

TABLE 32

(EM29)

| Surface | Radius | Asphere | Thickness | Material | ½ Diameter |
|---|---|---|---|---|---|
| 1 | 0.000000 | | −0.011620 | LV193975 | 75.462 |
| 2 | 585.070331 | AS | 17.118596 | SIO2V | 76.447 |
| 3 | −766.901651 | | 0.890161 | HEV19397 | 78.252 |
| 4 | 145.560665 | | 45.675278 | SIO2V | 85.645 |
| 5 | 2818.543789 | AS | 40.269525 | HEV19397 | 83.237 |
| 6 | 469.396236 | | 29.972759 | SIO2V | 75.894 |
| 7 | −193.297708 | AS | 21.997025 | HEV19397 | 73.717 |
| 8 | 222.509238 | | 27.666963 | SIO2V | 57.818 |
| 9 | −274.231957 | | 31.483375 | HEV19397 | 52.595 |
| 10 | 0.000000 | | 10.117766 | SIO2V | 44.115 |
| 11 | 0.000000 | | 15.361487 | HEV19397 | 47.050 |
| 12 | 26971.109897 | AS | 14.803554 | SIO2V | 54.127 |
| 13 | −562.070426 | | 45.416373 | HEV19397 | 58.058 |

TABLE 32-continued (EM29)

| Surface | Radius | Asphere | Thickness | Material | ½ Diameter |
|---|---|---|---|---|---|
| 14 | −510.104298 | AS | 35.926312 | SIO2V | 76.585 |
| 15 | −118.683707 |  | 36.432152 | HEV19397 | 80.636 |
| 16 | 0.000000 |  | 199.241665 | HEV19397 | 86.561 |
| 17 | −181.080772 | AS | −199.241665 | REFL | 147.684 |
| 18 | 153.434246 | AS | 199.241665 | REFL | 102.596 |
| 19 | 0.000000 |  | 36.432584 | HEV19397 | 105.850 |
| 20 | 408.244008 |  | 54.279598 | SIO2V | 118.053 |
| 21 | −296.362521 |  | 34.669451 | HEV19397 | 118.398 |
| 22 | −1378.452784 |  | 22.782283 | SIO2V | 106.566 |
| 23 | −533.252331 | AS | 0.892985 | HEV19397 | 105.292 |
| 24 | 247.380841 |  | 9.992727 | SIO2V | 92.481 |
| 25 | 103.088603 |  | 45.957039 | HEV19397 | 80.536 |
| 26 | −1832.351074 |  | 9.992069 | SIO2V | 80.563 |
| 27 | 151.452362 |  | 28.883857 | HEV19397 | 81.238 |
| 28 | 693.739003 |  | 11.559320 | SIO2V | 86.714 |
| 29 | 303.301679 |  | 15.104783 | HEV19397 | 91.779 |
| 30 | 1016.426625 |  | 30.905849 | SIO2V | 95.900 |
| 31 | −258.080954 | AS | 10.647394 | HEV19397 | 99.790 |
| 32 | −1386.614747 | AS | 24.903261 | SIO2V | 108.140 |

TABLE 32-continued (EM29)

| Surface | Radius | Asphere | Thickness | Material | ½ Diameter |
|---|---|---|---|---|---|
| 33 | −305.810572 |  | 14.249112 | HEV19397 | 112.465 |
| 34 | −11755.656826 | AS | 32.472684 | SIO2V | 124.075 |
| 35 | −359.229865 |  | 16.650084 | HEV19397 | 126.831 |
| 36 | 1581.896158 |  | 51.095339 | SIO2V | 135.151 |
| 37 | −290.829022 |  | −5.686977 | HEV19397 | 136.116 |
| 38 | 0.000000 |  | 0.000000 | HEV19397 | 131.224 |
| 39 | 0.000000 |  | 28.354383 | HEV19397 | 131.224 |
| 40 | 524.037274 | AS | 45.835992 | SIO2V | 130.144 |
| 41 | −348.286331 |  | 0.878010 | HEV19397 | 129.553 |
| 42 | 184.730622 |  | 45.614622 | SIO2V | 108.838 |
| 43 | 2501.302312 | AS | 0.854125 | HEV19397 | 103.388 |
| 44 | 89.832394 |  | 38.416586 | SIO2V | 73.676 |
| 45 | 209.429378 |  | 0.697559 | HEV19397 | 63.921 |
| 46 | 83.525032 |  | 37.916651 | CAF2V193 | 50.040 |
| 47 | 0.000000 |  | 0.300000 | SIO2V | 21.480 |
| 48 | 0.000000 |  | 0.000000 | SIO2V | 21.116 |
| 49 | 0.000000 |  | 3.000000 | H2OV193B | 21.116 |
| 50 | 0.000000 |  |  | AIR | 16.500 |

TABLE 32A

Aspherical Constants

| | Surface | | | | |
|---|---|---|---|---|---|
| | 2 | 5 | 7 | 12 | 14 |
| K | 0 | 0 | 0 | 0 | 0 |
| C1 | −5.72E−02 | −4.71E−02 | 1.75E−01 | −8.29E−02 | −4.35E−02 |
| C2 | −2.97E−07 | 7.04E−06 | −1.17E−05 | −1.87E−07 | 1.59E−06 |
| C3 | 1.03E−12 | 1.09E−10 | 1.34E−09 | −7.04E−10 | −6.81E−11 |
| C4 | 2.76E−14 | −2.90E−14 | −5.44E−14 | 6.65E−14 | 5.03E−15 |
| C5 | −1.51E−18 | −1.55E−21 | −1.82E−18 | −1.33E−17 | −1.68E−23 |
| C6 | −1.04E−24 | 5.61E−23 | 2.56E−22 | 2.46E−21 | −2.36E−23 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | | | | |
|---|---|---|---|---|---|
| | 17 | 18 | 23 | 31 | 32 |
| K | −197.849 | −204.054 | 0 | 0 | 0 |
| C1 | −2.94E−02 | 5.77E−02 | −7.06E−02 | 3.41E−02 | −4.85E−02 |
| C2 | 2.63E−07 | −5.00E−07 | 4.11E−06 | 4.07E−08 | 9.88E−07 |
| C3 | −6.11E−12 | 2.67E−11 | −1.18E−10 | 8.10E−11 | 7.37E−11 |
| C4 | 1.11E−16 | −5.69E−16 | 2.92E−15 | −4.34E−15 | −6.56E−15 |
| C5 | −2.01E−21 | 1.89E−20 | −3.23E−20 | 7.59E−19 | 6.53E−19 |
| C6 | 2.08E−26 | −1.49E−25 | 2.18E−25 | −3.41E−23 | −2.88E−23 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | | |
|---|---|---|---|
| | 34 | 40 | 43 |
| K | 0 | 0 | 0 |
| C1 | 1.59E−02 | −4.10E−02 | −3.89E−02 |
| C2 | −1.51E−06 | 3.04E−07 | 4.76E−06 |
| C3 | 6.62E−13 | 5.71E−11 | −2.23E−10 |
| C4 | 1.72E−15 | −1.72E−15 | 8.89E−15 |
| C5 | −9.36E−20 | −9.60E−22 | −2.41E−19 |
| C6 | 2.36E−24 | 3.81E−25 | 3.43E−24 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 34

(EM26)

| Surface | Radius | Thickness | Material | ½ Diam. | Type |
|---|---|---|---|---|---|
| 0 | 0.000000000 | 31.982585487 | AIR | 66.000 | |
| 1 | 0.000000000 | -0.017071913 | AIR | 76.172 | |
| 2 | 147.976296433 | 25.157601132 | SIO2V | 83.329 | |
| 3 | 483.267348199 | 66.318217434 | AIR | 83.329 | |
| 4 | 6843.187124890 | 14.990603080 | SIO2V | 89.462 | |
| 5 | -10922.857227200 | 0.990910304 | AIR | 89.696 | |
| 6 | 185.444884732 | 43.423576628 | SIO2V | 90.336 | |
| 7 | -291.453552095 | 0.988388071 | AIR | 88.691 | |
| 8 | 75.552245567 | 18.214694705 | SIO2V | 66.883 | |
| 9 | 76.794787833 | 36.638500036 | AIR | 60.819 | |
| 10 | 119.890093734 | 18.824651829 | SIO2V | 50.527 | |
| 11 | 1688.559592410 | 8.584817314 | AIR | 45.933 | |
| 12 | 0.000000000 | 0.000000000 | AIR | 38.451 | |
| 13 | 0.000000000 | 52.042672045 | AIR | 38.545 | |
| 14 | -59.826650342 | 14.981853380 | SIO2V | 48.449 | |
| 15 | -143.442731652 | 0.981820223 | AIR | 65.183 | |
| 16 | -809.267677971 | 22.623991877 | SIO2V | 74.792 | |
| 17 | -189.427877067 | 23.734179117 | AIR | 79.164 | |
| 18 | -404.048228936 | 40.321323389 | SIO2V | 94.462 | |
| 19 | -133.255827443 | 0.996126038 | AIR | 98.239 | |
| 20 | -532.626067795 | 25.229572964 | SIO2V | 102.508 | |
| 21 | -218.631437997 | 34.992902498 | AIR | 104.152 | |
| 22 | 0.000000000 | 232.569743258 | AIR | 102.146 | |
| 23 | -203.850853866 | -232.569743258 | AIR | 154.862 | REFL |
| 24 | 180.897913619 | 232.569743258 | AIR | 125.795 | REFL |
| 25 | 0.000000000 | 35.093353727 | AIR | 89.945 | |
| 26 | -2097.871590640 | 18.902530877 | SIO2V | 88.318 | |
| 27 | -311.592066935 | 1.000926290 | AIR | 88.349 | |
| 28 | 197.040247642 | 14.994864591 | SIO2V | 82.980 | |
| 29 | 123.794489384 | 39.397144698 | AIR | 76.695 | |
| 30 | -351.625590566 | 14.996140251 | SIO2V | 76.667 | |
| 31 | 194.519969585 | 25.840876165 | AIR | 79.734 | |
| 32 | -783.090311926 | 14.999335864 | SIO2V | 81.725 | |
| 33 | 602.209892650 | 15.636785753 | AIR | 89.884 | |
| 34 | -860.877333066 | 40.308090334 | SIO2V | 92.572 | |
| 35 | -144.751331394 | 0.995503627 | AIR | 96.367 | |
| 36 | 489.496864563 | 22.261422840 | SIO2V | 107.265 | |
| 37 | -1492.086252490 | 0.998123009 | AIR | 108.225 | |
| 38 | 542.517785037 | 42.667711177 | SIO2V | 110.092 | |
| 39 | -278.956019182 | 30.784648856 | AIR | 110.074 | |
| 40 | -143.206504187 | 16.457194925 | SIO2V | 109.358 | |
| 41 | -245.275186574 | 0.991006459 | AIR | 118.513 | |
| 42 | 450.076146500 | 56.637715430 | SIO2V | 124.493 | |
| 43 | -281.238265383 | 0.994417156 | AIR | 124.569 | |
| 44 | 173.286659802 | 30.025805518 | SIO2V | 105.228 | |
| 45 | 405.488019133 | 4.969943131 | AIR | 101.974 | |
| 46 | 170.349078374 | 38.966672867 | SIO2V | 93.740 | |
| 47 | 78634.784391100 | 0.980473718 | AIR | 86.875 | |
| 48 | 65.899645851 | 30.022369482 | SIO2V | 58.766 | |
| 49 | 115.328388498 | 0.871701885 | AIR | 51.820 | |
| 50 | 70.957276330 | 32.640666401 | CAF2V193 | 44.305 | |
| 51 | 0.000000000 | 3.000000148 | H2OV193 | 21.157 | |
| 52 | 0.000000000 | 0.000000000 | AIR | 16.500 | |

| | | | |
|---|---|---|---|
| WL | 193.368 nm | 193.468 nm | 193.268 nm |
| SIO2V' | 1.5607857 | 1.56062813 | 1.56094365 |
| CAF2V193' | 1.50175423 | 1.50185255 | 1.50195109 |
| H2OV193' | 1.4364632 | 1.43667693 | 1.43689123 |

NA 1.2;
Fmin = 18.63 mm;
Fmax = 66 mm

TABLE 34A

| Aspherical Constants | | | | | |
|---|---|---|---|---|---|
| Surface | K | C1 | C2 | C3 | C4 |
| 2 | 0.00000000e+000 | -4.78882631e-008 | -1.07874702e-012 | -3.02679637e-016 | 1.88733824e-020 |
| 4 | 0.00000000e+000 | 6.93936013e-009 | 4.14547565e-012 | -2.44188432e-016 | 3.37511708e-020 |
| 7 | 0.00000000e+000 | 2.35987002e-008 | 8.31924580e-012 | -7.77774842e-016 | 6.50303307e-021 |
| 11 | 0.00000000e+000 | 1.26922184e-007 | -4.36848744e-011 | 4.57206313e-015 | 1.74083492e-018 |
| 15 | 0.00000000e+000 | 7.93042774e-008 | -2.07633723e-013 | 3.76353009e-016 | 7.36365299e-020 |

TABLE 34A-continued

Aspherical Constants

| | | | | | |
|---|---|---|---|---|---|
| 18 | 0.00000000e+000 | −1.97913247e−009 | −8.66959877e−013 | 6.04641277e−017 | −4.73473989e−021 |
| 20 | 0.00000000e+000 | −5.08811298e−009 | −3.02758381e−013 | −6.93452917e−018 | 3.42662757e−022 |
| 23 | 0.00000000e+000 | 9.00942854e−009 | 1.77368463e−013 | 2.86086903e−018 | 5.71387977e−023 |
| 24 | 0.00000000e+000 | −6.79867230e−009 | −1.66279668e−013 | −3.17226607e−018 | −2.14919508e−022 |
| 26 | 0.00000000e+000 | −5.37053896e−008 | 1.67618239e−012 | 4.07995560e−016 | −3.53050500e−020 |
| 36 | 0.00000000e+000 | −3.31965207e−008 | 6.14833787e−013 | 2.40373774e−017 | 1.18984531e−022 |
| 41 | 0.00000000e+000 | −1.38336514e−008 | 8.93474375e−013 | −2.71551009e−017 | 1.74375713e−021 |
| 45 | 0.00000000e+000 | 1.44983141e−008 | −1.95881989e−014 | −1.05859436e−016 | 5.32744894e−021 |
| 47 | 0.00000000e+000 | 3.11232761e−008 | 2.84716248e−012 | −1.11706969e−016 | −2.66038924e−021 |

| Surface | C5 | C6 | C7 | C8 |
|---|---|---|---|---|
| 2 | −4.39149695e−025 | −1.09132516e−028 | −1.04998811e−035 | 7.96689244e−037 |
| 4 | −5.06638092e−024 | 5.32303197e−028 | −2.85457308e−032 | 3.58175757e−038 |
| 7 | 3.23059366e−024 | −1.16477659e−030 | −4.43574135e−032 | 2.44981381e−036 |
| 11 | −1.38306535e−022 | 2.43454067e−025 | −8.52163913e−029 | 1.77790237e−034 |
| 15 | −4.68407947e−024 | 8.91865260e−029 | 8.87815151e−032 | −8.32251546e−036 |
| 18 | 1.77442213e−025 | 4.52110292e−031 | −2.53815340e−035 | −4.30166930e−039 |
| 20 | −9.21678831e−028 | −3.68127185e−033 | 1.89749139e−038 | −4.16625182e−039 |
| 23 | −4.46902171e−028 | 1.13482418e−031 | −3.89411163e−036 | 7.97497644e−041 |
| 24 | 1.19742697e−026 | −1.09727605e−030 | 4.00797914e−035 | −7.95846450e−040 |
| 26 | 9.00535444e−025 | −3.46673523e−029 | −6.86798043e−033 | 5.92310794e−037 |
| 36 | −9.53667910e−026 | 4.93885674e−030 | −2.90808572e−034 | 1.22198832e−039 |
| 41 | −1.26665751e−025 | 5.84505761e−030 | −2.30469572e−034 | 6.06339556e−039 |
| 45 | −5.94726685e−026 | 2.48643254e−029 | −1.88792088e−033 | 5.60469477e−038 |
| 47 | 2.43106684e−025 | −3.95551801e−029 | −7.28245783e−037 | 4.70291791e−038 |

TABLE 36

(EM27)

| Surface | Radius | Asphere | Thickness | Material | ½ Diameter |
|---|---|---|---|---|---|
| 1 | 0.000000 | | −0.004216 | LUFTV193 | 75.440 |
| 2 | 341.127979 | AS | 22.791928 | SIO2V | 77.399 |
| 3 | −547.910038 | | 0.998331 | N2VP950 | 79.138 |
| 4 | 127.727169 | | 41.232021 | SIO2V | 85.886 |
| 5 | 423.981317 | AS | 37.538965 | N2VP950 | 83.125 |
| 6 | 1837.865411 | | 20.893107 | SIO2V | 73.497 |
| 7 | −224.309944 | AS | 1.002068 | N2VP950 | 71.189 |
| 8 | 162.793881 | | 28.373758 | SIO2V | 63.095 |
| 9 | −357.404285 | | 20.328095 | N2VP950 | 58.827 |
| 10 | −130.668159 | | 9.997405 | SIO2V | 40.623 |
| 11 | −153.854050 | | 6.572008 | N2VP950 | 37.125 |
| 12 | 0.000000 | | 9.999712 | SIO2V | 37.199 |
| 13 | 0.000000 | | 1.062092 | N2VP950 | 40.839 |
| 14 | 743.447647 | | 18.547401 | SIO2V | 42.269 |
| 15 | −194.707721 | | 22.944701 | N2VP950 | 46.232 |
| 16 | −91.226681 | | 9.997232 | SIO2V | 51.224 |
| 17 | −149.640287 | | 18.143695 | N2VP950 | 58.055 |
| 18 | −523.085587 | AS | 23.764093 | SIO2V | 70.561 |
| 19 | −159.366370 | | 0.999029 | N2VP950 | 75.025 |
| 20 | −418.047917 | AS | 30.390060 | SIO2V | 78.905 |
| 21 | −139.497541 | | 36.995337 | N2VP950 | 82.309 |
| 22 | 0.000000 | | 202.057337 | N2VP950 | 86.976 |
| 23 | −179.767561 | AS | −202.057337 | REFL | 144.017 |
| 24 | 157.031815 | AS | 202.057337 | REFL | 107.178 |
| 25 | 0.000000 | | 36.997499 | N2VP950 | 101.742 |
| 26 | 440.441126 | | 47.272805 | SIO2V | 111.232 |
| 27 | −305.204169 | | 41.252868 | N2VP950 | 111.473 |
| 28 | −462.717592 | | 18.096500 | SIO2V | 101.263 |
| 29 | −434.773502 | AS | 1.272365 | N2VP950 | 100.762 |
| 30 | 323.034266 | | 9.997203 | SIO2V | 90.351 |
| 31 | 107.871517 | | 41.101537 | N2VP950 | 80.055 |
| 32 | −2104.261715 | | 9.996146 | SIO2V | 80.354 |
| 33 | 162.693545 | | 24.114798 | N2VP950 | 82.448 |
| 34 | 461.867528 | | 11.590831 | SIO2V | 88.405 |
| 35 | 292.431899 | | 14.861810 | N2VP950 | 92.938 |
| 36 | 1076.736610 | | 38.645047 | SIO2V | 96.114 |
| 37 | −233.326361 | AS | 4.528881 | N2VP950 | 101.701 |
| 38 | −818.919435 | AS | 26.752850 | SIO2V | 107.052 |
| 39 | −301.917563 | | 18.307802 | N2VP950 | 113.375 |
| 40 | −2069.863617 | AS | 54.519854 | SIO2V | 125.923 |
| 41 | −240.586609 | | 40.043329 | N2VP950 | 131.701 |
| 42 | 0.000000 | | 0.000000 | N2VP950 | 138.484 |
| 43 | 0.000000 | | −20.273619 | N2VP950 | 138.484 |
| 44 | 442.810512 | | 63.820483 | SIO2V | 138.949 |
| 45 | −533.873885 | | 2.798052 | N2VP950 | 139.304 |
| 46 | 662.397337 | AS | 40.282382 | SIO2V | 135.640 |
| 47 | −428.200815 | | 0.994361 | N2VP950 | 134.489 |
| 48 | 213.024607 | | 43.377768 | SIO2V | 113.450 |
| 49 | 3009.037627 | AS | 0.987971 | N2VP950 | 107.741 |
| 50 | 95.712001 | | 40.028327 | SIO2V | 77.581 |
| 51 | 241.528599 | | 2.069796 | N2VP950 | 67.915 |
| 52 | 85.826880 | | 38.946996 | CAF2V193 | 50.851 |
| 53 | 0.000000 | | 3.000000 | H2OV193 | 21.090 |
| 54 | 0.000000 | | 0.000000 | AIR | 16.500 |

| WL | 193.368 nm | 193.468 nm | 193.268 nm |
|---|---|---|---|
| SIO2V' | 1.5607857 | 1.56062813 | 1.56094365 |
| CAF2V193' | 1.50175423 | 1.50185255 | 1.50195109 |
| H2OV193' | 1.4364632 | 1.43667693 | 1.43689123 |

NA 1.2;

Fmin = 18.63 mm;

Fmax = 66 mm

TABLE 36A

Aspherical Constants

| | Surface | | | | |
|---|---|---|---|---|---|
| | 2 | 5 | 7 | 18 | 20 |
| K | 0 | 0 | 0 | 0 | 0 |
| C1 | −6.825898e−08 | −1.139291e−07 | 1.715001e−07 | −5.525454e−08 | −1.928670e−08 |
| C2 | −5.820149e−13 | 6.229489e−12 | −3.362340e−12 | −1.835201e−13 | 1.369964e−12 |
| C3 | −1.764721e−16 | 2.070760e−16 | 2.245144e−16 | 1.097082e−16 | −1.178098e−16 |
| C4 | 1.898479e−20 | −3.072912e−20 | 6.731621e−20 | 2.983525e−22 | −5.533661e−22 |
| C5 | −2.878598e−26 | 5.780651e−25 | −1.102455e−23 | −7.073376e−25 | 4.333159e−25 |
| C6 | −4.377548e−29 | 7.588531e−29 | 1.662149e−28 | 2.028418e−28 | −5.576742e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | | | | |
|---|---|---|---|---|---|
| | 23 | 24 | 29 | 37 | 38 |
| K | −1.94543 | −2.30892 | 0 | 0 | 0 |
| C1 | −2.949816e−08 | 6.225716e−08 | −9.081623e−08 | 1.700564e−08 | −5.539058e−08 |
| C2 | 2.672898e−13 | −8.664624e−13 | 4.328932e−12 | 7.578402e−13 | 7.069194e−13 |
| C3 | −5.319153e−18 | 3.983466e−17 | −9.663515e−17 | 6.487979e−17 | 7.954509e−17 |
| C4 | 1.038342e−22 | −1.106567e−21 | 1.861873e−21 | −4.481439e−21 | −5.116182e−21 |
| C5 | −1.448694e−27 | 3.014885e−26 | −2.365064e−26 | 9.785695e−25 | 7.622924e−25 |
| C6 | 1.457411e−32 | −3.386885e−31 | 4.413420e−31 | −4.763684e−29 | −3.862189e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | Surface | | |
|---|---|---|---|
| | 40 | 46 | 49 |
| K | 0 | 0 | 0 |
| C1 | −6.320049e−10 | −2.772679e−08 | −2.949915e−08 |
| C2 | −1.306440e−13 | −1.390524e−13 | 3.478719e−12 |
| C3 | −3.923481e−17 | 4.871921e−17 | −1.481636e−16 |
| C4 | 2.072577e−21 | −1.427007e−21 | 6.052349e−21 |
| C5 | −6.511387e−26 | 7.907911e−27 | −1.731162e−25 |
| C6 | 1.538497e−30 | 1.183697e−31 | 2.820274e−30 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 37

(j342p)

| Surface | Radius | Asphere | Thickness | Material | ½ Diameter |
|---|---|---|---|---|---|
| 0 | 0.000000 | | 32.000671 | | 66.0 |
| 1 | 153.319623 | | 25.301467 | SILUV | 83.9 |
| 2 | 362.312706 | | 1.846656 | | 83.3 |
| 3 | 249.932462 | | 10.039369 | SILUV | 83.5 |
| 4 | 296.617151 | | 16.156206 | | 82.9 |
| 5 | 129.380687 | | 32.591808 | SILUV | 85.8 |
| 6 | 353.939024 | | 25.413158 | | 83.3 |
| 7 | 441.659706 | | 33.067185 | SILUV | 77.6 |
| 8 | −249.821483 | | 0.999731 | | 73.0 |
| 9 | 242.432431 | | 23.800036 | SILUV | 66.0 |
| 10 | −418.172385 | | 16.233683 | | 62.2 |
| 11 | −135.497448 | | 9.999688 | SILUV | 53.8 |
| 12 | −172.144731 | | 14.407576 | | 51.0 |
| 13 | 0.000000 | | 14.446986 | | 37.2 |
| 14 | 403.537798 | | 17.810754 | SILUV | 47.2 |
| 15 | −250.734154 | | 43.083755 | | 50.0 |
| 16 | −86.913472 | | 14.999924 | SILUV | 58.5 |
| 17 | −119.371112 | | 3.501271 | | 67.2 |
| 18 | −227.124051 | | 29.708033 | SILUV | 72.5 |
| 19 | −115.706665 | | 0.999372 | | 77.3 |
| 20 | −6458.564488 | | 21.246094 | SILUV | 81.9 |
| 21 | −316.595524 | | 244.245108 | | 83.5 |
| 22 | −175.503346 | | −209.246168 | REFL | 137.3 |
| 23 | 172.837073 | | 259.698197 | REFL | 116.6 |
| 24 | 286.122846 | | 54.616082 | SILUV | 114.1 |
| 25 | −319.487475 | | 0.999912 | | 113.6 |
| 26 | 966.963595 | | 26.197513 | SILUV | 104.1 |
| 27 | −1040.269926 | | 1.072535 | | 101.1 |
| 28 | 1363.207517 | | 10.039037 | SILUV | 93.7 |
| 29 | 99.625589 | | 52.260353 | | 77.5 |
| 30 | 4756.567563 | | 10.000836 | SILUV | 78.0 |
| 31 | 153.387698 | | 31.977828 | | 78.4 |
| 32 | −621.996267 | | 10.519453 | SILUV | 80.7 |
| 33 | 337.392641 | | 11.072501 | | 89.8 |
| 34 | 737.023107 | | 38.757083 | SILUV | 94.6 |
| 35 | −226.600466 | | 0.999349 | | 98.8 |
| 36 | 2080.296355 | | 23.152743 | SILUV | 107.0 |
| 37 | −464.590999 | | 1.039809 | | 110.3 |
| 38 | 1055.490633 | | 38.268883 | SILUV | 115.5 |
| 39 | −319.028277 | | 39.203877 | | 117.8 |
| 40 | 653.756661 | | 35.609928 | SILUV | 125.1 |
| 41 | −584.439739 | | 12.416338 | | 125.1 |

TABLE 37-continued (j342p)

| Surface | Radius | Asphere | Thickness | Material | ½ Diameter |
|---|---|---|---|---|---|
| 42 | 531.560104 | | 43.648724 | SILUV | 121.9 |
| 43 | −344.752529 | | 0.999813 | | 121.1 |
| 44 | 216.368978 | | 41.075323 | SILUV | 104.1 |
| 45 | −1287.916059 | | 1.004925 | | 99.2 |
| 46 | 80.185742 | | 39.619634 | SILUV | 69.4 |
| 47 | 176.364295 | | 1.538101 | | 59.8 |
| 48 | 85.292538 | | 38.558988 | SILUV | 48.9 |
| 49 | 0.000000 | | 3.000000 | H2O | 21.1 |
| 50 | 0.000000 | | | | 16.5 |

TABLE 37A

Aspherical Constants

| | Surface | | | | |
|---|---|---|---|---|---|
| | 3 | 8 | 20 | 22 | 23 |
| K | 0 | 0 | 0 | −2.68078 | −2.40925 |
| C1 | −3.607637E−08 | 1.865463E−07 | −2.924038E−08 | −4.659443E−08 | 5.109968E−08 |
| C2 | −2.229774E−12 | −7.002614E−12 | −1.606274E−13 | 1.037806E−12 | −5.972057E−13 |
| C3 | −9.424200E−17 | 6.321555E−16 | −3.464603E−17 | −3.569130E−17 | 2.704163E−17 |
| C4 | 2.475481E−20 | −2.270568E−20 | −8.460050E−22 | 1.252351E−21 | −7.866414E−22 |
| C5 | −2.200899E−24 | −7.376870E−24 | −3.093437E−26 | −4.105857E−26 | 3.951644E−26 |
| C6 | 2.031865E−28 | 4.292117E−28 | 1.330447E−29 | 1.072302E−30 | −1.866653E−30 |
| C7 | −1.376196E−32 | −4.030529E−32 | −2.982210E−33 | −1.880272E−35 | 6.750678E−35 |
| C8 | 1.838592E−38 | 6.145449E−36 | 1.368410E−37 | 1.598017E−40 | −1.047201E−39 |

| | Surface | | | | |
|---|---|---|---|---|---|
| | 27 | 36 | 38 | 42 | 45 |
| K | 0 | 0 | 0 | 0 | 0 |
| C1 | −7.658966E−08 | −5.016408E−08 | −9.533350E−10 | −3.314101E−08 | −6.295604E−09 |
| C2 | 5.681524E−12 | 6.321012E−13 | −5.085963E−13 | 3.915833E−13 | 2.792116E−12 |
| C3 | −2.238871E−16 | 1.067455E−16 | −9.972640E−17 | 5.982003E−17 | −1.225842E−16 |
| C4 | 5.298747E−21 | −7.397651E−21 | 6.787141E−21 | −1.575240E−21 | 1.102964E−20 |
| C5 | 6.569464E−25 | 1.926832E−25 | −1.791598E−25 | −3.559970E−26 | −1.065854E−24 |
| C6 | −9.223653E−29 | 6.753657E−30 | −3.368098E−30 | 1.054274E−30 | 8.785997E−29 |
| C7 | 5.022050E−33 | −9.556799E−34 | 3.525219E−34 | 1.406168E−35 | −4.393692E−33 |
| C8 | −1.105440E−37 | 1.329917E−38 | −3.436374E−39 | −3.845075E−40 | 1.041770E−37 |

TABLE 38

(j344p)

| Surface | Radius | Asphere | Thickness | Material | ½ Diameter |
|---|---|---|---|---|---|
| 0 | 0.000000 | | 35.248514 | | 66.0 |
| 1 | 143.248122 | | 28.781110 | SILUV | 86.3 |
| 2 | 358.453084 | | 2.742037 | | 85.3 |
| 3 | 249.892226 | | 15.480033 | SILUV | 85.2 |
| 4 | 590.981355 | | 14.283399 | | 84.5 |
| 5 | 117.666799 | | 24.212151 | SILUV | 83.0 |
| 6 | 167.854363 | | 18.418499 | | 79.6 |
| 7 | 383.299246 | | 37.170753 | SILUV | 78.0 |
| 8 | −249.806207 | | 1.005138 | | 72.8 |
| 9 | 176.708488 | | 25.812894 | SILUV | 64.2 |
| 10 | −489.209320 | | 17.845992 | | 60.0 |
| 11 | −138.689463 | | 10.119648 | SILUV | 47.3 |
| 12 | −180.883089 | | 11.123457 | | 43.8 |
| 13 | 1814.626805 | | 14.880881 | SILUV | 38.4 |
| 14 | −249.444318 | | 45.270915 | | 42.1 |
| 15 | −80.916188 | | 15.005805 | SILUV | 54.4 |
| 16 | −125.947065 | | 2.167332 | | 65.0 |
| 17 | −470.801754 | | 30.186754 | SILUV | 72.8 |

TABLE 38-continued (j344p)

| Surface | Radius | Asphere | Thickness | Material | ½ Diameter |
|---|---|---|---|---|---|
| 18 | −134.611795 | | 2.050714 | | 78.1 |
| 19 | −522.384219 | | 31.415391 | SILUV | 84.0 |
| 20 | −154.268791 | | 249.623006 | | 87.1 |
| 21 | −181.420630 | | −209.608609 | REFL | 140.1 |
| 22 | 169.119629 | | 250.842406 | REFL | 114.7 |
| 23 | 291.616363 | | 51.793776 | SILUV | 110.3 |
| 24 | −309.683041 | | 17.091881 | | 109.8 |
| 25 | −940.483291 | | 12.127436 | SILUV | 99.3 |
| 26 | −42805.292832 | | 1.002005 | | 97.3 |
| 27 | 220.631691 | | 10.003981 | SILUV | 88.3 |
| 28 | 99.320400 | | 49.161757 | | 77.3 |
| 29 | −561.336190 | | 9.999954 | SILUV | 77.2 |
| 30 | 154.957512 | | 24.909934 | | 79.0 |
| 31 | 1924.820454 | | 13.223705 | SILUV | 81.7 |
| 32 | 303.786903 | | 14.995612 | | 89.2 |
| 33 | 1300.890310 | | 31.155401 | SILUV | 93.9 |
| 34 | −258.803624 | | 9.929012 | | 98.4 |
| 35 | −3575.038127 | | 30.701987 | SILUV | 109.0 |
| 36 | −265.328196 | | 2.056209 | | 113.6 |
| 37 | 2294.378555 | | 44.440918 | SILUV | 123.1 |
| 38 | −267.747777 | | 29.673499 | | 125.9 |
| 39 | 557.248167 | | 36.861702 | SILUV | 131.7 |
| 40 | −783.213643 | | −0.938224 | | 131.3 |
| 41 | −14802.205529 | | 16.206383 | | 129.7 |
| 42 | 828.039709 | | 43.221788 | SILUV | 129.1 |
| 43 | −324.649154 | | 0.998849 | | 128.8 |
| 44 | 206.870457 | | 45.792196 | SILUV | 109.6 |
| 45 | −1913.727624 | | 0.997376 | | 104.5 |

TABLE 38-continued (j344p)

| Surface | Radius | Asphere | Thickness | Material | ½ Diameter |
|---|---|---|---|---|---|
| 46 | 81.421622 | | 39.892459 | SILUV | 70.6 |
| 47 | 171.051496 | | 1.070665 | | 60.3 |
| 48 | 81.435251 | | 36.484505 | CAFUV | 48.6 |
| 49 | 0.000000 | | 3.000000 | H2O | 21.1 |
| 50 | 0.000000 | | | | 16.5 |

TABLE 38A (j344p)
Aspherical Constants

| | Surface | | | | |
|---|---|---|---|---|---|
| | 3 | 8 | 17 | 19 | 21 |
| K | 0 | 0 | 0 | 0 | −2.35919 |
| C1 | −4.239547E−08 | 1.776408E−07 | −3.517097E−08 | −2.260275E−08 | −3.531314E−08 |
| C2 | −3.439882E−12 | −7.365374E−12 | −1.680998E−12 | 1.477964E−12 | 5.754980E−13 |
| C3 | 2.585420E−17 | 6.010661E−16 | 1.988836E−16 | −5.557313E−17 | −1.422154E−17 |
| C4 | −7.398192E−21 | 3.465765E−20 | −8.317822E−21 | −1.521633E−21 | 3.469778E−22 |
| C5 | 2.490541E−24 | −1.352374E−23 | 1.490936E−25 | 2.529206E−25 | −6.366916E−27 |
| C6 | −1.543807E−28 | 7.789367E−28 | 9.086464E−29 | −2.473128E−29 | 6.303151E−32 |

| | Surface | | | | |
|---|---|---|---|---|---|
| | 22 | 26 | 34 | 35 | 37 |
| K | −2.55041 | 0 | 0 | 0 | 0 |
| C1 | 5.763867E−08 | −9.608615E−08 | 1.305280E−08 | −5.677213E−08 | 3.512847E−09 |
| C2 | −8.648037E−13 | 4.888828E−12 | 5.858393E−13 | −4.457077E−13 | −9.211061E−17 |
| C3 | 3.811912E−17 | −1.061062E−16 | −2.240057E−17 | 7.309271E−17 | −9.211061E−17 |
| C4 | −1.031346E−21 | 2.226871E−21 | 1.299691E−21 | −7.691388E−21 | 7.360949E−21 |
| C5 | 2.586799E−26 | 6.374143E−26 | 1.071950E−25 | 4.906816E−25 | −3.041901E−25 |
| C6 | −2.333304E−31 | −5.123581E−30 | −1.228055E−29 | −1.882267E−29 | 6.008115E−30 |

| | Surface | |
|---|---|---|
| | 42 | 45 |
| K | 0 | 0 |
| C1 | −2.753413E−08 | −2.014104E−08 |
| C2 | −1.731330E−13 | 3.259304E−12 |
| C3 | 6.979195E−17 | −1.414937E−16 |
| C4 | −2.163794E−21 | 5.867152E−21 |
| C5 | 9.215216E−27 | −1.748151E−25 |
| C6 | 2.896055E−31 | 3.188929E−30 |

TABLE 39

(dave 040421)

| Surface | Radius | Asphere | Thickness | Material | ½ Diameter |
|---|---|---|---|---|---|
| 0 | 0.000000 | | 40.000000 | | 68.0 |
| 1 | 146.623761 | AS | 35.648639 | SIO2V | 84.3 |
| 2 | −262.402199 | AS | 11.489893 | | 86.4 |
| 3 | −1418.271111 | AS | 55.535686 | SIO2V | 89.1 |
| 4 | −149.803131 | | 80.058956 | | 92.8 |
| 5 | −316.127680 | | −80.058956 | REFL | 66.8 |
| 6 | −149.803131 | | −55.535686 | SIO2V | 77.9 |
| 7 | −1418.271111 | | −11.489893 | | 77.7 |
| 8 | −262.402199 | | 11.489893 | REFL | 78.4 |
| 9 | −1418.271111 | | 55.535686 | SIO2V | 88.5 |
| 10 | −149.803131 | | 90.058608 | | 97.6 |
| 11 | −318.170858 | AS | 42.027645 | SIO2V | 125.7 |
| 12 | −174.217513 | | 221.335808 | | 130.9 |
| 13 | −245.648700 | AS | −201.335981 | REFL | 202.8 |
| 14 | 114.970031 | AS | 241.335931 | REFL | 93.2 |
| 15 | 372.783567 | AS | 46.864614 | SIO2V | 124.6 |
| 16 | −819.903755 | | 1.038628 | | 123.6 |
| 17 | 177.861341 | | 41.772805 | SIO2V | 112.5 |
| 18 | 341.365208 | | 37.021407 | | 104.9 |
| 19 | −466.562113 | | 12.000000 | SIO2V | 100.5 |
| 20 | 162.712763 | | 42.079202 | | 91.1 |
| 21 | −370.098539 | | 12.000000 | SIO2V | 91.3 |
| 22 | 462.418362 | | 26.721285 | | 96.0 |
| 23 | −356.944827 | | 27.234109 | SIO2V | 97.2 |
| 24 | −176.415718 | | 1.000000 | | 100.3 |
| 25 | 250.680892 | AS | 35.225819 | SIO2V | 109.0 |
| 26 | −1151.380195 | | 1.000000 | | 108.8 |
| 27 | 400.524336 | | 38.251924 | SIO2V | 107.1 |
| 28 | −405.535651 | | 31.160614 | | 105.6 |
| 29 | −149.637246 | | 50.218339 | SIO2V | 104.4 |
| 30 | −384.493074 | AS | 30.129631 | | 114.6 |
| 31 | 0.000000 | | −29.129631 | | 116.2 |

TABLE 39-continued (dave 040421)

| Surface | Radius | Asphere | Thickness | Material | ½ Diameter |
|---|---|---|---|---|---|
| 32 | 266.421209 | | 50.004341 | SIO2V | 116.1 |
| 33 | −466.737916 | | 1.000000 | | 115.2 |
| 34 | 142.958212 | | 42.562558 | SIO2V | 102.2 |
| 35 | 432.609562 | AS | 0.098646 | | 97.2 |
| 36 | 114.421108 | | 32.582267 | SIO2V | 82.2 |
| 37 | 573.116962 | AS | 1.000000 | | 76.7 |
| 38 | 60.777409 | | 26.925305 | SIO2V | 52.9 |
| 39 | 76.682879 | | 1.000000 | | 41.9 |
| 40 | 70.399871 | | 26.141931 | CAF2V193 | 40.0 |
| 41 | 0.000000 | | 3.000000 | H2OV193 | 21.6 |
| 42 | 0 | | 0 | | 17.0 |

TABLE 39A (dave 040421)
Aspherical Constants

| | Surface | | | | |
|---|---|---|---|---|---|
| | 1 | 2 | 3 | 11 | 13 |
| K | 0 | 0 | 0 | 0 | 0 |
| C1 | −3.341087E−07 | 8.388602E−08 | 3.429680E−08 | 3.116059E−09 | 3.046218E−09 |
| C2 | −2.505072E−12 | −1.111052E−11 | −9.182012E−12 | 4.201540E−13 | 4.170047E−14 |
| C3 | 2.943082E−15 | 1.569768E−15 | 8.908974E−16 | −8.967249E−17 | 3.681161E−19 |
| C4 | −4.955011E−19 | −1.841754E−19 | −1.039175E−19 | 4.467021E−21 | 2.802579E−23 |
| C5 | 4.666851E−23 | 1.342877E−23 | 7.467060E−24 | −1.240183E−25 | −1.004802E−27 |
| C6 | −1.905456E−27 | −4.061739E−28 | −2.463306E−28 | −3.737311E−31 | 3.611732E−32 |
| C7 | | | | | −6.507196E−37 |
| C8 | | | | | 6.094959E−42 |

| | Surface | | | | | |
|---|---|---|---|---|---|---|
| | 14 | 15 | 25 | 30 | 35 | 37 |
| K | 0 | 0 | 0 | 0 | 0 | 0 |
| C1 | −1.471452E−07 | 1.493626E−09 | −2.761928E−08 | 3.891658E−09 | 8.202081E−10 | 1.252989E−07 |
| C2 | 3.389142E−12 | 7.786239E−13 | 1.065077E−13 | −2.344148E−13 | −6.269685E−13 | 2.533320E−12 |
| C3 | −1.091618E−15 | 3.130190E−17 | 8.399310E−18 | 1.511118E−17 | −2.459088E−16 | 1.123761E−16 |
| C4 | 1.594470E−19 | 2.199868E−22 | −2.005406E−21 | −1.816247E−21 | 5.806198E−20 | −1.266332E−19 |
| C5 | −2.248477E−23 | −1.132529E−25 | 1.619754E−25 | 3.834331E−26 | −3.997034E−24 | 1.618688E−23 |
| C6 | 1.655691E−27 | 2.738900E−30 | −8.094709E−30 | 5.510731E−31 | 1.041043E−28 | −8.614797E−28 |
| C7 | −5.527960E−32 | | | | | |
| C8 | −3.066052E−37 | | | | | |

TABLE 40

(d125i9)

| Surface | Radius | Asphere | Thickness | Material | ½ Diameter |
|---|---|---|---|---|---|
| 0 | 0.000000 | | 31.999820 | | 72.0 |
| 1 | 1121.871530 | AS | 22.353990 | SIO2V | 81.6 |
| 2 | −593.507575 | | 151.330057 | | 83.2 |
| 3 | −276.701090 | | −150.330068 | REFL | 99.4 |
| 4 | −1841.732700 | | 158.991136 | REFL | 58.1 |
| 5 | −1993.161426 | | 66.359854 | SIO2V | 129.7 |
| 6 | −226.138813 | | 0.999989 | | 137.1 |
| 7 | 320.967306 | | 58.008492 | SIO2V | 147.2 |
| 8 | −521.971452 | AS | 138.103093 | | 146.7 |
| 9 | 1018.489753 | AS | 33.863171 | SIO2V | 132.4 |
| 10 | −836.147368 | | 169.056435 | | 131.1 |
| 11 | −150.333251 | | 22.332601 | SIO2V | 98.2 |
| 12 | −264.622066 | | 19.637756 | | 104.6 |
| 13 | −642.439229 | | −19.637756 | REFL | 105.6 |
| 14 | −264.622066 | | −22.332601 | SIO2V | 96.6 |
| 15 | −150.333251 | | −169.056435 | | 86.0 |
| 16 | −836.147368 | | −33.863171 | SIO2V | 72.6 |
| 17 | 1018.489753 | AS | −94.088120 | | 78.6 |
| 18 | 196.895316 | | −14.999941 | SIO2V | 99.4 |
| 19 | 1436.276484 | | −28.015060 | | 114.2 |
| 20 | 263.470635 | | 28.015060 | REFL | 117.3 |
| 21 | 1436.276484 | | 14.999941 | SIO2V | 115.4 |
| 22 | 196.895316 | | 94.088120 | | 104.5 |
| 23 | 1018.489753 | AS | 33.863171 | SIO2V | 98.4 |
| 24 | −836.147368 | | 232.111001 | | 96.3 |
| 25 | −203.114130 | AS | 20.739811 | SIO2V | 89.7 |
| 26 | −179.567740 | | 1.000292 | | 94.4 |
| 27 | 214.374385 | | 45.853859 | SIO2V | 107.3 |
| 28 | −685.859253 | AS | 14.406908 | | 106.3 |
| 29 | 155.448944 | | 34.186529 | SIO2V | 99.0 |
| 30 | 402.440360 | | 26.948978 | | 95.4 |
| 31 | 1784.180000 | | 14.999955 | SIO2V | 87.8 |
| 32 | 215.162499 | | 22.977434 | | 79.8 |
| 33 | −1182.190098 | | 22.085678 | SIO2V | 78.7 |
| 34 | −212.011934 | | 1.511427 | | 77.6 |
| 35 | −2234.326431 | AS | 16.015583 | SIO2V | 73.6 |
| 36 | 102.656630 | | 55.587588 | | 68.2 |
| 37 | 227.255721 | | 75.569686 | SIO2V | 88.7 |
| 38 | −317.233998 | | 1.001303 | | 92.3 |
| 39 | 1810.772356 | AS | 34.492120 | SIO2V | 91.9 |
| 40 | −251.541624 | | 3.237774 | | 94.2 |
| 41 | 0.000000 | | −2.238080 | | 92.7 |

TABLE 40-continued (d125i9)

| Surface | Radius | Asphere | Thickness | Material | ½ Diameter |
|---|---|---|---|---|---|
| 42 | 312.037351 | | 16.355638 | SIO2V | 94.5 |
| 43 | 1101.731550 | AS | 0.999509 | | 94.2 |
| 44 | 373.203773 | | 35.331514 | SIO2V | 95.0 |
| 45 | −352.262575 | | 0.999305 | | 95.0 |
| 46 | 800.952563 | | 34.674551 | SIO2V | 91.8 |
| 47 | −210.477645 | AS | 0.999728 | | 90.3 |
| 48 | 72.234210 | | 29.521553 | SIO2V | 58.5 |
| 49 | 126.294484 | | 7.096090 | | 50.0 |
| 50 | 89.472175 | | 36.272448 | SIO2V | 41.5 |
| 51 | 0.000000 | | 0.000000 | | 18.0 |

TABLE 40A (d125i9) Aspherical Constants

| | Surface | | | | |
|---|---|---|---|---|---|
| | 1 | 8 | 9 | 17 | 23 |
| K | 0 | 0 | 0 | 0 | 0 |
| C1 | −6.489547E−09 | 1.779063E−08 | −2.537260E−09 | −2.537260E−09 | −2.537260E−09 |
| C2 | 2.573979E−12 | −1.318309E−13 | 8.794118E−14 | 8.794118E−14 | 8.794118E−14 |
| C3 | −6.945437E−18 | 1.871976E−18 | 1.370489E−18 | 1.370489E−18 | 1.370489E−18 |
| C4 | −9.856064E−22 | −2.538137E−23 | 2.480376E−23 | 2.480376E−23 | 2.480376E−23 |
| C5 | −5.398838E−26 | 5.262554E−28 | 3.221917E−28 | 3.221917E−28 | 3.221917E−28 |
| C6 | 3.582736E−29 | −4.568847E−33 | −1.526882E−32 | −1.526882E−32 | −1.526882E−32 |

| | Surface | | | | | |
|---|---|---|---|---|---|---|
| | 25 | 28 | 35 | 39 | 43 | 47 |
| K | 0 | 0 | 0 | 0 | 0 | 0 |
| C1 | 3.488627E−08 | 5.518741E−08 | −1.889508E−07 | −1.194060E−07 | 2.132675E−08 | 1.327564E−08 |
| C2 | −5.495753E−13 | −1.879963E−12 | −7.683963E−12 | −3.708989E−13 | 3.335407E−12 | 8.696711E−13 |
| C3 | −6.723461E−17 | −1.208371E−18 | 9.545139E−17 | 4.020986E−17 | 8.797815E−17 | −1.462960E−16 |
| C4 | 2.810907E−21 | 8.370662E−22 | 1.920197E−20 | −1.082725E−20 | −6.582985E−21 | 1.072413E−20 |
| C5 | −1.827899E−25 | −3.751988E−26 | 1.709381E−24 | 3.369011E−26 | −4.306562E−26 | −5.792663E−25 |
| C6 | 4.402454E−30 | 1.768617E−30 | −4.887431E−30 | 1.763283E−29 | 1.609953E−29 | 7.946613E−30 |

TABLE 41

| FIG. | NA | Y' | $N_L$ | $N_{OP}$ | $D_{max}$ | COMP1 | COMP2 | COMP3 |
|---|---|---|---|---|---|---|---|---|
| 4 | 1.10 | 16.25 | 17 | 3 | 201.5 | 10.25 | 174.21 | 58.07 |
| 7 | 1.10 | 16.25 | 17 | 3 | 220.9 | 11.23 | 190.99 | 63.66 |
| 8 | 1.15 | 16.25 | 17 | 3 | 220.1 | 10.24 | 174.11 | 58.04 |
| 16 | 1.20 | 16.25 | 20 | 3 | 219.7 | 9.39 | 187.78 | 62.59 |
| 17 | 1.20 | 16.25 | 21 | 3 | 235.5 | 10.06 | 211.35 | 70.45 |
| 19 | 1.20 | 16.25 | 20 | 3 | 263.9 | 11.28 | 225.56 | 75.19 |
| 20 | 1.20 | 16.00 | 19 | 3 | 306.5 | 13.30 | 252.76 | 84.25 |
| 21 | 1.20 | 16.17 | 20 | 3 | 240.6 | 10.33 | 206.66 | 68.89 |
| 22 | 1.20 | 16.25 | 19 | 3 | 249.3 | 10.65 | 202.42 | 67.47 |
| 23 | 1.20 | 16.17 | 18 | 3 | 264.2 | 11.35 | 204.24 | 68.08 |
| 27 | 1.20 | 16.50 | 23 | 3 | 269.9 | 11.36 | 261.27 | 87.09 |
| 28 | 1.20 | 16.50 | 23 | 3 | 229.4 | 9.65 | 222.06 | 74.02 |
| 30 | 1.20 | 16.50 | 21 | 3 | 266.1 | 11.20 | 235.19 | 78.40 |
| 31 | 1.20 | 16.50 | 20 | 3 | 272.6 | 11.47 | 229.46 | 76.49 |
| 32 | 1.20 | 16.50 | 20 | 3 | 272.3 | 11.46 | 229.21 | 76.40 |
| 34 | 1.20 | 16.50 | 22 | 3 | 241.0 | 10.14 | 223.15 | 74.38 |
| 36 | 1.20 | 16.50 | 23 | 3 | 278.6 | 11.73 | 269.69 | 89.90 |
| 37 | 1.20 | 16.50 | 23 | 3 | 250.2 | 10.53 | 242.20 | 80.73 |
| 38 | 1.20 | 16.50 | 23 | 3 | 263.4 | 11.09 | 254.97 | 84.99 |
| 39 | 1.20 | 17.00 | 16 | 3 | 260.0 | 10.62 | 169.93 | 56.64 |
| 40 | 1.05 | 18.00 | 19 | 3 | 294.0 | 14.81 | 281.48 | 93.83 |

What is claimed is:

1. An apparatus, comprising:
a plurality of optical elements positioned along an optical axis between an object plane and an image plane and configured so that during operation the plurality of optical elements direct radiation from the object plane to the image plane, wherein:
the apparatus is a catadioptric projection objective configured to image an object positioned in a field at the object plane to the image plane during operation and to form a total of two intermediate images between the object plane and the image plane,
the catadioptric projection objective includes a total of two mirrors, both of the mirrors being concave mirrors, and an area of each mirror that reflects the radiation is a continuous area that does not surround an aperture in the mirror surface.

2. The apparatus of claim 1, wherein a path of the radiation through the catadioptric projection objective is described by a plurality of rays including chief rays and marginal rays, the two mirrors are positioned in the path at locations where a chief ray from a field point furthest from the optical axis is further from the optical axis than a marginal ray from a field point closest to the optical axis.

3. The apparatus of claim 1, wherein the two mirrors are positioned in the path of the radiation between the first intermediate image and the second intermediate image.

4. The apparatus of claim 1, wherein the two mirrors are adjacent elements in the path of the radiation.

5. The apparatus of claim 1, wherein the concave surfaces of the two mirrors face each other.

6. The apparatus of claim 1, wherein the first and second mirrors each define a respective curvature surface, the curvature surface of the first mirror intersecting the optical axis at a first point and the curvature surface of the second mirror intersecting the optical axis at a second point, and the position of the first intermediate image with respect to the optical axis is between the first point and the second point.

7. The apparatus of claim 6, wherein the position of the second intermediate image with respect to the optical axis is between the first point on the optical axis and the second point on the optical axis.

8. The apparatus of claim 1, wherein the optical axis is a straight line between the object plane and the image plane.

9. The apparatus of claim 1, wherein at least one of the two mirrors is an aspheric mirrors.

10. The apparatus of claim 1, wherein the first intermediate image is positioned in the path of the radiation between the two mirrors.

11. The apparatus of claim 1, wherein at least some of the rays characterizing the path of the radiation cross the optical axis between the two mirrors.

12. The apparatus of claim 1, wherein the first intermediate image is positioned in the path of the radiation between the object plane and the second intermediate image, and the first intermediate image is larger than the object.

13. The apparatus of claim 1, wherein the catadioptric projection objective magnifies the second image by an amount $\beta_2$ relative to the first intermediate image, where $0.4 < |\beta_2| < 1.5$.

14. The apparatus of claim 12, wherein $0.9 < |\beta_2| < 1.1$.

15. The apparatus if claim 1, wherein the image at the image plane is smaller than the field at the object plane.

16. The apparatus of claim 1, wherein the catadioptric projection objective comprises at least one lens positioned in the path of the radiation between the two mirrors.

17. The apparatus of claim 16, wherein the path of the radiation traverses the lens more than once.

18. The apparatus of claim 16, wherein the lens is a negative lens.

19. The apparatus of claim 16, wherein the lens is a meniscus lens.

20. The apparatus of claim 1, wherein the concave surfaces of two mirrors are aspheric.

21. The apparatus of claim 1, wherein the first intermediate image is arranged in the path of the radiation between the image plane and the first of the two mirrors and the second intermediate image is arranged in the path of the radiation between the second of the two mirrors and the object plane.

22. The apparatus of claim 1, wherein the two mirrors are positioned on opposite sides of the optical axis.

23. The apparatus of claim 1, wherein the catadioptric projection objective comprises at least one lens comprising a concave lens surface, the lens being positioned so that the concave lens surface faces the image plane.

24. The apparatus of claim 23, wherein the lens is positioned in the path of the radiation between the second of the two mirrors and the object plane.

25. The apparatus of claim 1, wherein the catadioptric projection objective has an image side numerical aperture NA>0.9.

26. The apparatus of claim 1, the catadioptric projection objective has an image side numerical aperture NA>1.1.

27. The apparatus of claim 1, wherein the catadioptric projection objective is telecentric at the object plane and at the image plane.

28. The apparatus of claim 1, wherein the catadioptric projection objective comprises an aperture stop.

29. The apparatus of claim 28, wherein the aperture stop is positioned in the path of the radiation between the image plane and the second of the two intermediate images.

30. The apparatus of claim 28, wherein the aperture stop is positioned in the path of the radiation between the two intermediate images.

31. The apparatus of claim 28, wherein the aperture stop is positioned in the path of the radiation between the second of the two intermediate images and the object plane.

32. The apparatus of claim 1, wherein the two mirrors are the only optical elements positioned in the path of the radiation between the two intermediate images.

33. The apparatus of claim 1, wherein neither of the mirrors have a mirror surface that includes a hole.

34. An apparatus, comprising:
a plurality of optical elements positioned along an optical axis between an object plane and an image plane and configured so that during operation the plurality of optical elements direct radiation from the object plane to the image plane, wherein:
the apparatus is a catadioptric projection objective configured to image an object positioned in a field at the object plane to the image plane during operation and to form a total of two intermediate images between the object plane and the image plane,
the catadioptric projection objective includes a total of two mirrors, both of the mirrors being concave mirrors, and
an area of each mirror that reflects the radiation is a continuous area,
wherein the first intermediate image is positioned in the path of the radiation between the object plane and the second intermediate image, and the first intermediate image is larger than the object.

35. An apparatus, comprising:
a plurality of optical elements positioned along an optical axis between an object plane and an image plane and configured so that during operation the plurality of optical elements direct radiation from the object plane to the image plane, wherein:
the apparatus is a catadioptric projection objective configured to image an object positioned in a field at the object plane to the image plane during operation and to form a total of two intermediate images between the object plane and the image plane,
the catadioptric projection objective includes a total of two mirrors, both of the mirrors being concave mirrors;
an area of each mirror that reflects the radiation is a continuous area; and
the projection objective is an unobscured system having no pupil obscuration.

* * * * *

UNITED STATES PATENT AND TRADEMARK OFFICE
CERTIFICATE OF CORRECTION

| | | |
|---|---|---|
| PATENT NO. | : 7,679,821 B2 | Page 1 of 1 |
| APPLICATION NO. | : 12/184818 | |
| DATED | : March 16, 2010 | |
| INVENTOR(S) | : David Shafer et al. | |

It is certified that error appears in the above-identified patent and that said Letters Patent is hereby corrected as shown below:

On the Title Page, Item (56), Refs Cited, Page 2, Line 72, delete "EP 1318425 6/2003".

On the Title Page, Item (56), Refs Cited, Page 4, Line 4, delete "Microlithogtaphy" and insert --Microlithography--.

Column 6, line 49, delete "focussing" insert --focusing--.

Column 13, line 21, delete "(meridonal)" insert --meridional--.

Column 14, line 32, delete "FIG. 1," insert --FIG. 1;--.

Column 14, line 43, delete "stop." insert --stop;--.

Column 15, line 49, delete "mirrors;" insert --mirrors.--.

Column 20, line 37, delete "schematric." insert --schematic--.

Column 26, line 52, delete "where is" insert --where y is--.

Column 27, line 32, delete "catoptic" insert --catoptric--.

Column 30, line 19, delete "$-1 \leq k \leq 0$" insert -- $-1 < k < 0$ --.

Column 33, line 58, delete "meridonal" insert --meridional--.

Column 35, line 35, delete "meridonal" insert --meridional--.

Column 37, line 50, delete "for a" insert --for an--.

Column 39, line 62, after "observed" insert --.--.

Column 91, line 56, Claim 1, after "claim 1" insert --wherein--.

Signed and Sealed this

Fifteenth Day of June, 2010

David J. Kappos
*Director of the United States Patent and Trademark Office*